US012069947B2

(12) United States Patent
Seo et al.

(10) Patent No.: US 12,069,947 B2
(45) Date of Patent: Aug. 20, 2024

(54) COMPOSITION FOR OPTOELECTRONIC DEVICE AND ORGANIC OPTOELECTRONIC DEVICE AND DISPLAY DEVICE

(71) Applicant: SAMSUNG SDI CO., LTD., Yongin-si (KR)

(72) Inventors: Hansol Seo, Suwon-si (KR); Youngmook Lim, Suwon-si (KR); Jonghoon Kim, Suwon-si (KR); Changwoo Kim, Suwon-si (KR); Mijin Lee, Suwon-si (KR); Suyong Lim, Suwon-si (KR); Sung-Hyun Jung, Suwon-si (KR); Ho Kuk Jung, Suwon-si (KR); Youngkyoung Jo, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 625 days.

(21) Appl. No.: 17/361,716

(22) Filed: Jun. 29, 2021

(65) Prior Publication Data

US 2022/0006029 A1 Jan. 6, 2022

(30) Foreign Application Priority Data

Jun. 30, 2020 (KR) ........................ 10-2020-0080285

(51) Int. Cl.

| | |
|---|---|
| ***H10K 85/60*** | (2023.01) |
| *H10K 50/11* | (2023.01) |
| *H10K 101/10* | (2023.01) |
| *H10K 101/30* | (2023.01) |

(52) U.S. Cl.

CPC ..... *H10K 85/6572* (2023.02); *H10K 85/6574* (2023.02); *H10K 85/6576* (2023.02); *H10K 50/11* (2023.02); *H10K 2101/10* (2023.02); *H10K 2101/30* (2023.02)

(58) Field of Classification Search

None

See application file for complete search history.

(56) References Cited

U.S. PATENT DOCUMENTS

| | | | | |
|---|---|---|---|---|
| 5,061,569 | A | 10/1991 | Vanslyke et al. | |
| 2014/0374728 | A1* | 12/2014 | Adamovich | H10K 50/121 257/40 |
| 2015/0249221 | A1 | 9/2015 | Zeng et al. | |
| 2017/0117486 | A1* | 4/2017 | Cho | H10K 85/657 |
| 2019/0214573 | A1 | 7/2019 | Ryu et al. | |

(Continued)

FOREIGN PATENT DOCUMENTS

| | | | |
|---|---|---|---|
| CN | 109791981 | A | 5/2019 |
| JP | 1993-009471 | A | 1/1993 |

(Continued)

OTHER PUBLICATIONS

Korean Office Action dated Oct. 25, 2023, of the corresponding Korean Patent Application No. 10-2020-0080285.

(Continued)

*Primary Examiner* — Robert S Loewe
(74) *Attorney, Agent, or Firm* — Lee IP Law, P.C.

(57) ABSTRACT

A composition for an organic optoelectronic device, an organic optoelectronic device, and a display device, the composition comprising a first compound represented by Chemical Formula I; a second compound represented by Chemical Formula II; and a third compound represented by Chemical Formula III,

[Chemical Formula I]

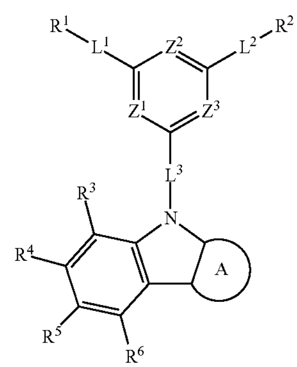

[Chemical Formula II]

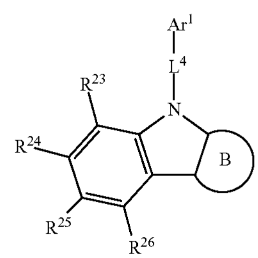

[Chemical Formula III]

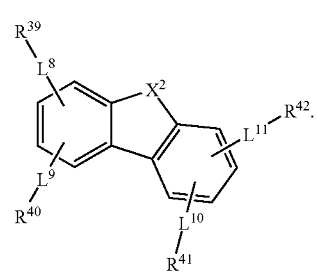

17 Claims, 1 Drawing Sheet

(56) References Cited

U.S. PATENT DOCUMENTS

| | | | | |
|---|---|---|---|---|
| 2019/0372012 | A1* | 12/2019 | Cho | H10K 85/6572 |
| 2020/0106026 | A1* | 4/2020 | Kang | C07D 403/14 |
| 2020/0127214 | A1* | 4/2020 | Choi | H10K 85/6574 |
| 2020/0136059 | A1* | 4/2020 | Hong | C07D 409/14 |
| 2020/0168818 | A1* | 5/2020 | Lin | H10K 85/6576 |
| 2021/0376252 | A1* | 12/2021 | Sun | C09K 11/06 |
| 2022/0006023 | A1* | 1/2022 | Hong | H10K 85/654 |
| 2022/0384732 | A1* | 12/2022 | Parham | C07D 409/14 |
| 2023/0172065 | A1* | 6/2023 | Park | H10K 85/6572 257/40 |
| 2023/0284526 | A1* | 9/2023 | Kai | H10K 85/6572 257/40 |
| 2023/0413662 | A1* | 12/2023 | Montenegro | C07D 333/76 |

FOREIGN PATENT DOCUMENTS

| | | | | |
|---|---|---|---|---|
| JP | 1995-126615 | A | 5/1995 | |
| JP | 1998-095973 | A | 4/1998 | |
| JP | 2012-33784 | A | 2/2012 | |
| KR | 10-2016-0050614 | A | 5/2016 | |
| KR | 10-2017-0037277 | A | 4/2017 | |
| KR | 10-2017-0068927 | A | 6/2017 | |
| WO | WO 1995/009147 | A1 | 4/1995 | |
| WO | WO 2012-014779 | A1 | 2/2012 | |
| WO | WO 2012/166101 | A1 | 12/2012 | |
| WO | WO-2012166101 | A1 * | 12/2012 | H01L 51/5016 |
| WO | WO 2016/068458 | A1 | 5/2016 | |

OTHER PUBLICATIONS

Chinese Office Action (including a search report) dated Feb. 6, 2024, for corresponding Chinese Patent Application No. 202110728486.0.

* cited by examiner

COMPOSITION FOR OPTOELECTRONIC DEVICE AND ORGANIC OPTOELECTRONIC DEVICE AND DISPLAY DEVICE

Korean Patent Application No. 10-2020-0080285 filed on Jun. 30, 2020, in the Korean Intellectual Property Office, and entitled: "Composition for Optoelectronic Device and Organic Optoelectronic Device and Display Device," is incorporated by reference herein in its entirety.

BACKGROUND

1. Field

Embodiments relate to a composition for an organic optoelectronic device, an organic optoelectronic device, and a display device.

2. Description of the Related Art

An organic optoelectronic device (e.g., organic optoelectronic diode) is a device capable of converting electrical energy and optical energy to each other.

Organic optoelectronic devices may be divided into two types according to a principle of operation. One is a photoelectric device that generates electrical energy by separating excitons formed by light energy into electrons and holes, and transferring the electrons and holes to different electrodes, respectively and the other is light emitting device that generates light energy from electrical energy by supplying voltage or current to the electrodes.

Examples of the organic optoelectronic device include an organic photoelectric device, an organic light emitting diode, an organic solar cell, and an organic photoconductor drum.

Among them, organic light emitting diodes (OLEDs) are attracting much attention in recent years due to increasing demands for flat panel display devices. The organic light emitting diode is a device that converts electrical energy into light, and the performance of the organic light emitting diode is greatly influenced by an organic material between electrodes.

SUMMARY

The embodiments may be realized by providing a composition for an organic optoelectronic device, the composition including a first compound; a second compound; and a third compound, wherein the first compound is represented by Chemical Formula I, the second compound is represented by Chemical Formula II, and the third compound is represented by Chemical Formula III:

[Chemical Formula I]

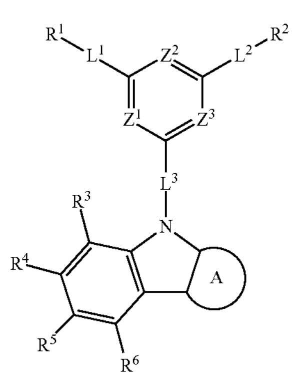

wherein, in Chemical Formula I, $Z^1$ to $Z^3$ are each independently N or C-$L^a$-$R^a$, at least two of $Z^1$ to $Z^3$ being N, $L^a$ and $L^1$ to $L^3$ are each independently a single bond, a substituted or unsubstituted C6 to C20 arylene group, a substituted or unsubstituted C2 to C20 heterocyclic group, or a combination thereof, $R^1$ and $R^2$ are each independently a substituted or unsubstituted C6 to C30 aryl group, a substituted or unsubstituted C2 to C30 heterocyclic group, or a combination thereof, $R^a$ and $R^3$ to $R^6$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and ring A is represented by one of Substituent A-1 to Substituent A-6,

[Substituent A-1]

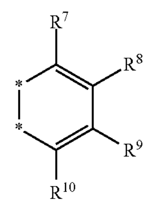

[Substituent A-2]

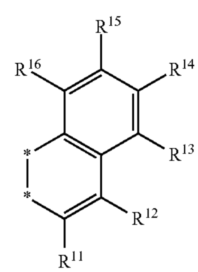

[Substituent A-3]

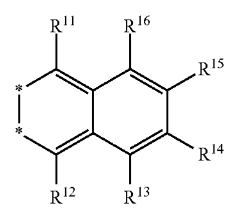

[Substituent A-4]

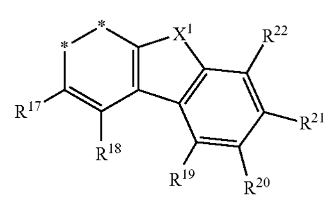

[Substituent A-5]

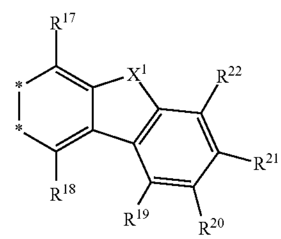

-continued

[Substituent A-6]

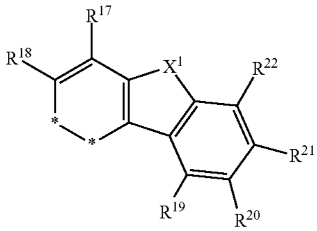

wherein, in Substituent A-1 to Substituent A-6, $X^1$ is O, S, or $NR^b$, $R^b$ and $R^7$ to $R^{22}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and * is a linking carbon;

[Chemical Formula II]

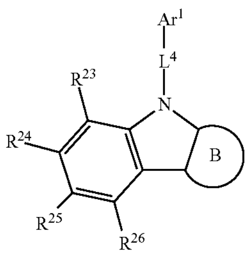

wherein, in Chemical Formula II, $L^4$ is a single bond, a substituted or unsubstituted C6 to C20 arylene group, a substituted or unsubstituted C2 to C20 heterocyclic group, or a combination thereof, $Ar^1$ is a substituted or unsubstituted C6 to C30 aryl group, a substituted or unsubstituted dibenzofuranyl group, a substituted or unsubstituted dibenzothiophenyl group, or a combination thereof, $R^{23}$ to $R^{26}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and ring B is represented by one of Substituent B-1 to Substituent B-4:

[Substituent B-1]

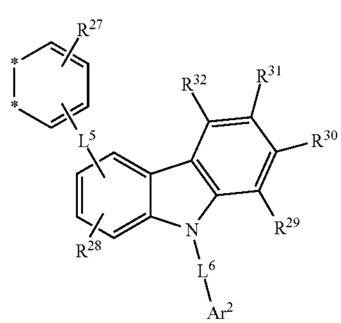

-continued

[Substituent B-2]

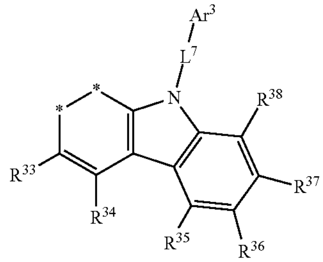

[Substituent B-3]

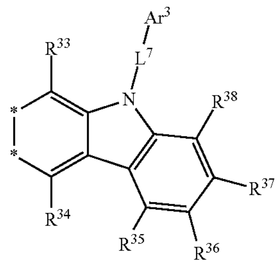

[Substituent B-4]

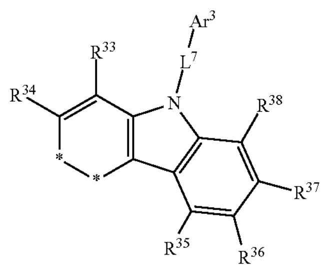

wherein, in Substituent B-1 to Substituent B-4, $L^5$ to $L^7$ are each independently a single bond, a substituted or unsubstituted C6 to C20 arylene group, a substituted or unsubstituted C2 to C20 heterocyclic group, or a combination thereof, $Ar^2$ and $Ar^3$ are each independently a substituted or unsubstituted C6 to C30 aryl group, a substituted or unsubstituted dibenzofuranyl group, a substituted or unsubstituted dibenzothiophenyl group, or a combination thereof, $R^{27}$ to $R^{38}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and * is a linking carbon;

[Chemical Formula III]

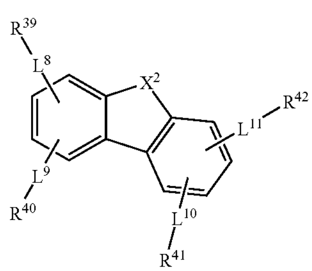

wherein, in Chemical Formula III, $X^2$ is O, or S, $L^8$ to $L^{11}$ are each independently a single bond or a substituted or unsubstituted C6 to C20 arylene group, $R^{39}$ to $R^{42}$ are each independently hydrogen, deuterium, a substituted or unsubstituted C1 to C30 alkyl group, a substituted or unsubstituted C6 to C30 aryl group, a substituted or unsubstituted dibenzofuranyl group, or a substituted or unsubstituted dibenzothiophenyl group, and at least one of $R^{39}$ to $R^{42}$ is a substituted or unsubstituted dibenzofuranyl group or a substituted or unsubstituted dibenzothiophenyl group.

The embodiments may be realized by providing an organic optoelectronic device including an anode and a cathode facing each other, and at least one organic layer between the anode and the cathode, wherein the at least one organic layer includes the composition for an organic optoelectronic device according to an embodiment.

The embodiments may be realized by providing a display device including the organic optoelectronic device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
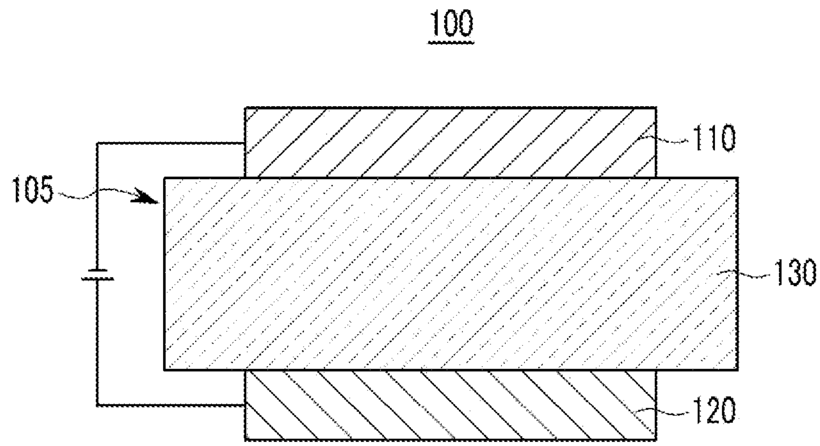
FIGS. 1 and 2 are cross-sectional views each illustrating an organic light emitting diode according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being “on” another layer or element, it can be directly on the other layer or element, or intervening layers may also be present. In addition, it will also be understood that when a layer is referred to as being “between” two layers, it can be the only layer between the two layers, or one or more intervening layers may also be present. Like reference numerals refer to like elements throughout.

In one example of the present disclosure, the “substituted” refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof. As used herein, the term “or” is not an exclusive term, e.g., “A or B” would include A, B, or A and B.

In specific example of the present disclosure, the “substituted” refers to replacement of at least one hydrogen of a substituent or a compound by deuterium, a cyano group, a C1 to C30 alkyl group, a C1 to C10 alkylsilyl group, a C6 to C30 arylamine group, a C6 to C30 arylsilyl group, a C3 to C30 cycloalkyl group, a C3 to C30 heterocycloalkyl group, a C6 to C30 aryl group, or a C2 to C30 heteroaryl group. In specific example of the present disclosure, the “substituted” refers to replacement of at least one hydrogen of a substituent or a compound by deuterium, a cyano group, a C1 to C20 alkyl group, a C6 to C30 arylamine group, a C6 to C30 aryl group, or a C2 to C30 heteroaryl group. In specific example of the present disclosure, the “substituted” refers to replacement of at least one hydrogen of a substituent or a compound by deuterium, a cyano group, a C1 to C5 alkyl group, a C6 to C20 arylamine group, a C6 to C18 aryl group, a dibenzofuranyl group, a dibenzothiophenyl group, a carbazolyl group, or a pyridinyl group. In specific example of the present disclosure, the “substituted” refers to replacement of at least one hydrogen of a substituent or a compound by deuterium, a cyano group, a methyl group, an ethyl group, a propyl group, a butyl group, a C6 to C20 arylamine group, a phenyl group, a biphenyl group, terphenyl group, a naphthyl group, a triphenyl group, a fluorenyl group, a dibenzofuranyl group, a dibenzothiophenyl group, a carbazolyl group, or a pyridinyl group.

As used herein, when a definition is not otherwise provided, “hetero” refers to one including one to three heteroatoms selected from N, O, S, P, and Si, and remaining carbons in one functional group.

As used herein, “an aryl group” refers to a group including at least one hydrocarbon aromatic moiety, and all elements of the hydrocarbon aromatic moiety have p-orbitals which form conjugation, for example a phenyl group, a naphthyl group, and the like, two or more hydrocarbon aromatic moieties may be linked by a sigma bond and may be, for example a biphenyl group, a terphenyl group, a quarterphenyl group, and the like, and two or more hydrocarbon aromatic moieties are fused directly or indirectly to provide a non-aromatic fused ring, for example a fluorenyl group.

The aryl group may include a monocyclic, polycyclic, or fused ring polycyclic (i.e., rings sharing adjacent pairs of carbon atoms) functional group.

As used herein, “a heterocyclic group” is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, “a heteroaryl group” may refer to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, or a combination thereof, but is not limited thereto.

More specifically, the substituted or unsubstituted C2 to C30 heterocyclic group may be a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiophenyl group, or a combination thereof, but is not limited thereto.

In the present specification, hole characteristics refer to an ability to donate an electron to form a hole when an electric field is applied and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to a lowest unoccupied molecular orbital (LUMO) level.

Hereinafter, a composition for an organic optoelectronic device according to an embodiment is described.

A composition for an organic optoelectronic device according to an embodiment may include a mixture of three types of compounds. In an implementation, the composition may include, e.g., a first compound having electron characteristics, a second compound having hole characteristics, and a third compound having buffer characteristics.

The third compound may be a compound having a wide HOMO-LUMO band gap including both the HOMO-LUMO band gaps of the first compound and the second compound and may have a hole mobility that is lower than that of the second compound having the hole characteristics, thereby slowing hole injection characteristics, and reducing hole traps to decrease a driving voltage and to increase the efficiency.

In an implementation, the light emitting layer region may be relatively moved toward the hole transport auxiliary layer while having an electron mobility lower than the electron mobility of the first compound, and exciton quenching at the interface toward the electron transport auxiliary layer and degradation caused by the same may be reduced, thereby increasing the life-span.

In an implementation, the first compound having electron characteristics may include a structure in which a nitrogen-containing six-membered or hexagonal ring is substituted with or bonded to a carbazole or a carbazole derivative. In an implementation, the first compound may be represented by Chemical Formula I.

[Chemical Formula 1]

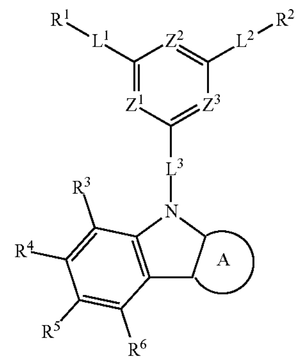

In Chemical Formula I, $Z^1$ to $Z^3$ may each independently be, e.g., N or C-$L^a$-$R^a$. In an implementation, at least two of $Z^1$ to $Z^3$ are N.

$L^a$ and $L^1$ to $L^3$ may each independently be or include, e.g., a single bond, a substituted or unsubstituted C6 to C20 arylene group, a substituted or unsubstituted C2 to C20 heterocyclic group, or a combination thereof.

$R^1$ and $R^2$ may each independently be or include, e.g., a substituted or unsubstituted C6 to C30 aryl group, a substituted or unsubstituted C2 to C30 heterocyclic group, or a combination thereof.

$R^a$ and $R^3$ to $R^6$ may each independently be or include, e.g., hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof.

Ring A may be represented by one of Substituent A-1 to Substituent A-6:

[Substituent A-1]

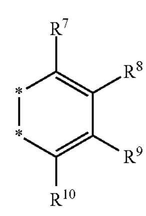

[Substituent A-2]

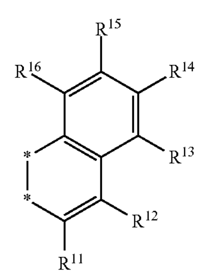

-continued

[Substituent A-3]

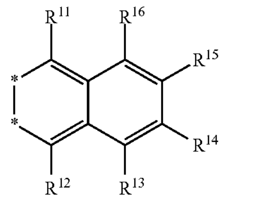

[Substituent A-4]

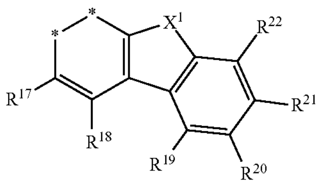

[Substituent A-5]

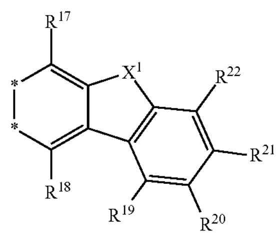

[Substituent A-6]

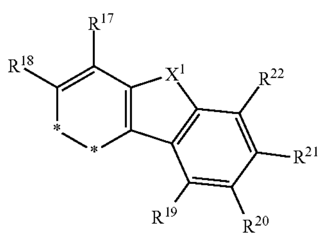

In Substituent A-1 to Substituent A-6, $X^1$ may be, e.g., O, S, or $NR^b$.

$R^b$ and $R^7$ to $R^{22}$ may each independently be or include, e.g., hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof.

Each * is a linking carbon. As used herein, the term "linking carbon" refers to a shared carbon at which fused rings are linked. In an implementation, the linking carbon may be $sp^2$ linking carbon, such that the ring fused to the nitrogen-containing 5-membered ring of Chemical Formula I is an aromatic ring.

In an implementation, $Z^1$ to $Z^3$ in Chemical Formula I may each independently be, e.g., N or CH, and at least two of $Z^1$ to $Z^3$ may be N.

In an implementation, $Z^1$ to $Z^3$ may each N.

In an implementation, $Z^1$ and $Z^3$ may be N, and $Z^2$ may be CH.

In an implementation $L^L$ to $L^3$ of Chemical Formula I may each independently be, e.g., a single bond, a substituted or unsubstituted phenylene group, a substituted or unsubstituted biphenylene group, a substituted or unsubstituted naphthylene group, a substituted or unsubstituted carbazolylene group, a substituted or unsubstituted dibenzofuranylene group, a substituted or unsubstituted dibenzothiophenylene group, or a substituted or unsubstituted pyridinylene group.

In an implementation, when $L^L$ to $L^3$ are substituted, the substituent may be a phenyl group or a carbazolyl group.

In an implementation, $R^1$ and $R^2$ of Chemical Formula I may each independently be, e.g., a substituted or unsubstituted phenyl group, a substituted or unsubstituted biphenyl group, a substituted or unsubstituted terphenyl group, a substituted or unsubstituted naphthyl group, a substituted or unsubstituted fluorenyl group, a substituted or unsubstituted carbazolyl group, a substituted or unsubstituted dibenzofuranyl group, or a substituted or unsubstituted dibenzothiophenyl group.

In an implementation, when $R^1$ and $R^2$ are substituted, the substituent may be a phenyl group, a biphenyl group, or a carbazolyl group.

In an implementation, $L^1$ to $L^3$ of Chemical Formula I may each independently be, e.g., a single bond, a m-phenylene group that is unsubstituted or substituted with a phenyl group or a carbazolyl group, a p-phenylene group that is unsubstituted or substituted with a phenyl group or a carbazolyl group, a dibenzofuranylene group that is unsubstituted or substituted with a phenyl group or a carbazolyl group, or a dibenzothiophenylene group that is unsubstituted or substituted with a phenyl group or a carbazolyl group.

In an implementation, $R^1$ and $R^2$ in Chemical Formula I may each independently be, e.g., a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group.

In an implementation, Chemical Formula I may be represented by one of Chemical Formula I-A to Chemical Formula I-J, e.g., depending on the specific structures of carbazole and carbazole derivatives.

[Chemical Formula I-A]

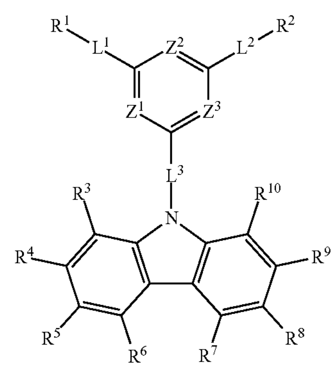

[Chemical Formula I-B]

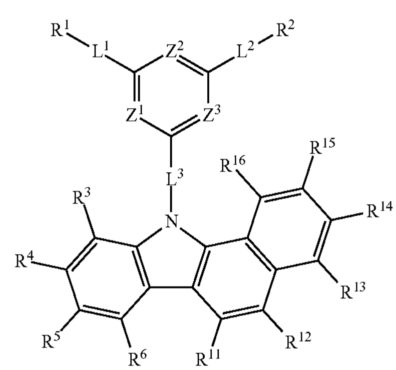

[Chemical Formula I-C]
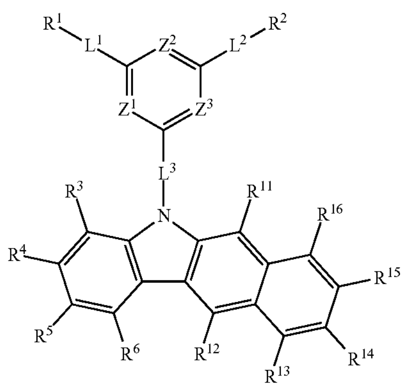
[Chemical Formula I-D]
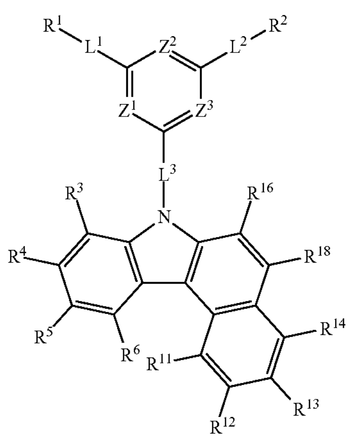
[Chemical Formula I-E]
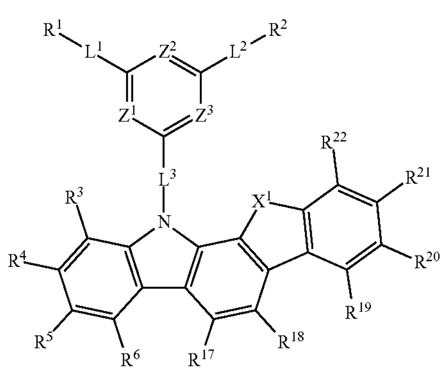
[Chemical Formula I-F]
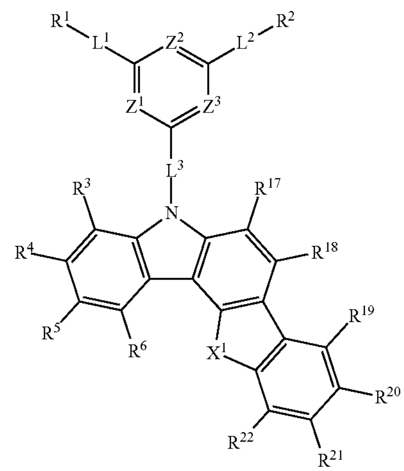
[Chemical Formula I-G]
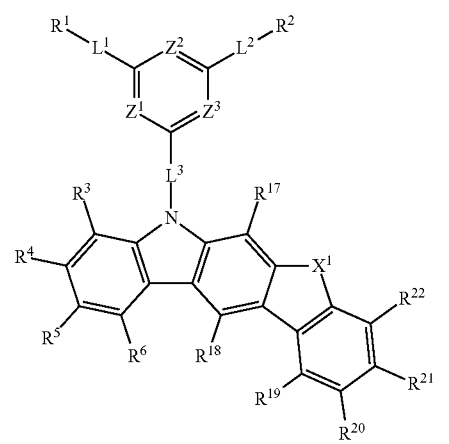
[Chemical Formula I-H]
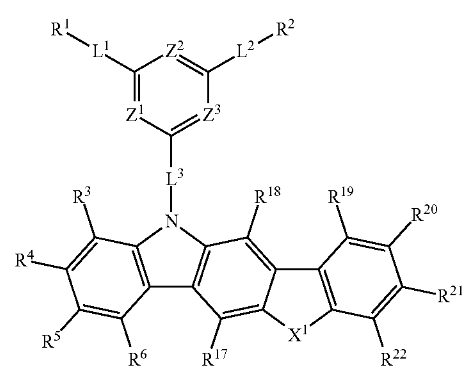

-continued

[Chemical Formula I-I]

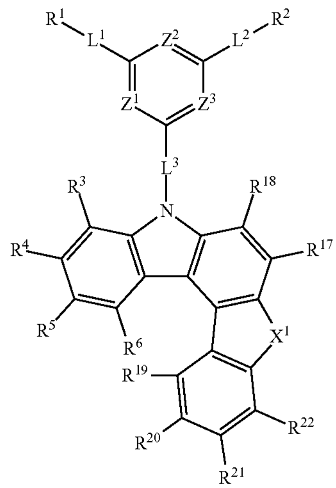

[Chemical Formula I-J]

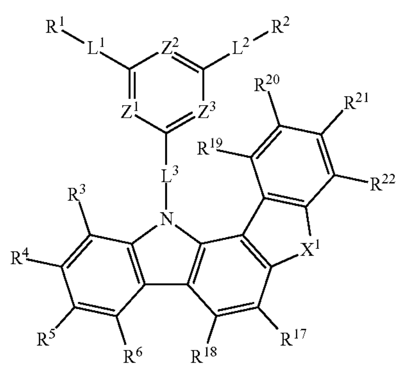

In Chemical Formula I-A to Chemical Formula I-J, $Z^1$ to $Z^3$, $L^1$ to $L^3$, $R^1$ to $R^{22}$ and $X^1$ may be defined the same as those described above.

In an implementation, the first compound may be represented by Chemical Formula I-A, Chemical Formula I-D, Chemical Formula I-E, Chemical Formula I-F, Chemical Formula I-G, Chemical Formula I-H, Chemical Formula I-I, or Chemical Formula I-J.

In an implementation, $R^3$ to $R^{10}$ in Chemical Formula I-A may each independently be, e.g., hydrogen, a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group.

In an implementation, Chemical Formula I-A may be represented by one of Chemical Formula I-A-1 to Chemical Formula I-A-7.

[Chemical Formula I-A-1]

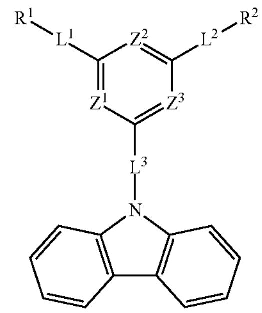

[Chemical Formula I-A-2]

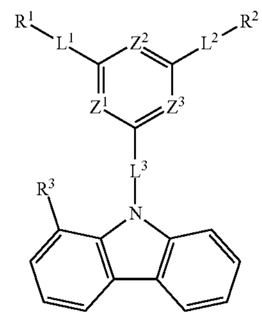

[Chemical Formula I-A-3]

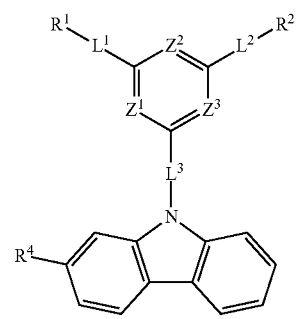

[Chemical Formula I-A-4]

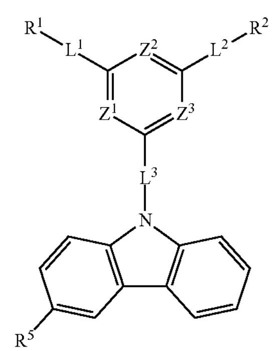

[Chemical Formula I-A-5]

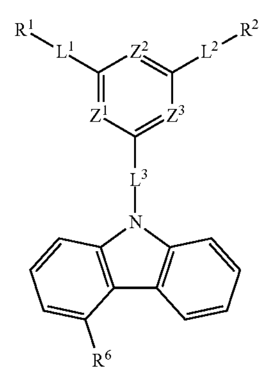

-continued

[Chemical Formula I-A-6]

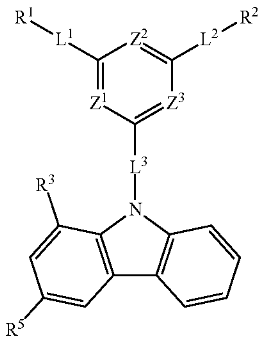

[Chemical Formula I-A-7]

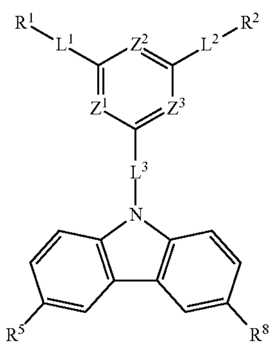

In Chemical Formula I-A-1 to Chemical Formula I-A-7, $Z^1$ to $Z^3$, $L^1$ to $L^3$, $R^1$, and $R^2$ may be defined the same as those described above.

$R^3$ to $R^5$ and $R^8$ may each independently be, e.g., a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group.

In an implementation, $R^3$ to $R^5$ and $R^8$ in Chemical Formula I-A-2 to Chemical Formula I-A-7 may each independently be, e.g., an unsubstituted phenyl group or an unsubstituted biphenyl group.

In an implementation, $R^3$ to $R^6$ and $R^{11}$ to $R^{16}$ in Chemical Formula I-B to Chemical Formula I-D may each independently be, e.g., hydrogen, a substituted or unsubstituted phenyl group, or a substituted or unsubstituted biphenyl group.

In an implementation, the first compound may be represented by Chemical Formula I-D, and may be, e.g., represented by Chemical Formula I-D-1.

[Chemical Formula I-D-1]

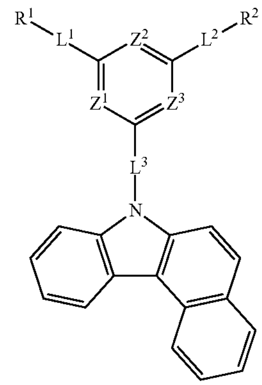

In Chemical Formula I-D-1, $Z^1$ to $Z^3$, $R^1$, $R^2$, and $L^1$ to $L^3$ may be the same as those described above.

In an implementation, $R^3$ to $R^6$ and $R^{17}$ to $R^{22}$ of Chemical Formula I-E to Chemical Formula I-J may each independently be, e.g., hydrogen, a substituted or unsubstituted phenyl group, or a substituted or unsubstituted biphenyl group.

In an implementation, the first compound may be represented by one of Chemical Formula I-E to Chemical Formula I-J, and may be, e.g., represented by one of Chemical Formula I-E-1 to Chemical Formula I-E-4, Chemical Formula I-F-1, Chemical Formula I-G-1, Chemical Formula I-G-2, Chemical Formula I-H-1, Chemical Formula I-I-1, and Chemical Formula I-J-1.

[Chemical Formula I-E-1]

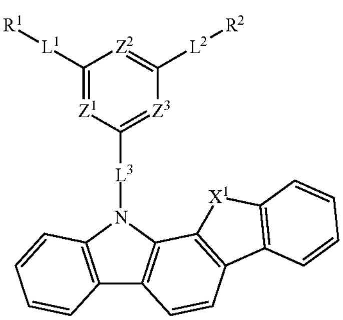

[Chemical Formula I-E-2]

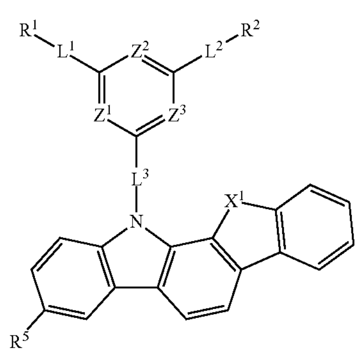

-continued
[Chemical Formula I-E-3]
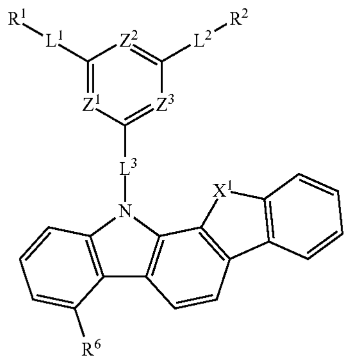
[Chemical Formula I-E-4]
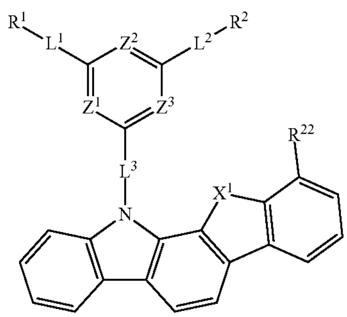
[Chemical Formula I-F-1]
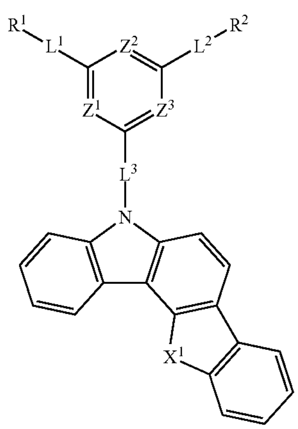
[Chemical Formula I-G-1]
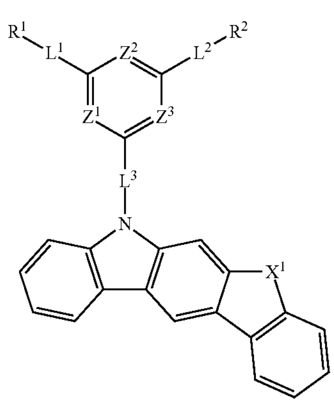
-continued
[Chemical Formula I-G-2]
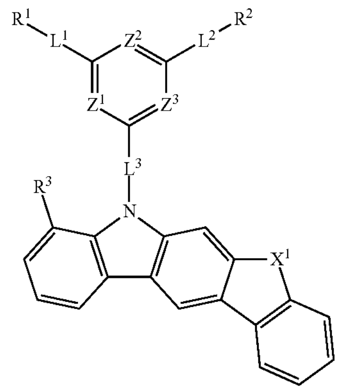
[Chemical Formula I-H-1]
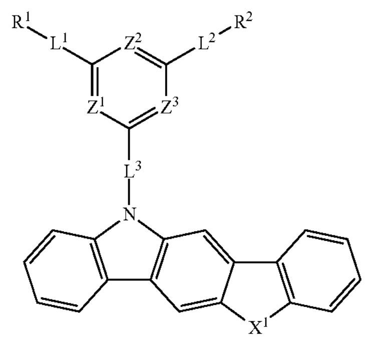
[Chemical Formula I-I-1]
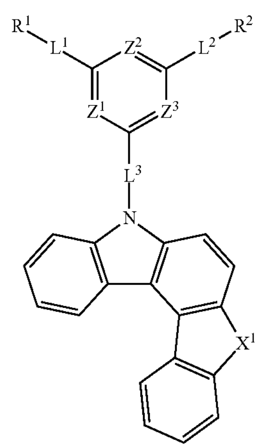
[Chemical Formula I-J-1]
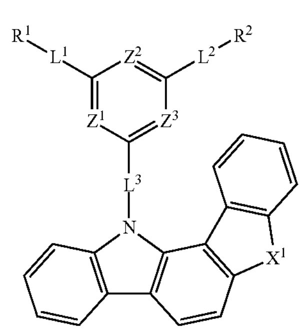
In Chemical Formula -IE-1 to Chemical Formula I-E-4, Chemical Formula I-F-1, Chemical Formula I-G-1, Chemical Formula I-G-2, Chemical Formula I-H-1, Chemical Formula I-I-1, and Chemical Formula I-J-1, $X^1$, $Z^1$ to $Z^3$, $R^1$, $R^2$, and $L^1$ to $L^3$ may be defined the same as those described above.

$R^3$, $R^5$, $R^6$, and $R^{22}$ in Chemical Formula I-E-2, Chemical Formula I-E-3, Chemical Formula I-E-4, and Chemical Formula I-G-2 may each be, e.g., an unsubstituted phenyl group.

In an implementation, the first compound may be represented by one of Chemical Formula I-A-1, Chemical Formula I-A-4, and Chemical Formula I-E-1.

In an implementation, in Chemical Formula I-A-1 and Chemical Formula I-A-4, $Z^1$ to $Z^3$ may each be N, $L^1$ to $L^3$ may each independently be, e.g., a single bond, a substituted or unsubstituted phenylene group, a substituted or unsubstituted dibenzofuranylene group, or a substituted or unsubstituted dibenzothiophenylene group, and $R^1$ and $R^2$ may each independently be, e.g., a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group.

In an implementation, in Chemical Formula I-E-1, $X^1$ may be, e.g., $NR^b$, O, or S, $R^b$ may be, e.g., a substituted or unsubstituted phenyl group, a substituted or unsubstituted biphenyl group, or a substituted or unsubstituted terphenyl group, $Z^1$ to $Z^3$ may each be N, $L^1$ to $L^3$ may each independently be, e.g., a single bond or a substituted or unsubstituted phenylene group, and $R^1$ and $R^2$ may each independently be, e.g., a substituted or unsubstituted phenyl group, or a substituted or unsubstituted biphenyl group.

In an implementation, the first compound may be, e.g., a compound of Group 1.

[Group 1]

[1-1]

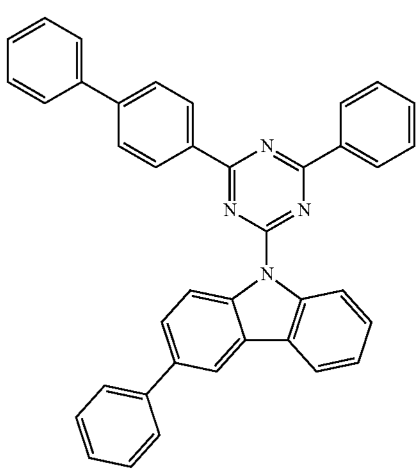

-continued

[1-2]

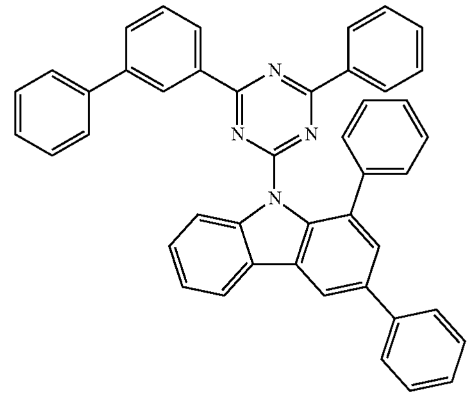

[1-3]

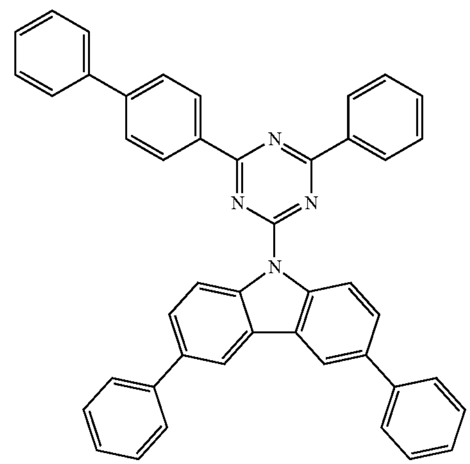

[1-4]

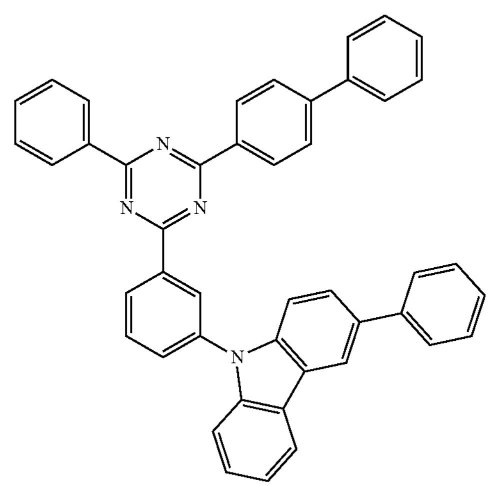

[1-5]
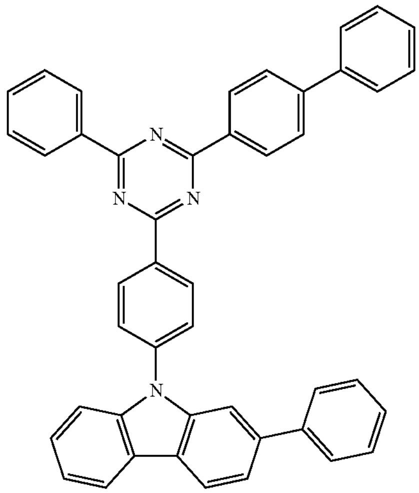
[1-6]
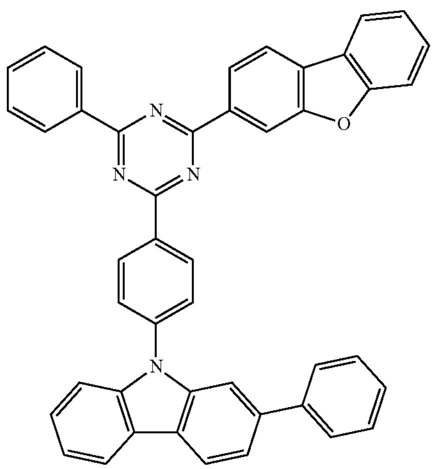
[1-7]
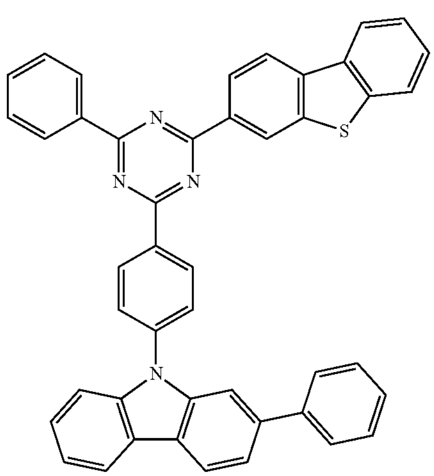
[1-8]
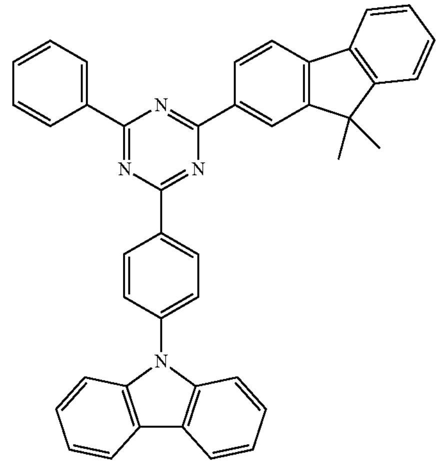
[1-9]
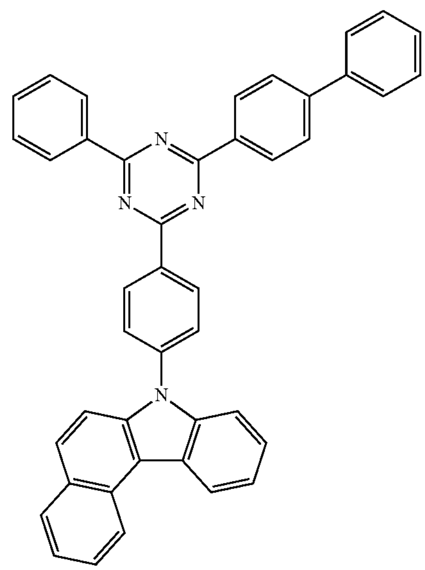
[1-10]
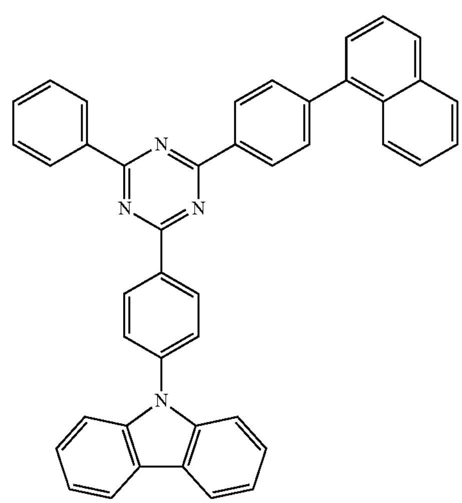

-continued
[1-11]
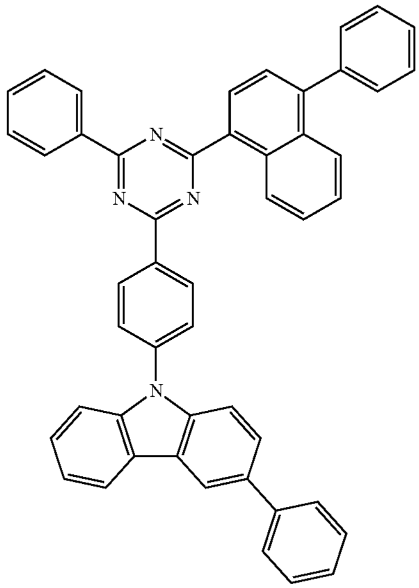
[1-12]
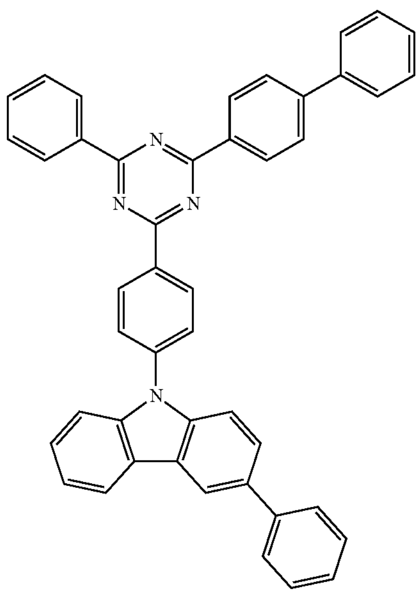
[1-13]
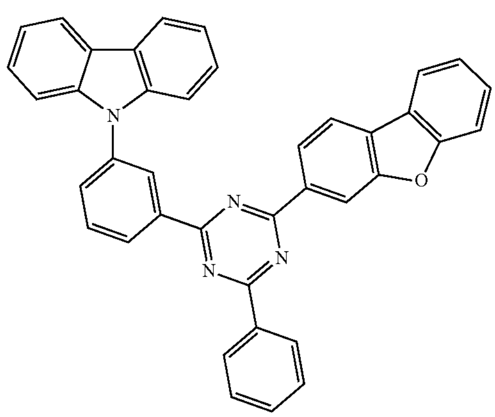
-continued
[1-14]
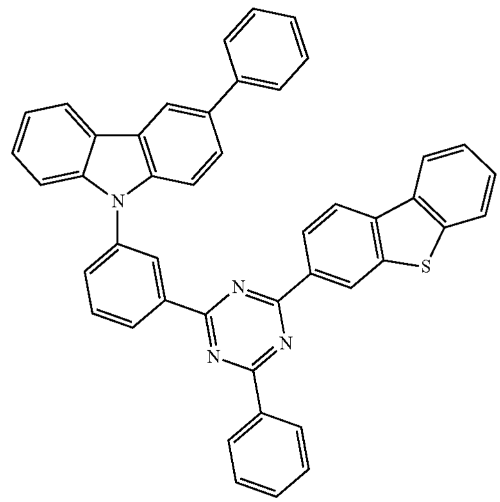
[1-15]
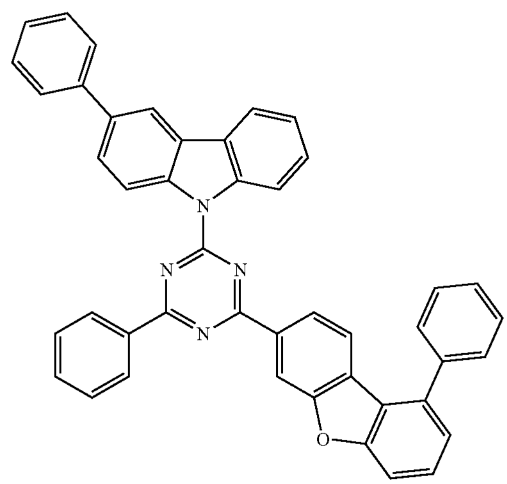
[1-16]
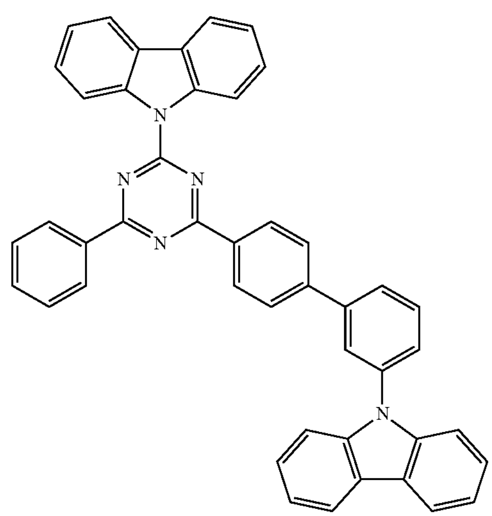

-continued
[1-17]
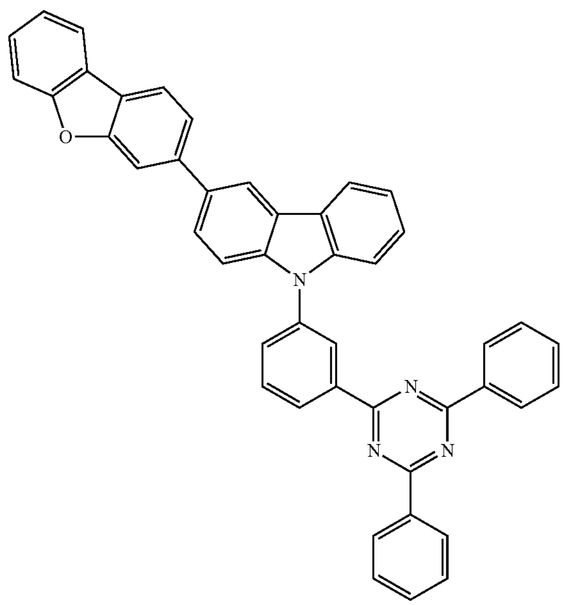
[1-18]
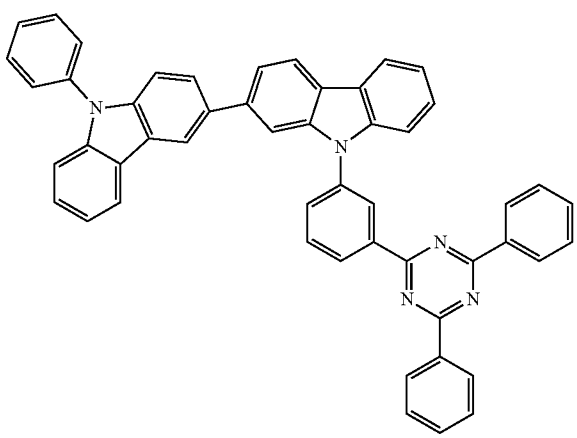
[1-19]
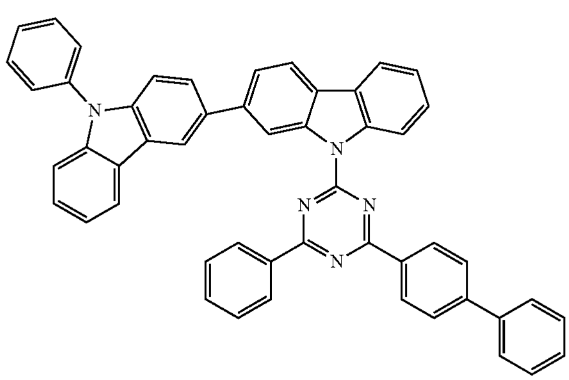
-continued
[1-20]
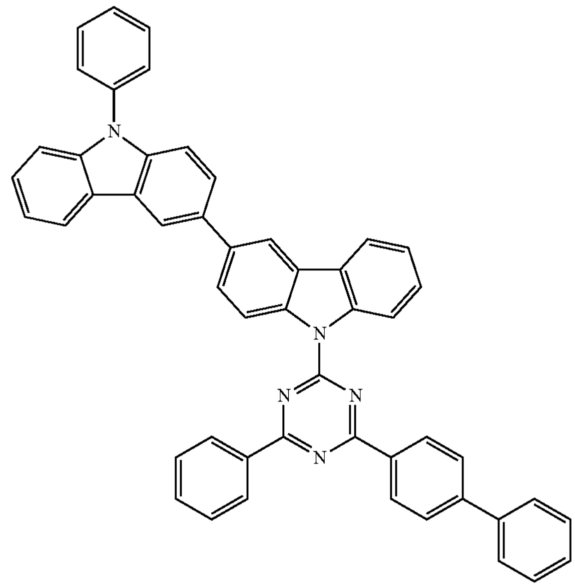
[1-21]
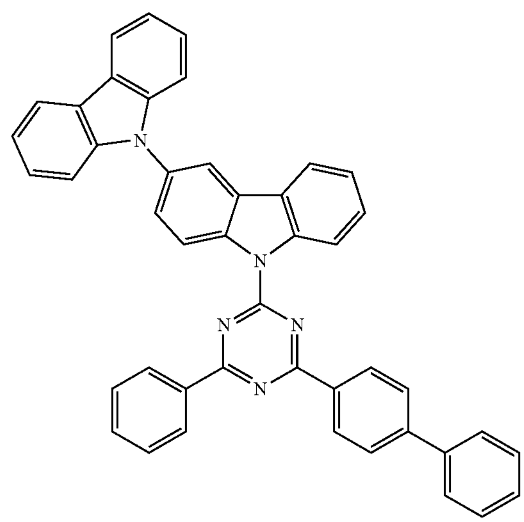
[1-22]
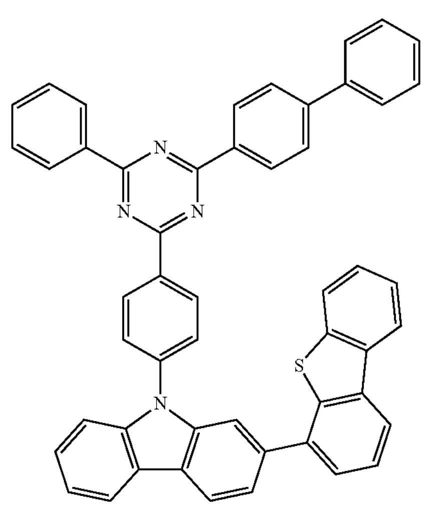

-continued
[1-23]
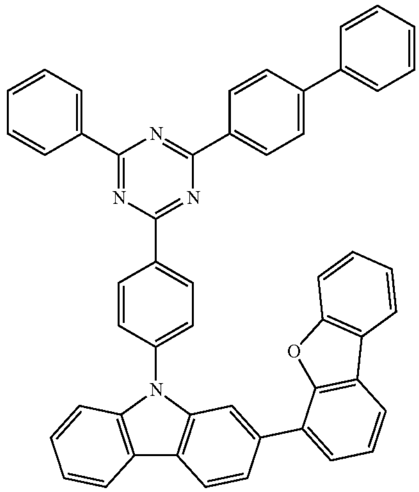
[1-24]
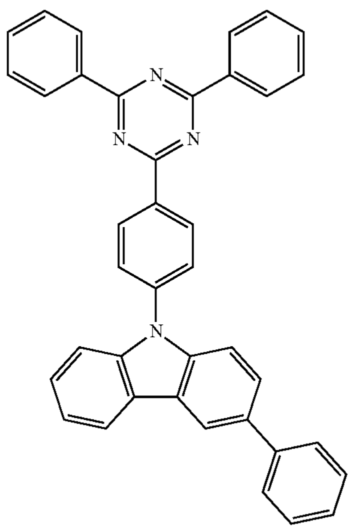
[1-25]
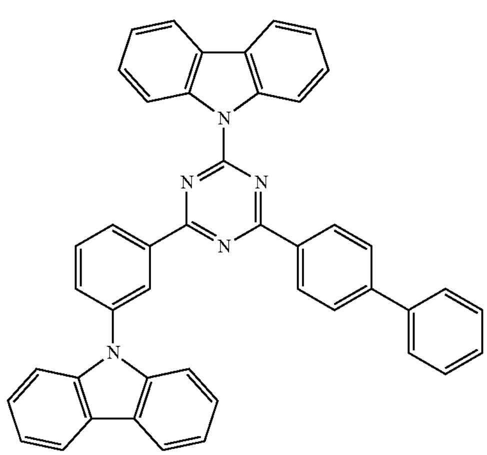
-continued
[1-26]
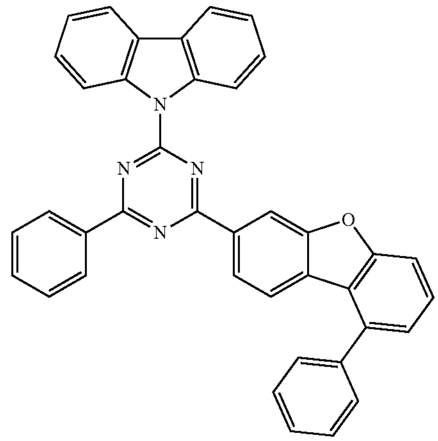
[1-27]
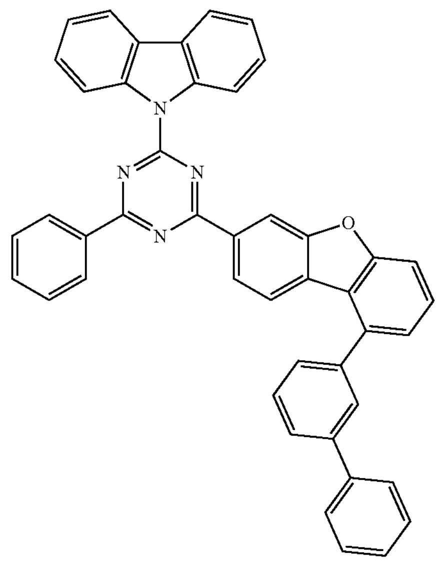
[1-28]
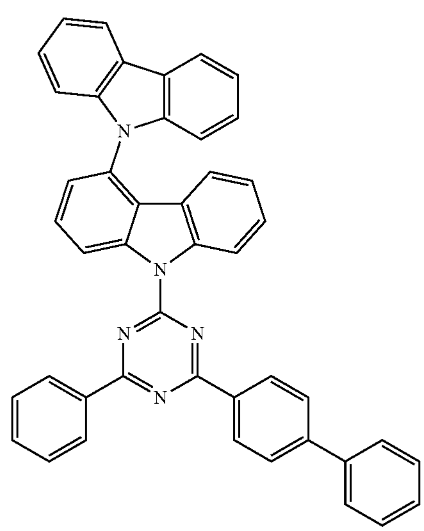

-continued
[1-29]
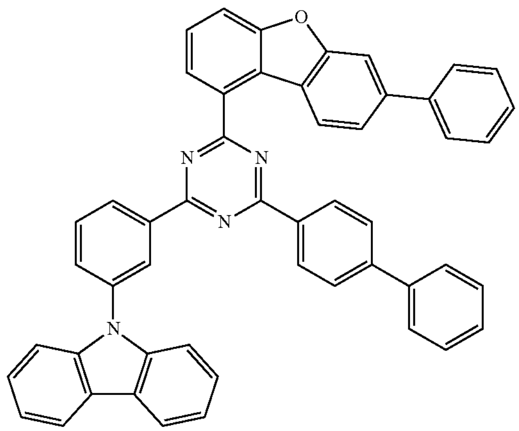
[1-30]
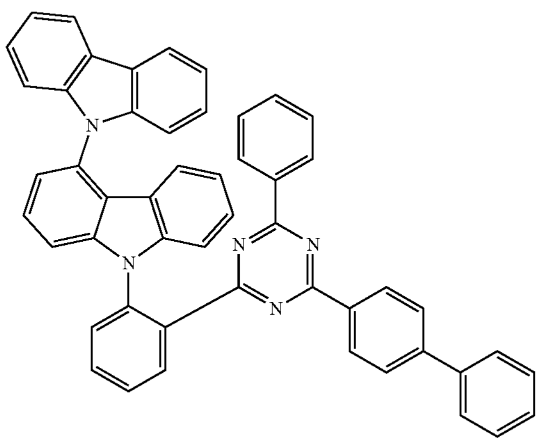
[1-31]
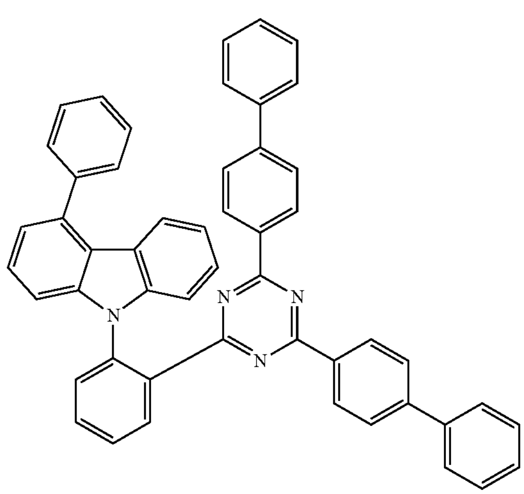
-continued
[1-32]
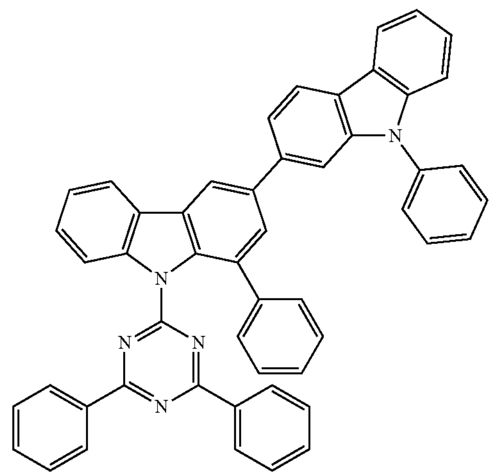
[1-33]
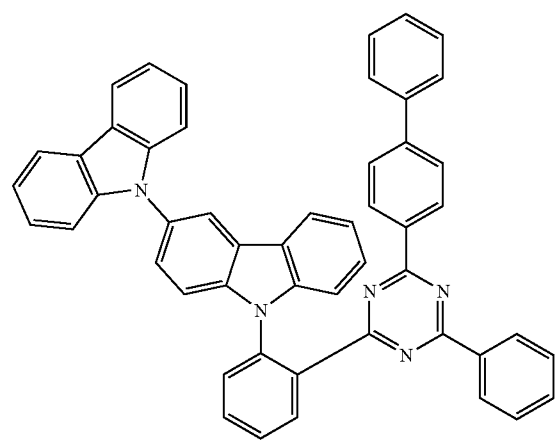
[1-34]
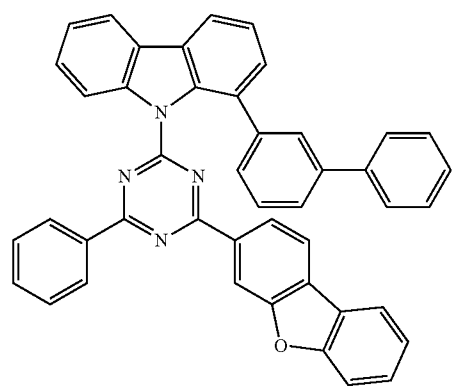

-continued
[1-35]
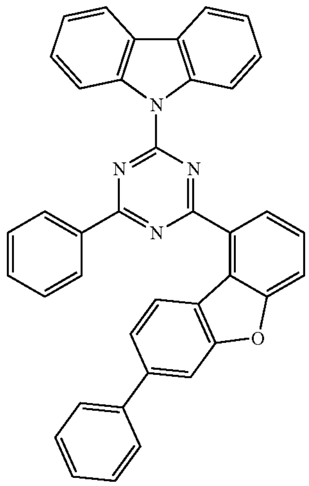
[1-36]
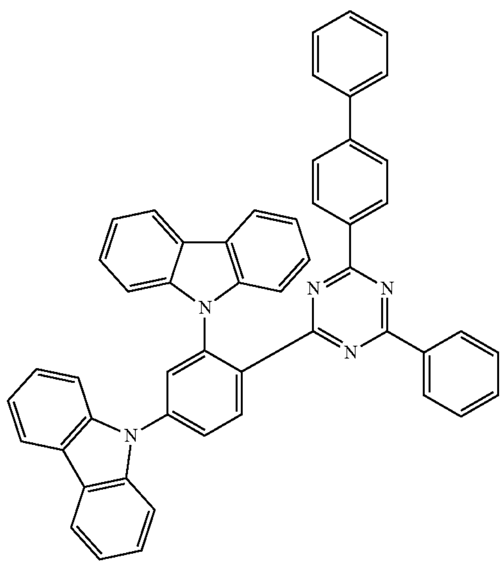
[1-37]
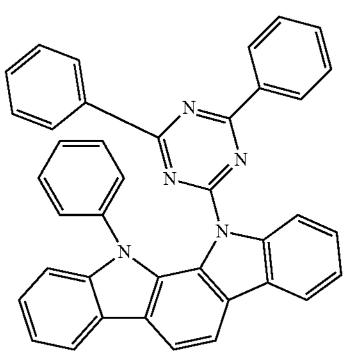
-continued
[1-38]
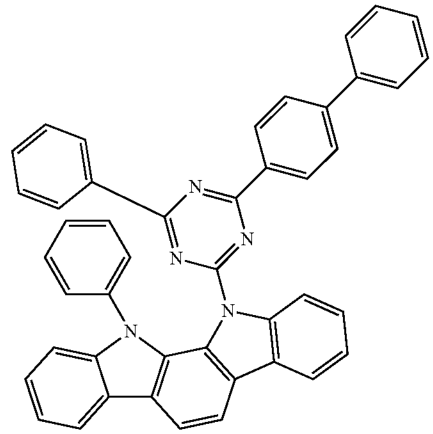
[1-39]
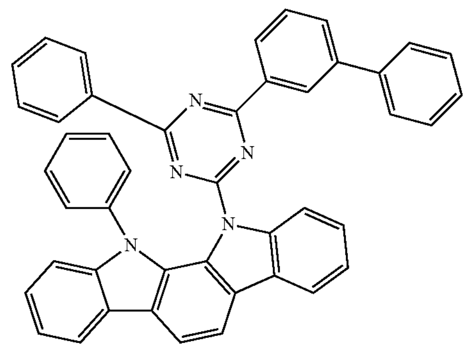
[1-40]
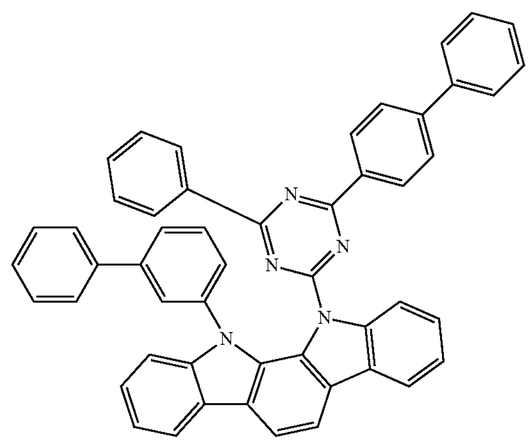
[1-41]
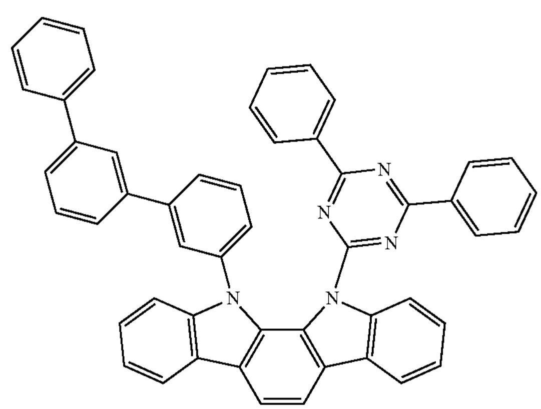

[1-42]
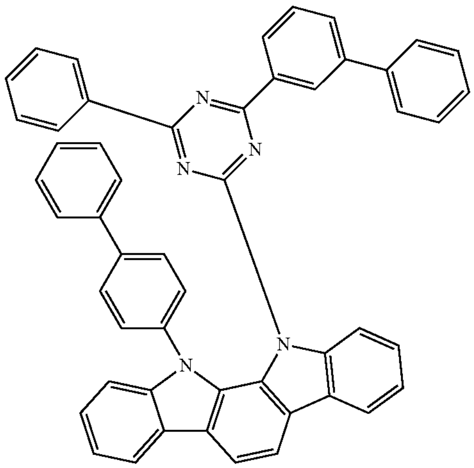
[1-43]
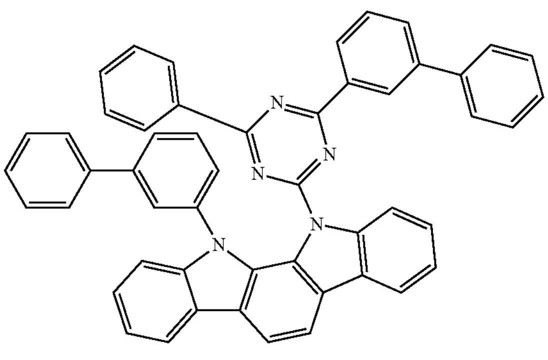
[1-44]
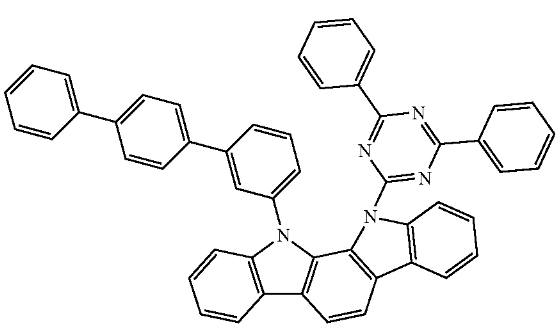
[1-45]
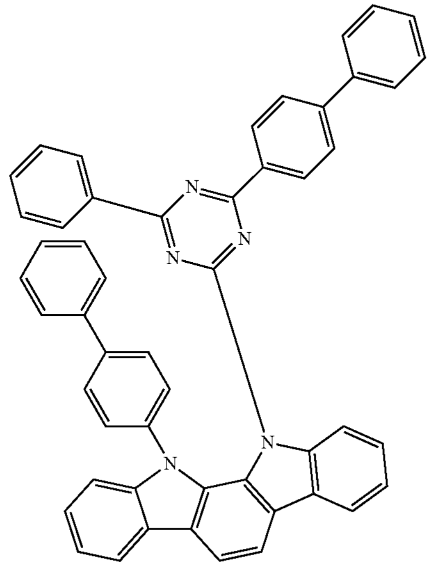
[1-46]
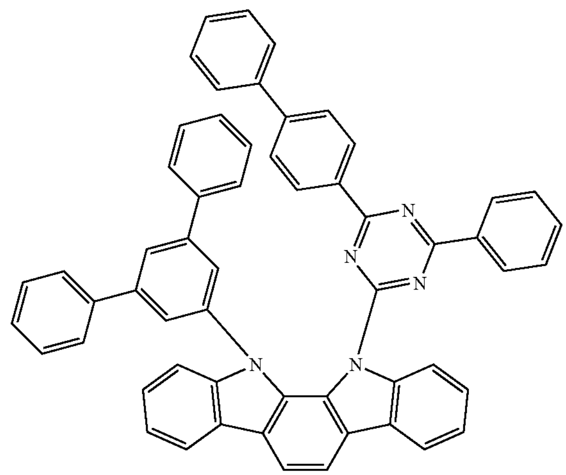
[1-47]
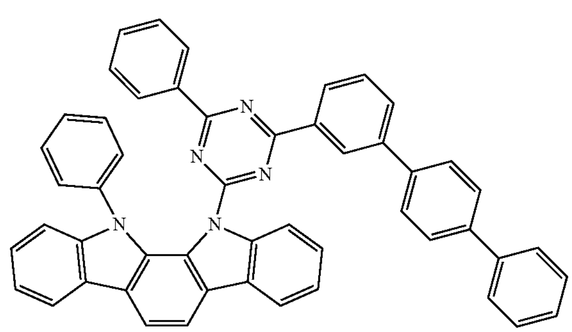

[1-48]
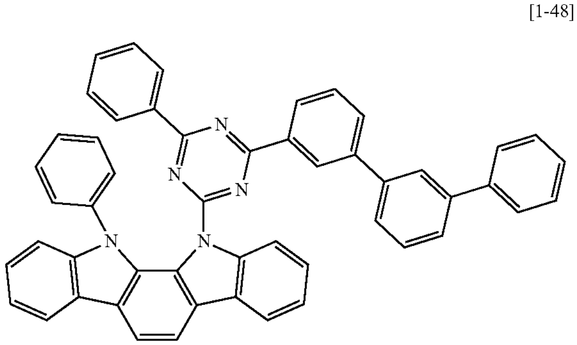
[1-49]
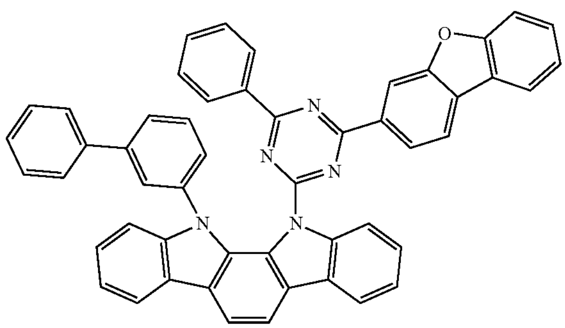
[1-50]
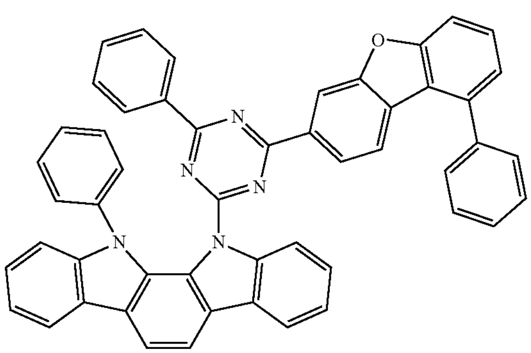
[1-51]
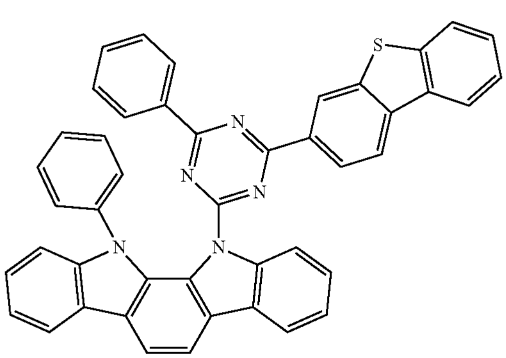
[1-52]
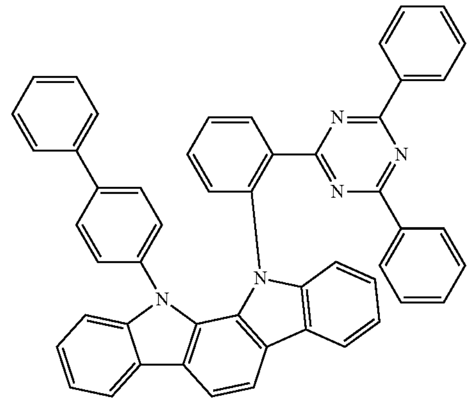
[1-53]
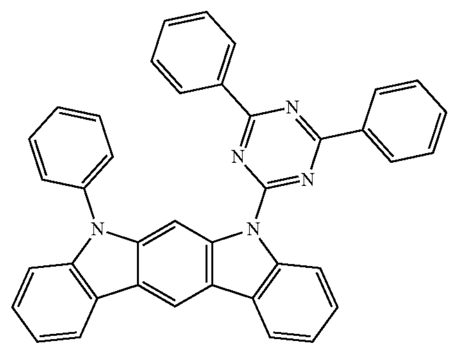
[1-54]
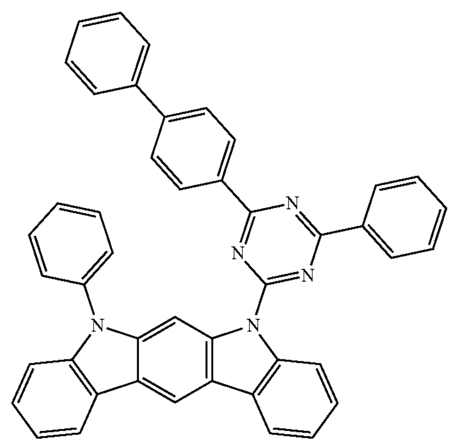
[1-55]
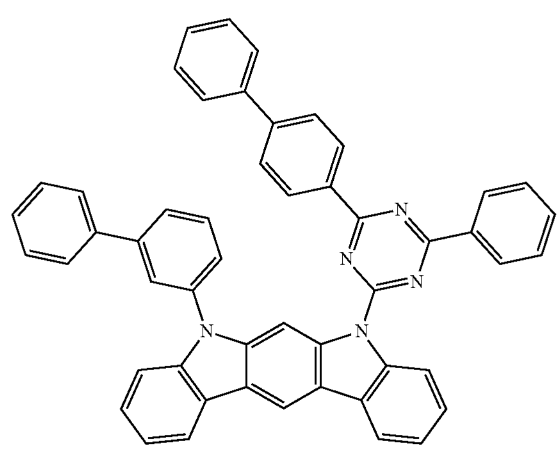

[1-56]
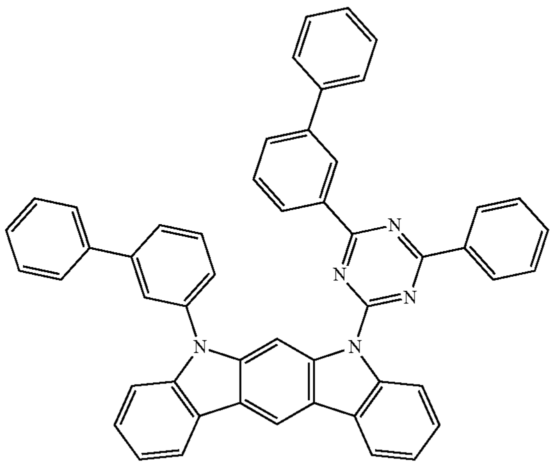
[1-57]
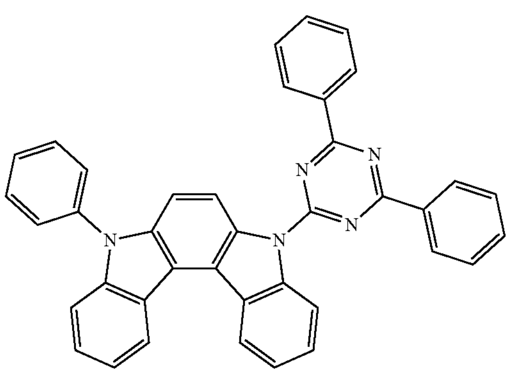
[1-58]
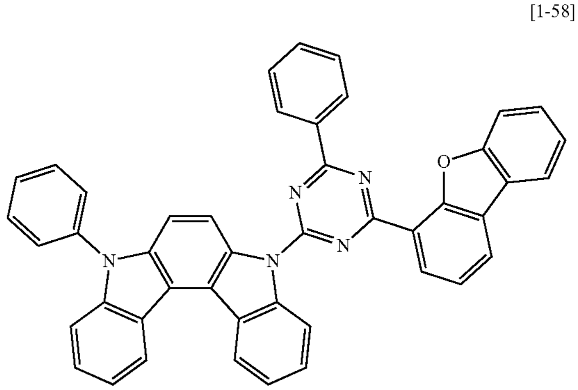
[1-59]
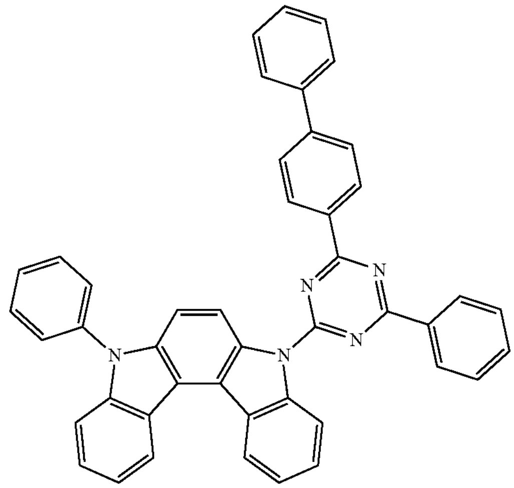
[1-60]
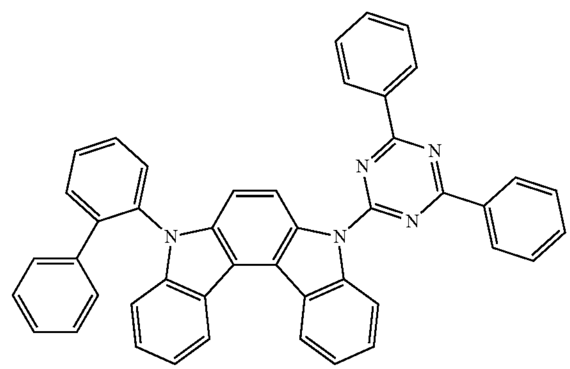
[1-61]
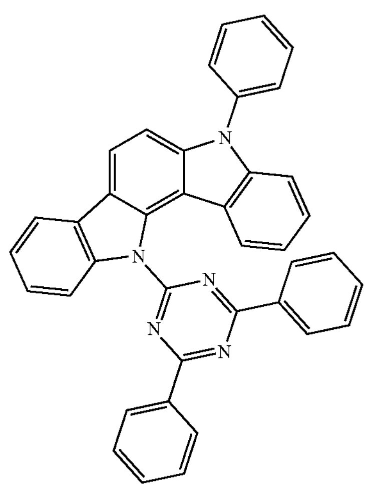

-continued
[1-62]
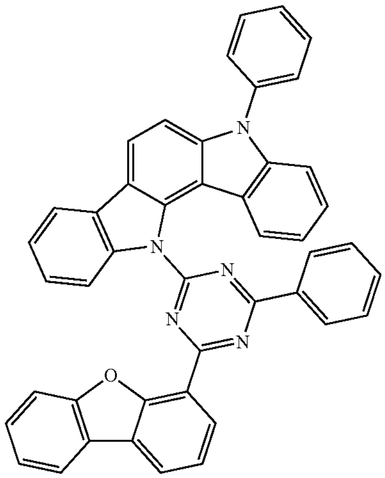
[1-63]
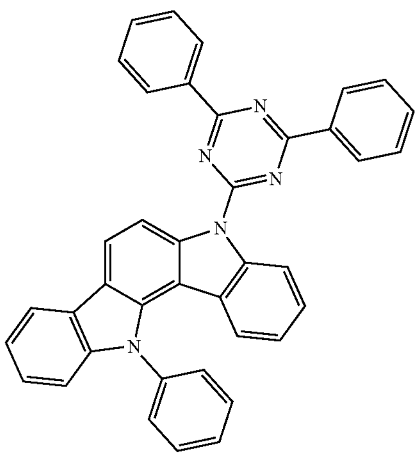
[1-64]
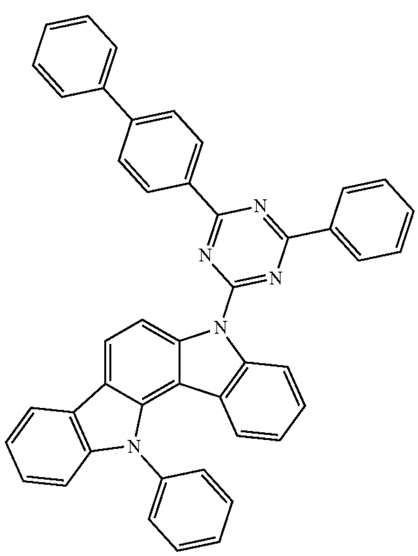
-continued
[1-65]
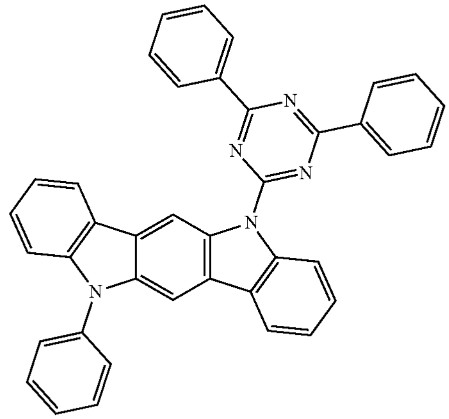
[1-66]
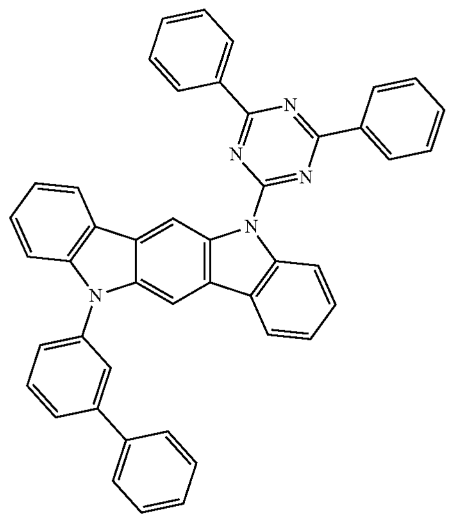
[1-67]
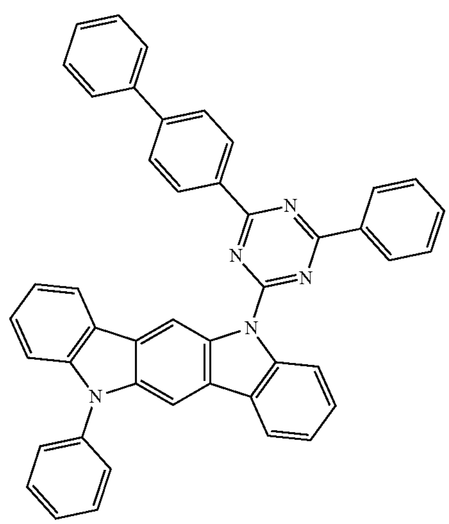

[1-68]
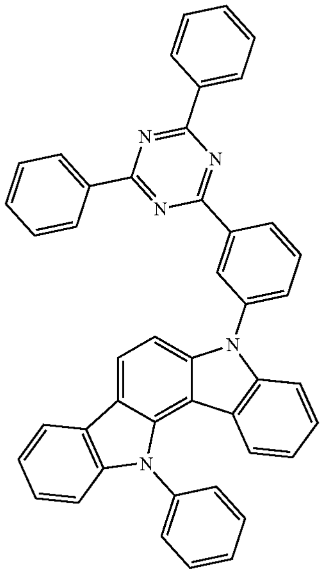
[1-69]
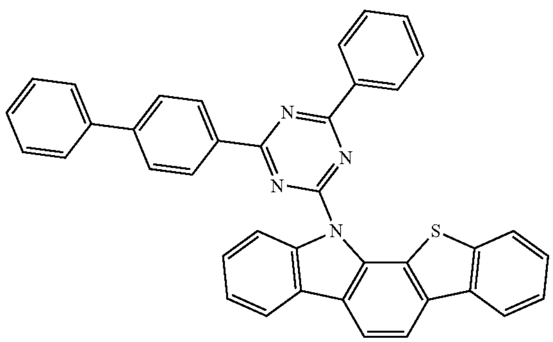
[1-70]
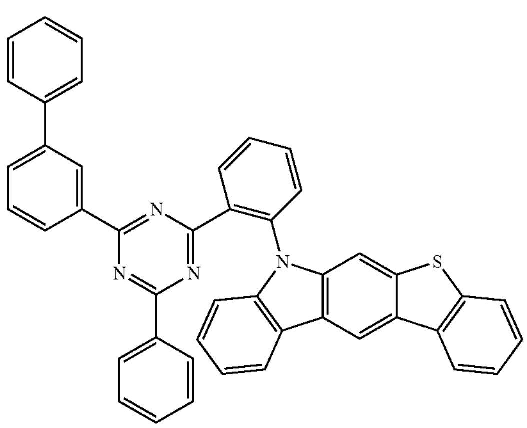
[1-71]
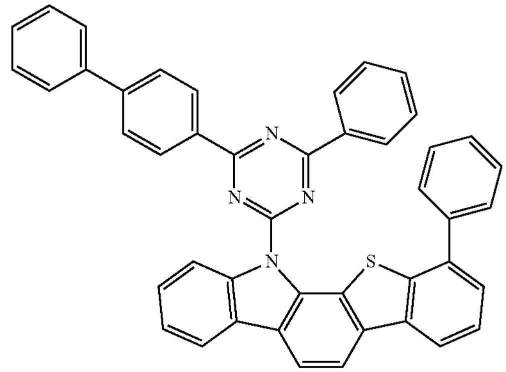
[1-72]
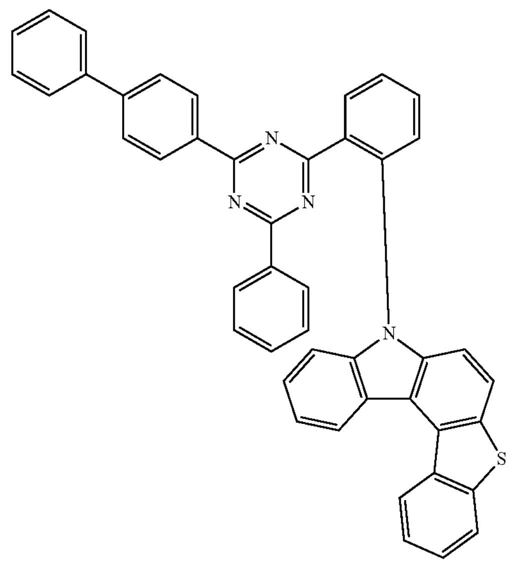
[1-73]
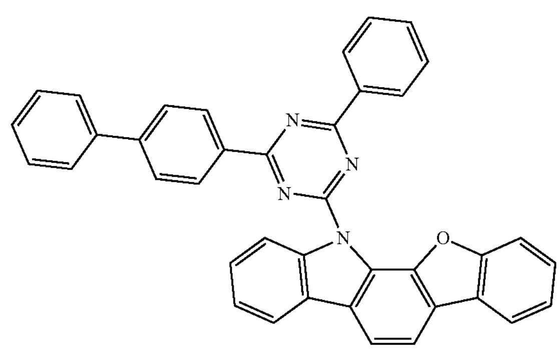

-continued
[1-74]
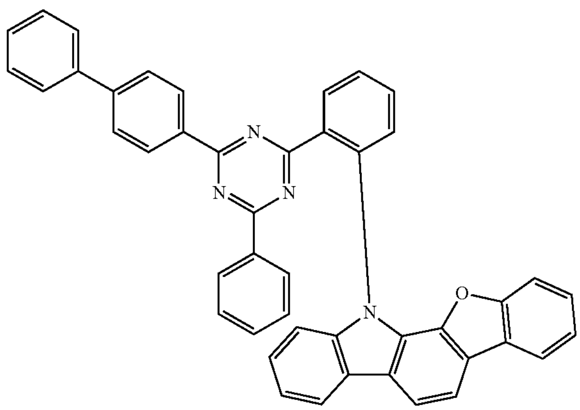
[1-75]
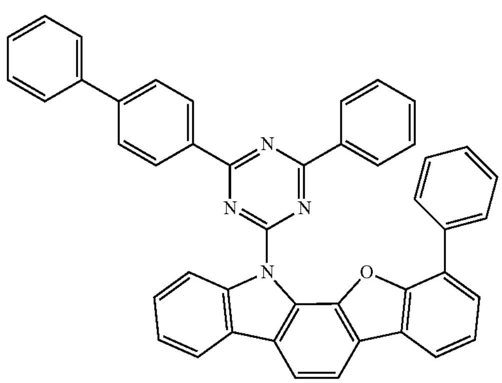
[1-76]
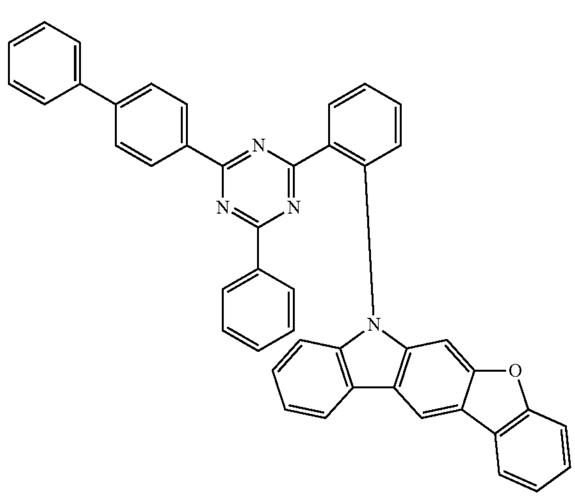
-continued
[1-77]
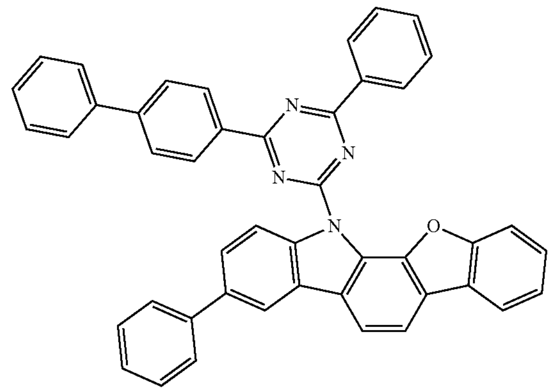
[1-78]
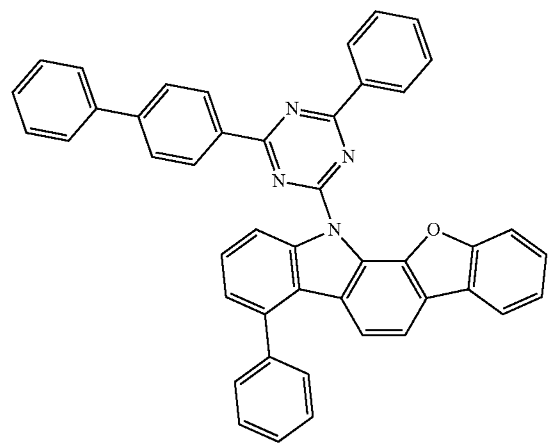
[1-79]
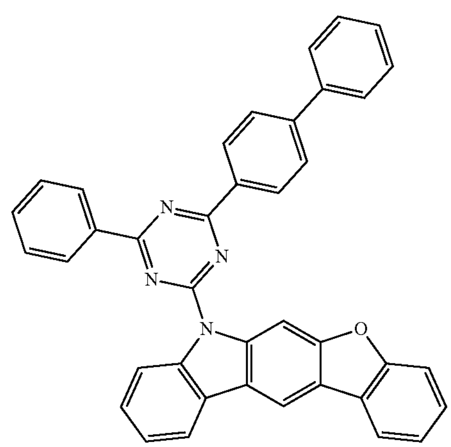

-continued

[1-80]

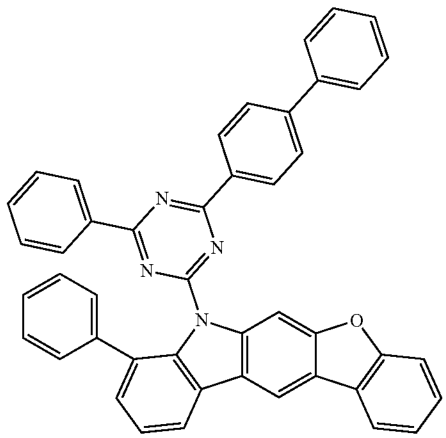

In an implementation, the second compound having the hole characteristics may include a structure in which a carbazole or carbazole derivative (e.g., carbazole moiety) is substituted with or bonded to a substituted or unsubstituted C6 to C30 aryl group, a substituted or unsubstituted dibenzofuranyl group, or a substituted or unsubstituted dibenzothiophenyl group. In an implementation, the second compound may be represented by Chemical Formula II.

[Chemical Formula II]

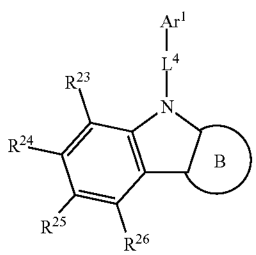

In Chemical Formula II, $L^4$ may be or include, e.g., a single bond, a substituted or unsubstituted C6 to C20 arylene group, a substituted or unsubstituted C2 to C20 heterocyclic group, or a combination thereof.

$Ar^1$ may be or include, e.g., a substituted or unsubstituted C6 to C30 aryl group, a substituted or unsubstituted dibenzofuranyl group, a substituted or unsubstituted dibenzothiophenyl group, or a combination thereof.

$R^{23}$ to $R^{26}$ may each independently be or include, e.g., hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof.

Ring B may be, e.g., represented by one of Substituent B-1 to Substituent B-4.

[Substituent B-1]

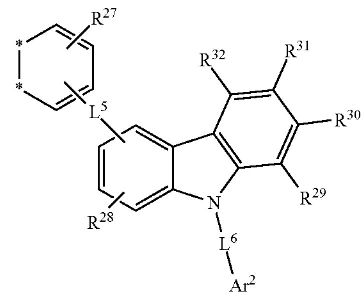

[Substituent B-2]

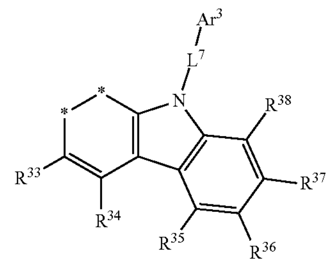

[Substituent B-3]

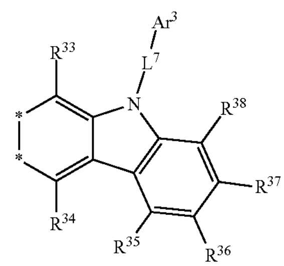

[Substituent B-4]

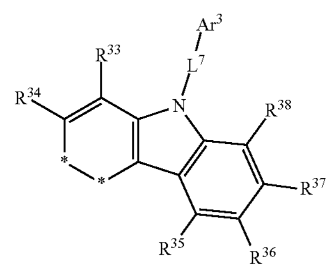

In Substituent B-1 to Substituent B-4, $L^5$ to $L^7$ may each independently be or include, e.g., a single bond, a substituted or unsubstituted C6 to C20 arylene group, a substituted or unsubstituted C2 to C20 heterocyclic group, or a combination thereof.

$Ar^2$ and $Ar^3$ may each independently be or include, e.g., a substituted or unsubstituted C6 to C30 aryl group, a substituted or unsubstituted dibenzofuranyl group, a substituted or unsubstituted dibenzothiophenyl group, or a combination thereof, $R^{27}$ to $R^{38}$ may each independently be or include, e.g., hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof.

* is a linking carbon. In an implementation, the linking carbon may be $sp^2$ linking carbon, such that the ring fused to the nitrogen-containing 5-membered ring of Chemical Formula II is an aromatic ring.

In an implementation, $L^4$ of Chemical Formula II may be, e.g., a single bond or a C6 to C12 arylene group.

In an implementation, $L^4$ in Chemical Formula II may be, e.g., a single bond or a substituted or unsubstituted phenyl group.

$Ar^1$ in Chemical Formula II may be, e.g., a substituted or unsubstituted phenyl group, a substituted or unsubstituted biphenyl group, a substituted or unsubstituted terphenyl group, a substituted or unsubstituted naphthyl group, a substituted or unsubstituted phenanthrene group, a substituted or unsubstituted triphenylene group, a substituted or unsubstituted fluorenyl group, a substituted or unsubstituted carbazolyl group, a substituted or unsubstituted dibenzofuranyl group, or a substituted or unsubstituted dibenzothiophenyl group.

In an implementation, $Ar^1$ in Chemical Formula II may be, e.g., a substituted or unsubstituted phenyl group, or a substituted or unsubstituted biphenyl group.

In an implementation, Chemical Formula II may be represented by one of Chemical Formula IIA to Chemical Formula IIF, e.g., depending on the specific structures of carbazole and carbazole derivatives.

[Chemical Formula IIA]

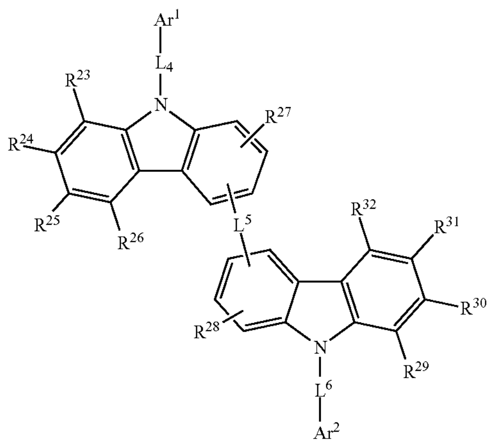

[Chemical Formula IIB]

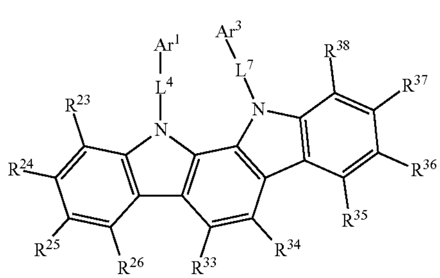

-continued

[Chemical Formula IIC]

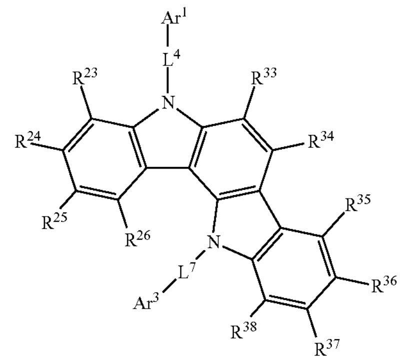

[Chemical Formula IID]

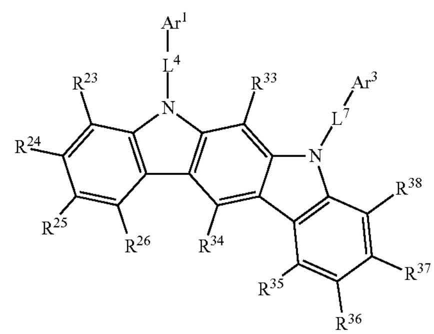

[Chemical Formula IIE]

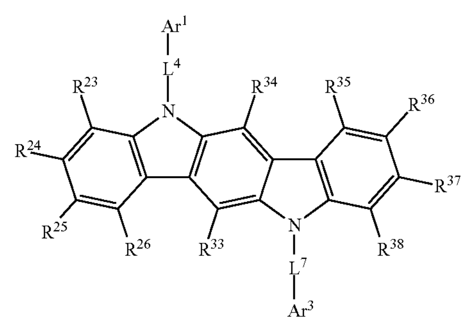

[Chemical Formula IIF]

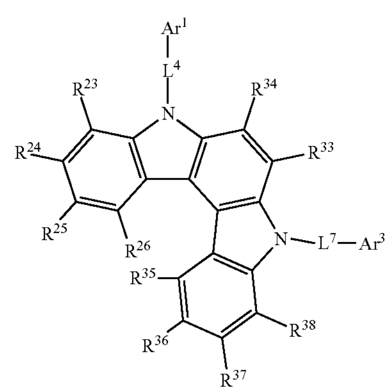

In Chemical Formula IIA to Chemical Formula IIF, $L^4$ to $L^7$, $Ar^1$ to $Ar^3$, and $R^{23}$ to $R^{38}$ may be defined the same as those described above.

In an implementation, $R^{23}$ to $R^{32}$ in Chemical Formula IIA may each independently be, e.g., hydrogen, deuterium, a cyano group, a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group.

In an implementation, $L^4$ to $L^6$ in Chemical Formula IIA may each independently be, e.g., a single bond, a substituted or unsubstituted phenylene group, a substituted or unsubstituted biphenylene group, a substituted or unsubstituted naphthylene group, a substituted or unsubstituted dibenzofuranylene group, or a substituted or unsubstituted dibenzothiophenylene group.

In an implementation, $L^5$ in Chemical Formula IIA may be, e.g., a single bond or a substituted or unsubstituted phenylene group.

In an implementation, $Ar^1$ and $Ar^2$ in Chemical Formula IIA may each independently be, e.g., a substituted or unsubstituted phenyl group, a substituted or unsubstituted biphenyl group, a substituted or unsubstituted terphenyl group, a substituted or unsubstituted naphthyl group, a substituted or unsubstituted phenanthrene group, a substituted or unsubstituted triphenylene group, a substituted or unsubstituted fluorenyl group, a substituted or unsubstituted dibenzofuranyl group, or a substituted or unsubstituted dibenzothiophenyl group.

In an implementation, when $Ar^1$ and $Ar^2$ are substituted, the substituent may be, e.g., a phenyl group or a cyano group.

In an implementation, $R^{23}$ to $R^{26}$ and $R^{33}$ to $R^{38}$ in Chemical Formula IIB to Chemical Formula IIF may each independently be, e.g., hydrogen, deuterium, a cyano group, a substituted or unsubstituted phenyl group, a substituted or unsubstituted biphenyl group, a substituted or unsubstituted carbazolyl group, or a substituted or unsubstituted triphenylene group.

In an implementation, when $R^{23}$ to $R^{26}$ and $R^{33}$ to $R^{38}$ are substituted, the substituent may be, e.g., a phenyl group or a carbazolyl group.

In an implementation, $L^4$ and $L^7$ in Chemical Formula IIB to Chemical Formula IIF may each independently be, e.g., a single bond, a substituted or unsubstituted phenylene group, a substituted or unsubstituted biphenylene group, or a substituted or unsubstituted carbazolylene group.

In an implementation, $Ar^1$ and $Ar^3$ in Chemical Formula IIB to Chemical Formula IIF may each independently be, e.g., a substituted or unsubstituted phenyl group, a substituted or unsubstituted biphenyl group, a substituted or unsubstituted terphenyl group, a substituted or unsubstituted triphenylene group, a substituted or unsubstituted carbazolyl group, a substituted or unsubstituted dibenzofuranyl group, or a substituted or unsubstituted dibenzothiophenyl group.

In an implementation, when $Ar^1$ and $Ar^3$ are substituted, the substituent may be, e.g., a phenyl group, a cyano group, or carbazolyl group.

In an implementation, each of $R^{23}$ to $R^{32}$ in Chemical Formula IIA may be hydrogen.

In an implementation, $L^4$ to $L^6$ in Chemical Formula IIA may each independently be, e.g., a single bond or a substituted or unsubstituted phenylene group.

In an implementation, $Ar^1$ and $Ar^2$ in Chemical Formula IIA may each independently be, e.g., a substituted or unsubstituted phenyl group or a substituted or unsubstituted biphenyl group.

In an implementation, $R^{23}$ to $R^{26}$ and $R^{33}$ to $R^{38}$ in Chemical Formula IIB to Chemical Formula IIF may each be hydrogen.

In an implementation, $L^4$ and $L^7$ in Chemical Formula IIB to Chemical Formula IIF may each independently be, e.g., a single bond or a substituted or unsubstituted phenylene group.

In an implementation, $Ar^1$ and $Ar^3$ in Chemical Formula IIB to Chemical Formula IIF may each independently be, e.g., a substituted or unsubstituted phenyl group or a substituted or unsubstituted biphenyl group.

In an implementation, the second compound may be represented by Chemical Formula IIA or Chemical Formula IIF.

In an implementation, Chemical Formula IIA may be represented by one of Chemical Formula IIA-1 to Chemical Formula IIA-3.

[Chemical Formula IIA-1]

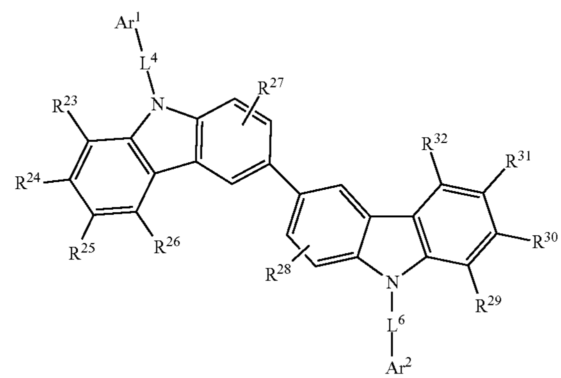

[Chemical Formula IIA-2]

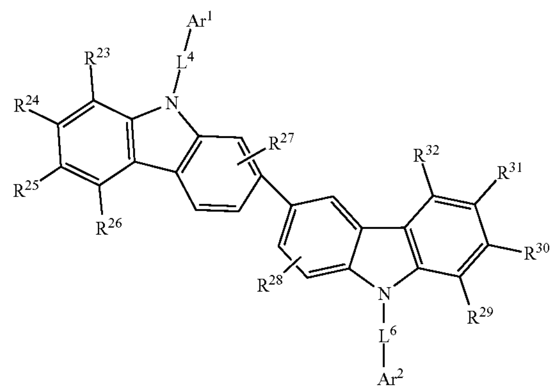

[Chemical Formula IIA-3]

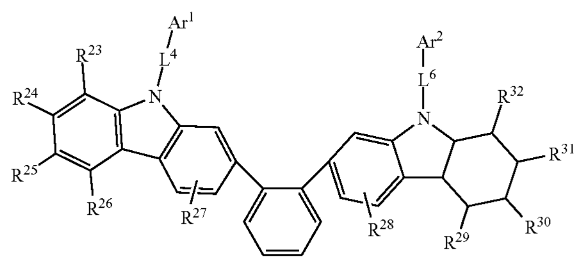

In Chemical Formula IIA-1 to Chemical Formula IIA-3, each of the linking groups and substituents (e.g., L, R, and Ar) may be defined the same as those described above.

In an implementation, the second compound may be represented by Chemical Formula IIA-1, Chemical Formula IIA-2, or Chemical Formula IIF.

In an implementation, the second compound may be, e.g., a compound of Group 2.

[Group 2]
[2-1]
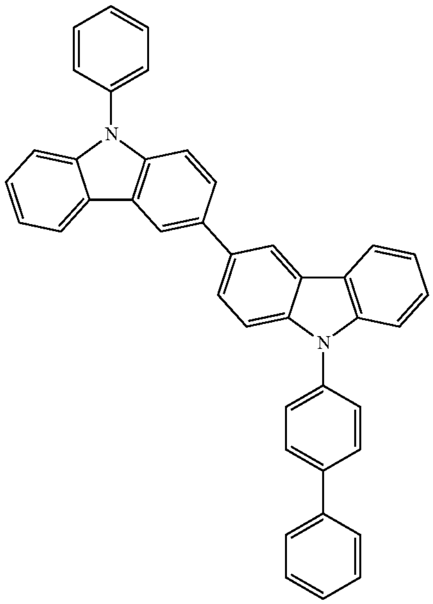
[2-2]
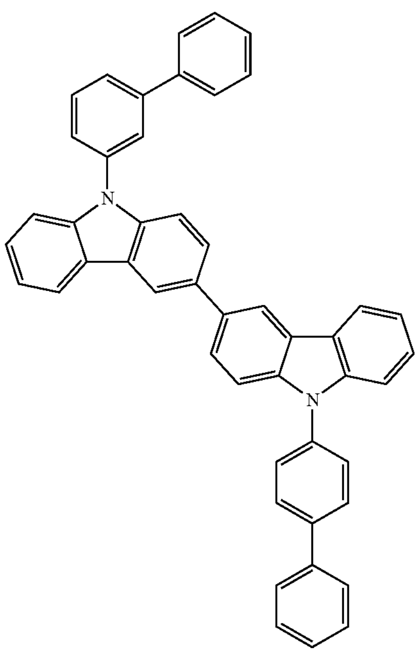
-continued
[2-3]
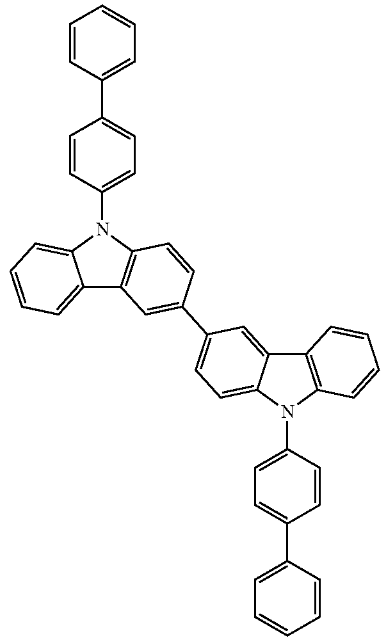
[2-4]
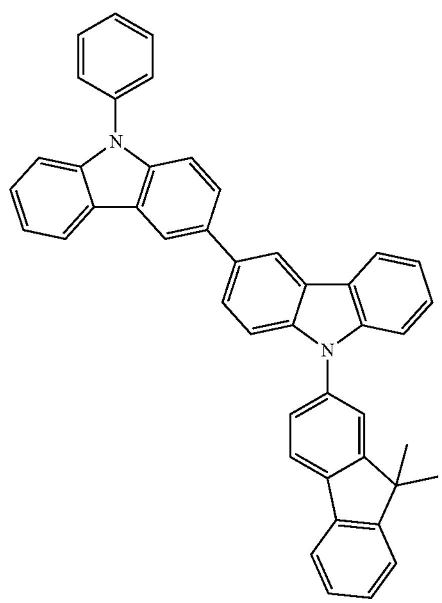

[2-5]
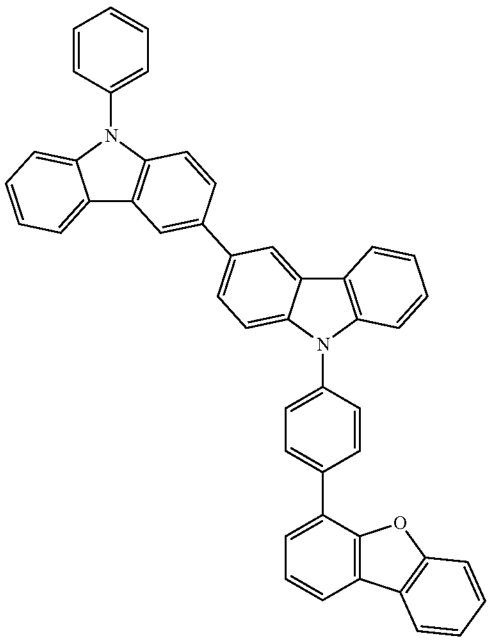
[2-6]
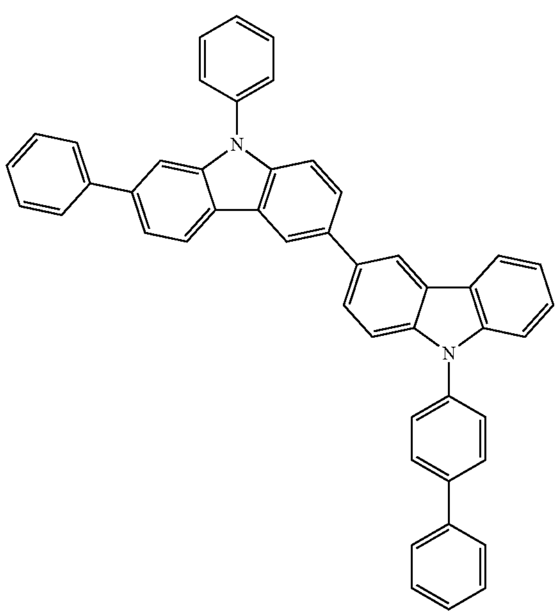
[2-7]
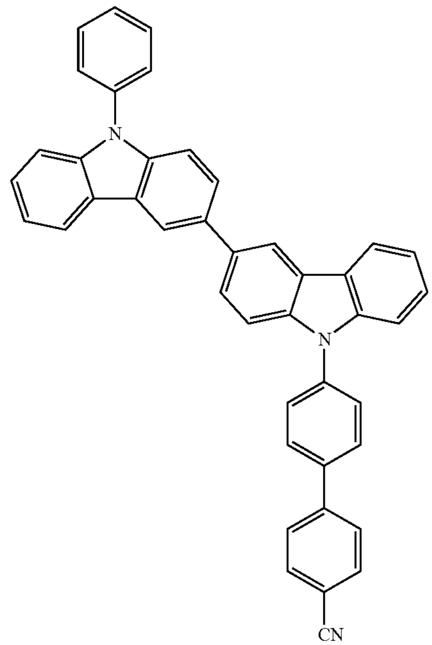
[2-8]
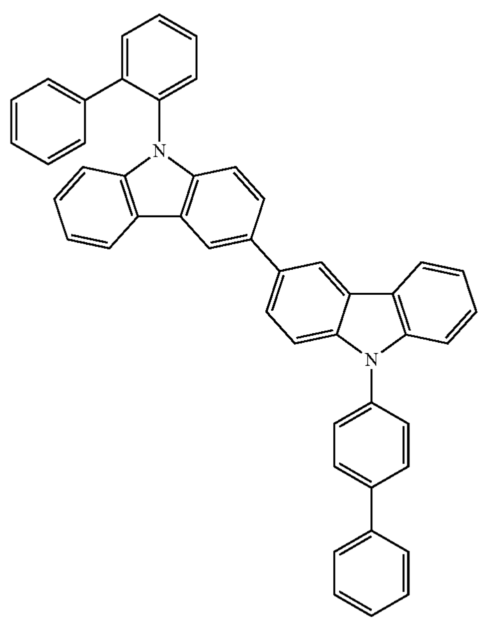

-continued
[2-9]
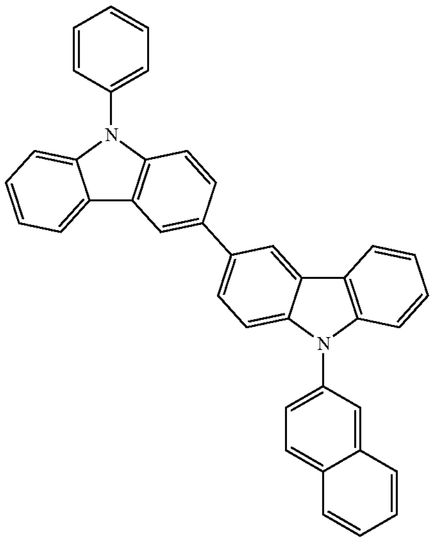
[2-10]
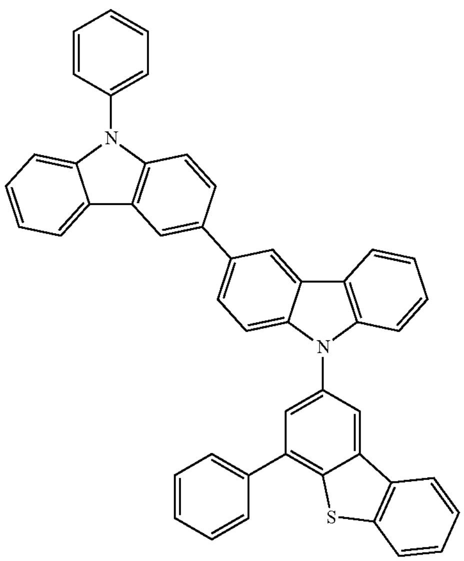
[2-11]
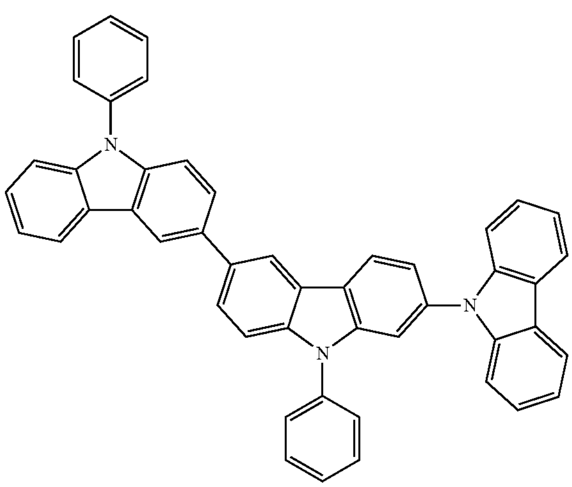
-continued
[2-12]
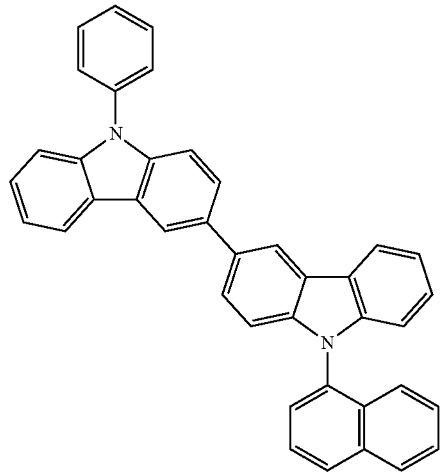
[2-13]
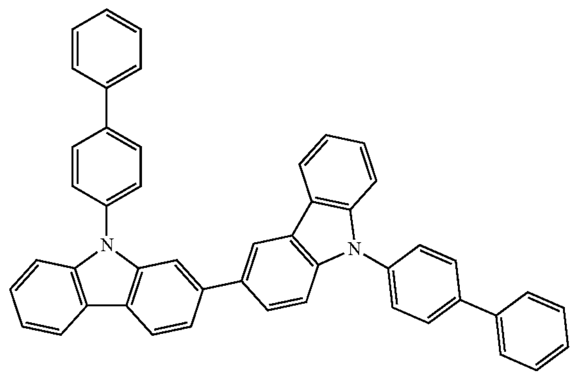
[2-14]
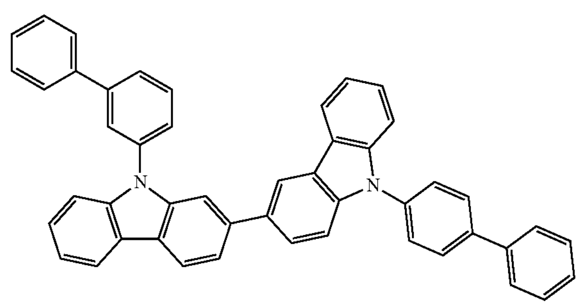

-continued
[2-15]
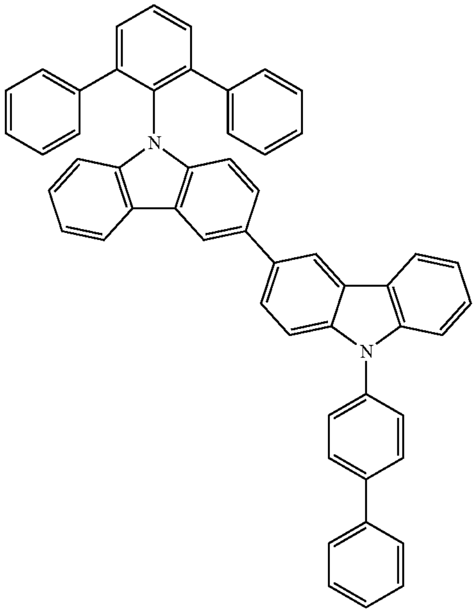
[2-16]
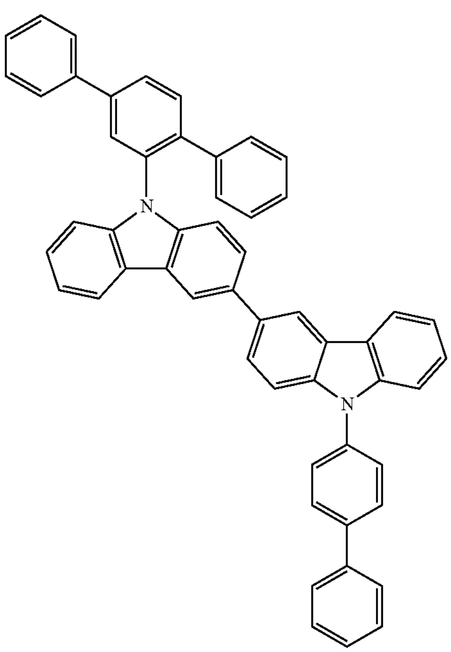
-continued
[2-17]
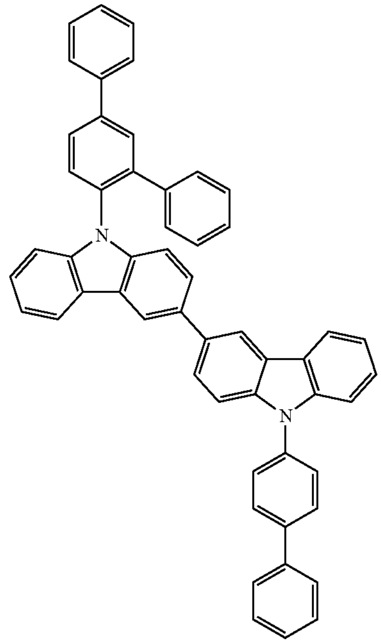
[2-18]
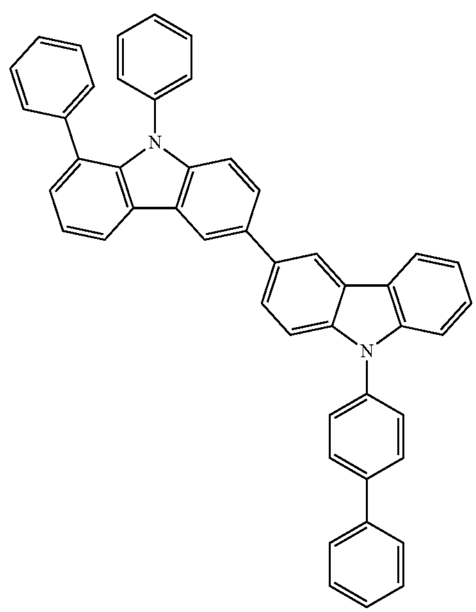

-continued
[2-19]
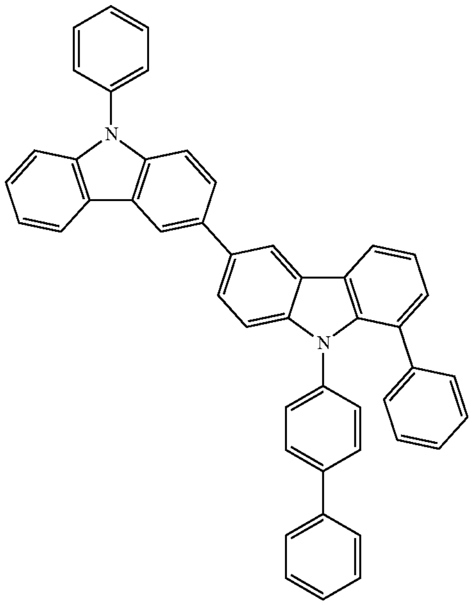
[2-20]
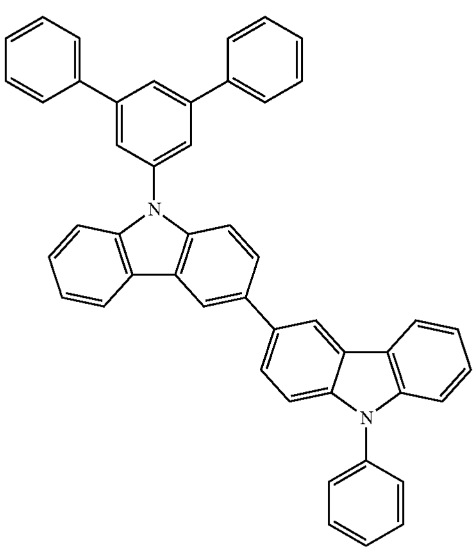
-continued
[2-21]
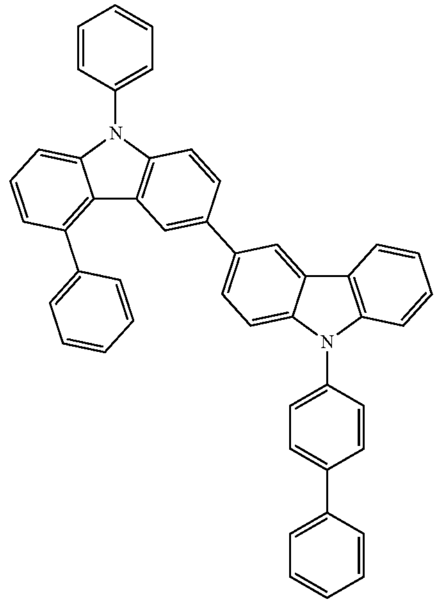
[2-22]
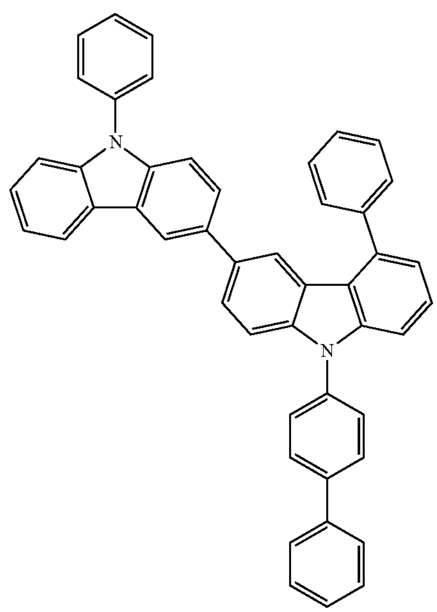

-continued
[2-23]
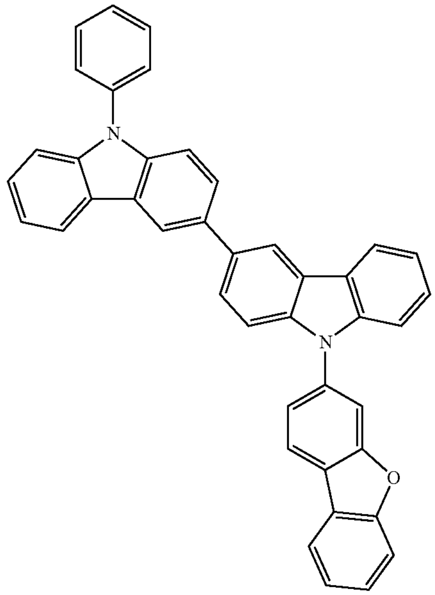
-continued
[2-25]
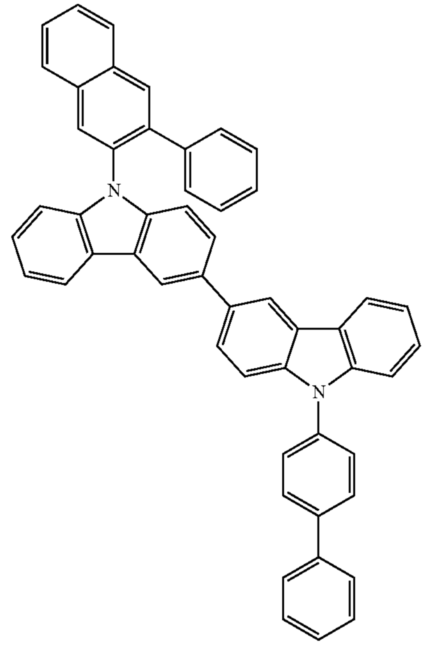
[2-24]
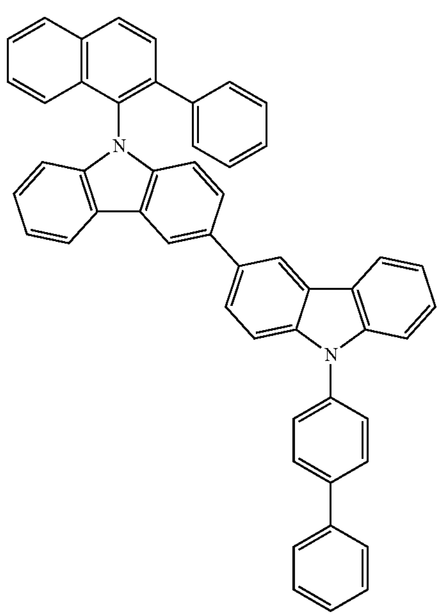
[2-26]
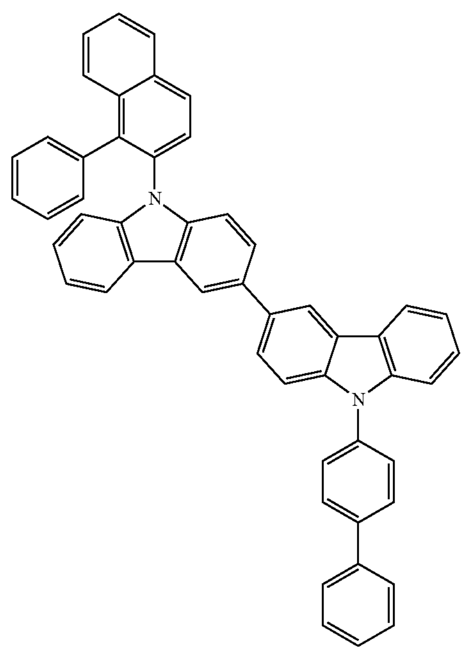

-continued
[2-27]
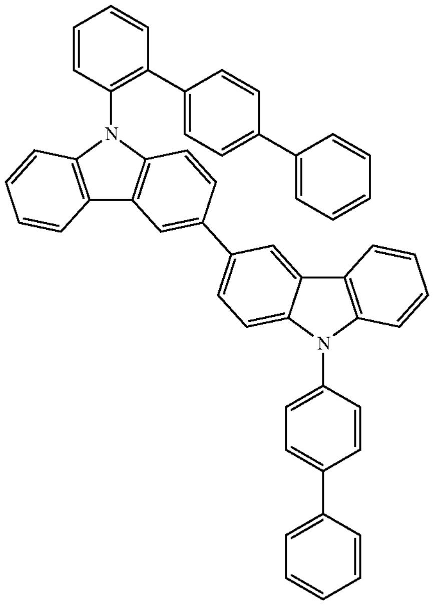
[2-28]
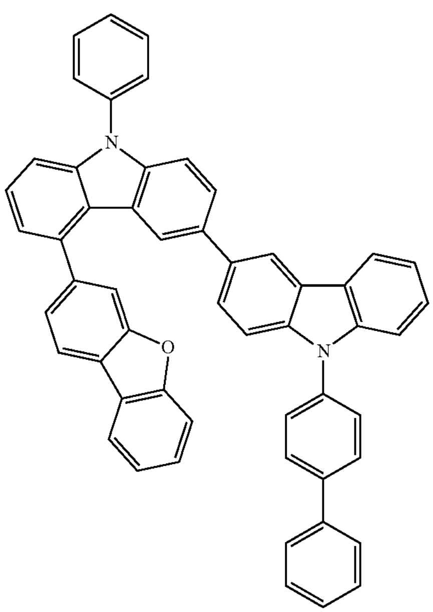
-continued
[2-29]
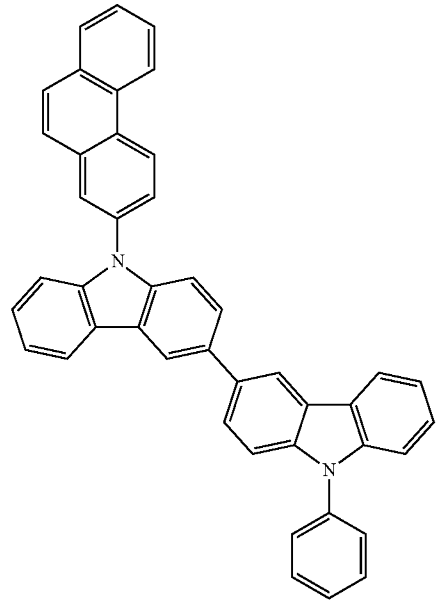
[2-30]
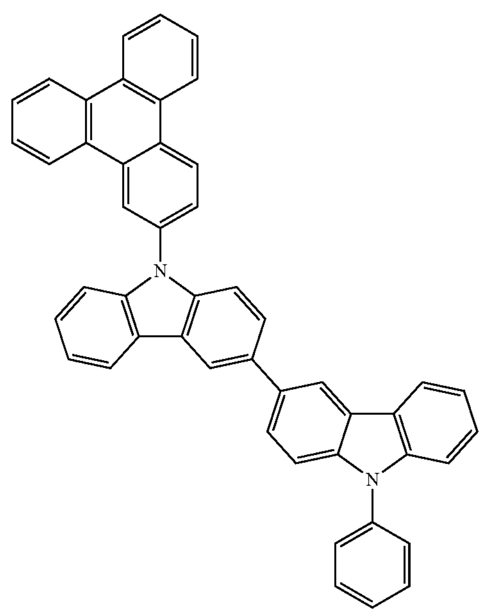

-continued
[2-31]
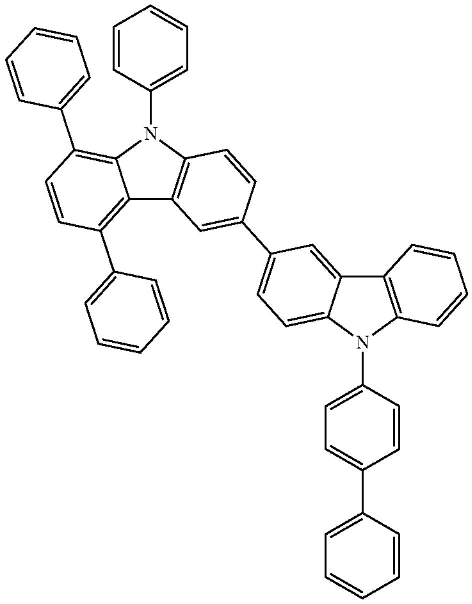
[2-32]
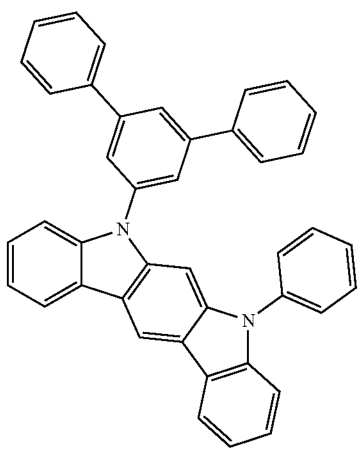
[2-33]
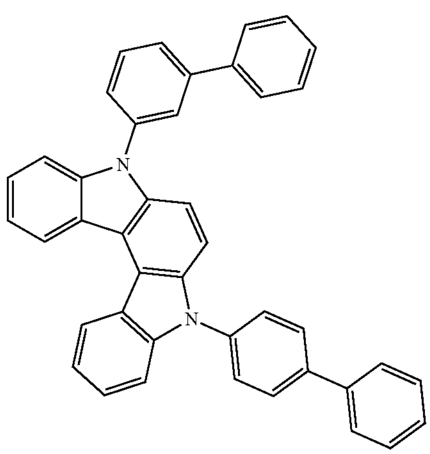
-continued
[2-34]
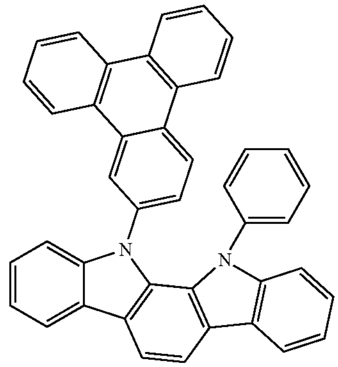
[2-35]
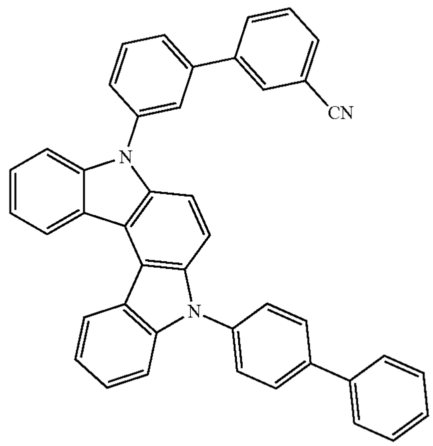
[2-36]
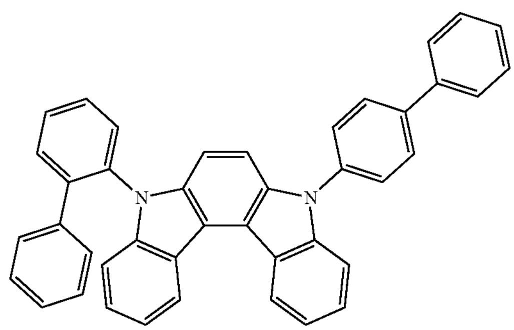
[2-37]
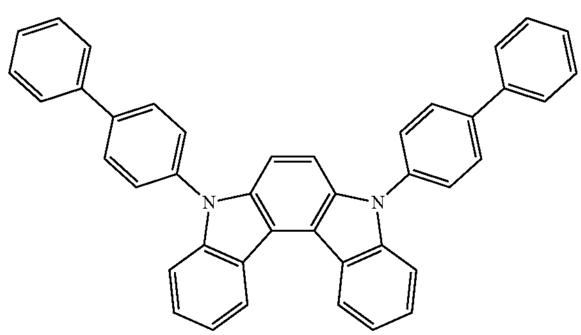

-continued
[2-38]
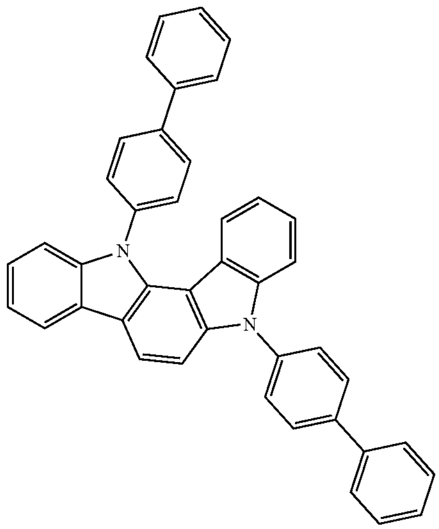
[2-39]
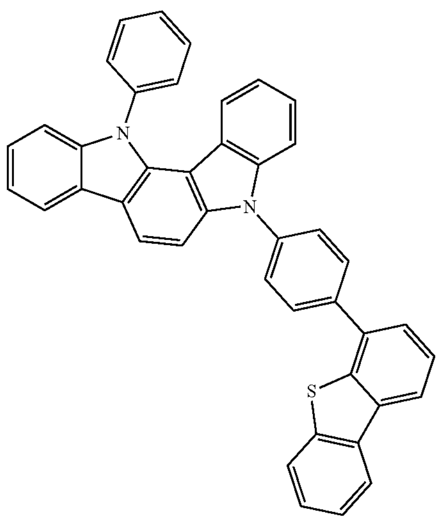
[2-40]
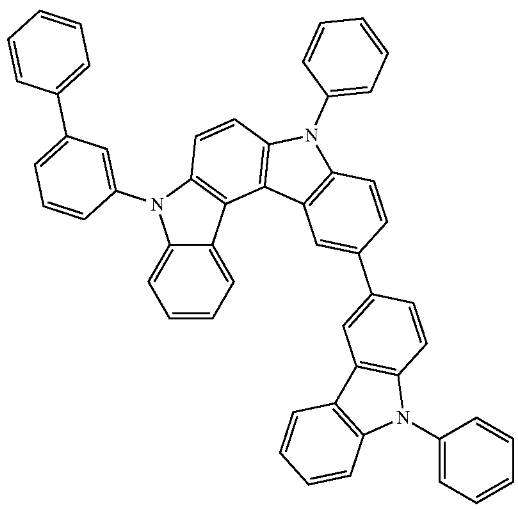
-continued
[2-41]
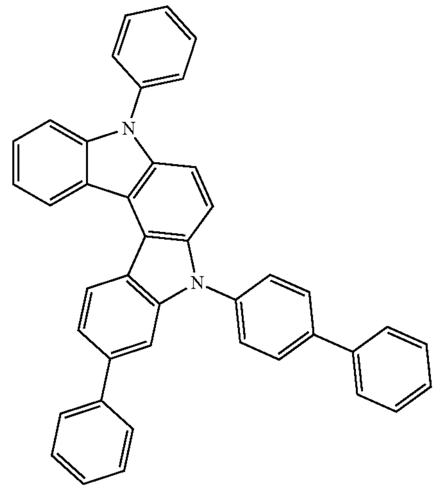
[2-42]
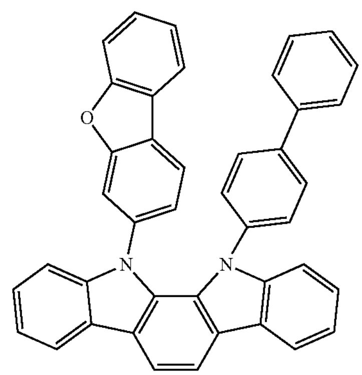
[2-43]
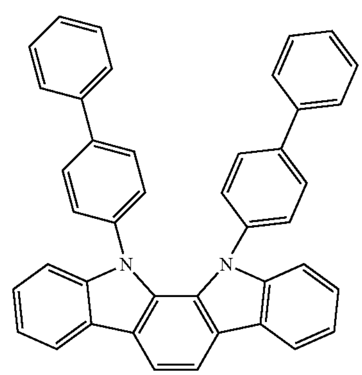

-continued
[2-44]
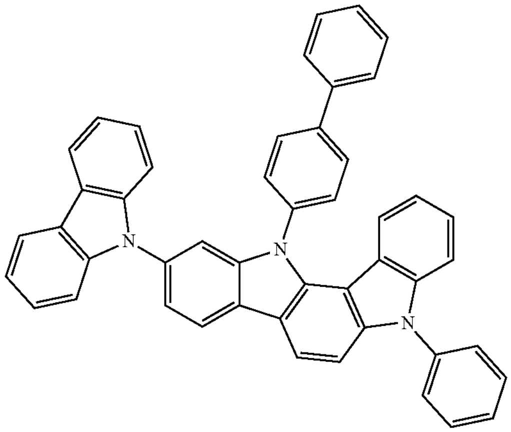
[2-45]
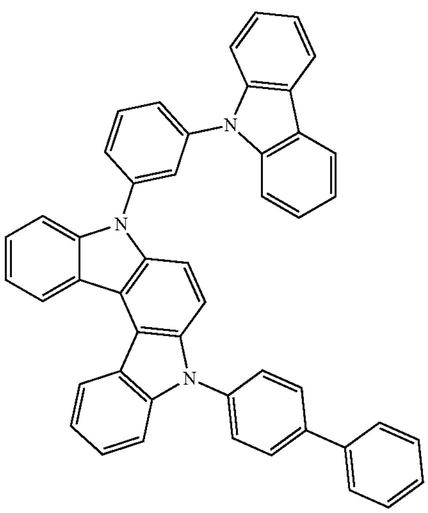
[2-46]
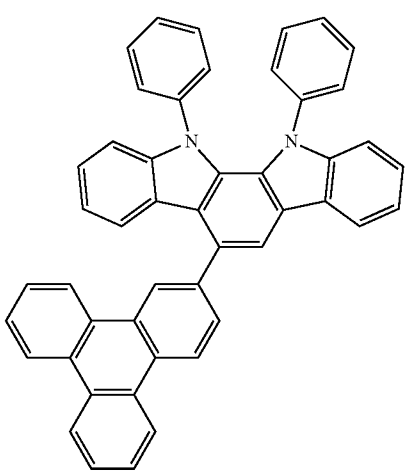
-continued
[2-47]
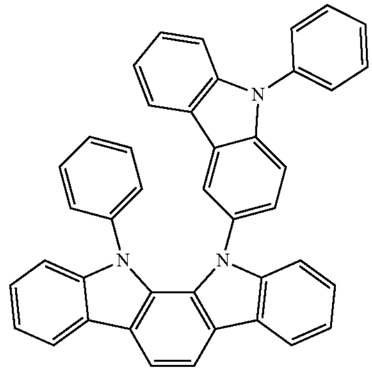
[2-48]
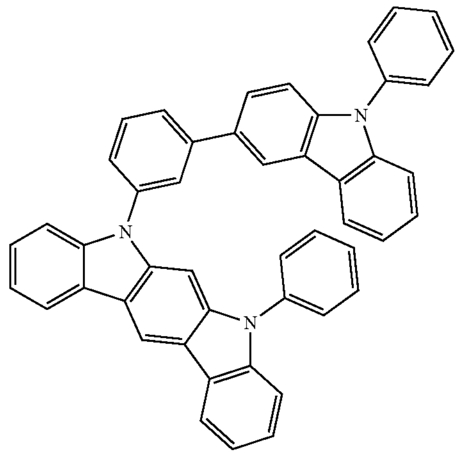
[2-49]
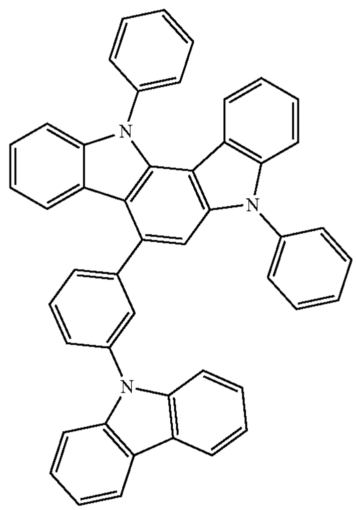
[2-50]
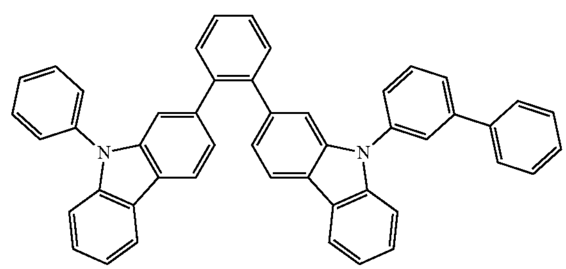

In an implementation, the third compound having the buffer characteristics may have a structure in which at least two dibenzofuran or at least two dibenzothiophenes are linked. In an implementation, the third compound may be, e.g., represented by Chemical Formula III.

[Chemical Formula III]

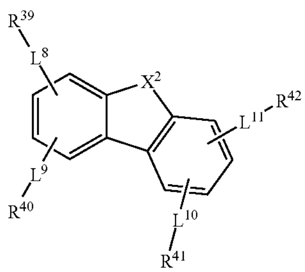

In Chemical Formula III, $X^2$ may be, e.g., O or S.

$L^1$ to $L^{11}$ may each independently be or include, e.g., a single bond, or a substituted or unsubstituted C6 to C20 arylene group.

$R^{39}$ to $R^{42}$ may each independently be or include, e.g., hydrogen, deuterium, a substituted or unsubstituted C1 to C30 alkyl group, a substituted or unsubstituted C6 to C30 aryl group, a substituted or unsubstituted dibenzofuranyl group, or a substituted or unsubstituted dibenzothiophenyl group.

In an implementation, at least one of $R^{39}$ to $R^{42}$ may be, e.g., a substituted or unsubstituted dibenzofuranyl group or a substituted or unsubstituted dibenzothiophenyl group.

In an implementation, the third compound may be represented by, e.g., Chemical Formula IIIA or Chemical Formula IIIB, depending on the number of dibenzofuranyl groups or dibenzothiophenyl groups substituted for $R^{39}$ to $R^{42}$.

[Chemical Formula IIIA]

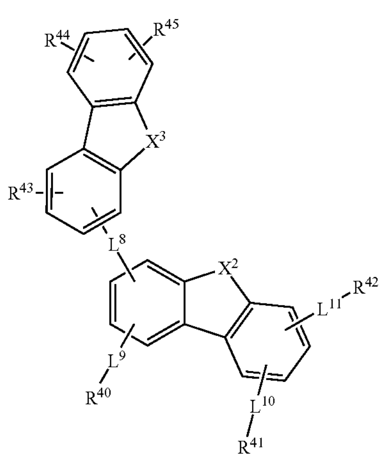

-continued

[Chemical Formula IIIB]

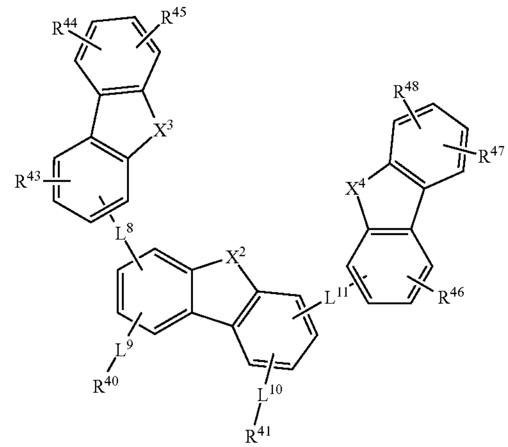

In Chemical Formula IIIA and Chemical Formula IIIB, $X^2$, $L^8$ to $L^{11}$, and $R^{40}$ to $R^{42}$ may be defined the same as those described above.

$X^3$ and $X^4$ may each independently be, e.g., O or S.

$R^{43}$ to $R^{48}$ may each independently be, e.g., hydrogen, deuterium, a substituted or unsubstituted C1 to C30 alkyl group, or a substituted or unsubstituted C6 to C30 aryl group.

In an implementation, $R^{43}$ to $R^{45}$ in Chemical Formula IIIA may each independently be, e.g., hydrogen, deuterium, or a substituted or unsubstituted C6 to C18 aryl group.

In an implementation, $R^{43}$ to $R^{48}$ in Chemical Formula IIIB may each independently be, e.g., hydrogen, deuterium, or a substituted or unsubstituted C6 to C18 aryl group.

In an implementation, Chemical Formula IIIA may be represented by, e.g., one of Chemical Formula IIIA-1 to Chemical Formula IIIA-4, depending on the substitution point at which dibenzofuran or dibenzothiophene is substituted.

[Chemical Formula IIIA-1]

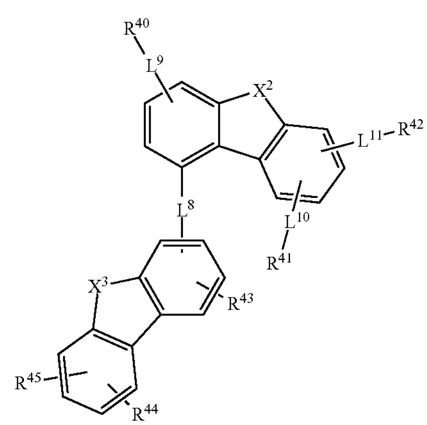

-continued

[Chemical Formula IIIA-2]

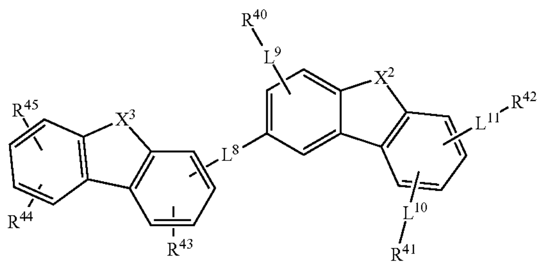

[Chemical Formula IIIA-3]

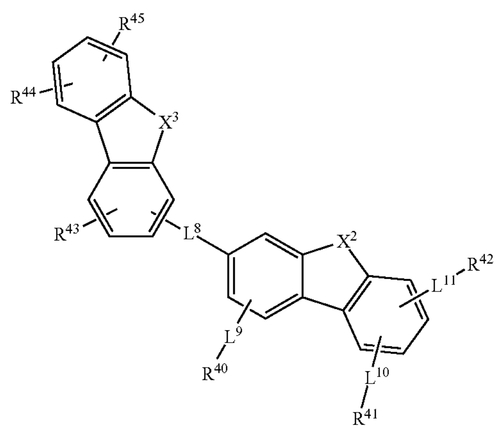

[Chemical Formula IIIA-4]

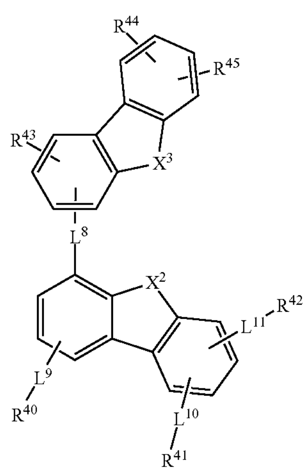

In Chemical Formula IIIA-1 to Chemical Formula IIIA-4, $X^2$, $X^3$, $R^{40}$ to $R^{45}$, and $L^8$ to $L^{11}$ may be defined the same as those described above.

In an implementation, Chemical Formula IIIA-1 may be represented by, e.g., one of Chemical Formula IIIA-1-1 to Chemical Formula IIIA-1-4, depending on a specific position at which dibenzofuran or dibenzothiophene is substituted.

[Chemical Formula IIIA-1-1]

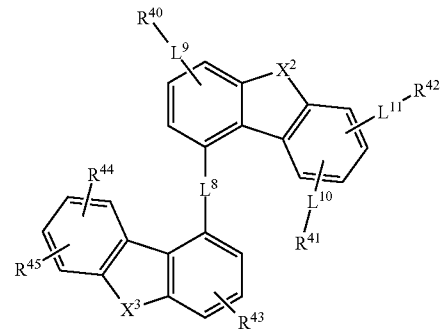

[Chemical Formula IIIA-1-2]

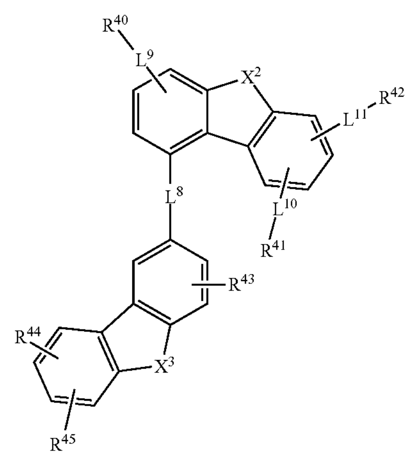

[Chemical Formula IIIA-1-3]

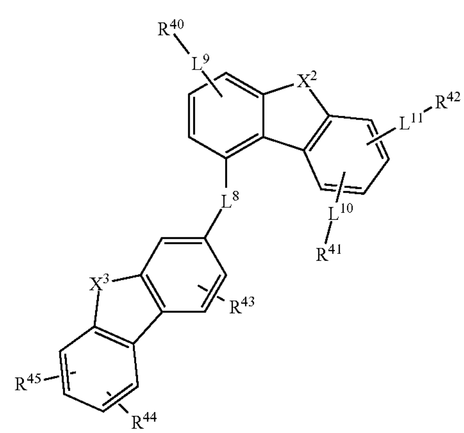

-continued

[Chemical Formula IIIA-1-4]

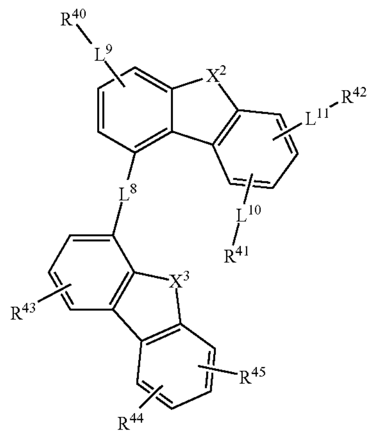

In an implementation, Chemical Formula IIIA-2 may be represented by, e.g., one of Chemical Formula IIIA-2-1 to Chemical Formula IIIA-2-4, depending on a specific position at which dibenzofuran or dibenzothiophene is substituted.

[Chemical Formula IIIA-2-1]

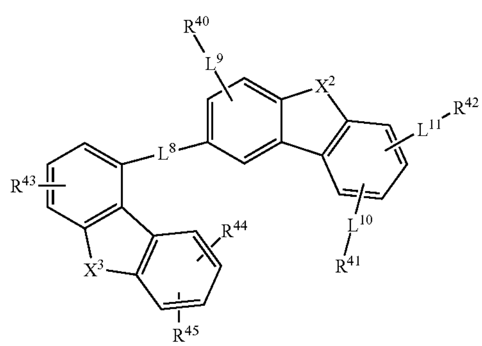

[Chemical Formula IIIA-2-2]

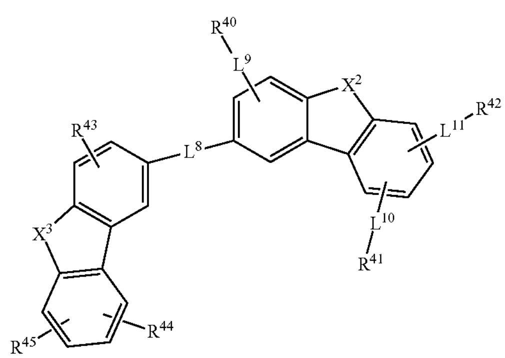

-continued

[Chemical Formula IIIA-2-3]

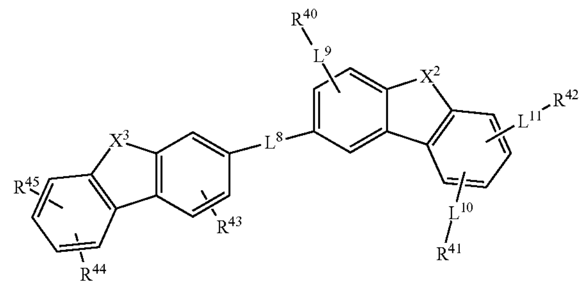

[Chemical Formula IIIA-2-4]

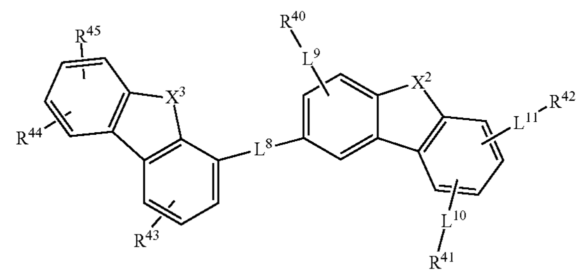

In an implementation, Chemical Formula IIIA-3 may be represented by, e.g., one of Chemical Formula IIIA-3-1 to Chemical Formula IIIA-3-4, depending on a specific position at which dibenzofuran or dibenzothiophene is substituted.

[Chemical Formula IIIA-3-1]

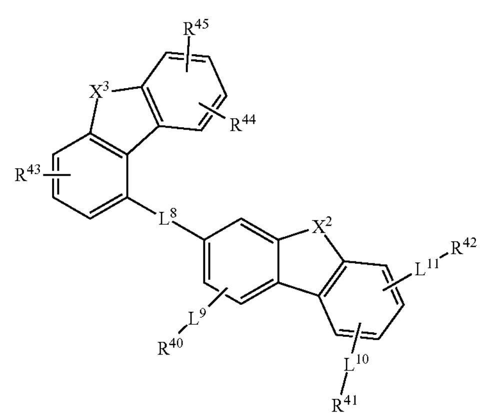

-continued

[Chemical Formula IIIA-3-2]

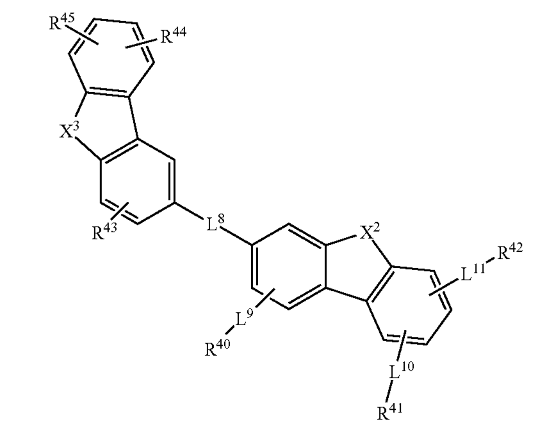

[Chemical Formula IIIA-3-3]

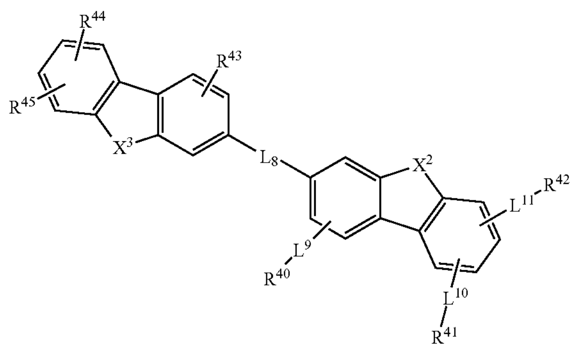

[Chemical Formula IIIA-3-4]

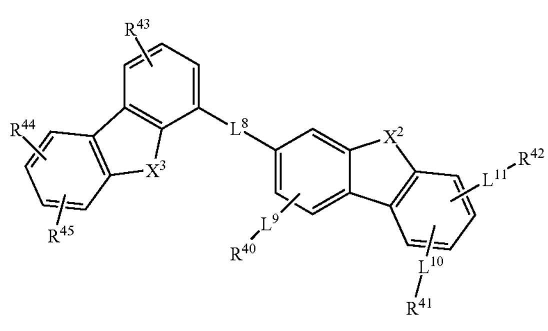

In an implementation, Chemical Formula IIIA-4 may be represented by, e.g., one of Chemical Formula III-4-1 to Chemical Formula III-4-4, depending on a specific position at which dibenzofuran or dibenzothiophene is substituted.

[Chemical Formula IIIA-4-1]

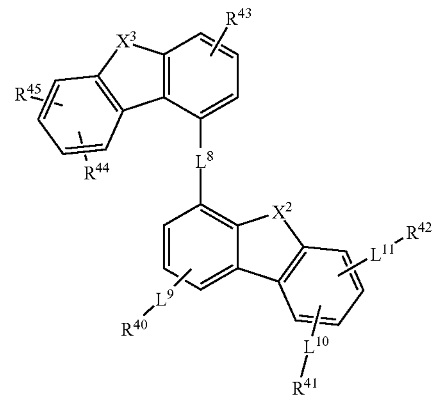

[Chemical Formula IIIA-4-2]

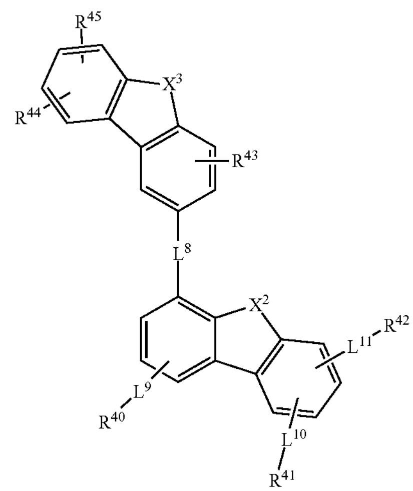

[Chemical Formula IIIA-4-3]

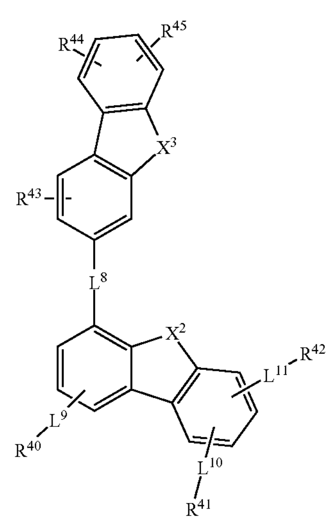

-continued

[Chemical Formula IIIA-4-4]

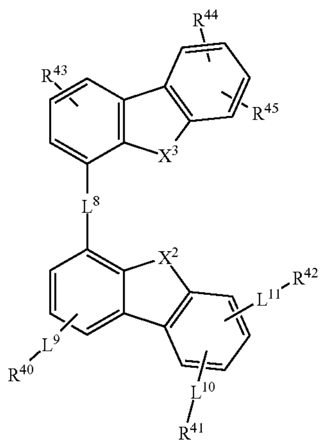

In Chemical Formula IIIA-1-1 to Chemical Formula IIIA-1-4, Chemical Formula IIIA-2-1 to Chemical Formula IIIA-2-4, Chemical Formula IIIA-3-1 to Chemical Formula IIIA-3-4, and Chemical Formula IIIA-4-1 to Chemical Formula IIIA-4-4, $X^2$, $X^3$, $R^{40}$ to $R^{45}$, and $L^8$ to $L^{11}$ may be defined the same as those described above.

In an implementation, Chemical Formula IIIB may be represented by, e.g., one of Chemical Formula IIIB-1 to Chemical Formula IIIB-4, depending on the substitution point at which dibenzofuran or dibenzothiophene is substituted.

[Chemical Formula IIIB-1]

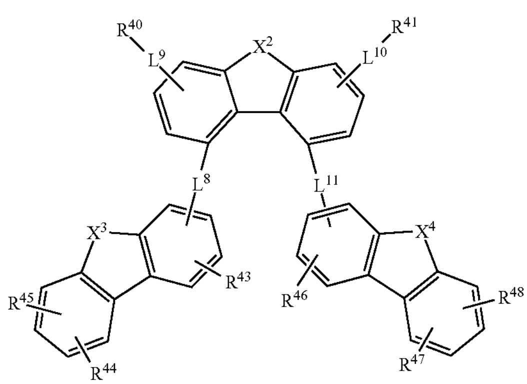

[Chemical Formula IIIB-2]

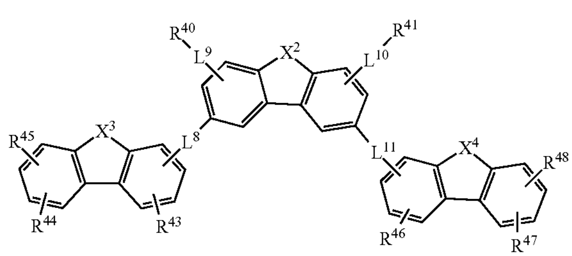

-continued

[Chemical Formula IIIB-3]

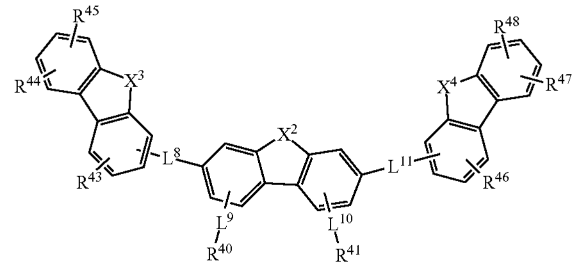

[Chemical Formula IIIB-4]

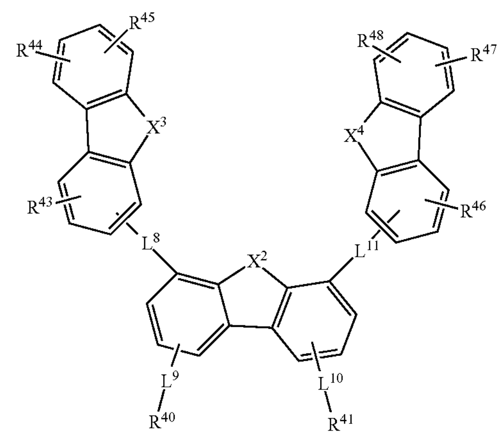

In Chemical Formula IIIB-1 to Chemical Formula IIIB-4, $X^2$ to $X^4$, $R^{40}$, $R^{41}$, $R^{43}$ to $R^{48}$, and $L^8$ to $L^{11}$ may be defined the same as those described above.

In an implementation, Chemical Formula IIIB-1 may be represented by, e.g., one of Chemical Formula IIIB-1-1 to Chemical Formula IIIB-1-10, depending on the specific substitution position of dibenzofuran or dibenzothiophene.

[Chemical Formula IIIB-1-1]

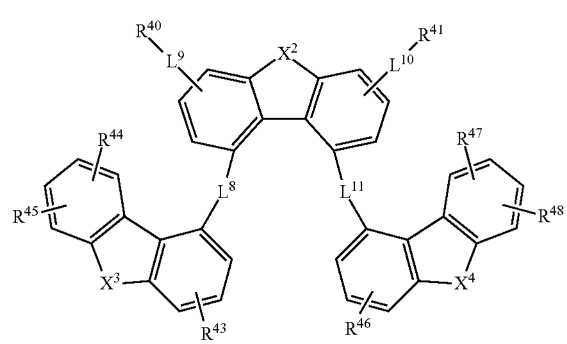

-continued
[Chemical Formula IIIB-1-2]
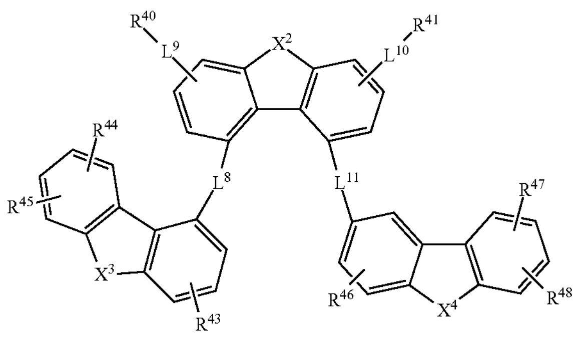
[Chemical Formula IIIB-1-3]
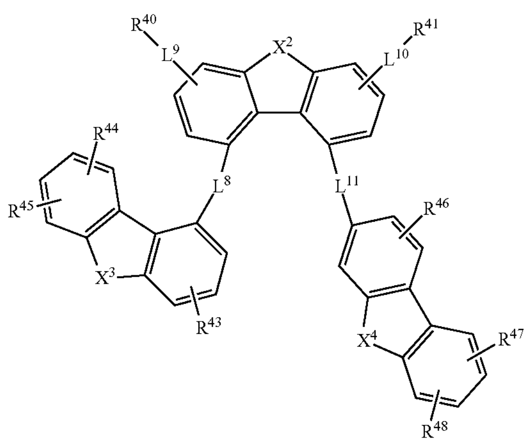
[Chemical Formula IIIB-1-4]
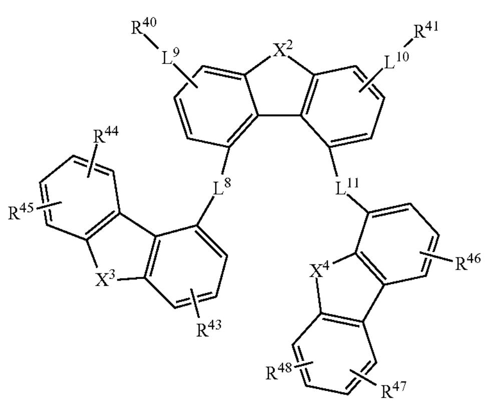
[Chemical Formula IIIB-1-5]
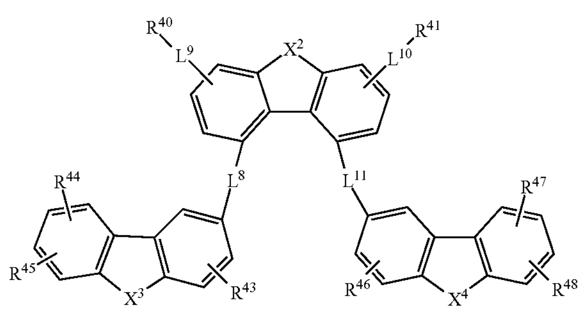
-continued
[Chemical Formula IIIB-1-6]
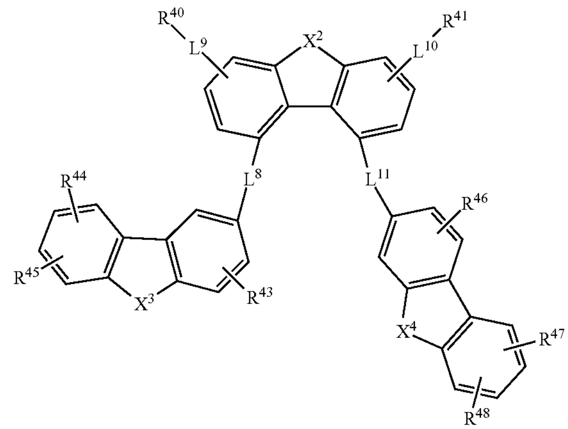
[Chemical Formula IIIB-1-7]
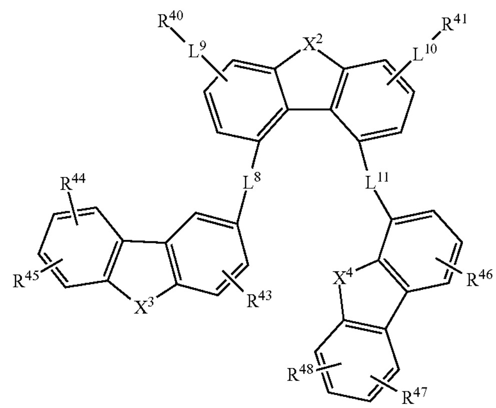
[Chemical Formula IIIB-1-8]
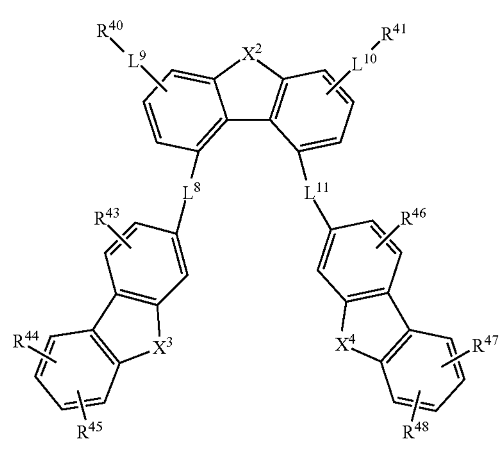

-continued

[Chemical Formula IIIB-1-9]

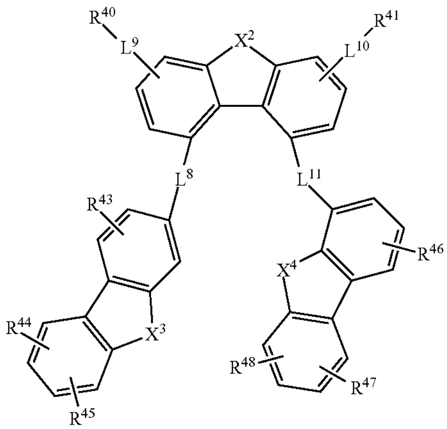

[Chemical Formula IIIB-1-10]

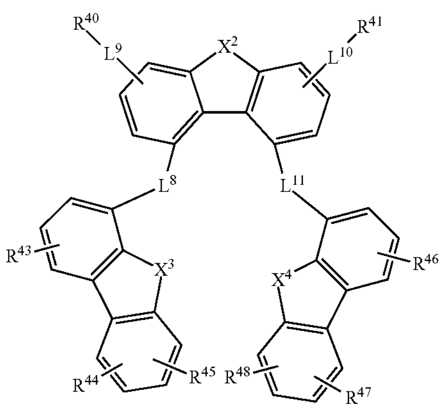

In Chemical Formula IIIB-1-1 to Chemical Formula IIIB-1-10, $X^2$ to $X^4$, $R^{40}$, $R^{41}$, $R^{43}$ to $R^{48}$, and $L^8$ to $L^{11}$ may be defined the same as those described above.

In an implementation, Chemical Formula IIIB-2 may be represented by, e.g., one of Chemical Formula IIIB-2-1 to Chemical Formula IIIB-2-10, depending on the specific substitution position of dibenzofuran or dibenzothiophene.

[Chemical Formula IIIB-2-1]

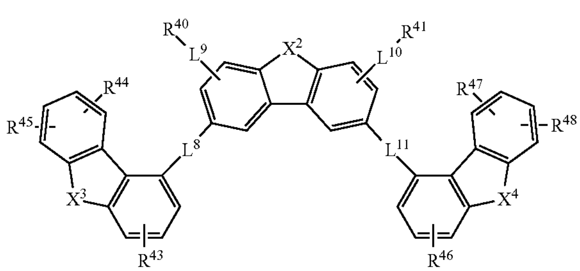

-continued

[Chemical Formula IIIB-2-2]

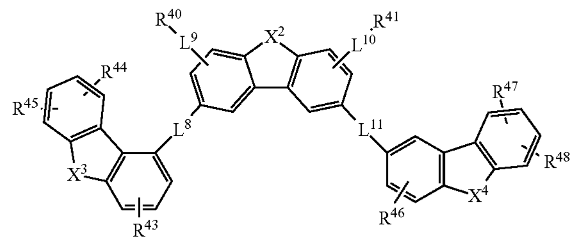

[Chemical Formula IIIB-2-3]

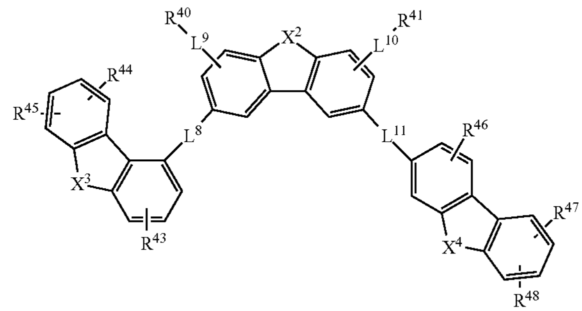

[Chemical Formula IIIB-2-4]

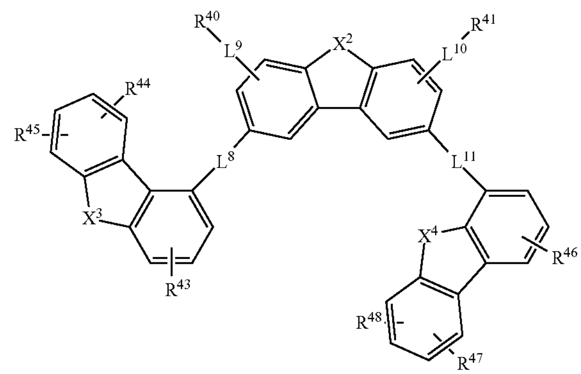

[Chemical Formula IIIB-2-5]

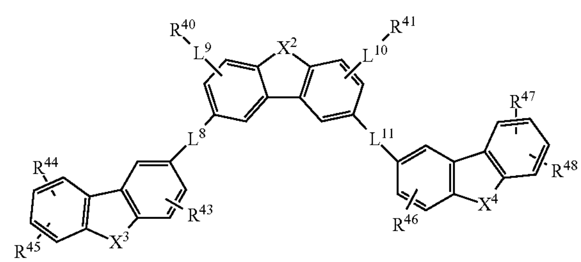

[Chemical Formula IIIB-2-6]

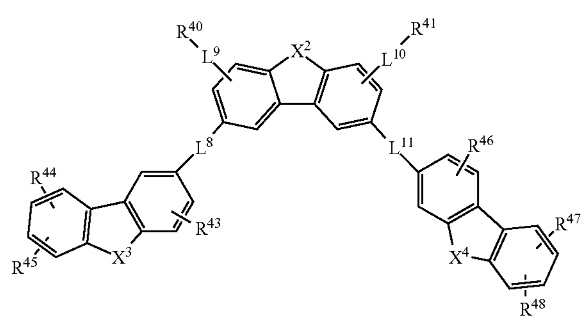

-continued

[Chemical Formula IIIB-2-7]

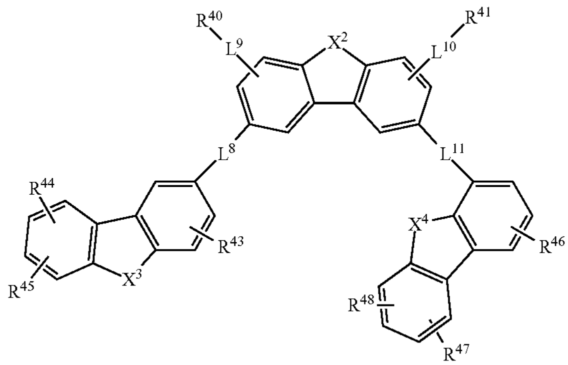

[Chemical Formula IIIB-2-8]

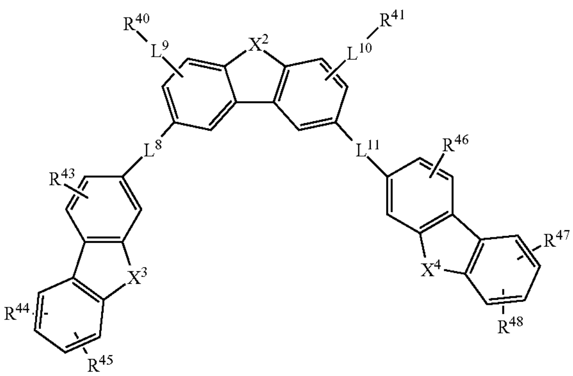

-continued

[Chemical Formula IIIB-2-9]

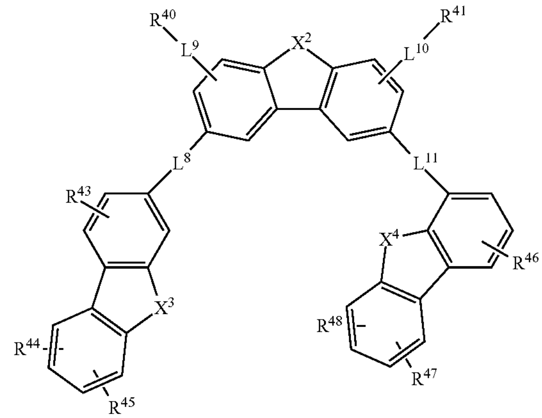

[Chemical Formula IIIB-2-10]

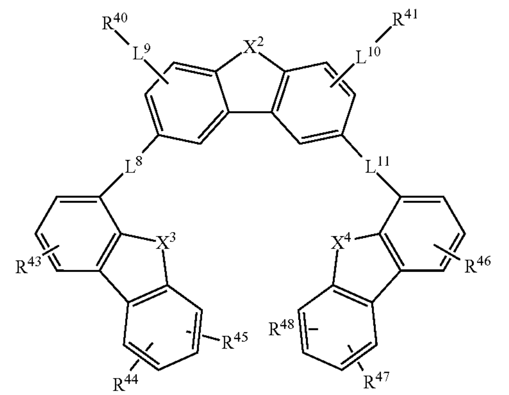

In Chemical Formula IIIB-2-1 to Chemical Formula IIIB3-2-10, $X^2$ to $X^4$, $R^{40}$, $R^{41}$, $R^{43}$ to $R^{48}$, and $L^8$ to $L^{11}$ may be defined the same as those described above.

In an implementation, Chemical Formula IIIB3-3 may be represented by, e.g., one of for example Chemical Formula IIIB-3-1 to Chemical Formula IIIB-3-10, depending on the specific substitution position of dibenzofuran or dibenzothiophene.

[Chemical Formula IIIB-3-1]

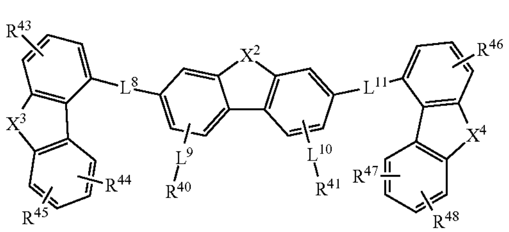

[Chemical Formula IIIB-3-2]

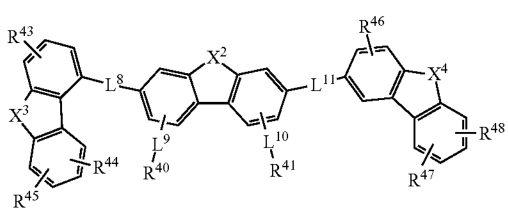

[Chemical Formula IIIB-3-3]

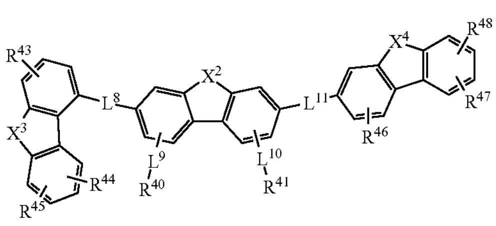

[Chemical Formula IIIB-3-4]

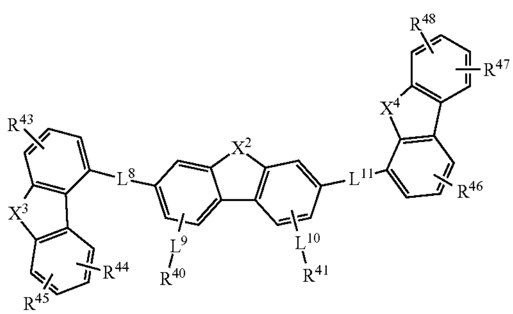

-continued
[Chemical Formula IIIB-3-5]
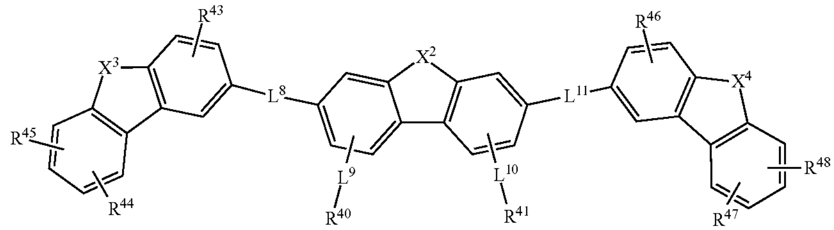
[Chemical Formula IIIB-3-6]
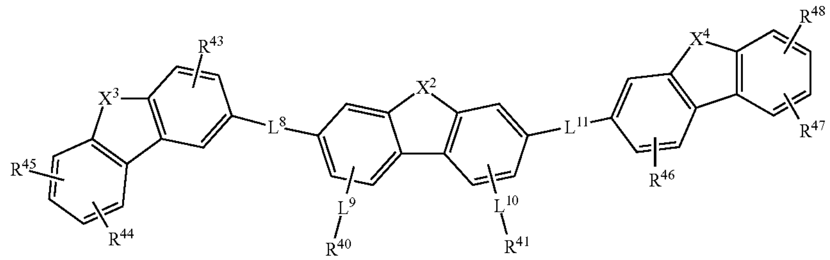
[Chemical Formula IIIB-3-7]
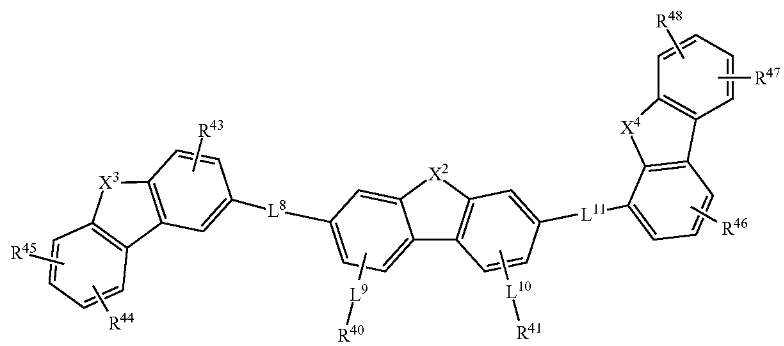
[Chemical Formula IIIB-3-8]
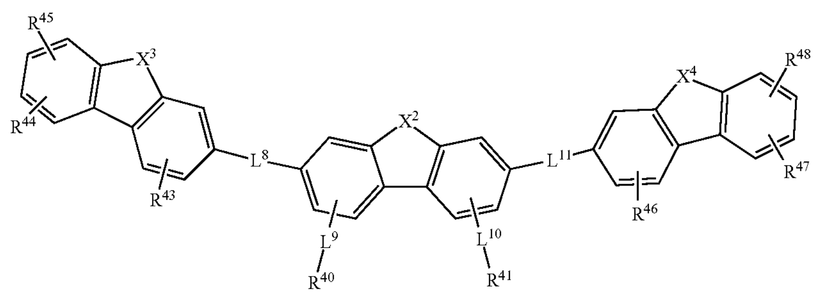
[Chemical Formula IIIB-3-9]
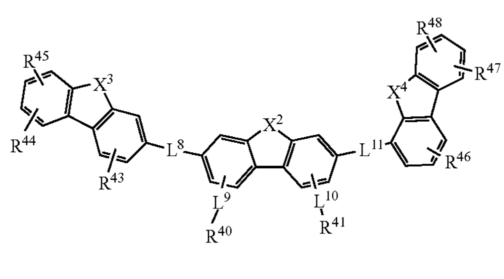
[Chemical Formula IIIB-3-10]
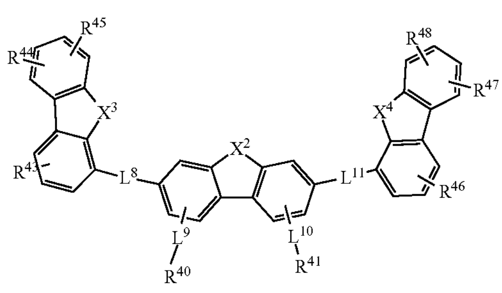

In Chemical Formula IIIB-3-1 to Chemical Formula IIIB-3-10, $X^2$ to $X^4$, $R^{40}$, $R^{41}$, $R^{43}$ to $R^{48}$, and $L^8$ to $L^{11}$ may be defined the same as those described above.

In an implementation, Chemical Formula IIIB-4 may be represented by, e.g., one of Chemical Formula IIIB-4-1 to Chemical Formula IIIB-4-10, depending on the specific substitution position of dibenzofuran or dibenzothiophene.

[Chemical Formula IIIB-4-1]

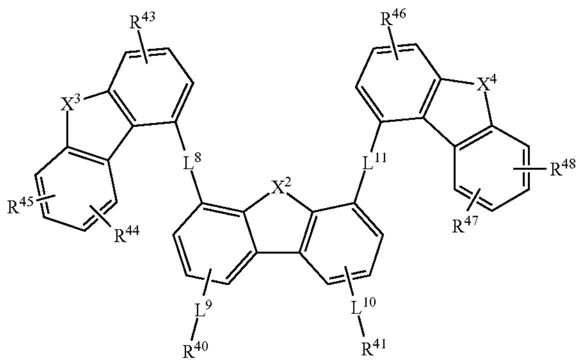

[Chemical Formula IIIB-4-2]

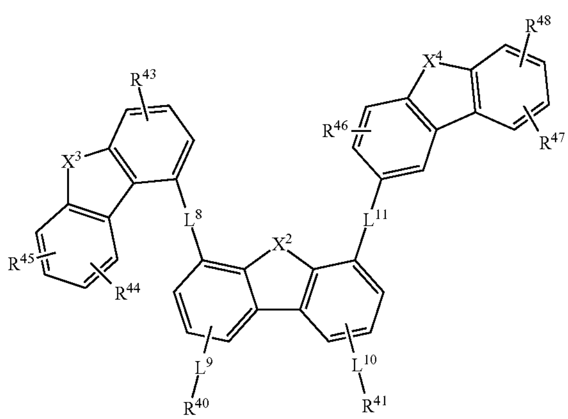

[Chemical Formula IIIB-4-3]

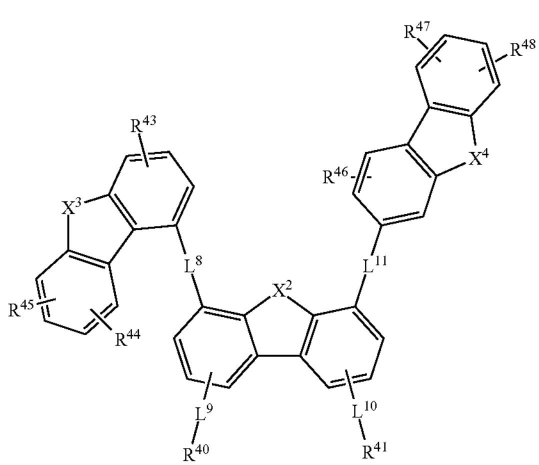

-continued

[Chemical Formula IIIB-4-4]

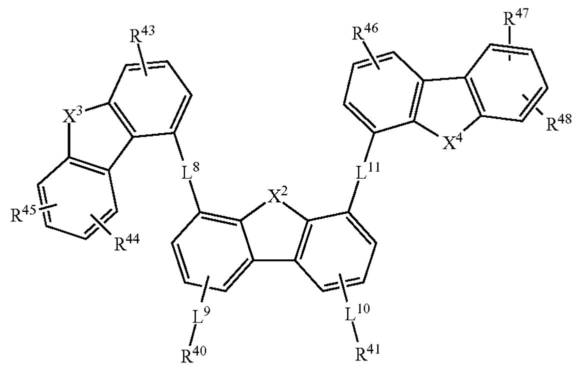

[Chemical Formula IIIB-4-5]

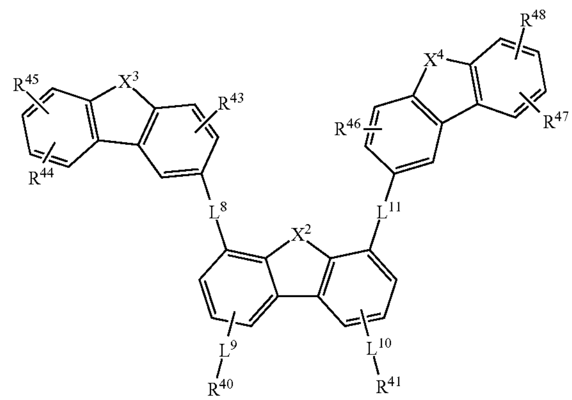

[Chemical Formula IIIB-4-6]

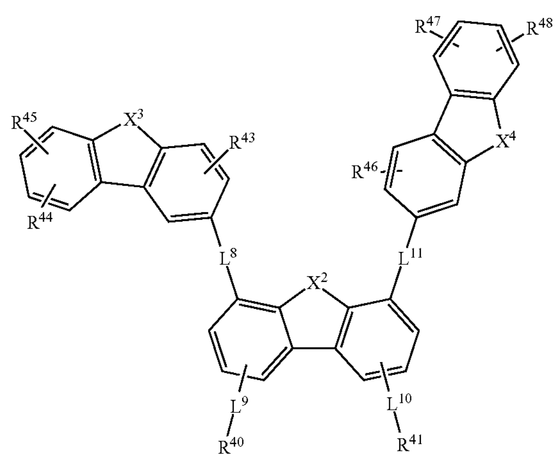

[Chemical Formula IIIB-4-7]

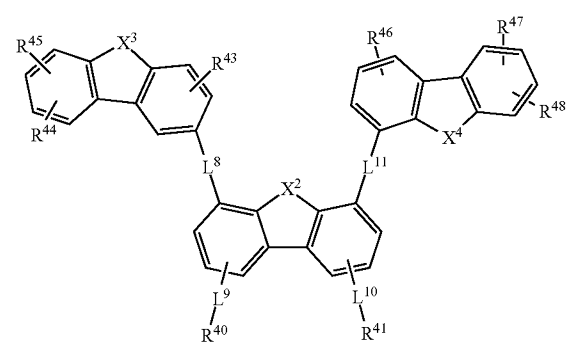

-continued

[Chemical Formula IIIB-4-8]

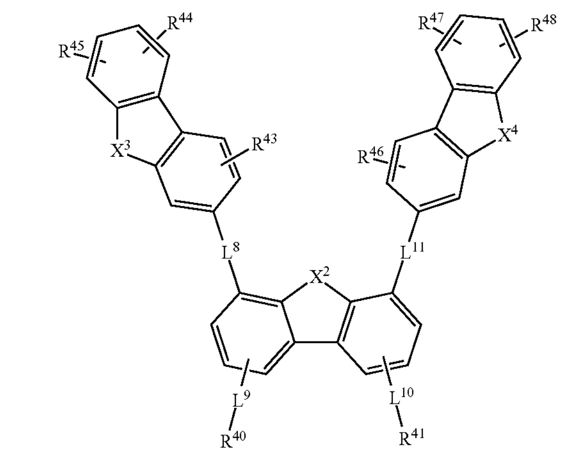

[Chemical Formula IIIB-4-9]

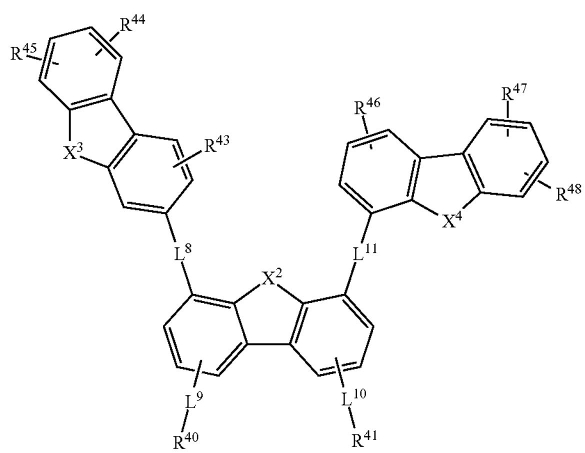

[Chemical Formula IIIB-4-10]

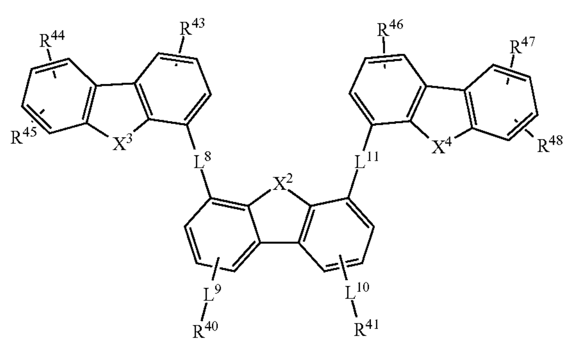

In Chemical Formula IIIB-4-1 to Chemical Formula IIIB-4-10, $X^2$ to $X^4$, $R^{40}$, $R^{41}$, $R^{43}$ to $R^{48}$, and $L^8$ to $L^{11}$ may be defined the same as those described above.

In an implementation, the third compound may be represented by, e.g., Chemical Formula IIIA-1, Chemical Formula IIIA-2, Chemical Formula IIIA-4, or Chemical Formula IIIB-4.

In an implementation, the third compound may be represented by, e.g., Chemical Formula IIIA-2-2, Chemical Formula IIIA-4-1, Chemical Formula IIIB-4-1, or Chemical Formula IIIB-4-5.

In an implementation, Chemical Formula IIIA-2-2 may be represented by Chemical Formula IIIA-2-2a.

[Chemical Formula IIIA-2-2a]

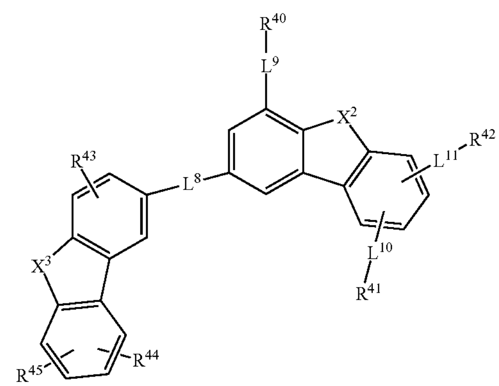

In an implementation, Chemical Formula IIIA-4-1 may be represented by Chemical Formula IIIA-4-1a.

[Chemical Formula IIIA-4-1a]

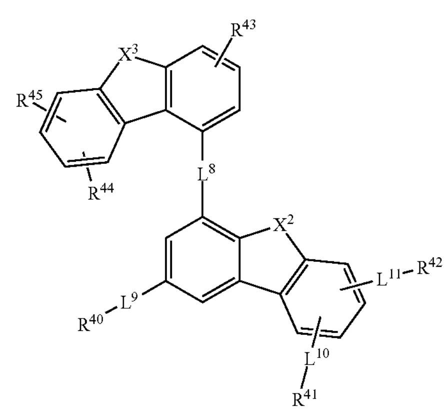

In Chemical Formula IIIA-2-2a and Chemical Formula IIIA-4-1a, $X^2$ and $X^3$, $L^8$ to $L^{11}$, $R^{40}$ to $R^{45}$ may be defined the same as those described above.

In an implementation, Chemical Formula IIIB-4-5 may be represented by Chemical Formula IIIB-4-5a.

[Chemical Formula IIIB-4-5a]

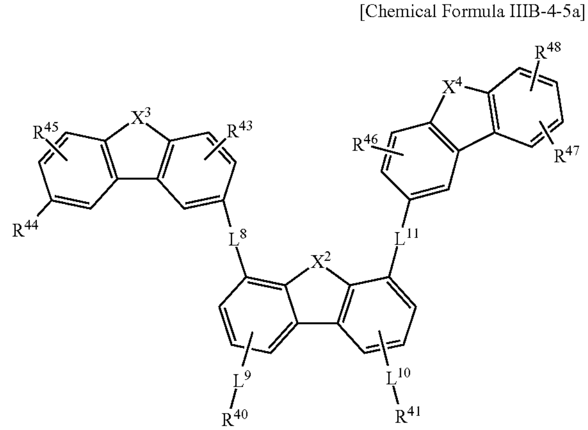

In Chemical Formula IIIB-4-5a, $X^2$ to $X^4$, $L^8$ to $L^{11}$, $R^{40}$, $R^{41}$, and $R^{43}$ to $R^{48}$ may be defined the same as those described above.

In an implementation, $L^8$ to $L^{11}$ in Chemical Formula III may each independently be, e.g., a single bond, a substituted or unsubstituted phenylene group, a substituted or unsubstituted biphenylene group, or a substituted or unsubstituted terphenylene group.

In an implementation, when $L^8$ to $L^{11}$ are substituted, the substituent may be, e.g., a phenyl group or a biphenyl group. In an implementation, the number of substituents substituted for $L^8$ to $L^{11}$ may be, e.g., 1, 2, or 3.

In an implementation, $R^{39}$ to $R^{42}$ may each independently be, e.g., hydrogen, deuterium, a substituted or unsubstituted C6 to C18 aryl group, a substituted or unsubstituted dibenzofuranyl group, or a substituted or unsubstituted dibenzothiophenyl group, provided that at least one of $R^{39}$ to $R^{42}$ may be a substituted or unsubstituted dibenzofuranyl group, or a substituted or unsubstituted dibenzothiophenyl group.

In an implementation, $L^9$ in Chemical Formula IIIA-2-2a and Chemical Formula IIIA-4-1a may be, e.g., a single bond, a substituted or unsubstituted phenylene group, or a substituted or unsubstituted biphenylene group.

In an implementation, $R^{40}$ in Chemical Formula IIIA-2-2a and Chemical Formula IIIA-4-1a may be, e.g., a substituted or unsubstituted phenyl group, a substituted or unsubstituted biphenyl group, or a substituted or unsubstituted terphenyl group.

In an implementation, moiety $-L^9-R^{40}$ in Chemical Formula IIIA-2-2a and Chemical Formula IIIA-4-1a may be, e.g., a meta-terphenyl group.

In an implementation, $L^8$ and $L^{11}$ in Chemical Formula IIIB-4-1 may each be, e.g., substituted or unsubstituted phenylene groups, and $R^{40}$, $R^{41}$, and $R^{43}$ to $R^{48}$ may each be hydrogen.

In an implementation, $R^{44}$ in Chemical Formula IIIB-4-5a may be, e.g., a substituted or unsubstituted phenyl group, and $R^{43}$ and $R^{45}$ to $R^{48}$ may each be hydrogen.

In an implementation, the third compound may be, e.g., a compound of Group 3.

[3-1]

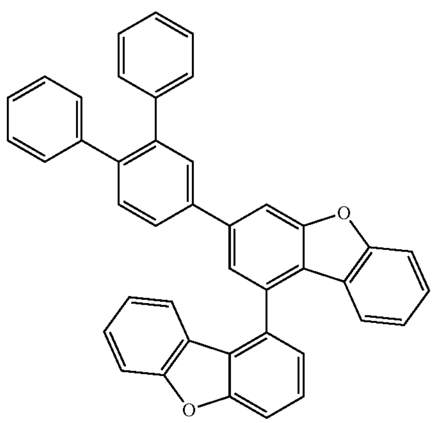

[3-2]

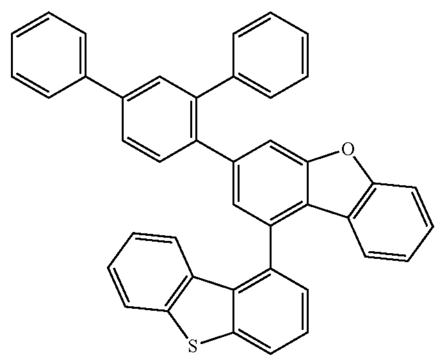

[3-3]

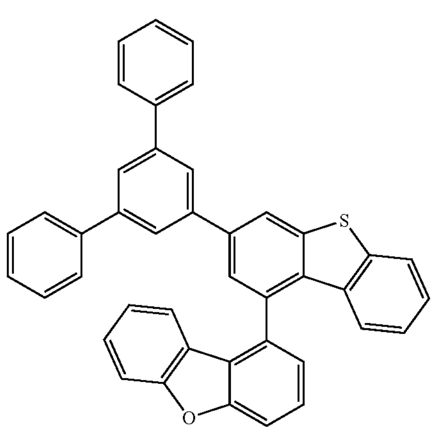

[3-4]

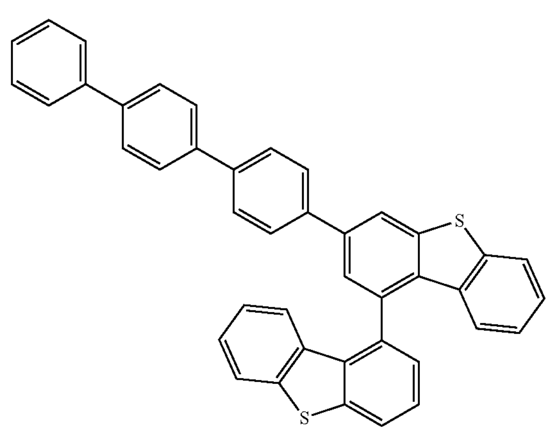

-continued
[3-5]
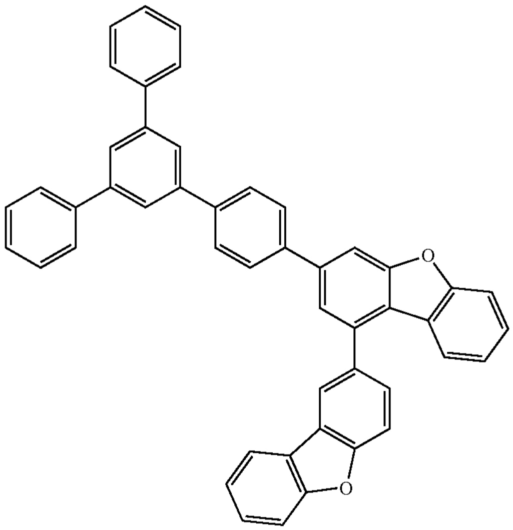
[3-6]
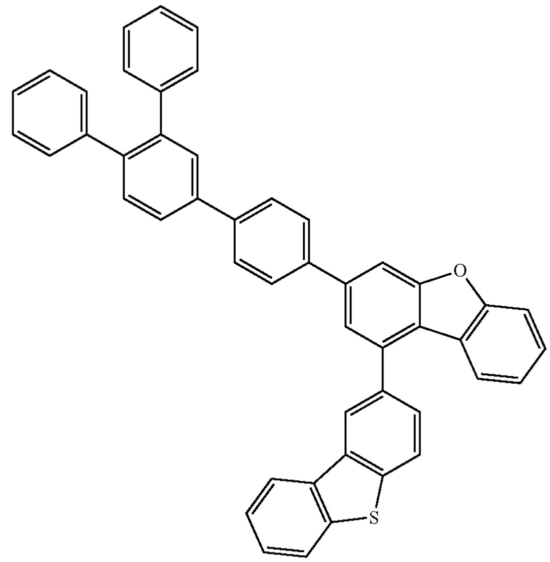
[3-7]
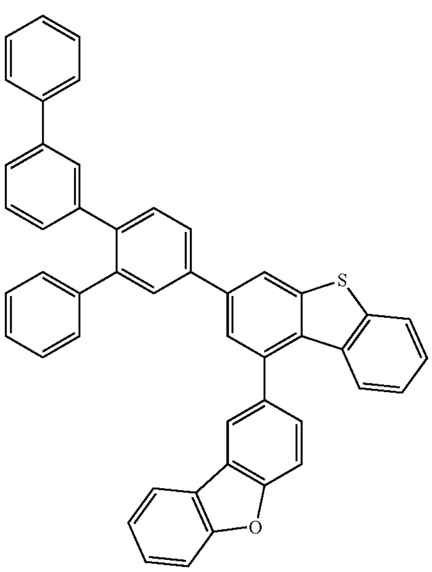
[3-8]
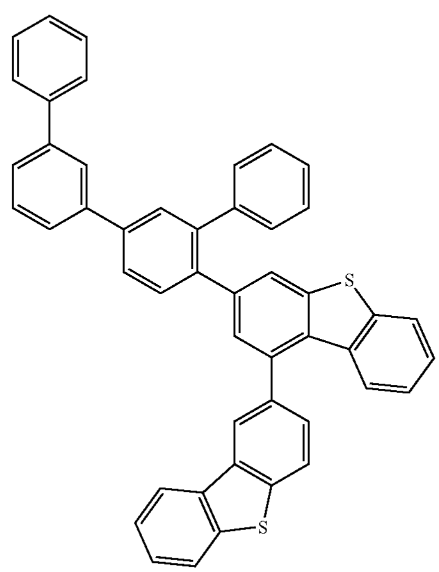

-continued
[3-9]
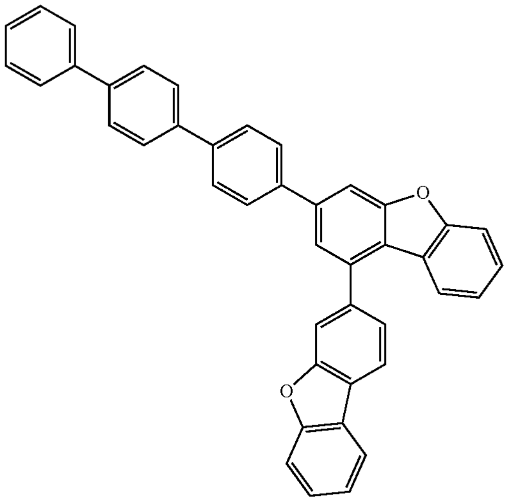
[3-10]
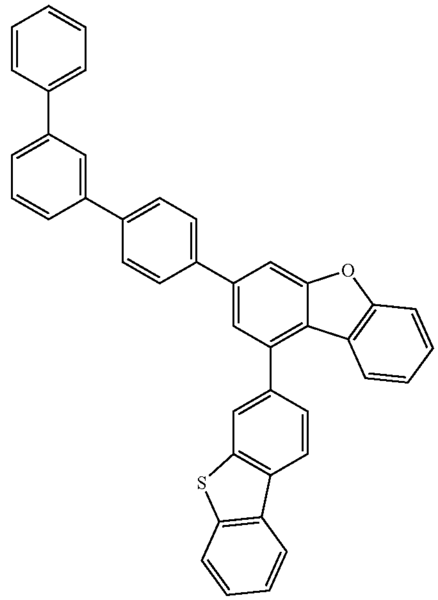
[3-11]
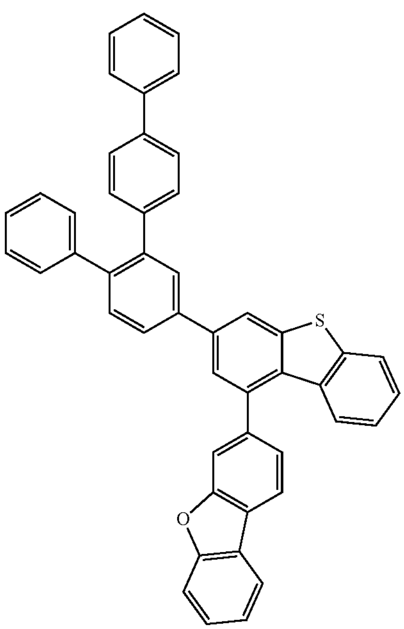
[3-12]
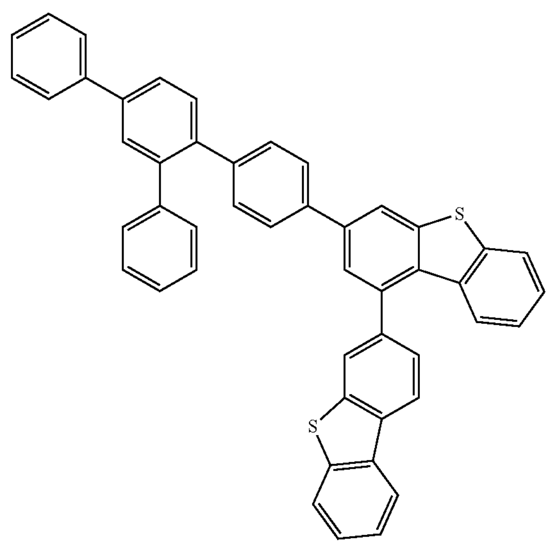

-continued
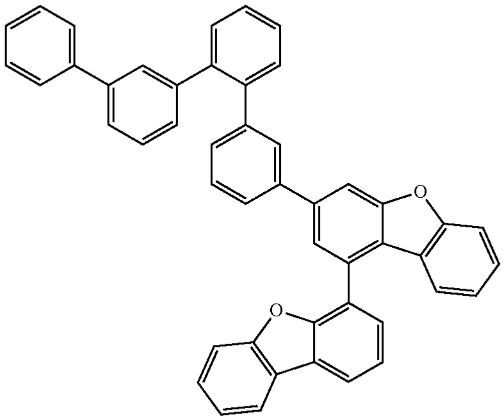
[3-13]
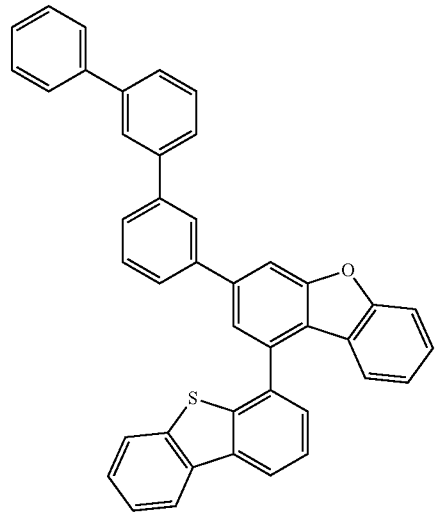
[3-14]
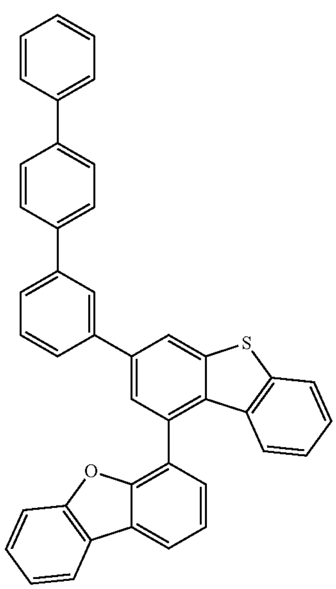
[3-15]
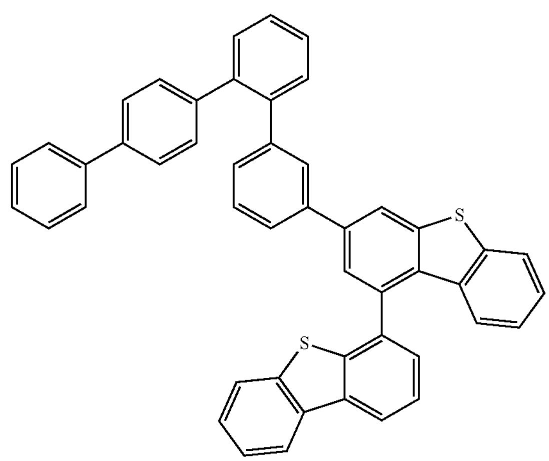
[3-16]

-continued
[3-17]
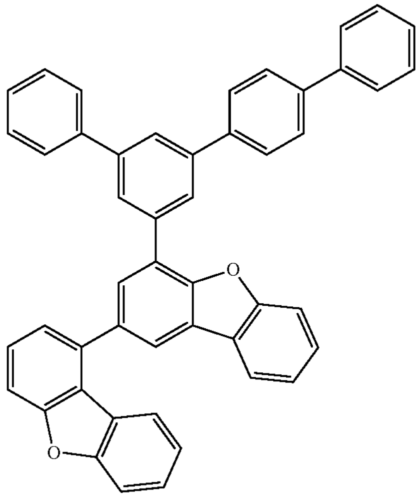
[3-18]
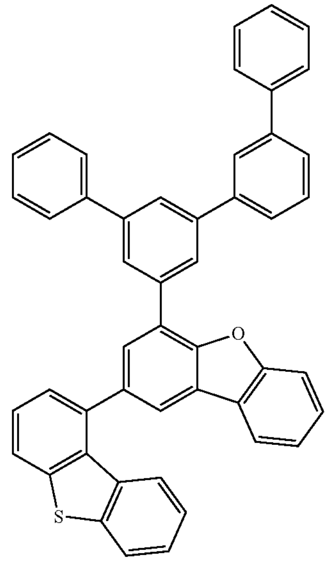
[3-19]
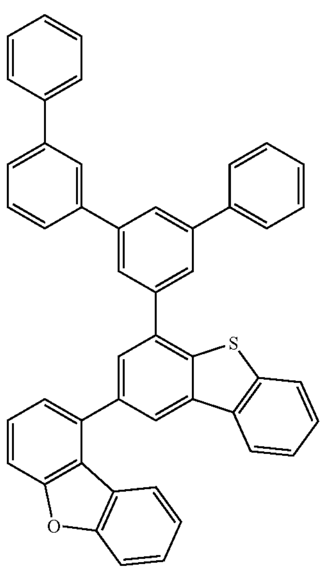
[3-20]
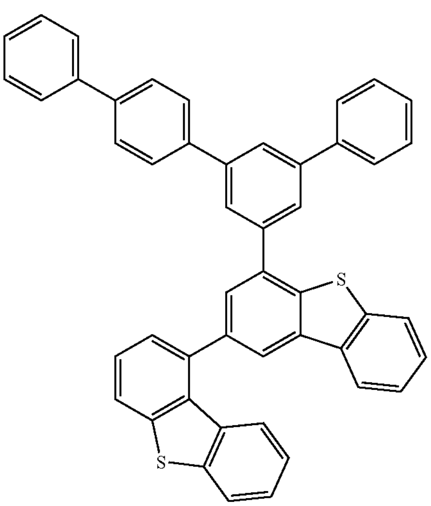

-continued
[3-25]
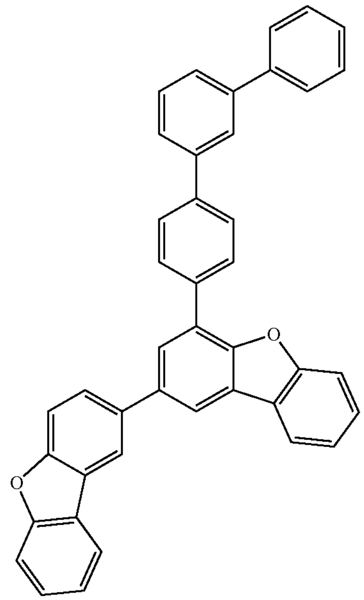
[3-26]
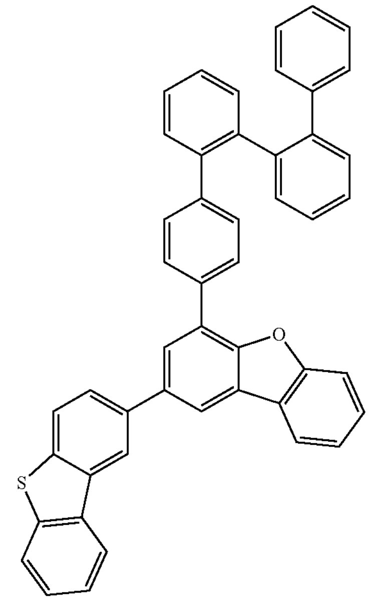
[3-27]
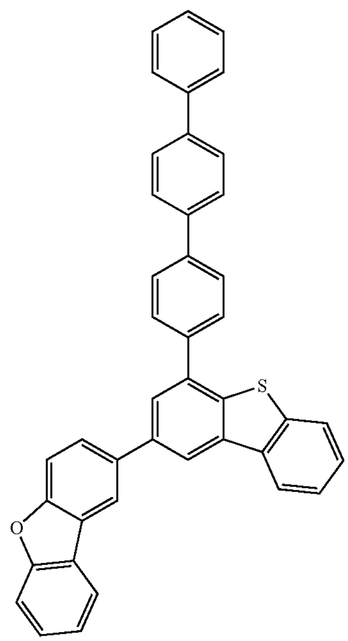
[3-28]
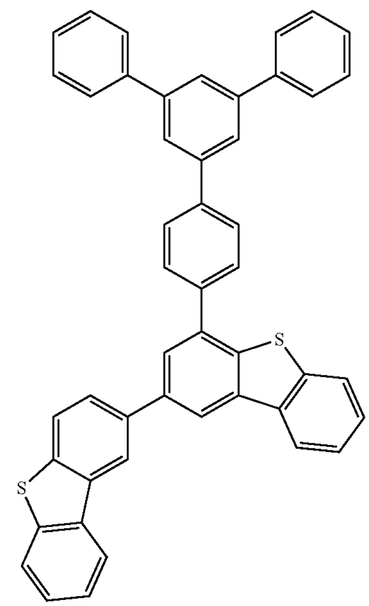
[3-29]
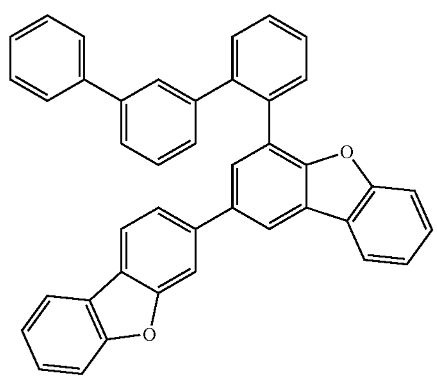
[3-30]
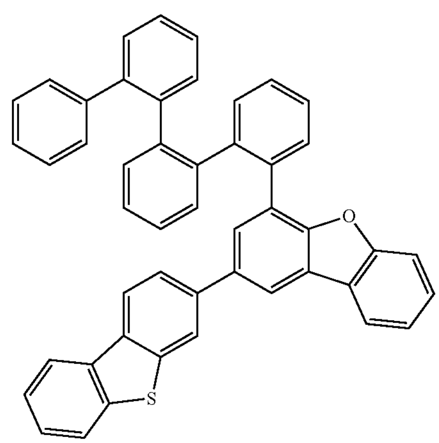

-continued
[3-31]
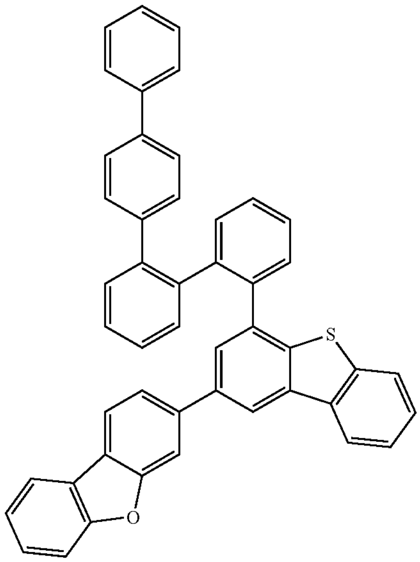
[3-32]
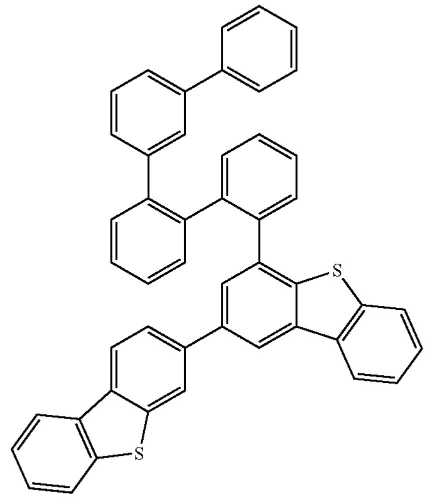
[3-33]
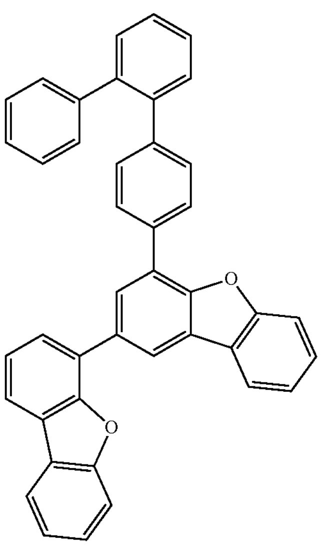
[3-34]
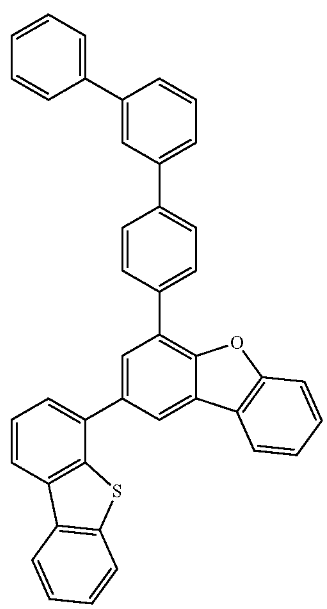

-continued
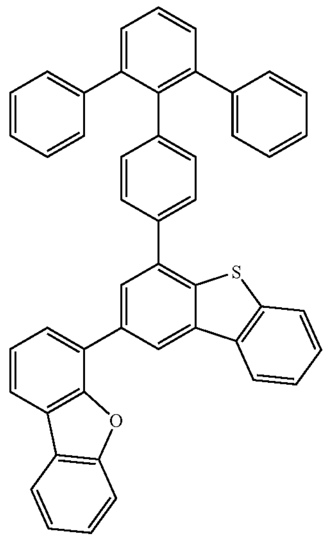
[3-35]
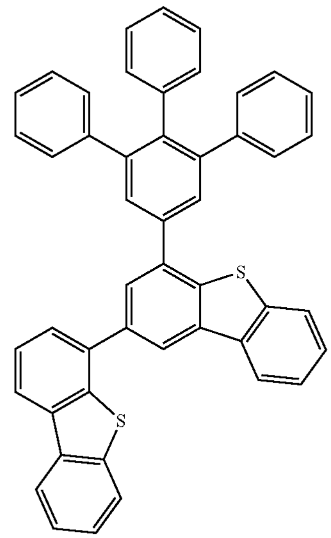
[3-36]
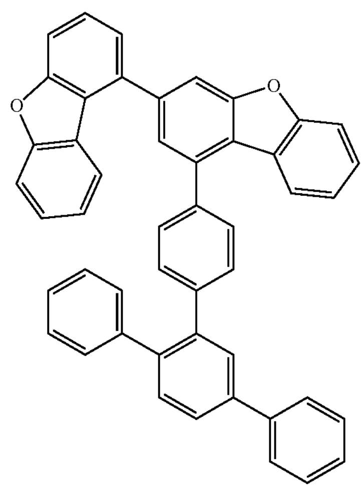
[3-37]
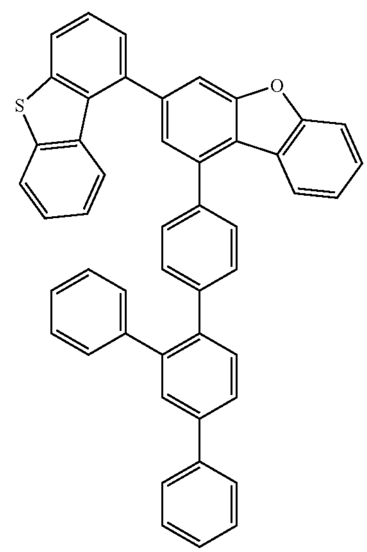
[3-38]
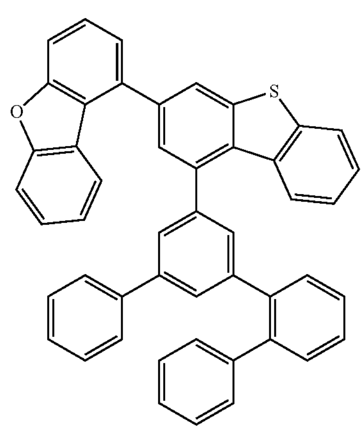
[3-39]
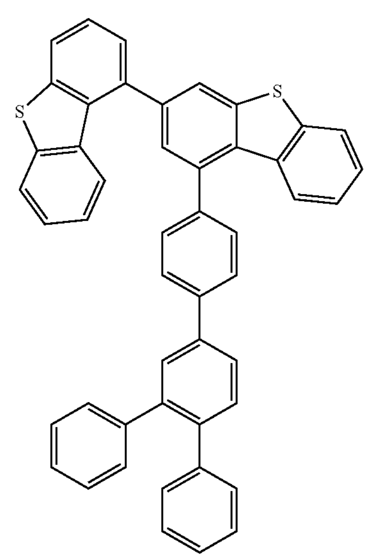
[3-40]

-continued
[3-41]
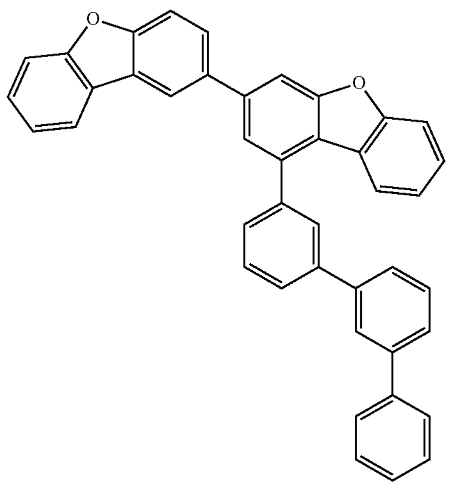
[3-42]
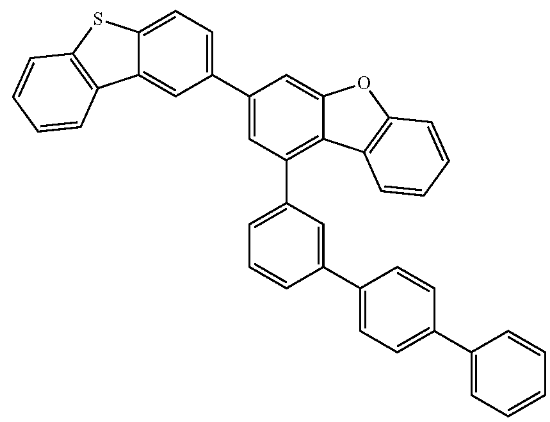
[3-43]
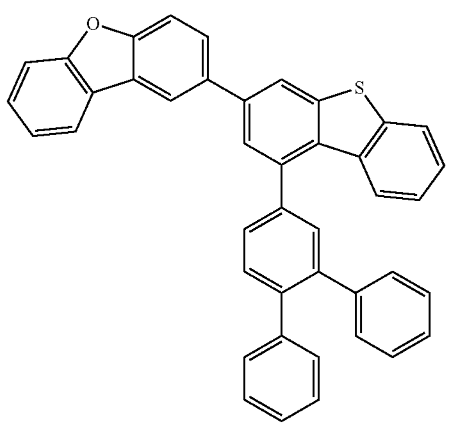
[3-44]
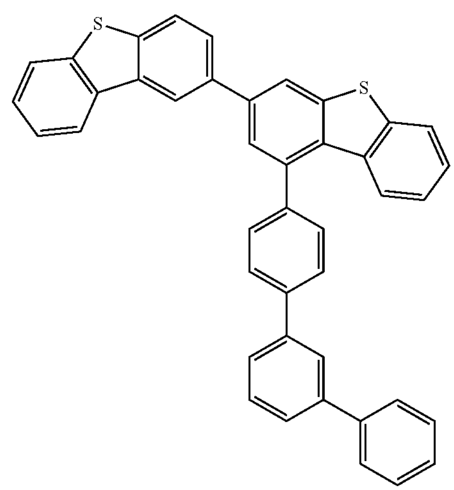
[3-45]
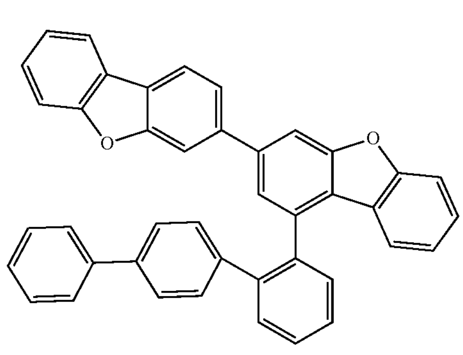
[3-46]
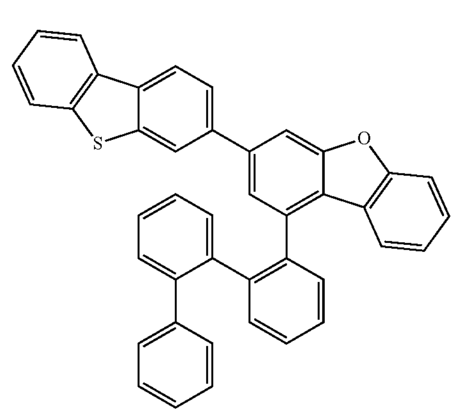

-continued
[3-47]
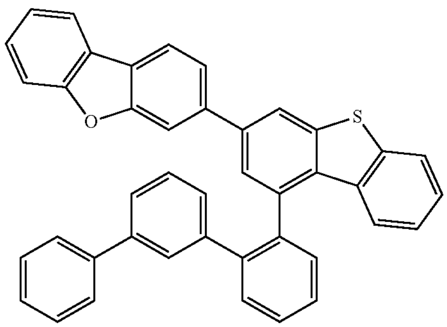
[3-48]
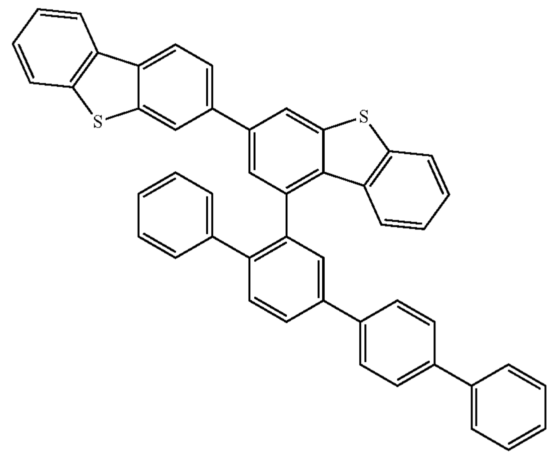
[3-49]
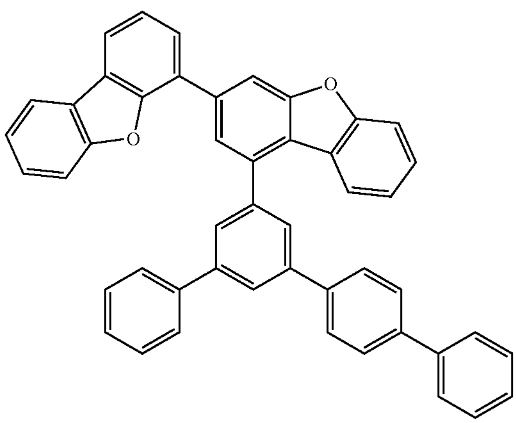
[3-50]
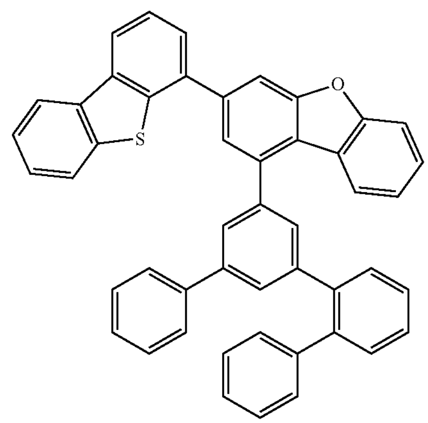
[3-51]
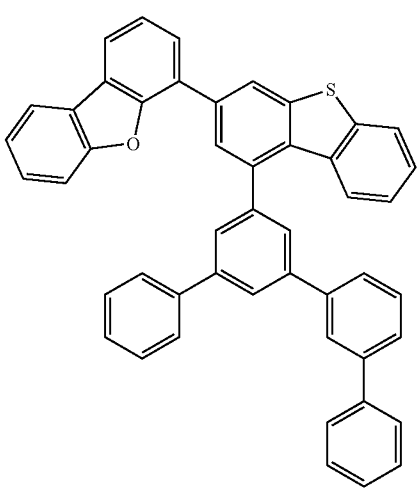
[3-52]
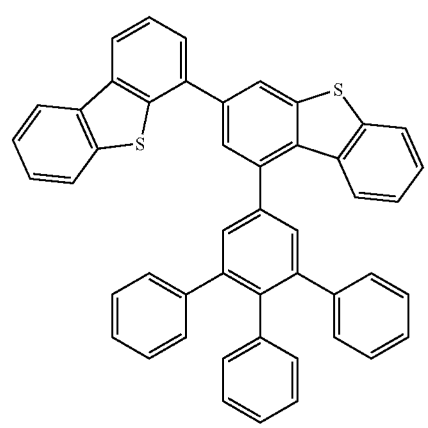

-continued
[3-53]
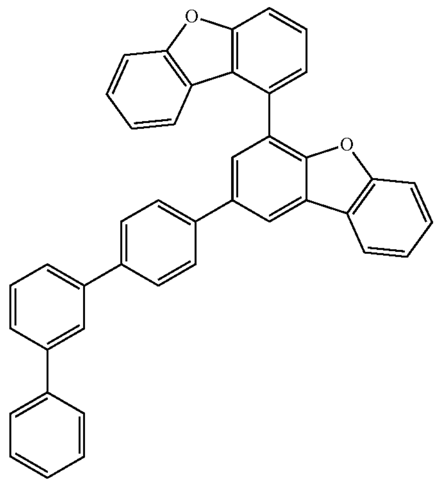
[3-54]
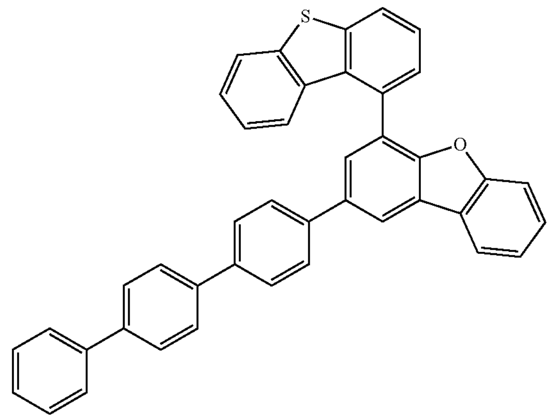
[3-55]
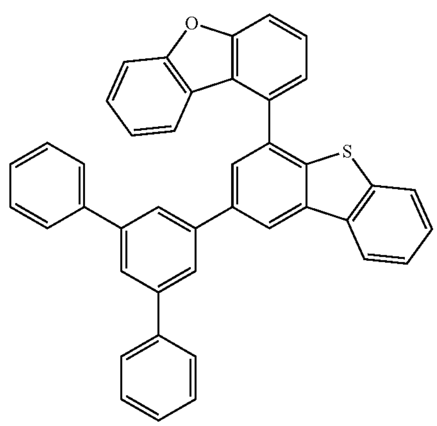
[3-56]
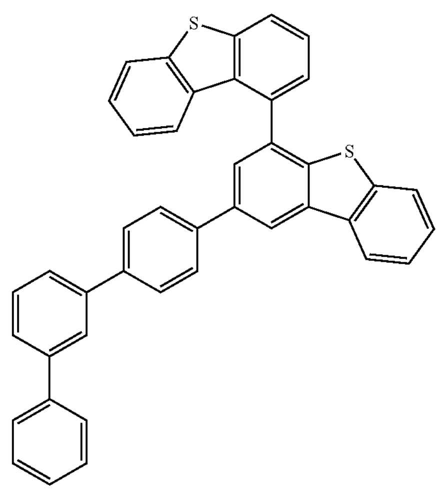
[3-57]
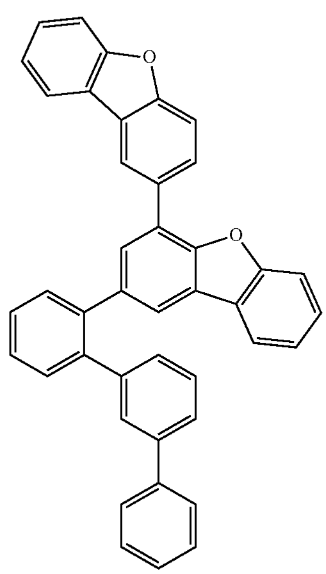
[3-58]
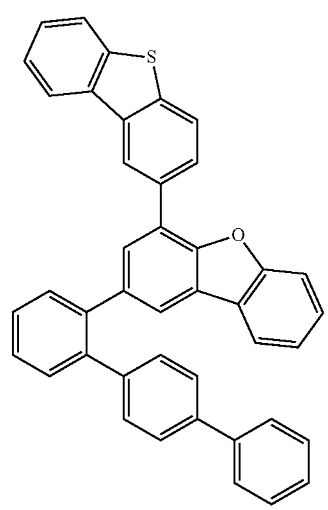

-continued
[3-59]
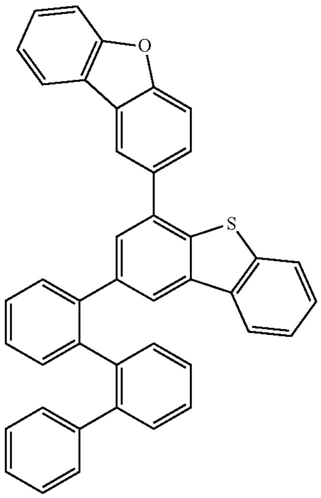
[3-60]
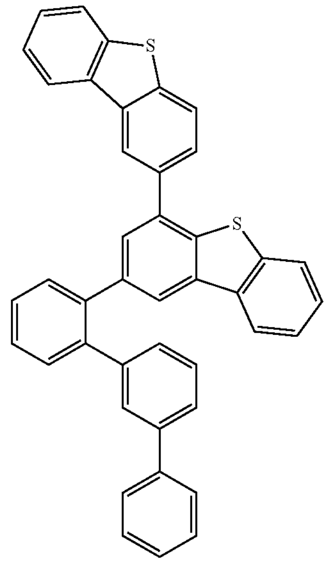
[3-61]
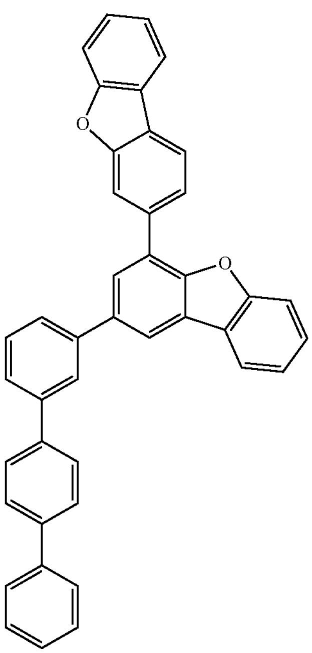
[3-62]
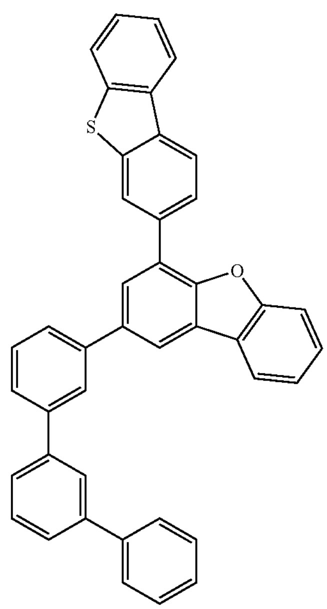

-continued
[3-63]
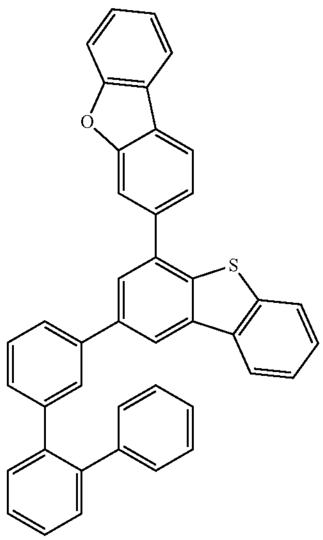
[3-64]
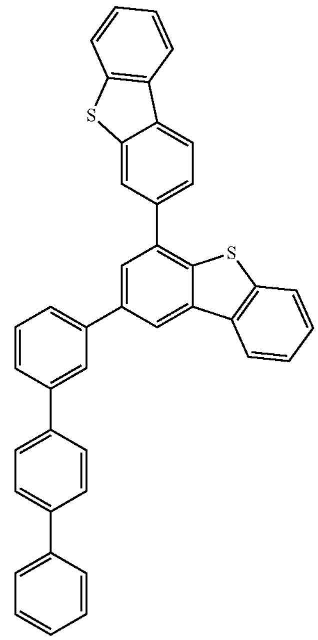
[3-65]
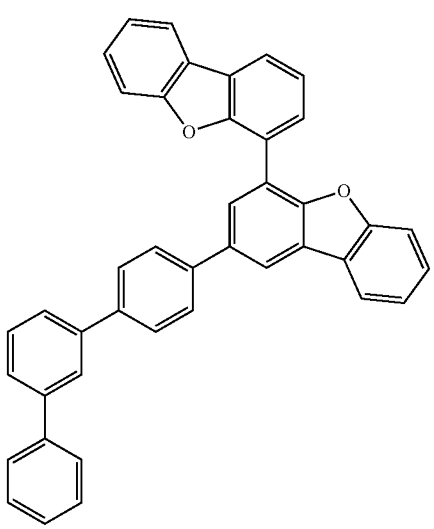
[3-66]
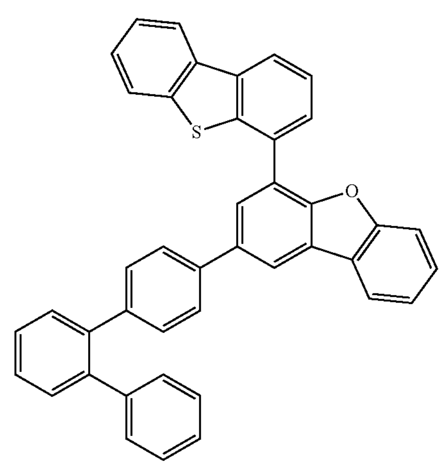

-continued
[3-67]
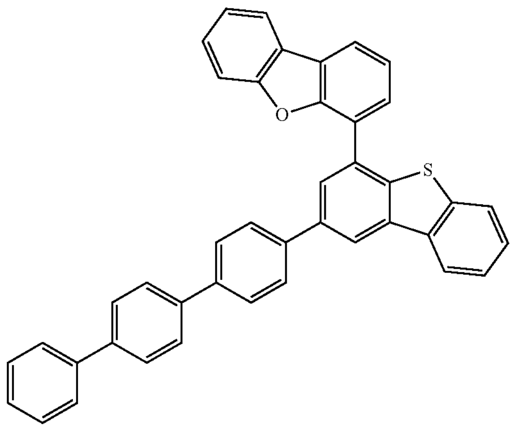
[3-68]
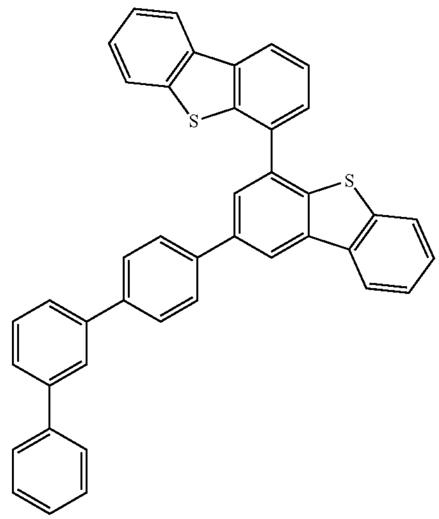
[3-69]
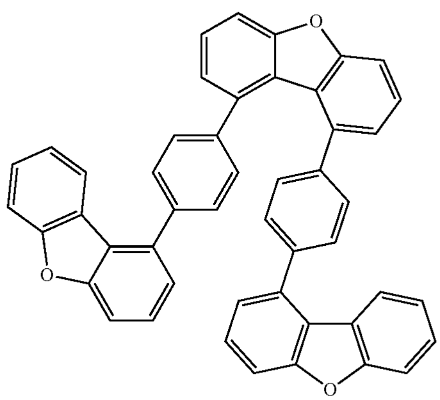
[3-70]
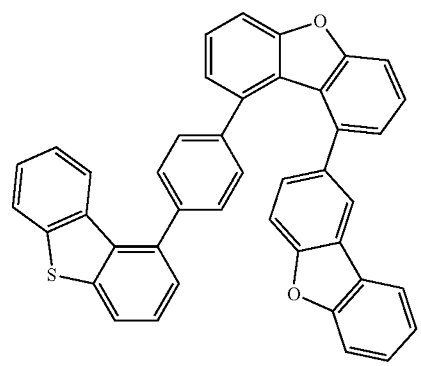
[3-71]
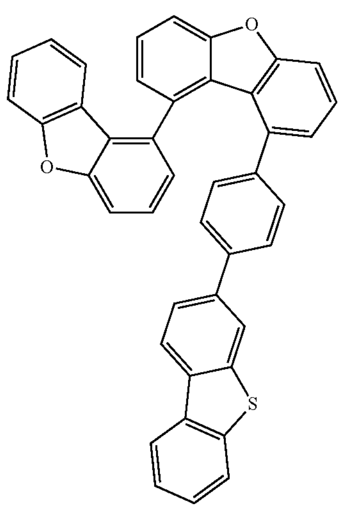
[3-72]
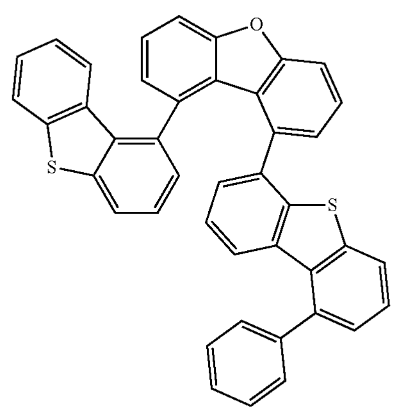

-continued
[3-73]
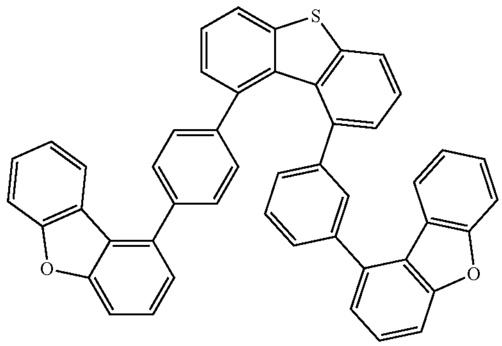
[3-74]
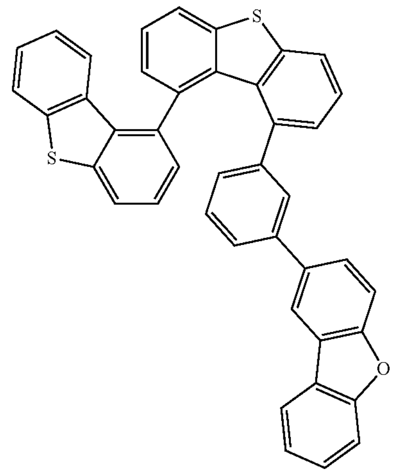
[3-75]
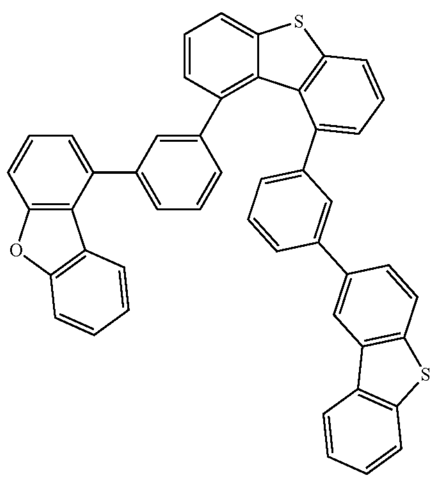
[3-76]
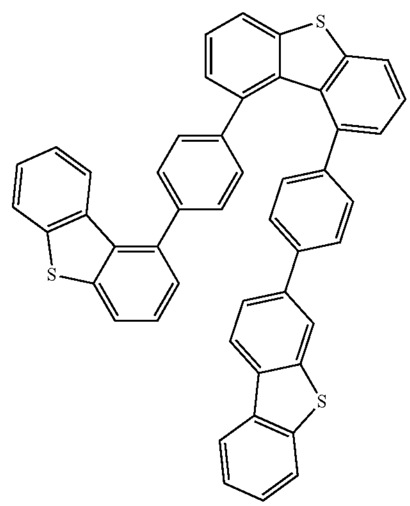
[3-77]
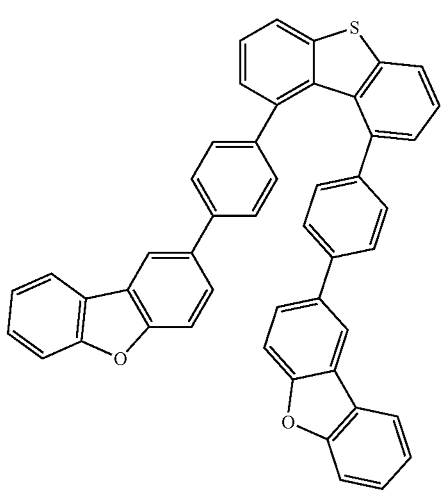
[3-78]
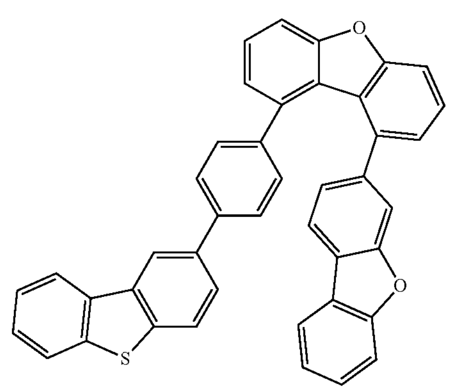

-continued
[3-79]
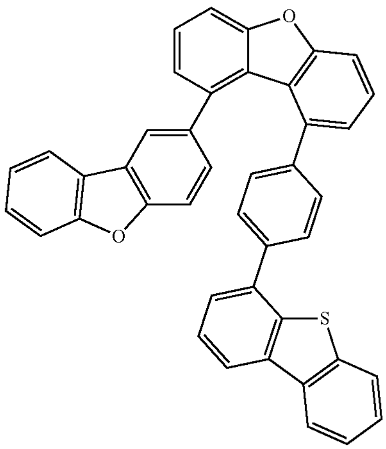
[3-80]
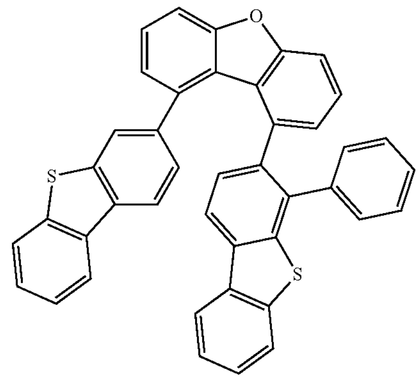
[3-81]
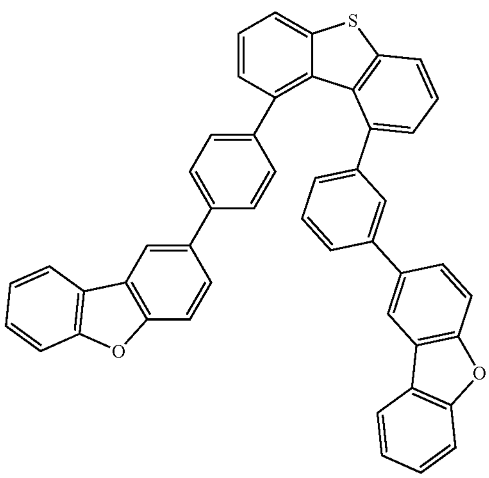
[3-82]
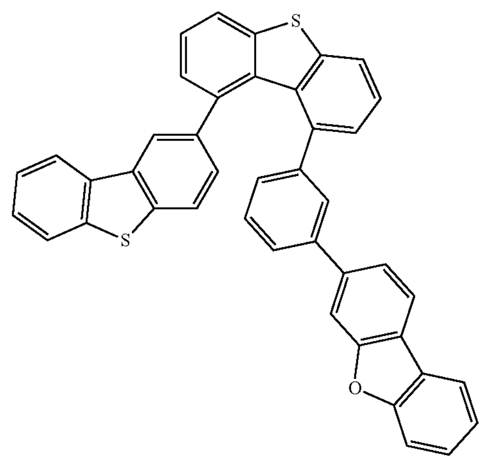
[3-83]
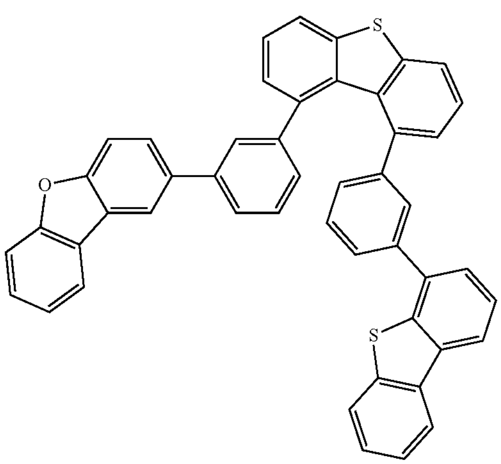
[3-84]
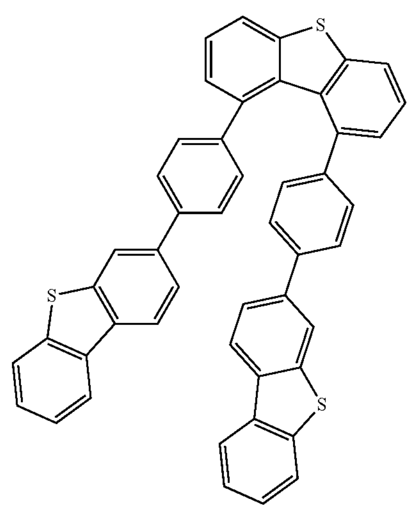

-continued
[3-85]
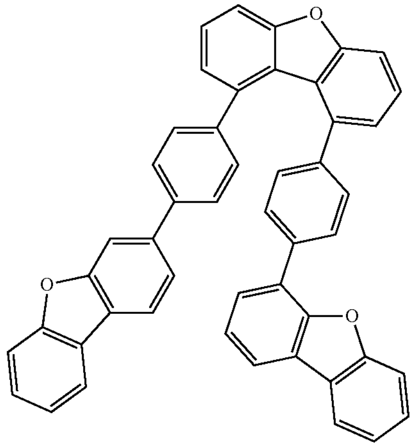
[3-86]
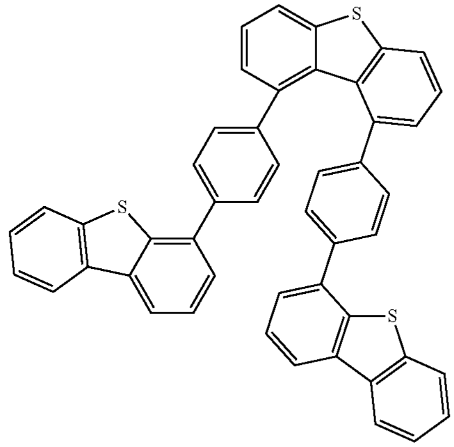
[3-87]
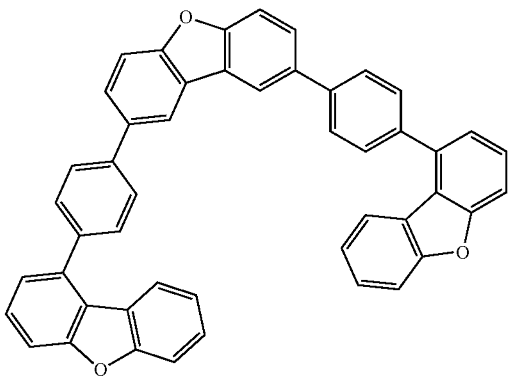
[3-88]
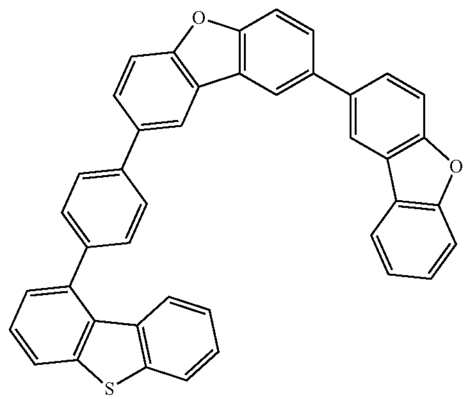
[3-89]
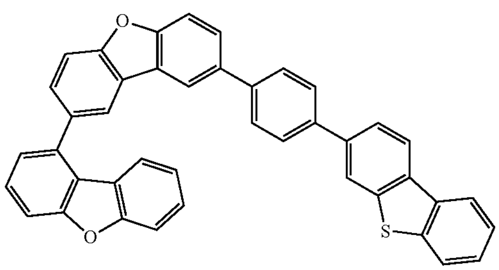
[3-90]
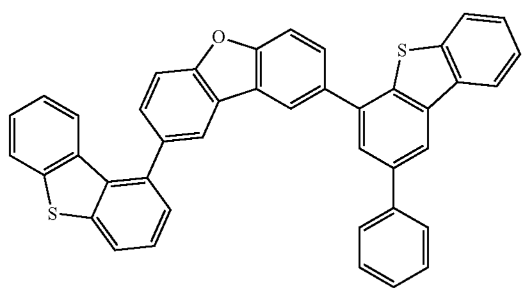
[3-91]
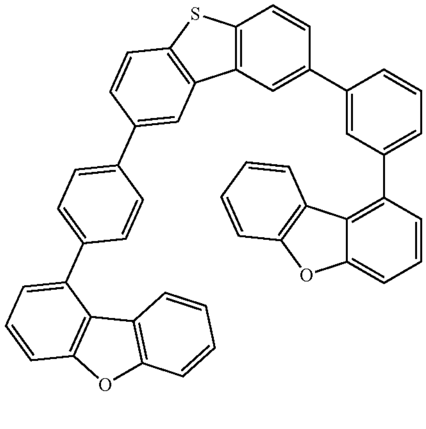
[3-92]
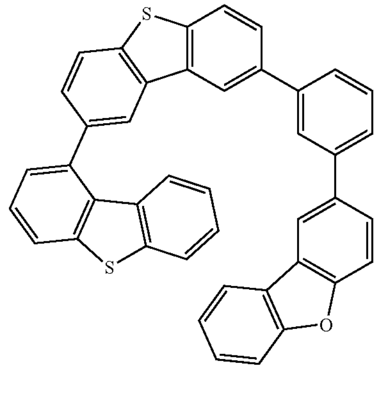

-continued
[3-93]
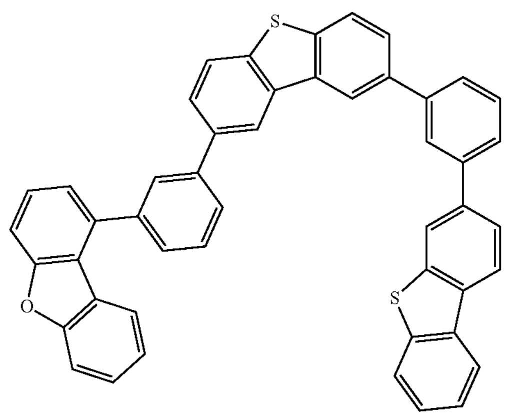
[3-94]
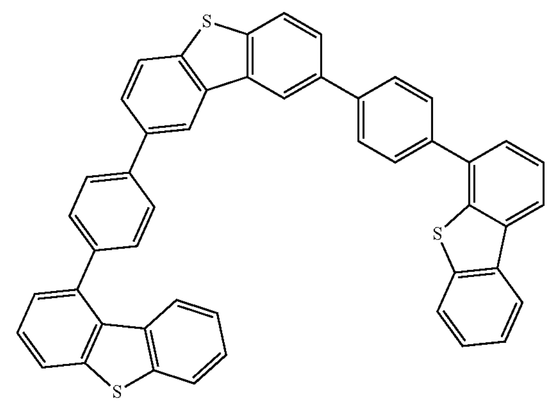
[3-95]
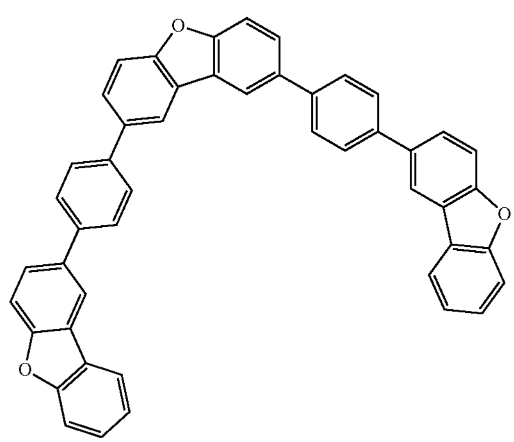
[3-96]
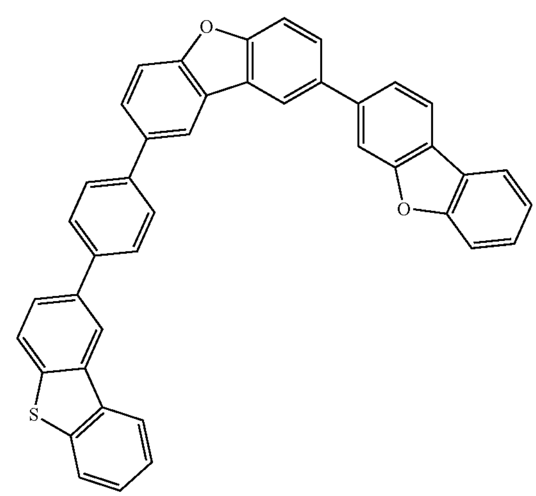
[3-97]
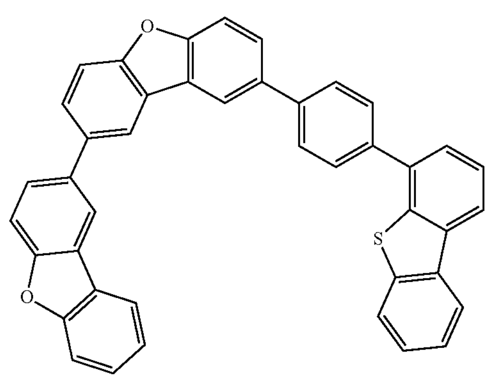
[3-98]
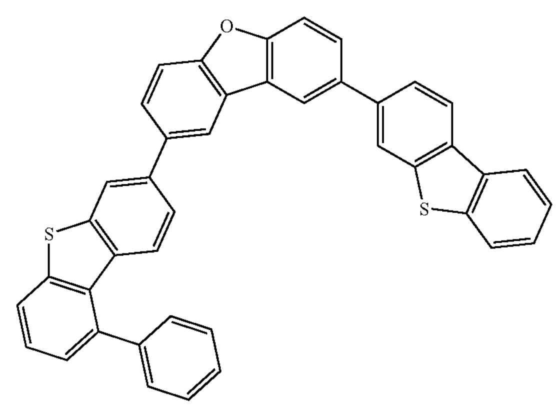

-continued
[3-99]
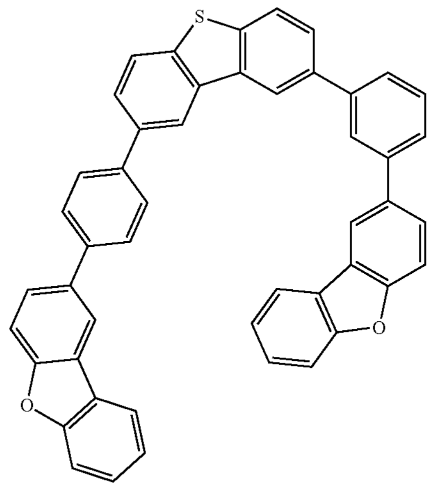
[3-100]
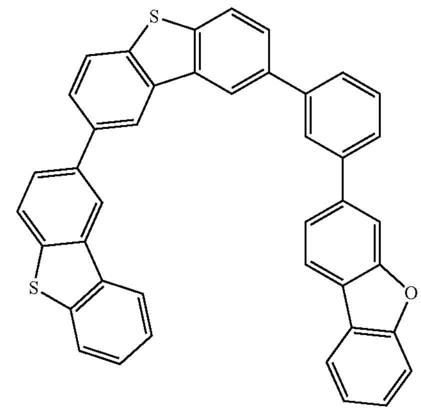
[3-101]
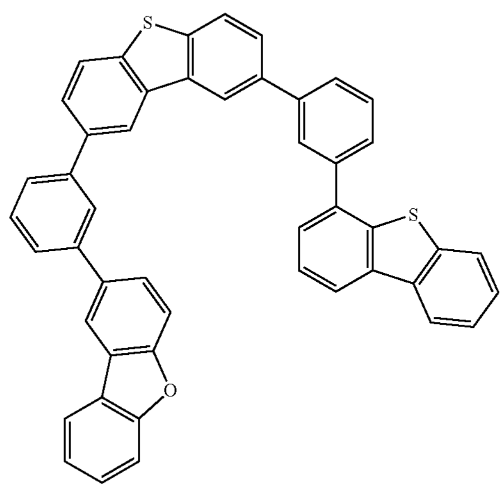
[3-102]
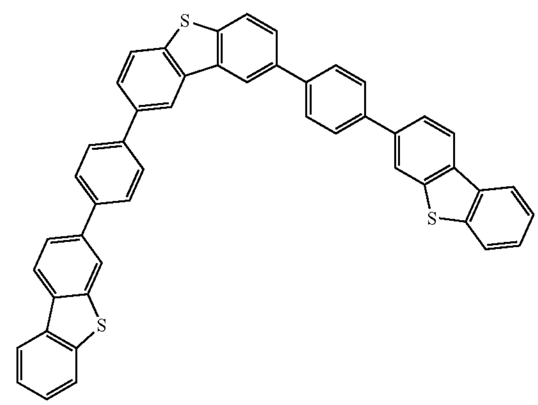
[3-103]
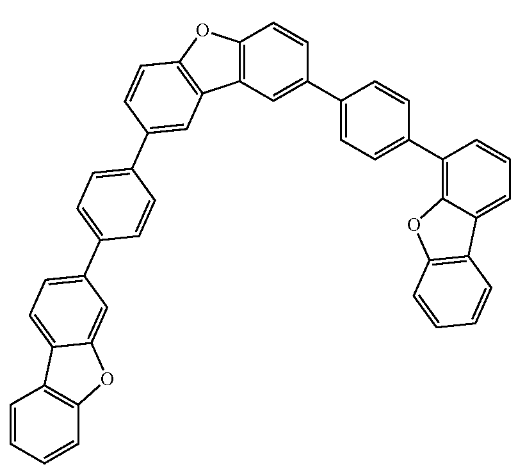
[3-104]
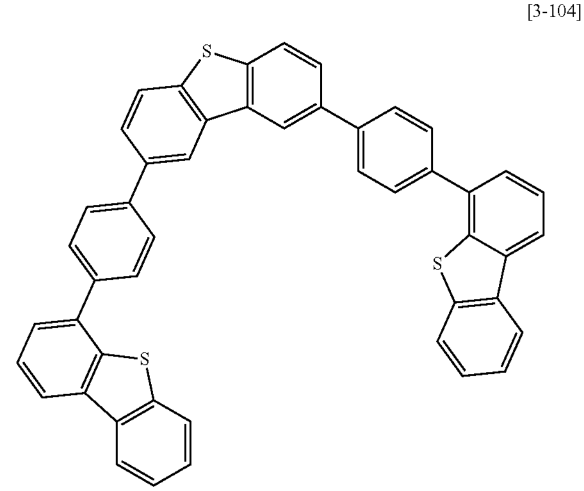

-continued
[3-105]
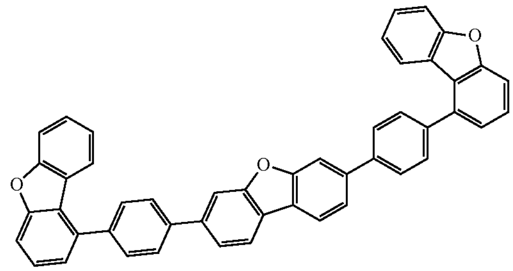
[3-106]
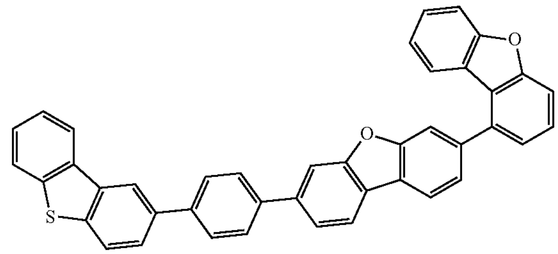
[3-107]
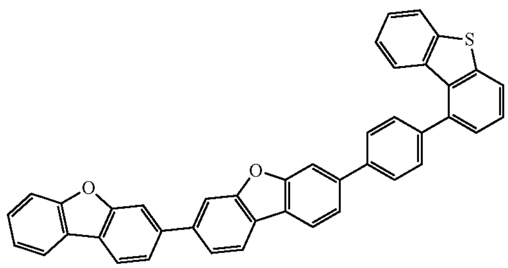
[3-108]
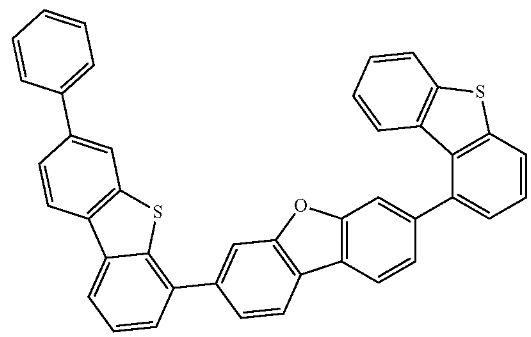
[3-109]
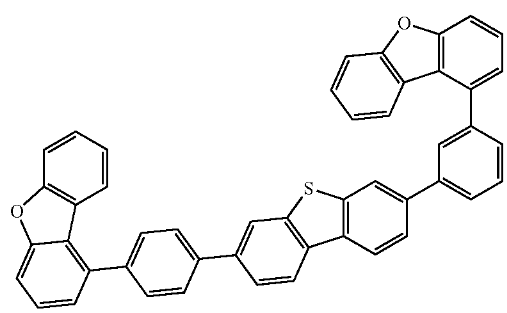
[3-110]
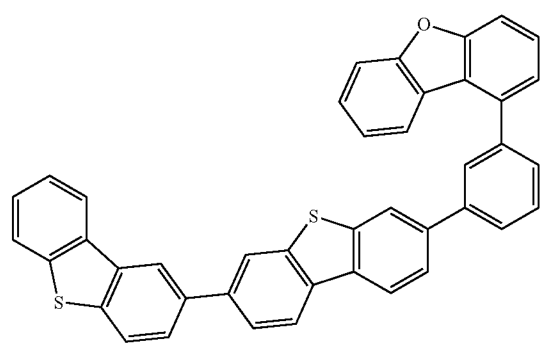
[3-111]
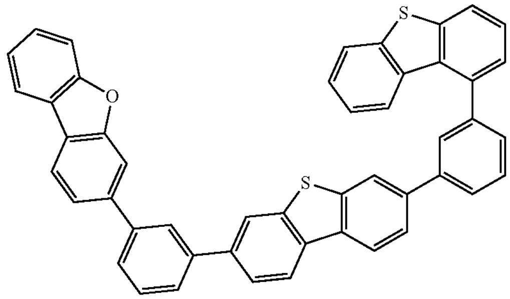
[3-112]
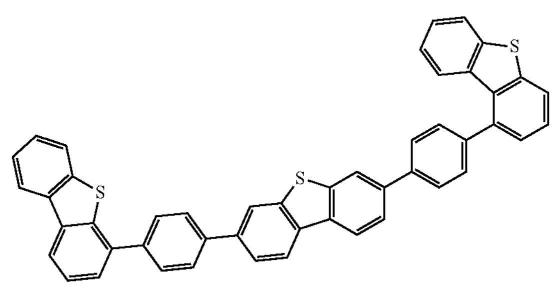

-continued
[3-113]
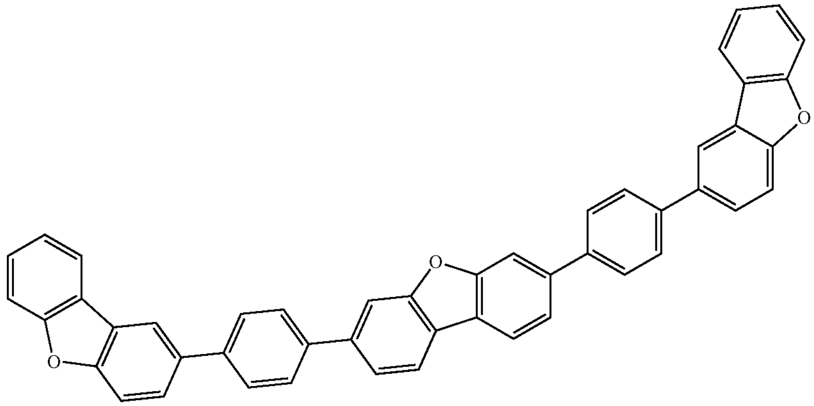
[3-114]
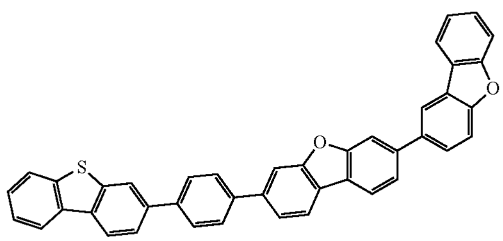
[3-115]
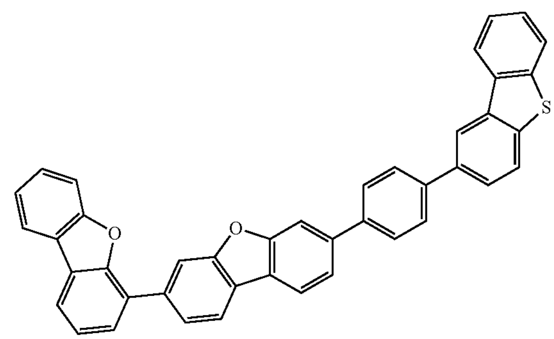
[3-116]
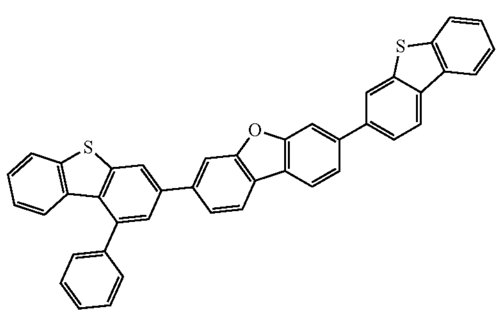
[3-117]
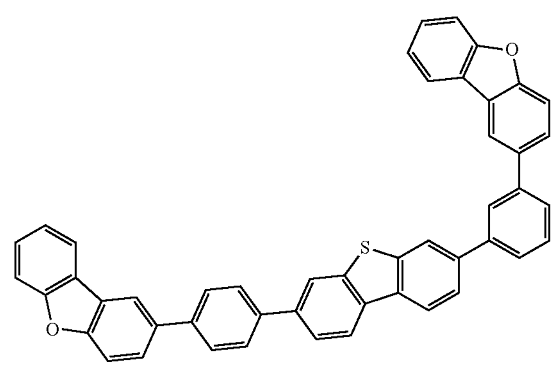
[3-118]
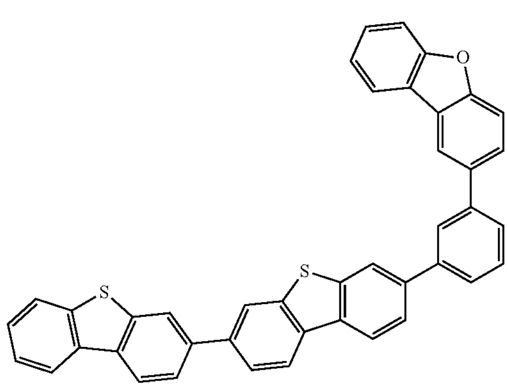
[3-119]
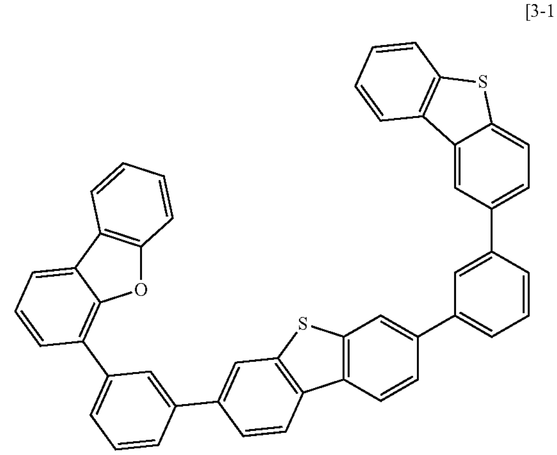

-continued
[3-120]
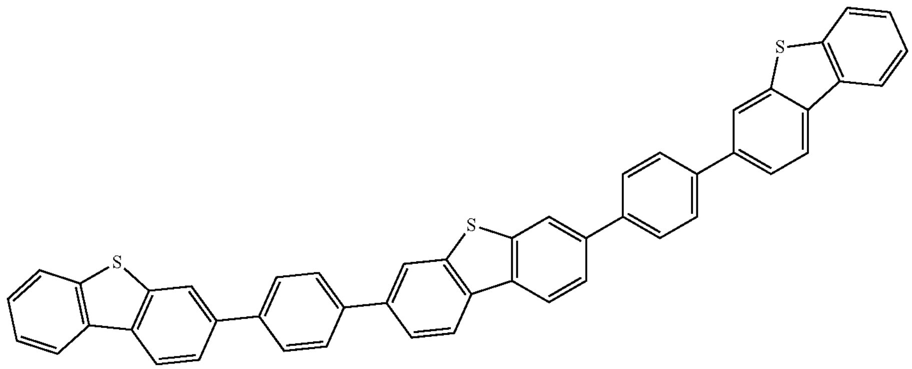
[3-121]
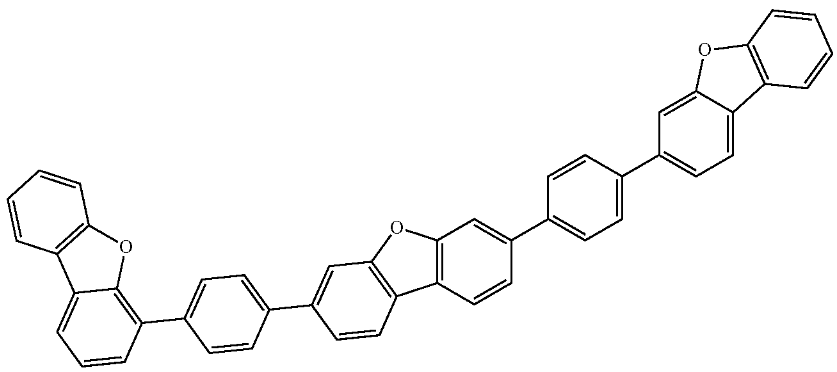
[3-122]
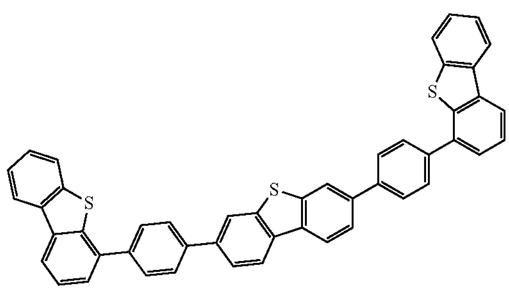
[3-123]
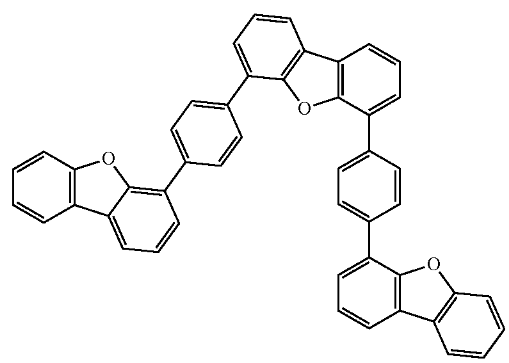
[3-124]
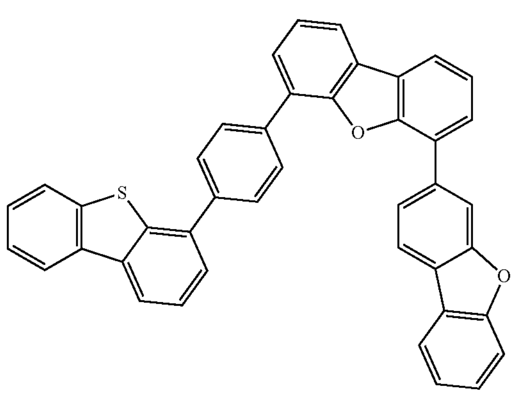
[3-125]
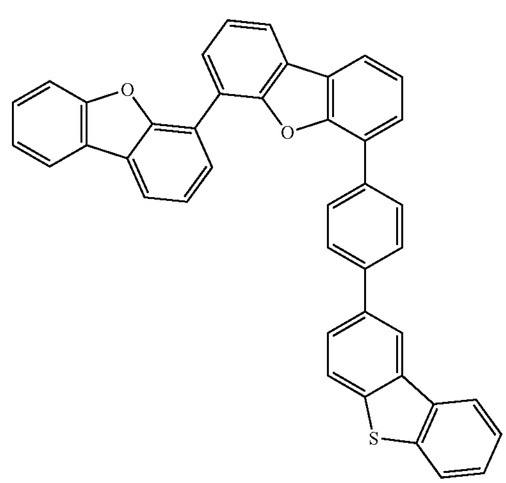

-continued
[3-126]
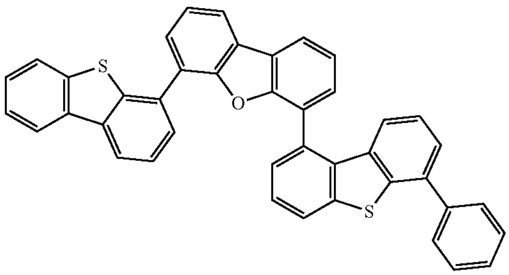
[3-127]
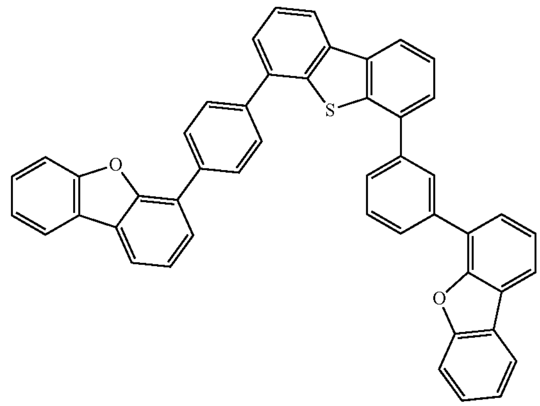
[3-128]
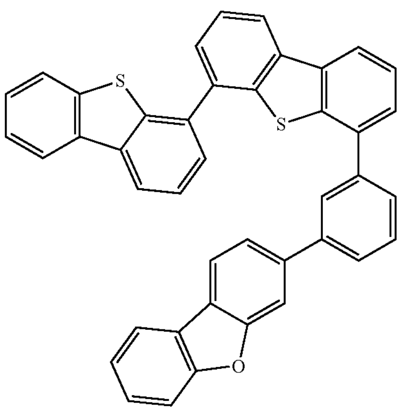
[3-129]
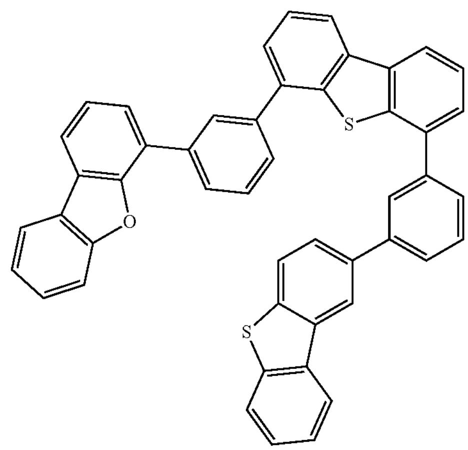
[3-130]
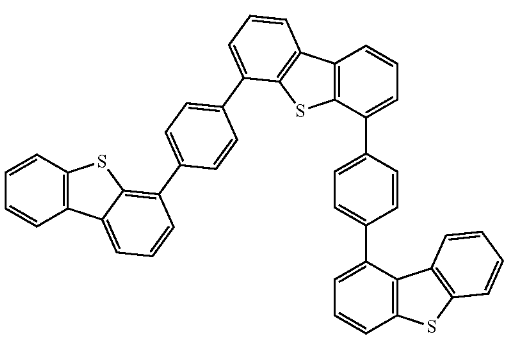
[3-131]
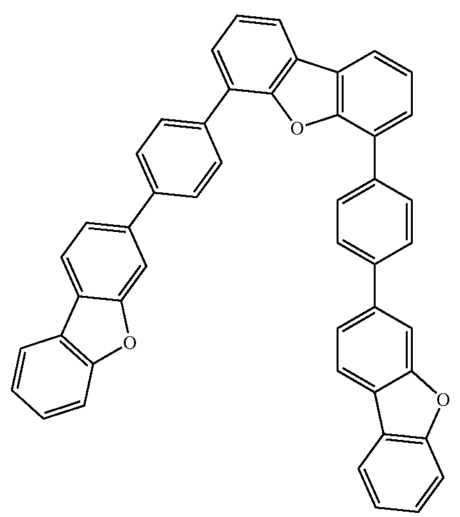

-continued
[3-132]
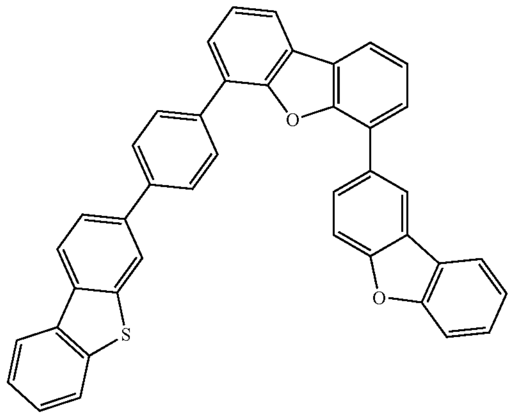
[3-133]
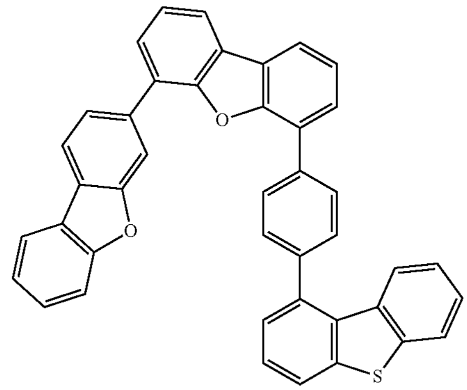
[3-134]
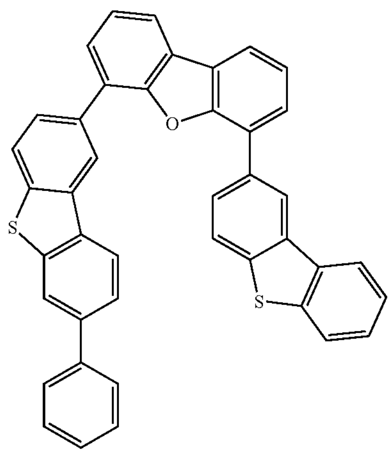
[3-135]
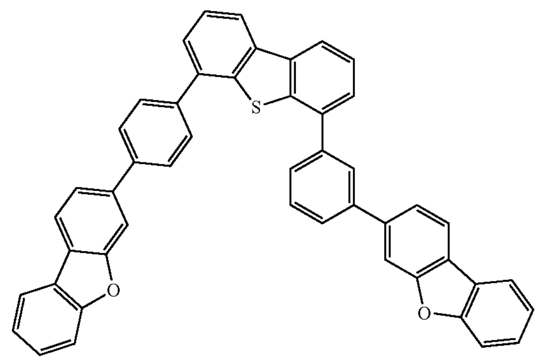
[3-136]
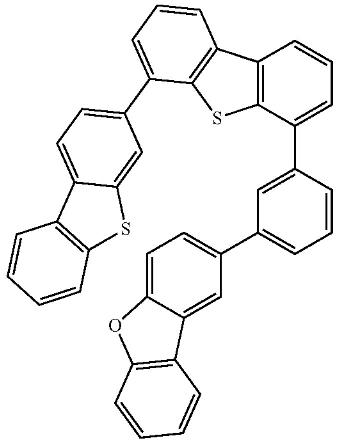
[3-137]
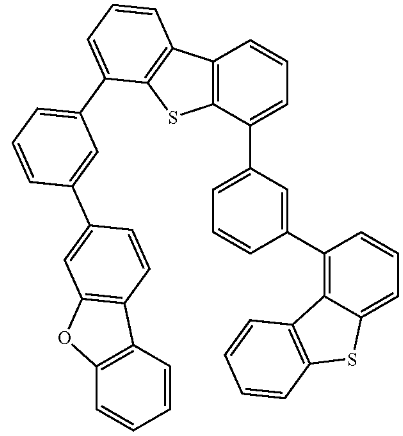

-continued

[3-138]

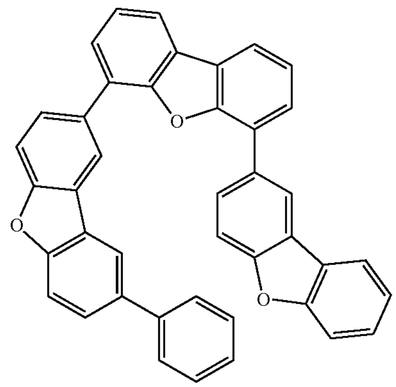

[3-139]

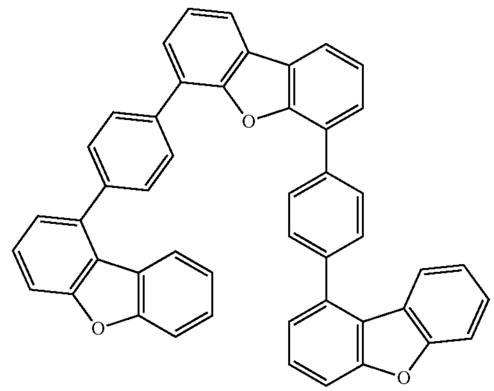

[3-140]

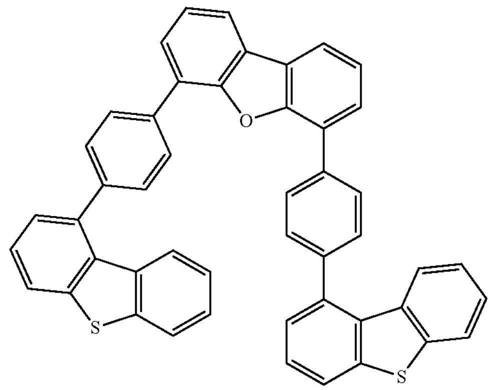

The first compound may include a nitrogen-containing 6-membered ring having high electron transport characteristics, and thus electrons may be stably and effectively transported to lower a driving voltage, to increase current efficiency, and to implement long life-span characteristics of a device.

The second compound may have a structure including carbazole having high HOMO energy, and thus may help effectively inject and transport holes, thereby contributing to improvement of device characteristics.

The third compound may have a wide HOMO-LUMO band gap, thereby helping to control the movement rate of holes and electrons of the first compound and the second compound, and thus hole trapping and exciton quenching may be prevented through relative movement of the light emitting layer region, which contributes to the improvement of the life-span characteristics of the device.

The three-host composition including the first compound, the second compound, and the third compound may achieve an optimum balance achieved by more finely adjusting electron/hole characteristics in the device stack, compared with other compositions, and may help improve device characteristics greatly due to an appropriate balance of charges, compared with a two-host composition such as a composition including only the first compound and the second compound or a composition including only the first compound and the third compound.

In an implementation, the first compound may be represented by the aforementioned Chemical Formula I-A-1, the second compound may be represented by the aforementioned Chemical Formula IIA-2, and the third compound may be represented by the aforementioned Chemical Formula IIIA-2-2.

In Chemical Formula I-A-1, $Z^1$ to $Z^3$ may each be N, $L^1$ to $L^3$ may each independently be, e.g., a single bond or a substituted or unsubstituted phenylene group, and $R^1$ and $R^2$ may each independently be, e.g., a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group.

In Chemical Formula IIA-2, $R^{23}$ to $R^{32}$ may each independently be, e.g., hydrogen, deuterium, a cyano group, a substituted or unsubstituted phenyl group, or a substituted or unsubstituted biphenyl group, $L^4$ and $L^6$ may each independently be, e.g., a single bond, or a substituted or unsubstituted phenylene group, or a substituted or unsubstituted biphenylene group, and $Ar^1$ and $Ar^2$ may each independently be, e.g., a substituted or unsubstituted phenyl group, a substituted or unsubstituted biphenyl group, a substituted or unsubstituted terphenyl group, a substituted or unsubstituted naphthyl group, a substituted or unsubstituted phenanthrene group, a substituted or unsubstituted triphenylene group, a substituted or unsubstituted fluorenyl group, a substituted or unsubstituted dibenzofuranyl group, or a substituted or unsubstituted dibenzothiophenyl group.

In Chemical Formula IIIA-2-2, $X^2$ and $X^3$ may each independently be, e.g., O or S, $R^{40}$ to $R^{45}$ may each independently be, e.g., hydrogen or a substituted or unsubstituted C6 to C18 aryl group, $L^8$ may be a single bond, and $L^9$ to $L^{11}$ may each independently be, e.g., a single bond, a substituted or unsubstituted phenylene group, or a substituted or unsubstituted biphenylene group.

In an implementation, the first compound may be represented by the aforementioned Chemical Formula I-E-1, and the second compound may be represented by the aforementioned Chemical Formula IIA-1, and the third compound may be represented by the aforementioned Chemical Formula IIIA-4-1.

In Chemical Formula I-E-1, $X^1$ may be, e.g., NR, O, or S, $R^b$ may be, e.g., a substituted or unsubstituted phenyl group, a substituted or unsubstituted biphenyl group, or a substituted or unsubstituted terphenyl group, $Z^1$ to $Z^3$ may each be N, $L^1$ to $L^3$ may each independently be, e.g., a single bond or a substituted or unsubstituted phenylene group, and $R^1$ and $R^2$ may each independently be, e.g., a substituted or unsubstituted phenyl group, or a substituted or unsubstituted biphenyl group.

In Chemical Formula IIA-1, $R^{23}$ to $R^{32}$ may each independently be, e.g., hydrogen, deuterium, a cyano group, a substituted or unsubstituted phenyl group, or a substituted or unsubstituted biphenyl group, $L^4$ and $L^6$ may each independently be, e.g., a single bond, a substituted or unsubstituted phenylene group, or a substituted or unsubstituted biphenylene group, and $Ar^1$ and $Ar^2$ may each independently be, e.g., a substituted or unsubstituted phenyl group, a substituted or unsubstituted biphenyl group, a substituted or unsubstituted terphenyl group, a substituted or unsubstituted naphthyl group, a substituted or unsubstituted phenanthrene group, a substituted or unsubstituted triphenylene group, a substituted or unsubstituted fluorenyl group, a substituted or unsubstituted dibenzofuranyl group, or a substituted or unsubstituted dibenzothiophenyl group.

In Chemical Formula IIIA-4-1, $X^2$ and $X^3$ may each independently be, e.g., O or S, $R^{40}$ to $R^{45}$ may each independently be, e.g., hydrogen or a substituted or unsubstituted C6 to C18 aryl group, $L^8$ may be a single bond, and $L^9$ to $L^{11}$ may each independently be, e.g., a single bond, a substituted or unsubstituted phenylene group, or a substituted or unsubstituted biphenylene group.

In an implementation, the first compound may be represented by the aforementioned Chemical Formula I-E-1, and the second compound may be represented by the aforementioned Chemical Formula IIA-I or Chemical Formula IIF, and the third compound may be represented by the aforementioned Chemical Formula IIIB-4-1 or Chemical Formula IIIB-4-5.

In Chemical Formula I-E-1, $X^1$ may be, e.g., $NR^b$, O, or S, $R^b$ may be, e.g., a substituted or unsubstituted phenyl group, a substituted or unsubstituted biphenyl group, or a substituted or unsubstituted terphenyl group, $Z^1$ to $Z^3$ may each be N, $L^1$ to $L^3$ may each independently be, e.g., a single bond or a substituted or unsubstituted phenylene group, and $R^1$ and $R^2$ may each independently be, e.g., a substituted or unsubstituted phenyl group, or a substituted or unsubstituted biphenyl group.

In Chemical Formula IIA-I and Chemical Formula IIF, $R^{23}$ to $R^{38}$ may each independently be, e.g., hydrogen, deuterium, a cyano group, a substituted or unsubstituted phenyl group, or a substituted or unsubstituted biphenyl group, $L^4$, $L^6$, and $L^7$ may each independently be, e.g., a single bond, a substituted or unsubstituted phenylene group, or a substituted or unsubstituted biphenylene group, and $Ar^1$ to $Ar^3$ may each independently be, e.g., a substituted or unsubstituted phenyl group, a substituted or unsubstituted biphenyl group, a substituted or unsubstituted terphenyl group, a substituted or unsubstituted naphthyl group, a substituted or unsubstituted phenanthrene group, a substituted or unsubstituted triphenylene group, a substituted or unsubstituted fluorenyl group, a substituted or unsubstituted dibenzofuranyl group, or a substituted or unsubstituted dibenzothiophenyl group.

In Chemical Formula IIIB-4-1 and Chemical Formula IIIB-4-5, $X^2$ to $X^4$ may each independently be, e.g., O or S, $R^{40}$, $R^{41}$, and $R^{43}$ to $R^{48}$ may each independently be, e.g., hydrogen or a substituted or unsubstituted C6 to C18 aryl group, and $L^8$ to $L^{11}$ may each independently be, e.g., a single bond, or a substituted or unsubstituted phenylene group.

In the composition for an organic optoelectronic device, the first compound may be included in an amount of, e.g., about 20 wt % to about 50 wt %, based on a total weight of the first compound, the second compound, and the third compound, the second compound may be included in an amount of, e.g., about 40 wt % to about 60 wt %, based on the total weight of the first compound, the second compound, and the third compound, and the third compound may be included in an amount of, e.g., about 10 wt % to about 30 wt %, based on the total weight of the first compound, the second compound, and the third compound.

Within the above range, e.g., the first compound may be included in an amount of about 25 wt % to about 45 wt % based on the total weight of the first compound, the second compound, and the third compound, the second compound may be included in an amount of about 45 wt % to about 60 wt % based on the total weight of the first compound, the second compound, and the third compound, and the third compound may be included in an amount of about 10 wt % to about 25 wt % based on the total weight of the first compound, the second compound, and the third compound.

In an implementation, the first compound may be included in an amount of about 30 wt % to about 40 wt % based on the total weight of the first compound, the second compound, and the third compound, the second compound may be included in an amount of about 45 wt % to about 55 wt % based on the total weight of the first compound, the second compound, and the third compound, and the third compound may be included in an amount of about 10 wt % to about 20 wt % based on the total weight of the first compound, the second compound, and the third compound.

In an implementation, the composition for an organic optoelectronic device may include the first compound: the second compound: the third compound in a weight ratio of about 35:55:10, or about 32:48:20. Within the above ranges, the electron transport capability of the first compound, the hole transport capability of the second compound, and the buffering capability of the third compound are properly balanced, thereby improving the efficiency and life-span of the device.

The composition for an organic optoelectronic device may further include one or more other compounds in addition to the aforementioned first compound, second compound, and third compound.

The composition for an organic optoelectronic device may further include a dopant. The dopant may be, e.g., a phosphorescent dopant. The dopant may be, e.g., a red, green or blue phosphorescent dopant. The dopant may be, e.g., a green phosphorescent dopant.

The dopant may be a material mixed with the composition including the first compound, the second compound, and the third compound in a small amount to cause light emission and may be a material such as a metal complex that emits light by multiple excitation into a triplet or more. The dopant may be, e.g., an inorganic, organic, or organic-inorganic compound, and one or more types thereof may be used.

Examples of the dopant may include a phosphorescent dopant and examples of the phosphorescent dopant may be an organometal compound including Ir, Pt, Os, Ti, Zr, Hf, Eu, Tb, Tm, Fe, Co, Ni, Ru, Rh, Pd, or a combination thereof. In an implementation, the phosphorescent dopant may be, e.g., a compound represented by Chemical Formula Z.

$L^A M X^A$ [Chemical Formula Z]

In Chemical Formula Z, M may be, e.g., a metal, and $L^A$ and $X^A$ may each independently be, e.g., ligands forming a complex compound with M.

The M may be, e.g., Ir, Pt, Os, Ti, Zr, Hf, Eu, Tb, Tm, Fe, Co, Ni, Ru, Rh, Pd, or a combination thereof and $L^A$ and $X^A$ may be, e.g., bidentate ligands.

Examples of the ligands represented by $L^A$ and $X^A$ may be ligands of Group D.

[Group D]

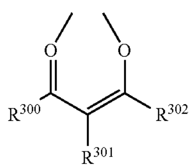

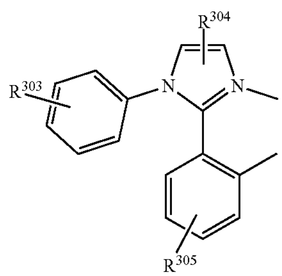

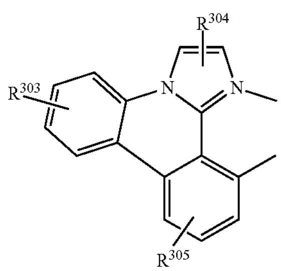

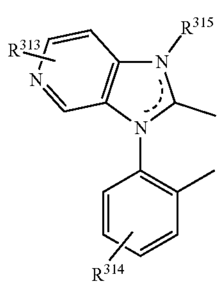

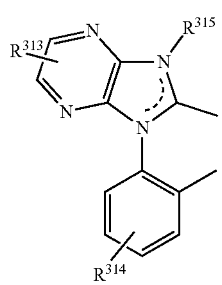

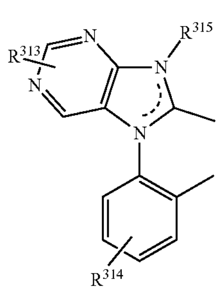

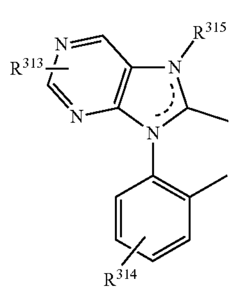

-continued

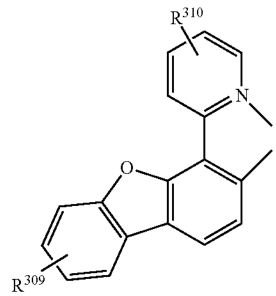

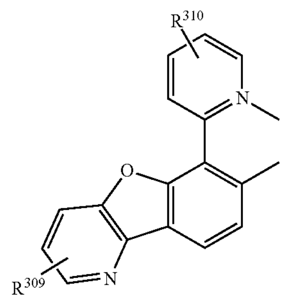

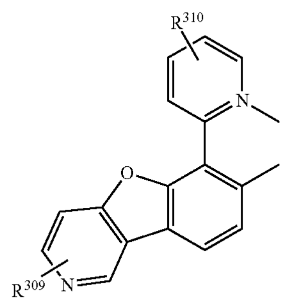

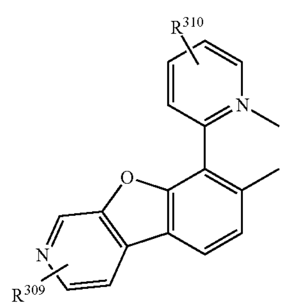

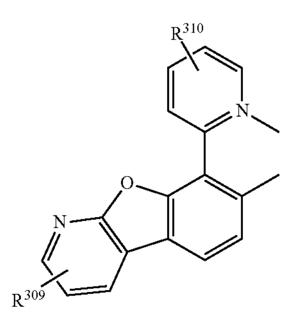

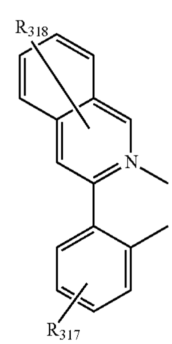

-continued

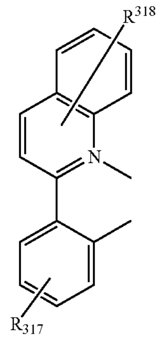

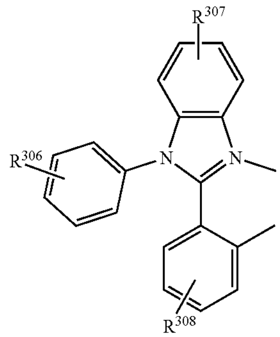

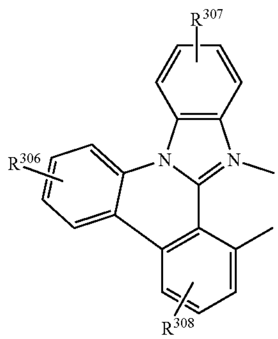

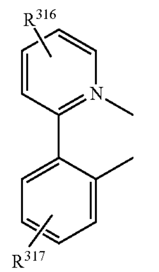

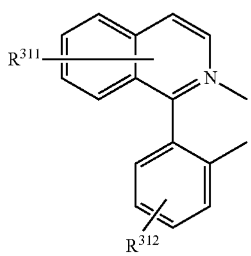

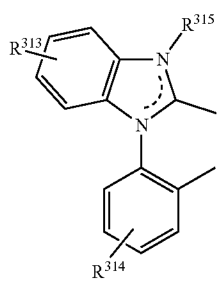

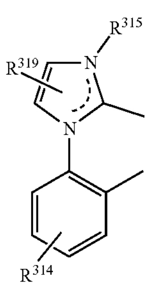

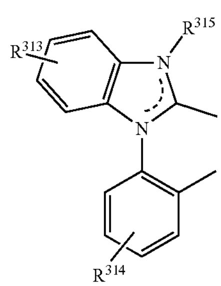

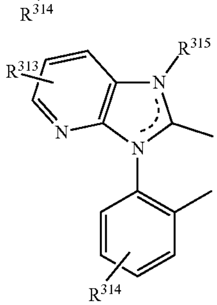

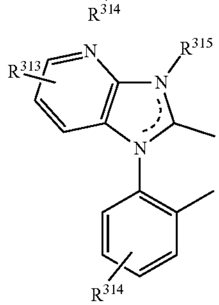

-continued

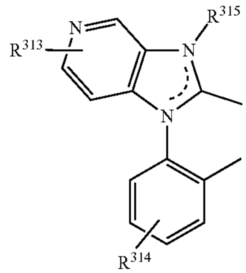

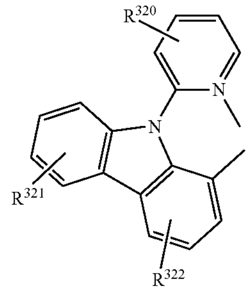

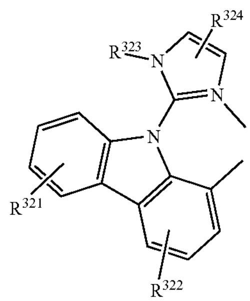

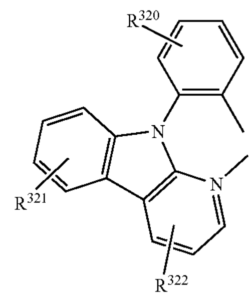

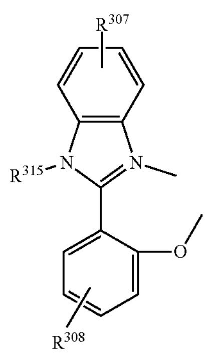

In Group D, $R^{300}$ to $R^{302}$ may each independently be, e.g., hydrogen, deuterium, a C1 to C30 alkyl group that is unsubstituted or substituted with a halogen, a C6 to C30 aryl group that is unsubstituted or substituted with a C1 to C30 alkyl, or a halogen.

$R^{303}$ to $R^{324}$ may each independently be, e.g., hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, a substituted or unsubstituted C6 to C30 arylamino group, SFs, a trialkylsilyl group having a substituted or unsubstituted C1 to C30 alkyl group, a dialkylarylsilyl group having a substituted or unsubstituted C1 to C30 alkyl group and C6 to C30 aryl group, or a triarylsilyl group having a substituted or unsubstituted C6 to C30 aryl group.

In an implementation, a dopant represented by Chemical Formula Z-1 may be included.

[Chemical Formula Z-1]

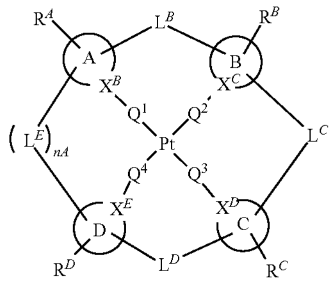

In Chemical Formula Z-1, rings A, B, C, and D may each independently be, e.g., a 5-membered or 6-membered carbocyclic or heterocyclic ring.

$R^A$, $R^B$, $R^C$, and $R^D$ may each independently be, e.g., mono-, di-, tri-, or tetra-substitution, or unsubstitution.

$L^B$, $L^C$, and $L^D$ may each independently be, e.g., a direct bond, BR, NR, PR, O, S, Se, C═O, S═O, $SO_2$, CRR', SiRR', GeRR', or a combination thereof.

When nA is 1, $L^E$ may be, e.g., a direct bond, BR, NR, PR, O, S, Se, C═O, S═O, $SO_2$, CRR', SiRR', GeRR', or a combinations thereof, when nA is O, $L^E$ does not exist.

$R^A$, $R^B$, $R^C$, $R^D$, R, and R' may each independently be, e.g., hydrogen, deuterium, a halogen, an alkyl group, a cycloalkyl group, a heteroalkyl group, an arylalkyl group, an alkoxy group, an aryloxy group, an amino group, a silyl group, an alkenyl group, a cycloalkenyl group, a heteroalkenyl group, an alkynyl group, an aryl group, a heteroaryl group, an acyl group, a carbonyl group, a carboxylic acid group, an ester group, a nitrile group, an isonitrile group, a sulfanyl group, a sulfinyl group, a sulfonyl group, a phosphino group, or a combination thereof, any adjacent $R^A$, $R^B$, $R^C$, $R^D$, R, and R' may be optionally linked to each other to provide a ring; $X^B$, $X^C$, X, and $X^E$ may each independently be, e.g., carbon or nitrogen; and $Q^1$, $Q^2$, $Q^3$, and $Q^4$ may each independently be, e.g., oxygen or a direct bond.

The dopant according to an embodiment may be a platinum complex, and may be, e.g., represented by Chemical Formula IV.

[Chemical Formula IV]

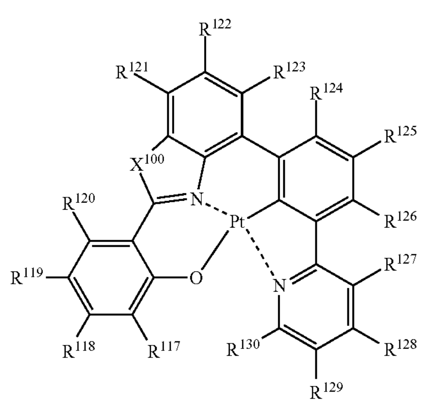

In Chemical Formula IV, $X^{100}$ may be, e.g., O, S, or $N(R^{131})$ $R^{117}$ to $R^{131}$ may each independently be, e.g., hydrogen, deuterium, a substituted or unsubstituted C1 to C10 alkyl group, a substituted or unsubstituted C6 to C20 aryl group, or $—SiR^{132}R^{133}R^{134}$.

$R^{132}$ to $R^{134}$ may each independently be, e.g., a C1 to C6 alkyl group.

In an implementation, at least one of $R^{117}$ to $R^{131}$ may be, e.g., $—SiR^{132}R^{133}R^{134}$ or a tert-butyl group.

Hereinafter, an organic optoelectronic device including the aforementioned composition for an organic optoelectronic device is described.

The organic optoelectronic device may be a suitable device to convert electrical energy into photoenergy and vice versa, and may be, e.g., an organic photoelectric device, an organic light emitting diode, an organic solar cell, or an organic photoconductor drum.

Herein, an organic light emitting diode as one example of an organic optoelectronic device is described referring to drawings.

Figure 2:
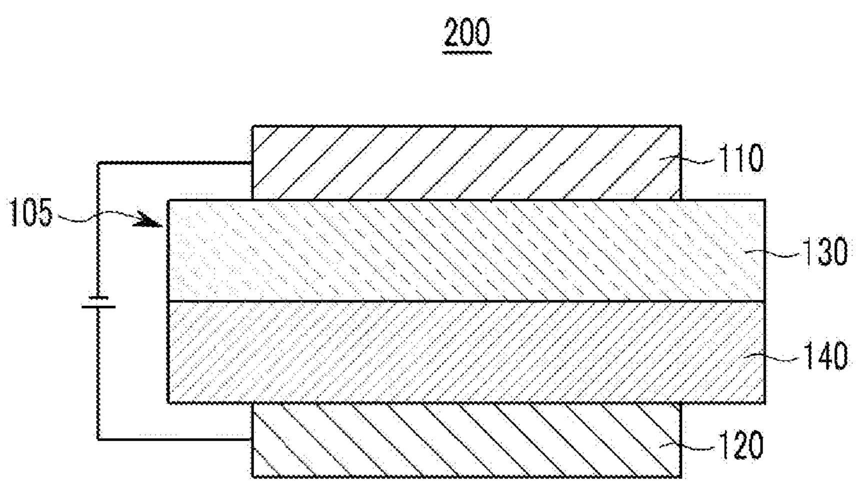

FIGS. 1 and 2 are cross-sectional views showing organic light emitting diodes according to embodiments.

Referring to FIG. 1, an organic light emitting diode 100 according to an embodiment includes an anode 120 and a cathode 110 facing each other and an organic layer 105 disposed between the anode 120 and cathode 110.

The anode 120 may be made of a conductor having a large work function to help hole injection, and may be, e.g., a metal, a metal oxide or a conductive polymer. The anode 120 may be, e.g., a metal such as nickel, platinum, vanadium, chromium, copper, zinc, gold, and the like or an alloy thereof; a metal oxide such as zinc oxide, indium oxide, indium tin oxide (ITO), indium zinc oxide (IZO), or the like; a combination of a metal and an oxide such as ZnO and Al or $SnO_2$ and Sb; a conductive polymer such as poly(3-methylthiophene), poly(3,4-(ethylene-1,2-dioxy)thiophene) (PEDOT), polypyrrole, or polyaniline.

The cathode 110 may be made of a conductor having a small work function to help electron injection, and may be, e.g., a metal, a metal oxide, or a conductive polymer. The cathode 110 may be, e.g., a metal such as magnesium, calcium, sodium, potassium, titanium, indium, yttrium, lithium, gadolinium, aluminum silver, tin, lead, cesium, barium, or the like, or an alloy thereof; a multi-layer structure material such as LiF/Al, $LiO_2$/Al, LiF/Ca, LiF/Al, or $BaF_2$/Ca.

The organic layer 105 may include the aforementioned composition for an organic optoelectronic device.

The organic layer 105 may include, e.g., the light emitting layer 130, and the light emitting layer 130 may include, e.g., the aforementioned composition for an organic optoelectronic device.

The aforementioned composition for an organic optoelectronic device may be, e.g., a green light emitting composition.

The light emitting layer 130 may include, e.g., the aforementioned first compound, second compound, and third compound as a phosphorescent host.

Referring to FIG. 2, an organic light emitting diode 200 may further include a hole auxiliary layer 140 in addition to the light emitting layer 130. The hole auxiliary layer 140 further increases hole injection and/or hole mobility and blocks electrons between the anode 120 and the light emitting layer 130. The hole auxiliary layer 140 may be, e.g., a hole transport layer, a hole injection layer, and/or an electron blocking layer, and may include at least one layer.

The hole auxiliary layer 140 may include, e.g., a compound of Group E.

In an implementation, the hole auxiliary layer 140 may include a hole transport layer between the anode 120 and the light emitting layer 130 and a hole transport auxiliary layer between the light emitting layer 130 and the hole transport layer, and at least one of compounds of Group E may be included in the hole transport auxiliary layer.
[Group E]
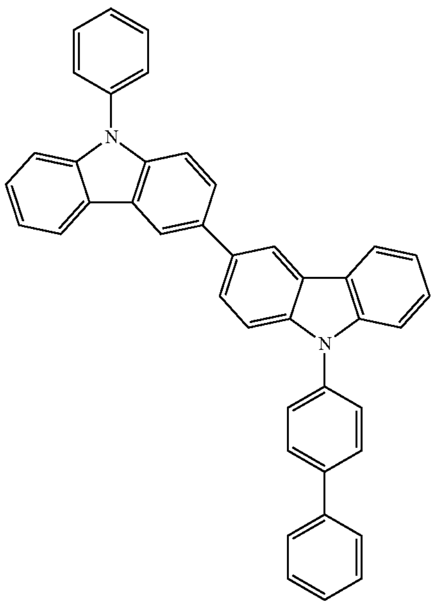
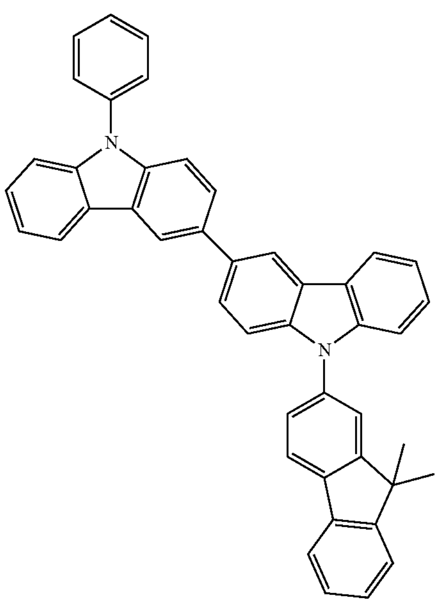
-continued
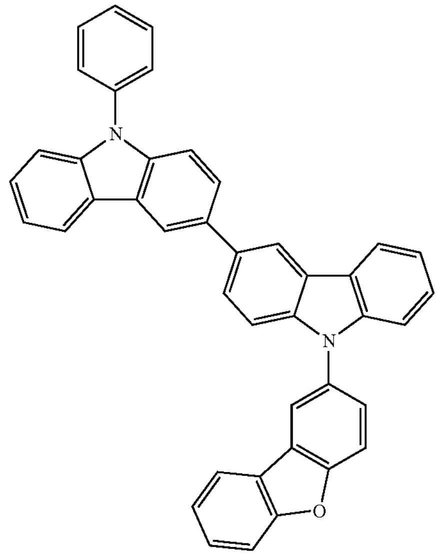
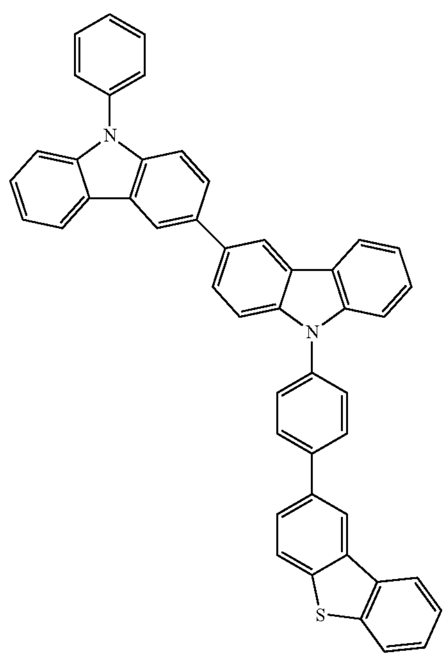

-continued
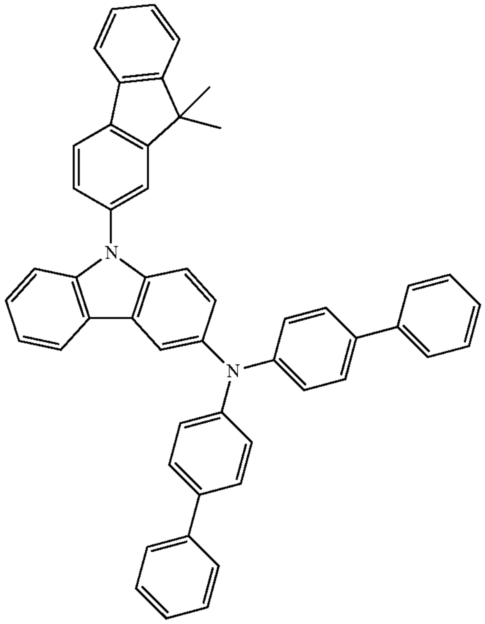
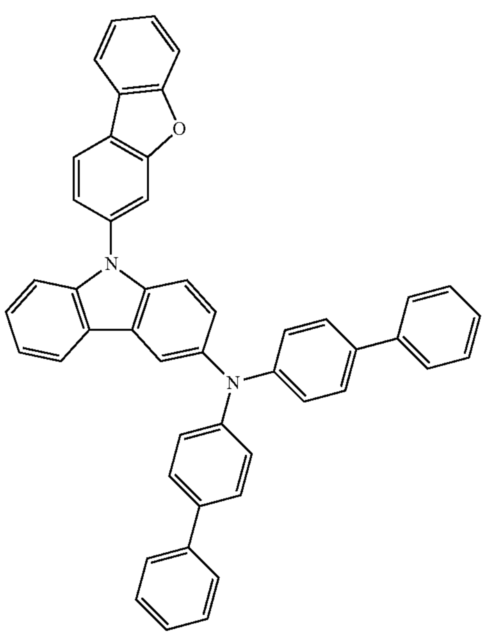
-continued
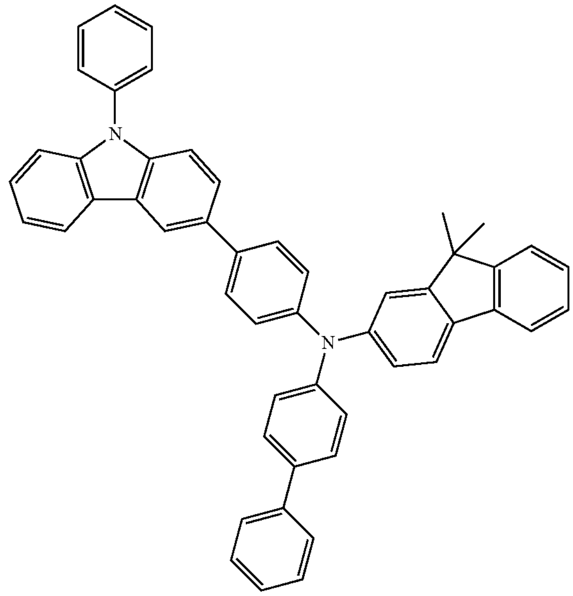
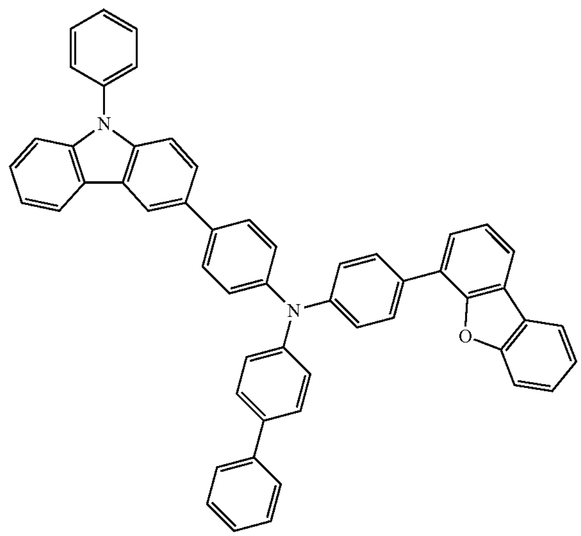
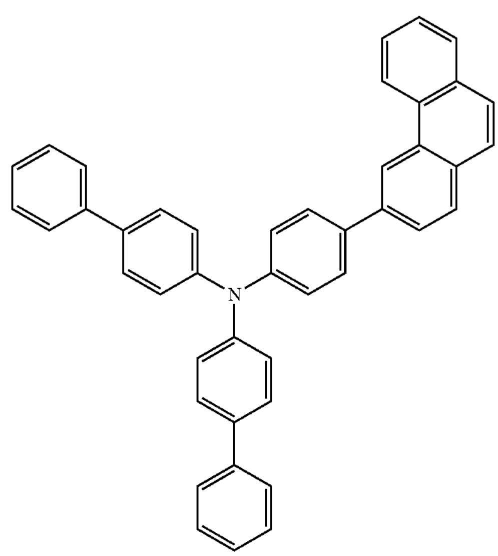

-continued
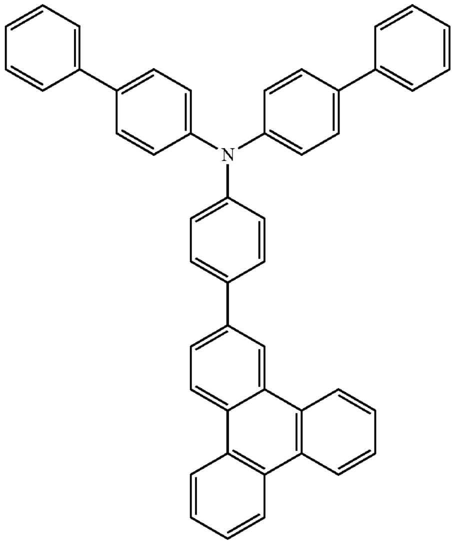
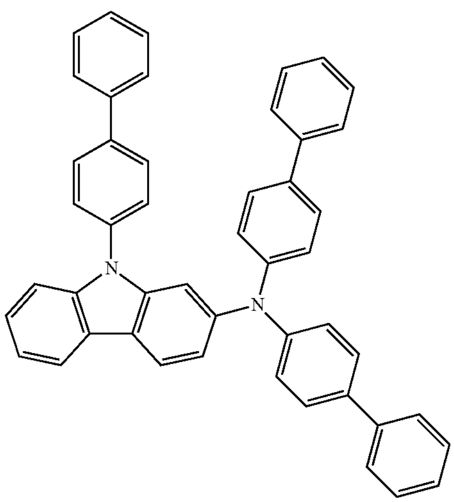
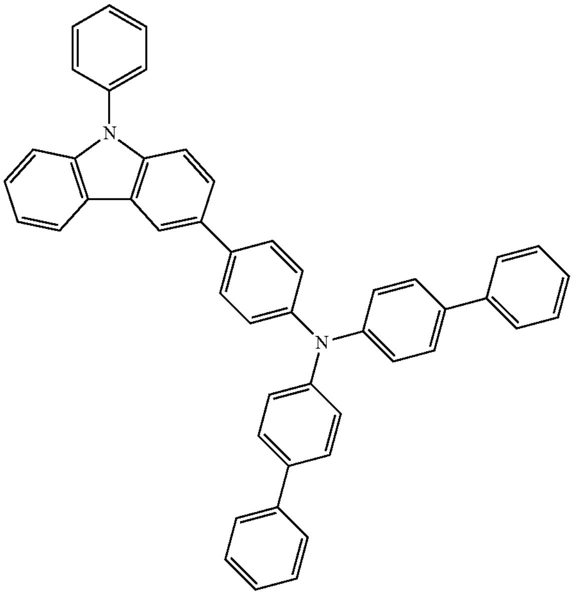
-continued
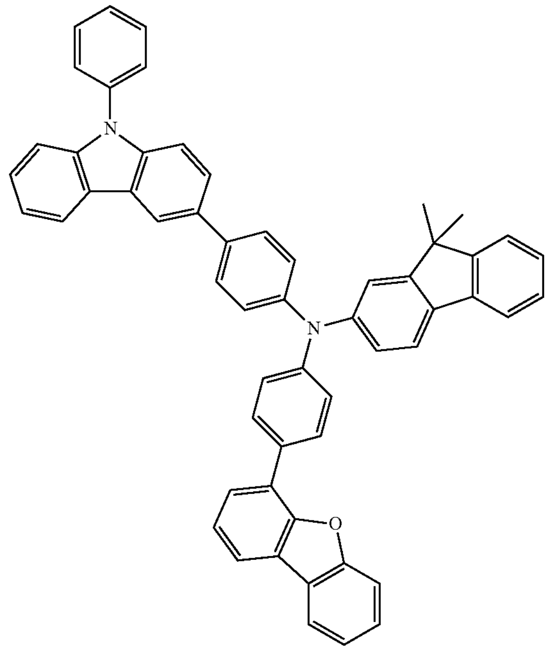
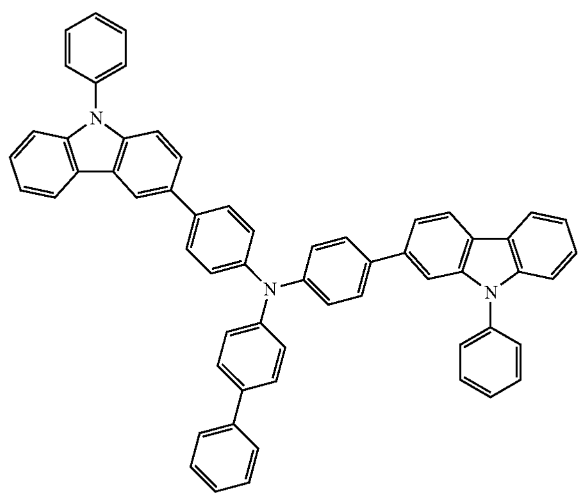
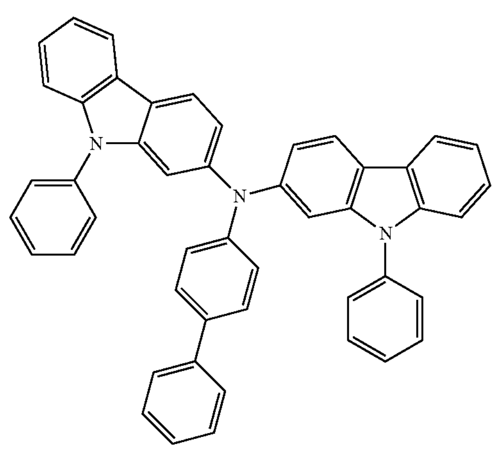

-continued
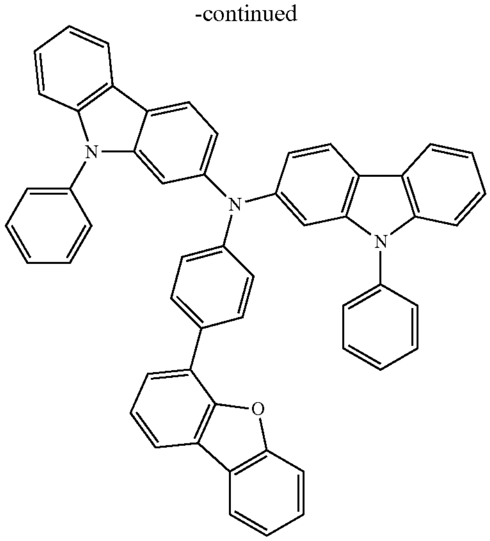
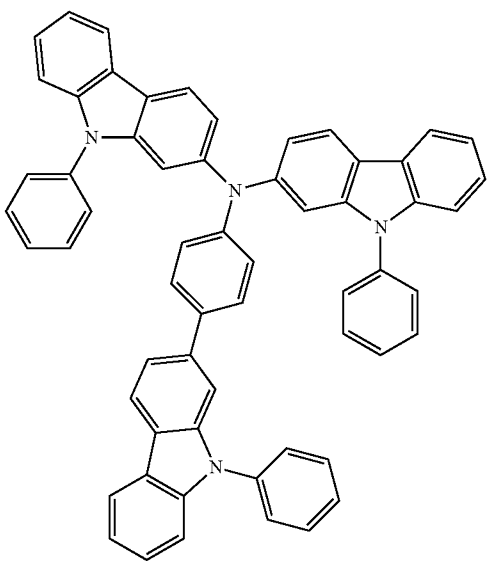
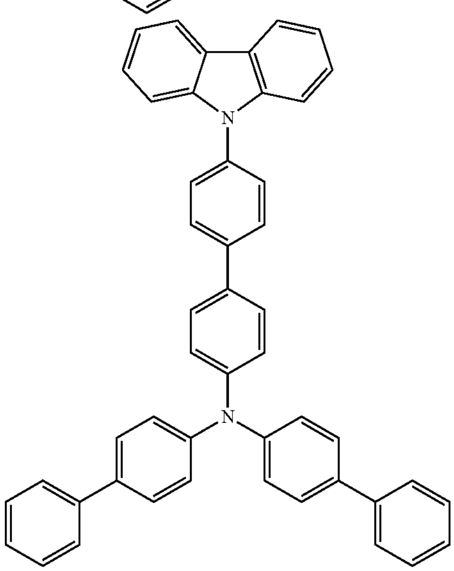
-continued
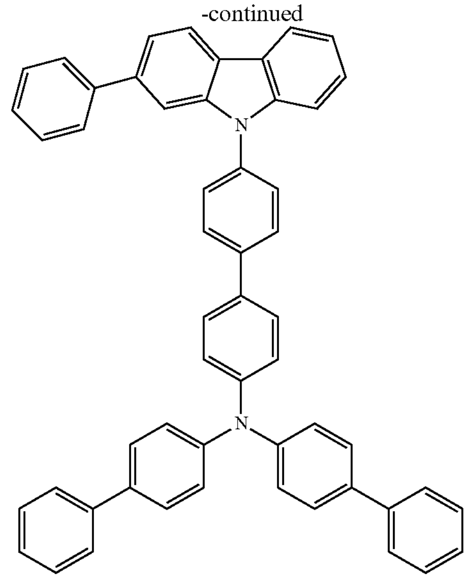
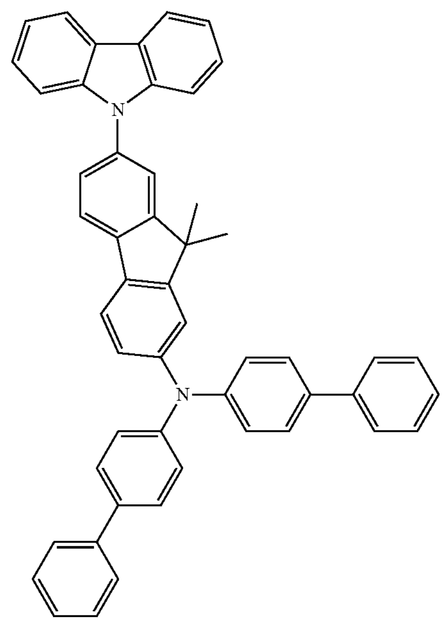
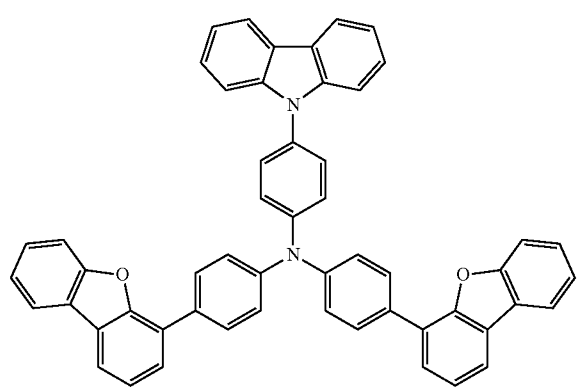

-continued
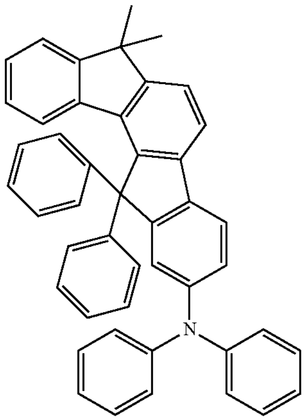
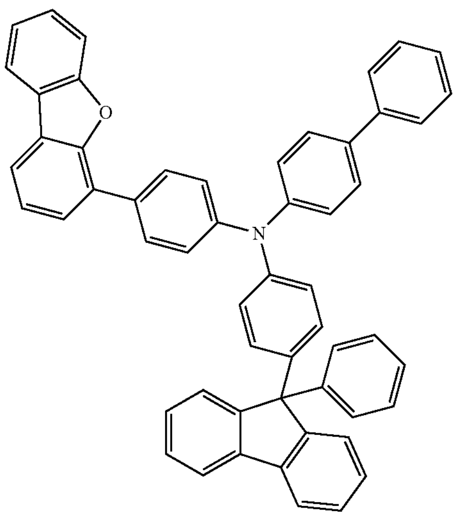
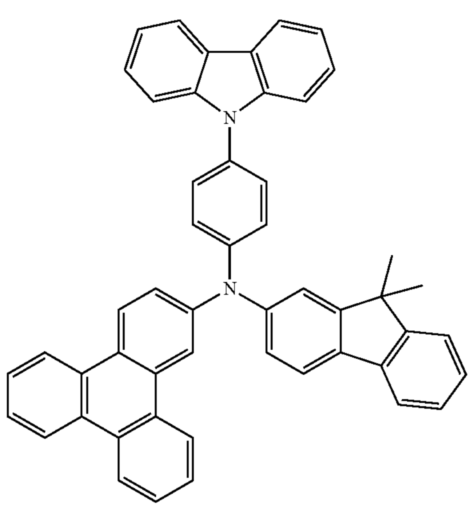
-continued
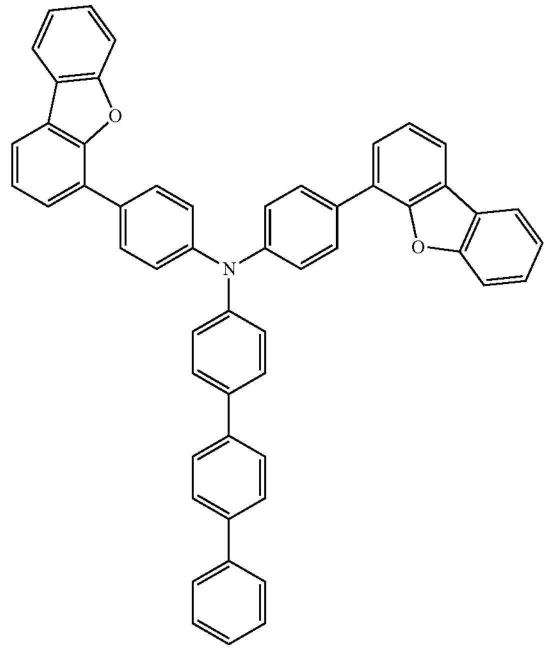
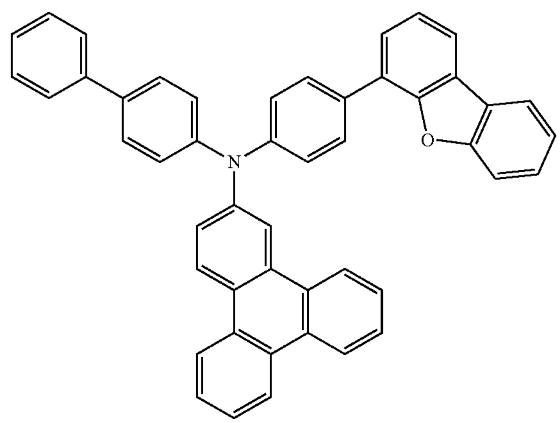
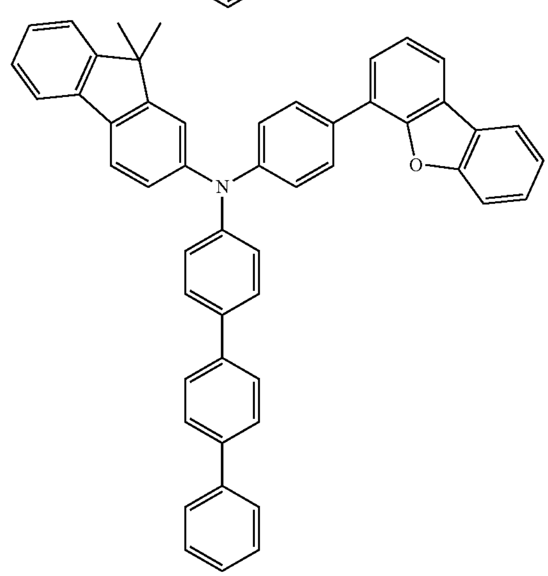

-continued
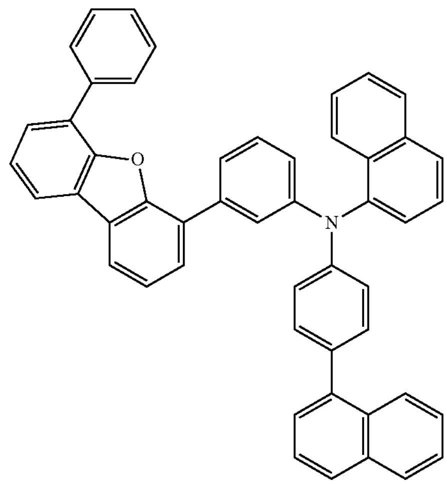
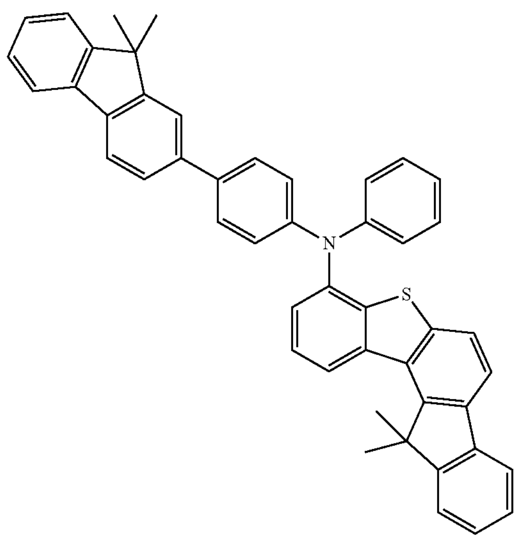
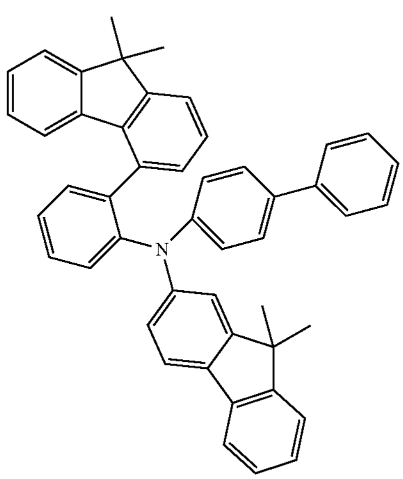
-continued
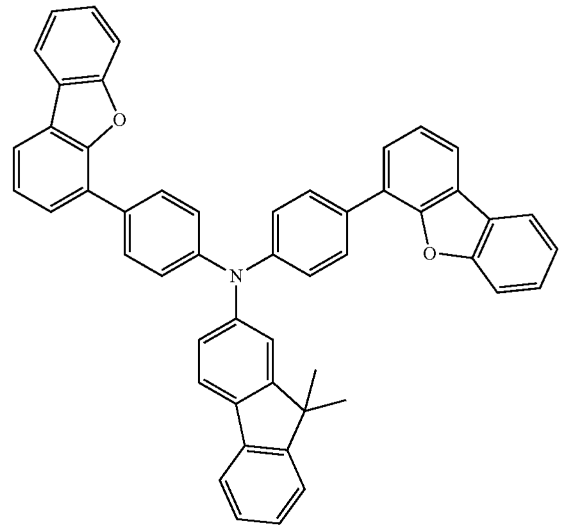
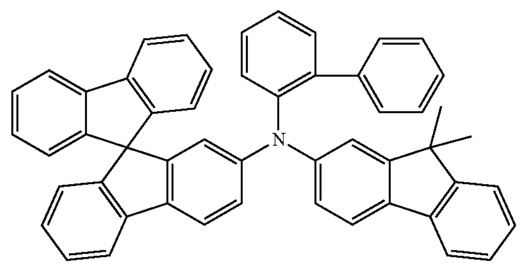
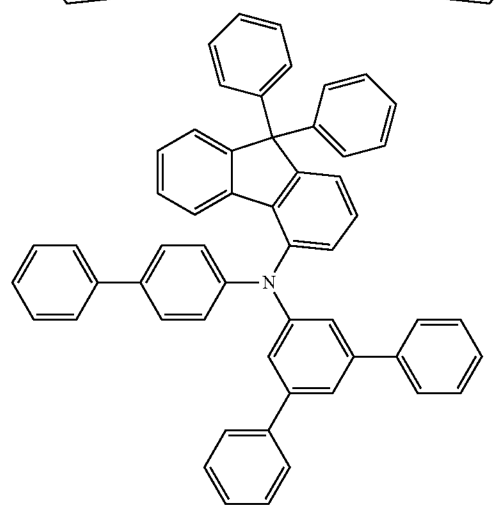
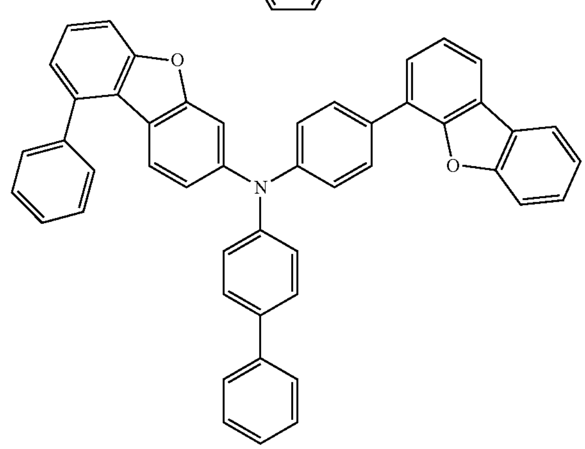

-continued
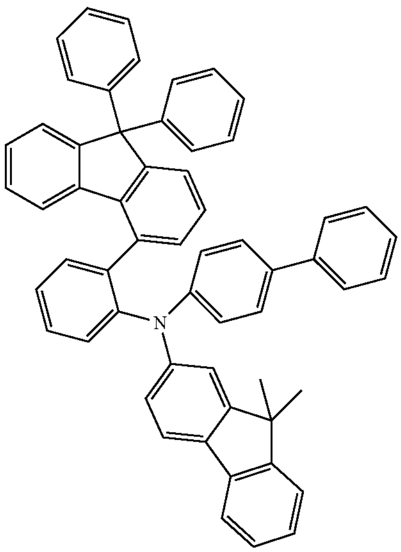
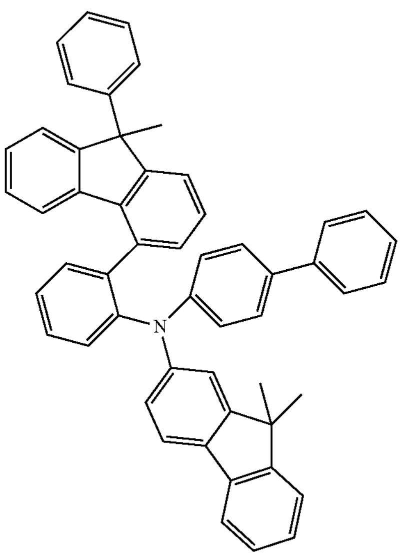
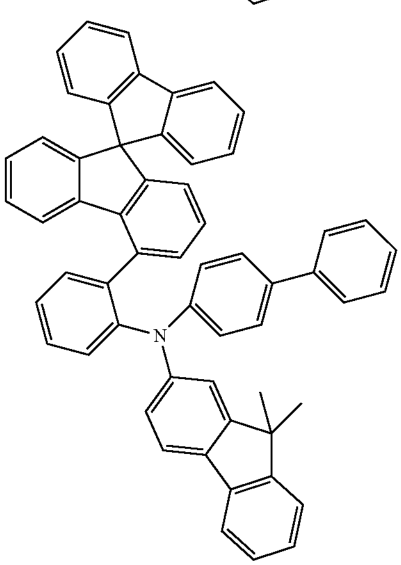
-continued
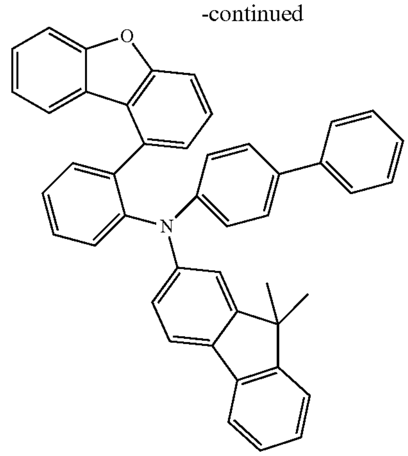
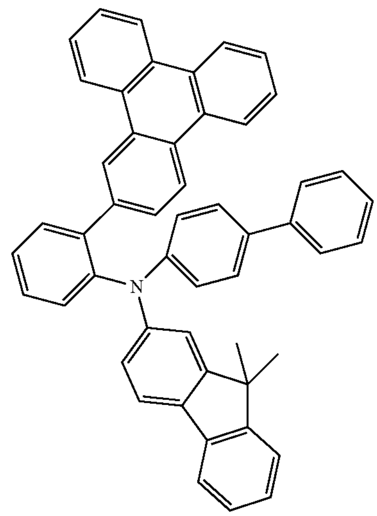
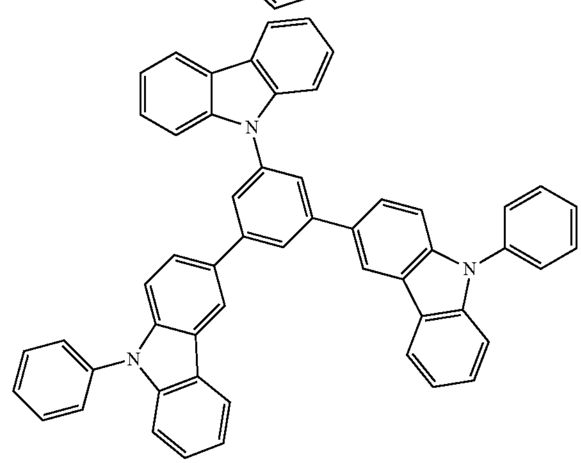
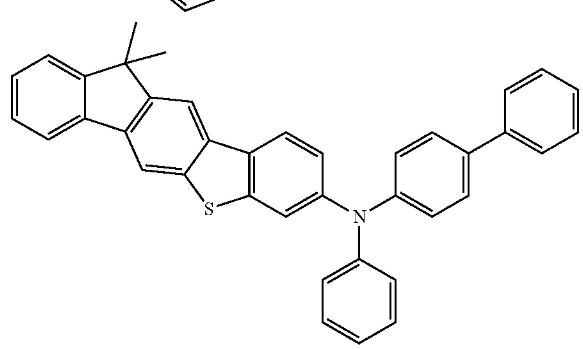

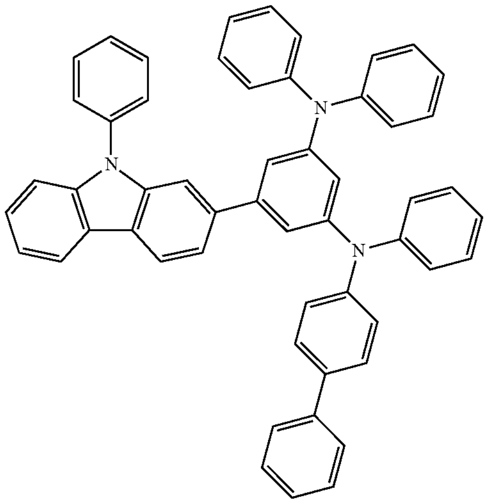
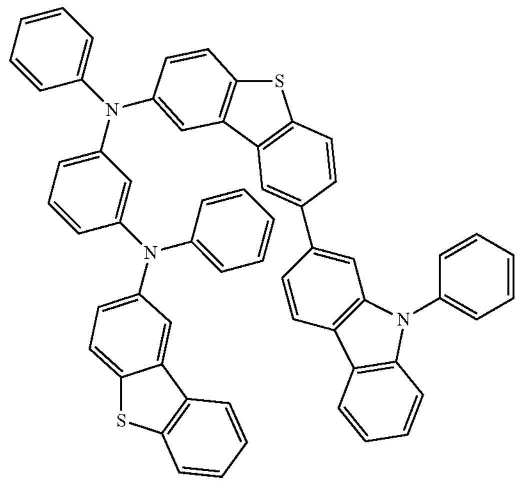
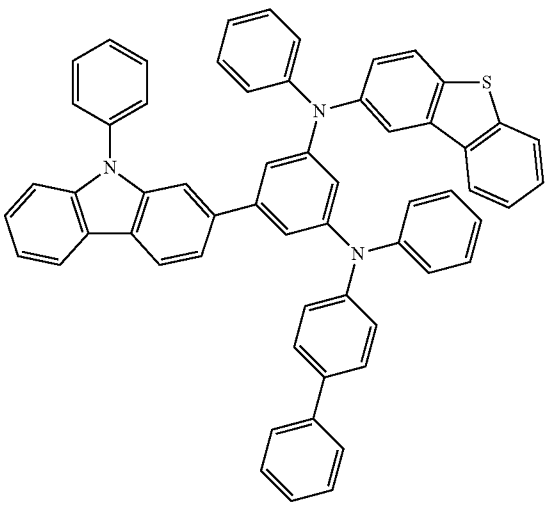
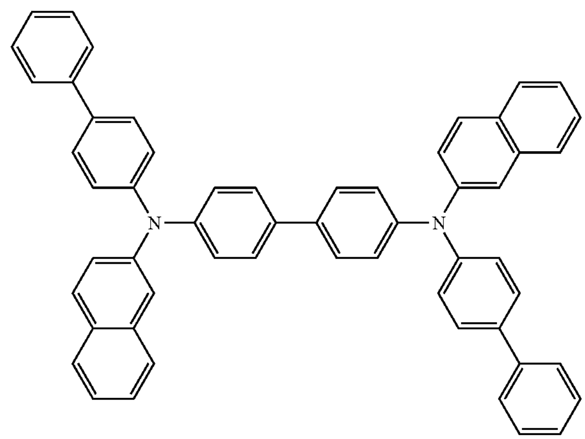
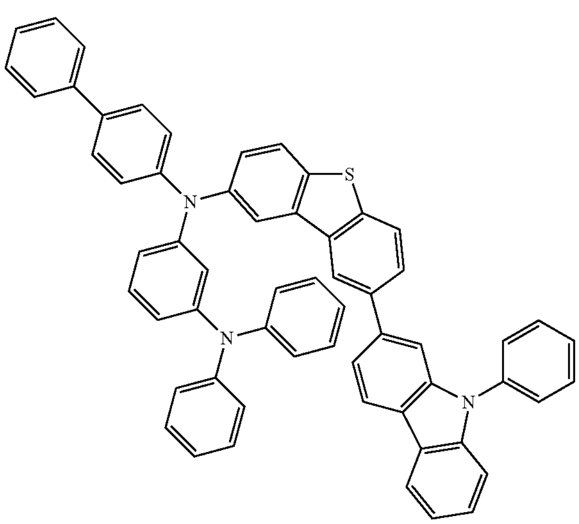
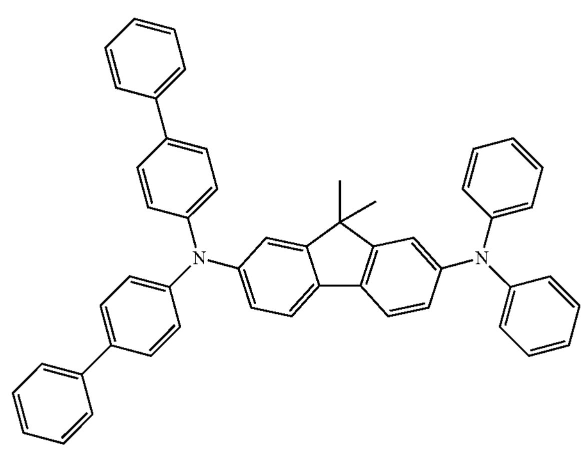

-continued
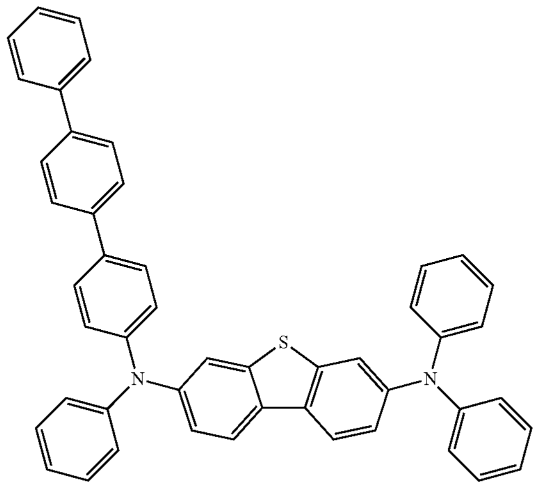
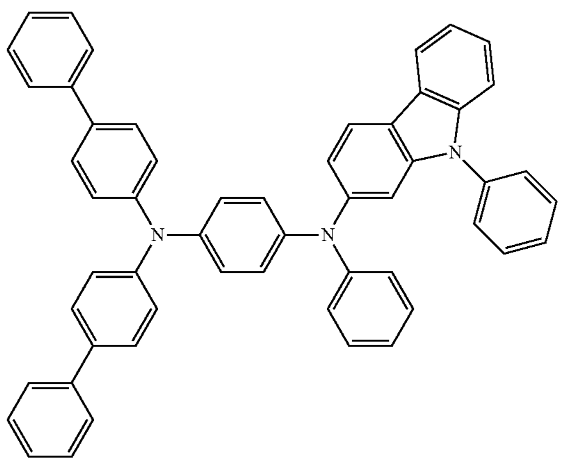
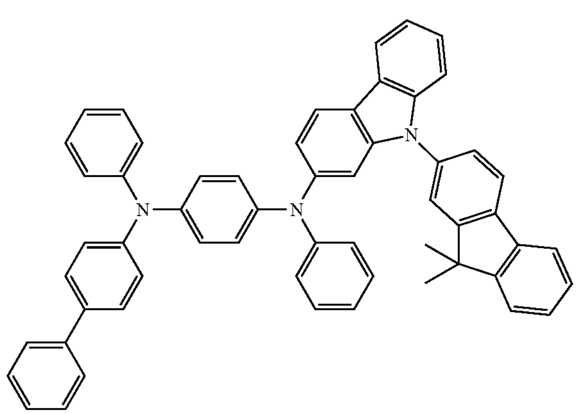
-continued
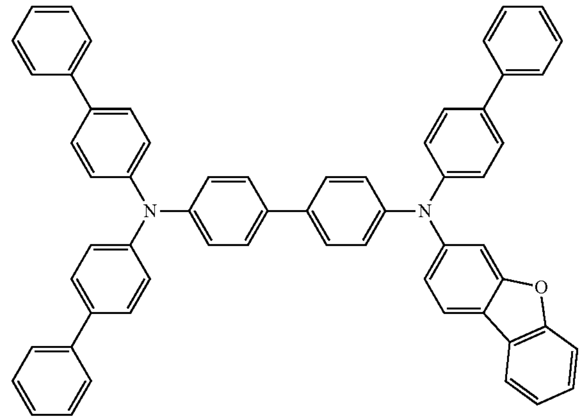
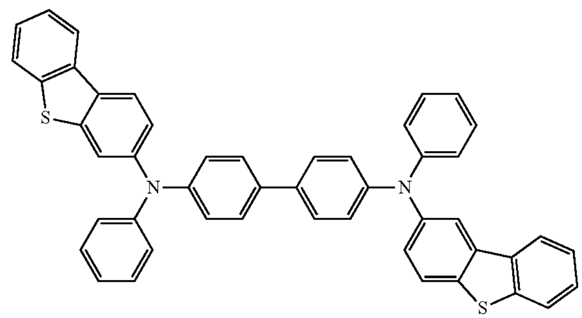
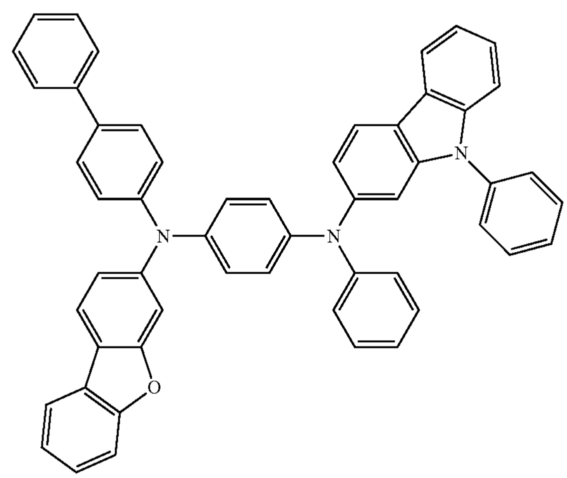
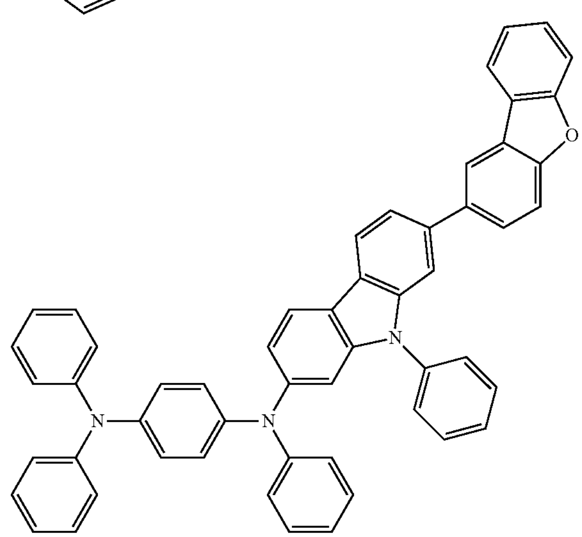

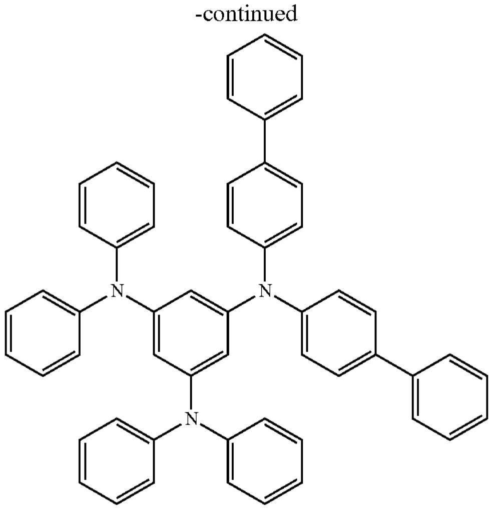
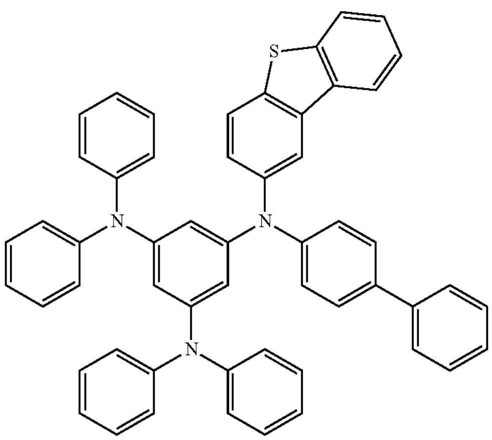
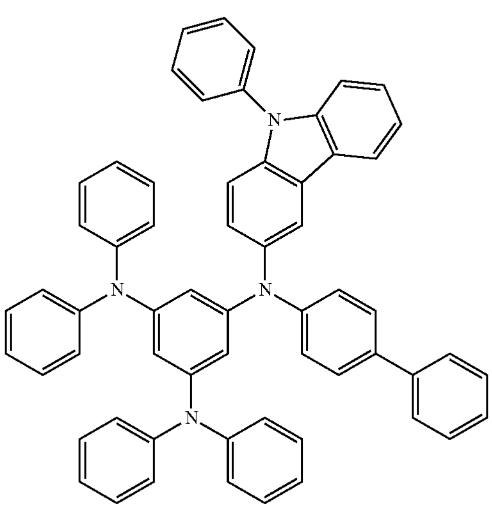
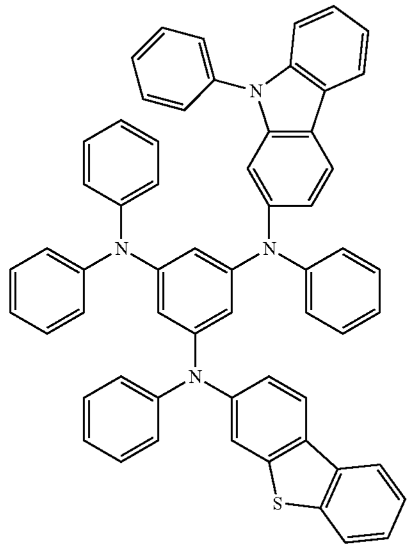
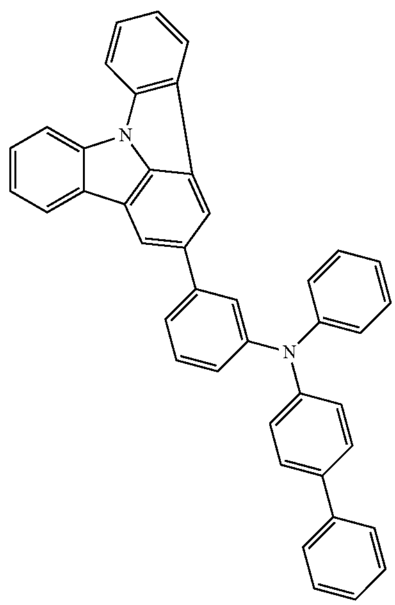
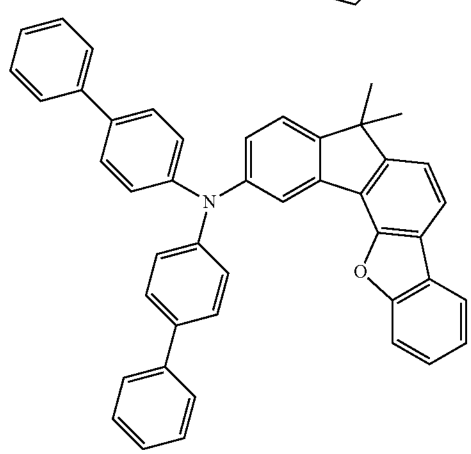

-continued
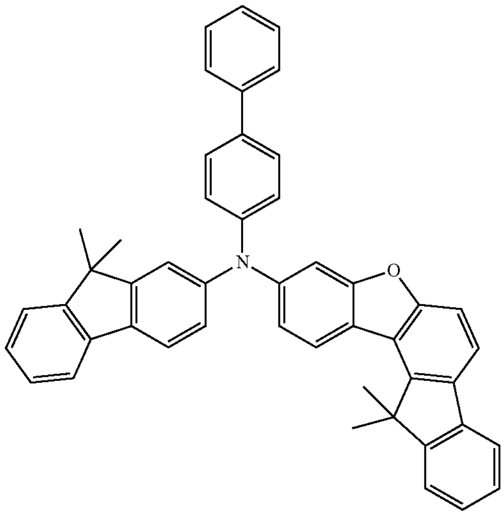
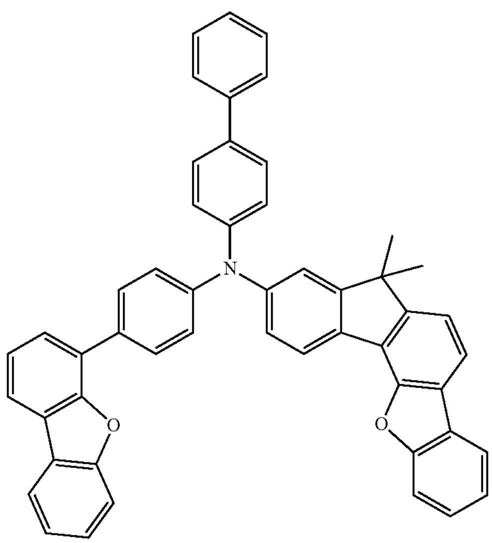
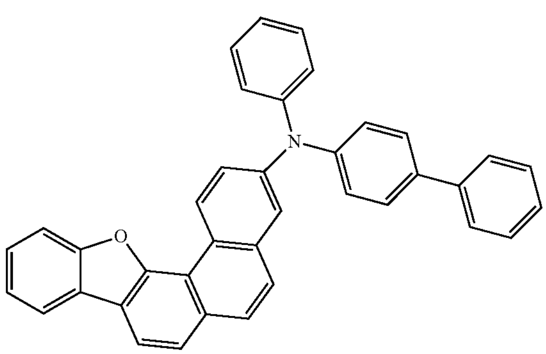
-continued
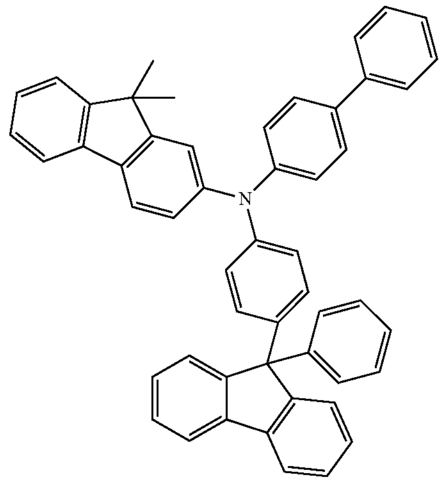
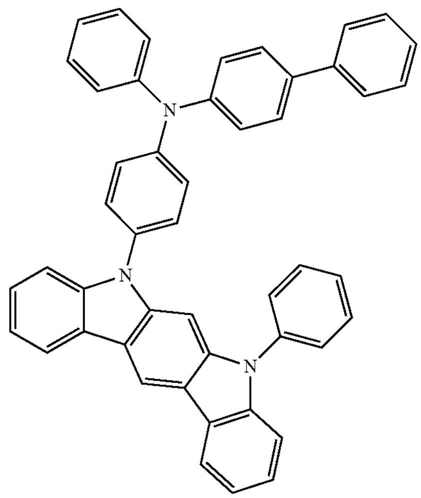
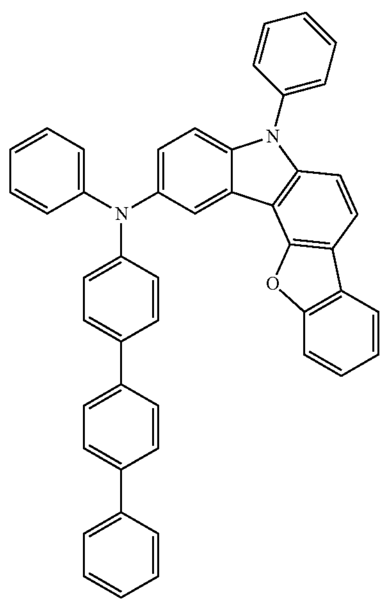

-continued

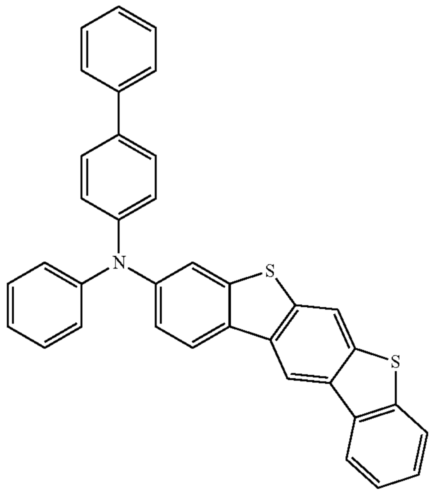

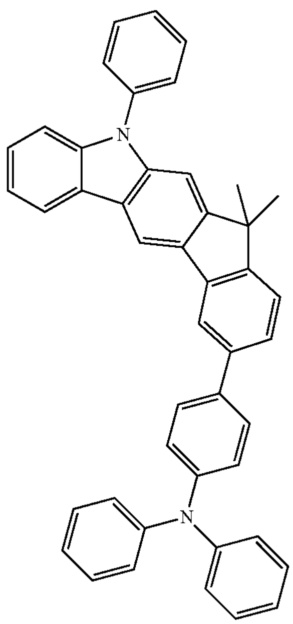

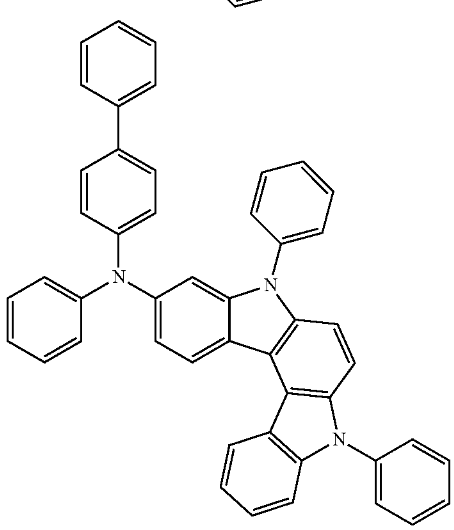

-continued

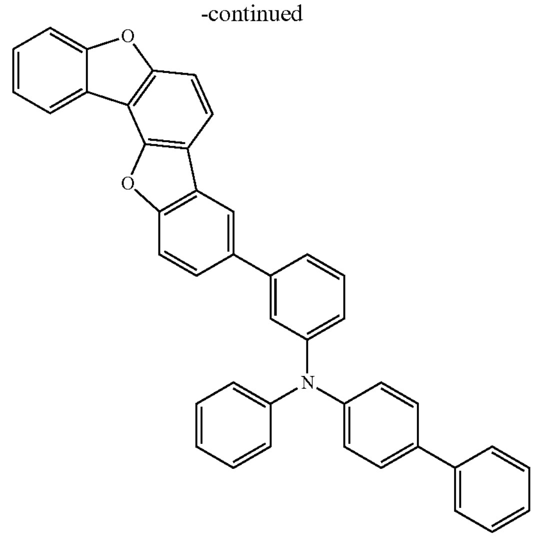

In the hole transport auxiliary layer, other suitable compounds may be used in addition to the compounds above.

In an implementation, an organic light emitting diode may further include an electron transport layer, an electron injection layer, or a hole injection layer as the organic layer 105.

The organic light emitting diodes 100 and 200 may be produced by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation of First Compound

Synthesis Example 1: Synthesis of Intermediate Int-6

[Reaction Scheme 1]

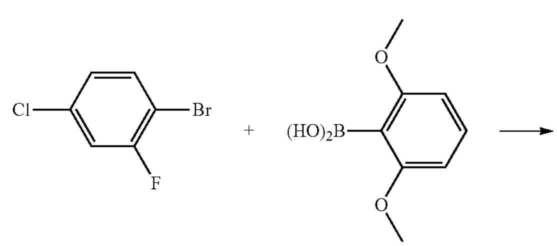

-continued

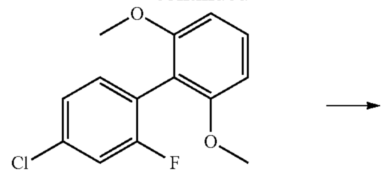

Int-1

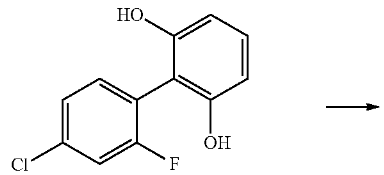

Int-2

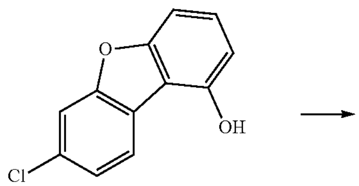

Int-3

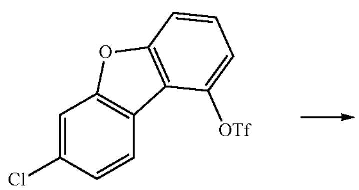

Int-4

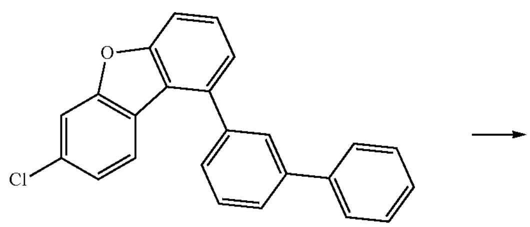

Int-5

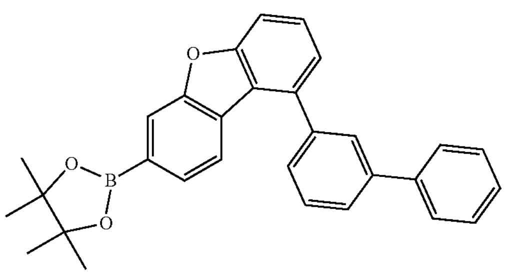

Int-6

1<sup>st</sup> Step: Synthesis of Intermediate Int-1

61 g (291 mmol) of 1-bromo-4-chloro-2-fluorobenzene, 50.4 g (277 mmol) of 2,6-dimethoxyphenylboronic acid, 60.4 g (437 mmol) of $K_2CO_3$, and 10.1 g (8.7 mmol) of $Pd(PPh_3)_4$ were put in a round-bottomed flask and dissolved in 500 ml of THF and 200 ml of distilled water and then, stirred under reflux at 60° C. for 12 hours. When a reaction was completed, a product obtained therefrom after removing an aqueous layer was treated through column chromatography (hexane:DCM (20%)) to obtain 38 g (51%) of Intermediate Int-1.

2<sup>nd</sup> Step: Synthesis of Intermediate Int-2

38 g (142 mmol) of Intermediate Int-1 and 165 g (1425 mmol) of pyridine hydrochloride were put in the round-bottomed flask and then, stirred under reflux at 200° C. for 24 hours. When a reaction was completed, the resultant was cooled down to ambient temperature and slowly poured into distilled water and then, stirred for 1 hour. A solid was filtered therefrom to obtain 23 g (68%) of Intermediate Int-2.

3<sup>rd</sup> Step: Synthesis of Intermediate Int-3

23 g (96 mmol) of Intermediate Int-2 and 20 g (144 mmol) of $K_2CO_3$ were put in a round-bottomed flask and dissolved in 100 ml of NMP and then, stirred under reflux at 180° C. for 12 hours. When a reaction was completed, the mixture was poured into an excess of distilled water. A solid was filtered therefrom, dissolved in ethyl acetate (EA), and dried with $MgSO_4$, and an organic layer was removed under a reduced pressure. A product obtained therefrom was treated through column chromatography (hexane:EA (30%)) to obtain 16 g (76%) of Intermediate Int-3.

4<sup>th</sup> Step: Synthesis of Intermediate Int-4

16 g (73 mmol) of Intermediate Int-3 and 12 ml (146 mmol) of pyridine were put in a round-bottomed flask and dissolved in 200 ml of DCM. After decreasing the temperature down to 0° C., 14.7 ml (88 mmol) of trifluoromethane sulfonic anhydride was slowly added thereto in a dropwise fashion. The obtained mixture was stirred for 6 hours, and when a reaction was completed, an excess of distilled water was added thereto and then, stirred for 30 minutes and extracted with DCM. After removing an organic solvent therefrom under a reduced pressure, the residue was vacuum-dried to obtain 22.5 g (88%) of Intermediate Int-4.

5<sup>th</sup> Step: Synthesis of Intermediate Int-5

25 g (71.3 mmol) of Intermediate Int-4, 16.2 g (81.8 mmol) of 3-biphenylboronic acid, 14.8 g (106.9 mmol) of $K_2CO_3$, and 4.1 g (3.6 mmol) of $Pd(PPh_3)_4$ were used in the same method as the 1<sup>st</sup> step to synthesize 21 g (83%) of Intermediate Int-5.

6<sup>th</sup> Step: Synthesis of Intermediate Int-6

21 g (59.2 mmol) of Intermediate Int-5, 19.5 g (76.9 mmol) of bis(pinacolato)diboron, 2.4 g (2.9 mmol) of $Pd(dppf)Cl_2$, 3.3 g (11.8 mmol) of tricyclohexylphosphine, and 11.6 g (118.4 mmol) of potassium acetate were put in a round bottomed flask and dissolved in 320 ml of DMF. The mixture was stirred under reflux at 120° C. for 10 hours. When a reaction was completed, the mixture was poured into an excess of distilled water and then, stirred for 1 hour. A solid was filtered therefrom and dissolved in DCM. $MgSO_4$ was used to remove moisture therefrom, and an organic solvent was filtered by using a silica gel pad and removed under a reduced pressure. A solid therefrom was recrystallized with ethyl acetate and hexane to obtain 18.5 g (70%) of Intermediate Int-6.

Synthesis Example 2: Synthesis of Intermediate Int-7

[Reaction Scheme 2]

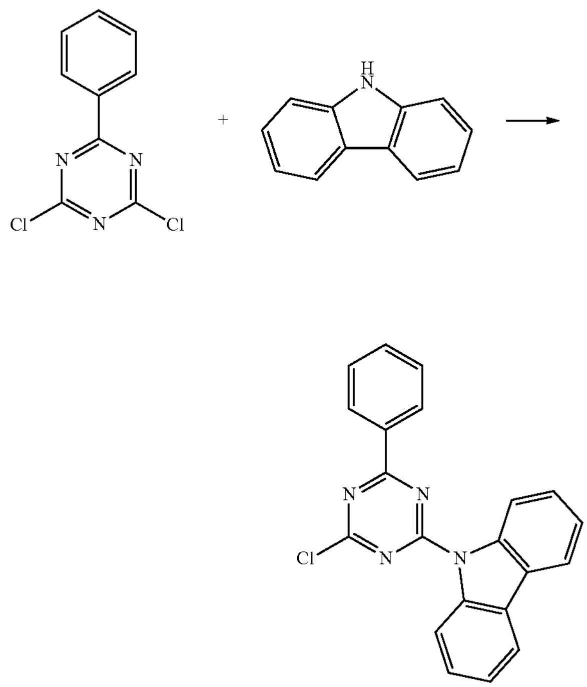

Int-7

230 g (132.7 mmol) of 2,4-dichloro-6-phenyl-1,3,5-triazine, 17.75 g (106.2 mmol) of carbazole, and 14.03 g (146.0 mmol) of NaOtBu were put in a round-bottomed flask and dissolved in 650 ml of THF and then, stirred at ambient temperature for 12 hours. A solid produced therein was filtered and stirred in an aqueous layer for 30 minutes. The solid was filtered and then, dried to obtain 20 g (42%) of Intermediate Int-7.

Synthesis Example 3: Synthesis of Compound 1-27

[Reaction Scheme 3]

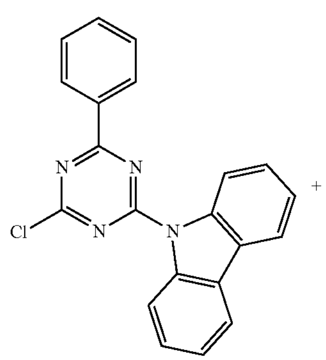

Int-7

-continued

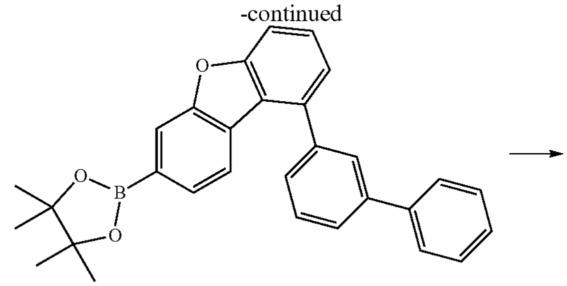

Int-6

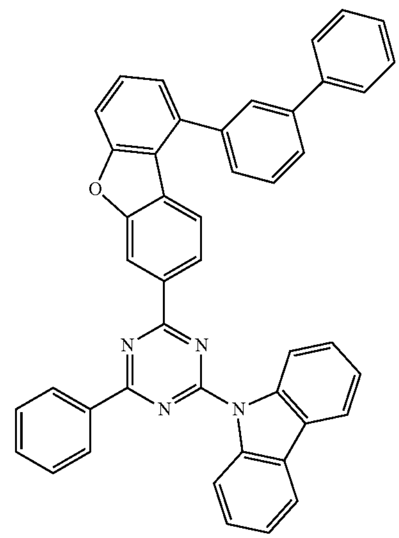

1-27

9.5 g (26.6 mmol) of Intermediate Int-7, 14.25 g (31.9 mmol) of Intermediate Int-6, 9.2 g (66.6 mmol) of $K_2CO_3$, and 1.5 g (1.3 mmol) of Pd $(PPh_3)_4$ were put in a round-bottomed flask and dissolved in 100 ml of THE and 40 ml of distilled water and then, stirred under reflux at 70° C. for 12 hours. When a reaction was completed, the mixture was added to 500 mL of methanol, and a solid crystallized therein was filtered, dissolved in monochlorobenzene (MCB), filtered with silica gel, and after removing an appropriate amount of an organic solvent, recrystallized with methanol to obtain 13.1 g (77%) of Compound 1-27.

(LC/MS: theoretical value: 640.23 g/mol, measured value: M+=641.39 g/mol)

Synthesis Example 4: Synthesis of Compound 1-24

[Reaction Scheme 4]

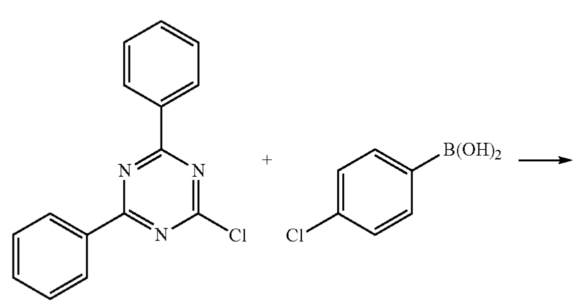

-continued

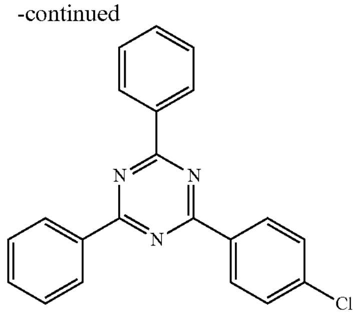

Int-8

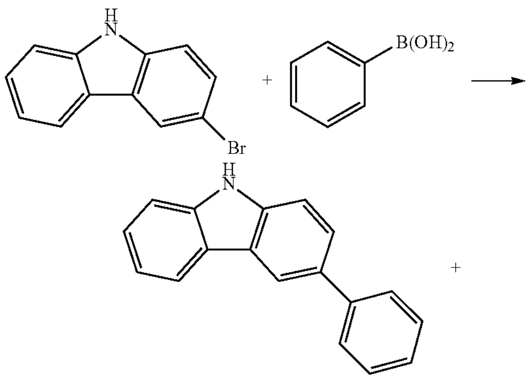

Int-9

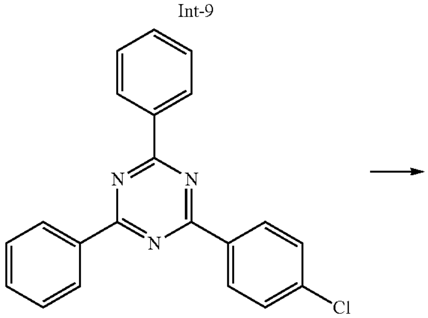

Int-8

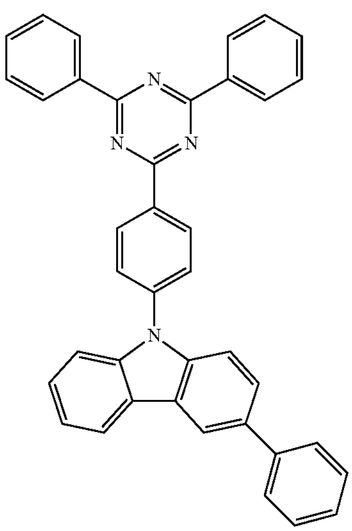

1-24

1st Step: Synthesis of Intermediate Int-8

100 mL of THF, 100 mL of toluene, and 100 mL of distilled water were added to 23.4 g (87.3 mmol) of 2-chloro-4,6-diphenyl-1,3,5-triazine, and 0.9 equivalent of 4-chlorophenylboronic acid, 0.03 equivalent of $Pd(PPh_3)_4$, and 2 equivalents of $K_2CO_3$ were added thereto and then, refluxed and stirred under a nitrogen atmosphere for 6 hours. After removing an aqueous layer, an organic layer therefrom was dried under a reduced pressure. A solid obtained therefrom was washed with water and hexane and then, recrystallized with 200 mL of toluene to obtain 20 g (67%) of Intermediate Int-8.

2nd Step: Synthesis of Intermediate Int-9

35 g (142 mmol) of 3-bromo-9H-carbazole was dissolved in 500 mL of THF, and 17.3 g (142 mmol) of phenylboronic acid and 8.2 g (7.1 mmol) of $Pd(PPh_3)_4$ were added thereto and then, stirred. $K_2CO_3$ saturated in water was added thereto in order to provide 49.1 g (356 mmol) of $K_2CO_3$ and then, stirred under reflux at 80° C. for 12 hours. When a reaction was completed, water was added to the reaction solution, and the mixture was extracted with DCM, treated with $MgSO_4$ to removed moisture, filtered, and concentrated under a reduced pressure. The obtained residue was separated and purified through column chromatography (hexane: DCM (20%)) to obtain 22.0 g (64%) of Intermediate Int-9.

3rd Step: Synthesis of Compound 1-24

22.0 g (90.4 mmol) of Intermediate Int-9, 31.1 g (90.4 mmol) of Intermediate Int-8, 13.1 g (135.6 mmol) of NaOtBu, 2.5 g (2.7 mmol) of $Pd_2(dba)_3$, and 5.5 g (50% in toluene) of $P(t\text{-}Bu)_3$ were added to 300 mL of xylene and then, stirred under reflux under a nitrogen flow for 12 hours. After removing the xylene, 200 mL of methanol was added to the obtained mixture, and a solid crystallized therein was filtered, dissolved in MCB, and filtered with silica gel, and an appropriate amount of an organic solvent was concentrated to obtain 32 g (64%) of Compound 1-24.

(LC/MS: theoretical value: 550.22 g/mol, measured value: M+=551.23 g/mol)

Synthesis Example 5: Synthesis of Compound 1-41

[Reaction Scheme 5]

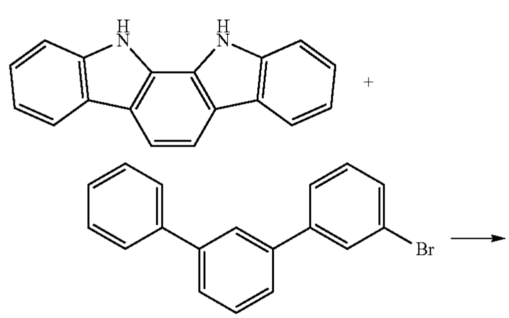

-continued

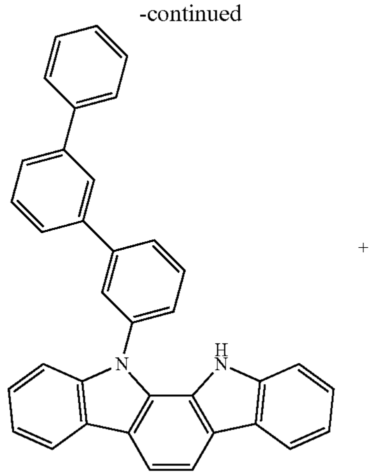

Int-10

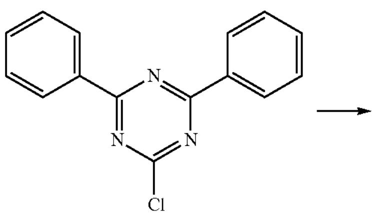

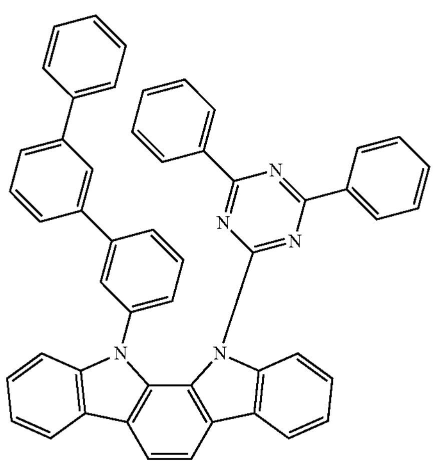

1-41

1st Step: Synthesis of Intermediate Int-10

15 g (58.5 mmol) of Indolo[2,3-a]carbazole, 18.1 g (58.5 mmol) of 3-bromo-m-terphenyl, 1.6 g (1.8 mmol) of $Pd_2(dba)_3$, 2.8 ml (5.8 mmol) of $P(t\text{-}Bu)_3$, and 8.4 g (87.8 mmol) of NaOtBu were suspended in 300 ml of xylene and then, stirred under reflux at 120° C. for 12 hours. When a reaction was completed, distilled water was added thereto and then, stirred for 30 minutes and extracted, and an organic layer therefrom alone was purified through silica gel column (hexane:DCM (30%)) to obtain 16.2 g (57%) of Intermediate Int-10.

2nd Step: Synthesis of Compound 1-41

16.1 g (33.2 mmol) of Intermediate Int-10 and 8.9 g (33.2 mmol) of 2-chloro-4,6-diphenyl-1,3,5-triazine were used in the same method as the 3rd step of Synthesis Example 4 to obtain 11.4 g (48%) of Compound 1-41.

(LC/MS: theoretical value: 715.27 g/mol, measured value: M+=716.29 g/mol)

Synthesis Example 6: Synthesis of Compound 1-25

[Reaction Scheme 6]

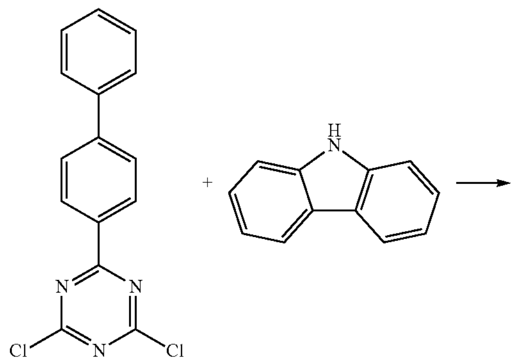

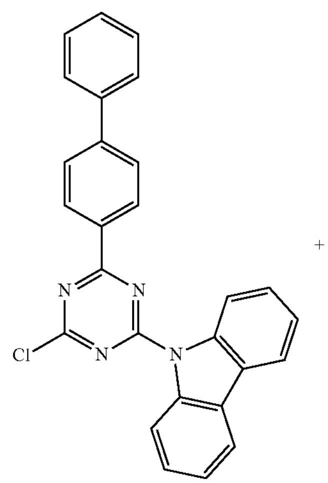

Int-11

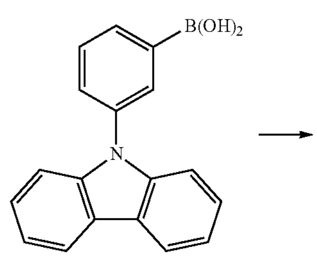

-continued

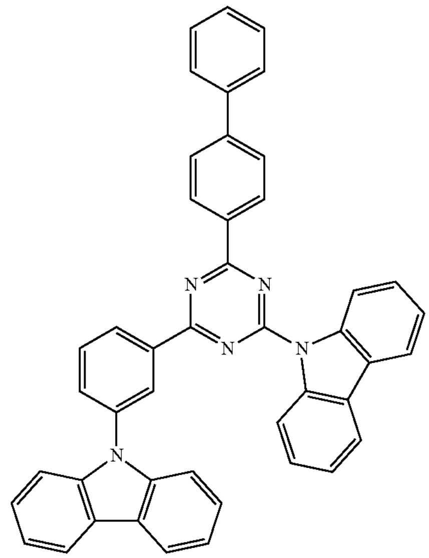

1-25

1st Step: Synthesis of Intermediate Int-11

65.5 g (216.8 mmol) of 2-[1,1'-biphenyl]-4-yl-4,6-dichloro-1,3,5-triazine and 25 g (149.5 mmol) of carbazole were suspended in 800 ml of THF, and 15.1 g (157.0 mmol) of NaOtBu was slowly added thereto. After stirring the mixture for 12 hours at ambient temperature, a solid produced therein was filtered, washed with distilled water, acetone, and hexane in order to obtain 40.2 g (62%) of Intermediate Int-11 as a target compound.

2nd Step: Synthesis of Compound 1-25

10 g (23.1 mmol) of Intermediate Int-11, 8.7 g (23.6 mmol) of 3-(9H-carbazol-9-yl)phenylboronic acid, 0.8 g (0.7 mmol) of $Pd(PPh_3)_4$, and 6.4 g (46.2 mmol) of $K_2CO_3$ were suspended in 100 ml of THF and 50 ml of distilled water and then, stirred under reflux for 12 hours. When a reaction was completed, a solid produced therein was filtered and washed with distilled water and acetone. The solid was recrystallized in 150 ml of dichlorobenzene (DCB) to obtain 11 g (74%) of Compound 1-25.

(LC/MS: theoretical value: 639.75 g/mol, measured value: 640.40 g/mol)

Synthesis Example 7: Synthesis of Compound 1-43

[Reaction Scheme 7]

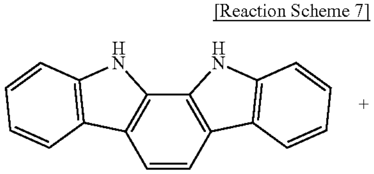

-continued

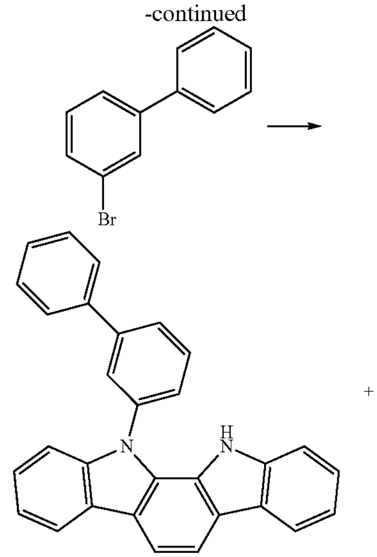

Int-12

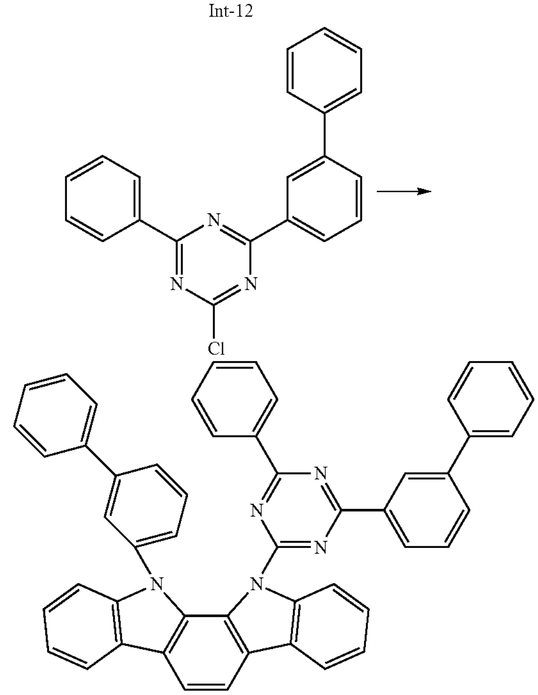

1-43

1st Step: Synthesis of Intermediate Int-12

12 g (46.8 mmol) of indolo[2,3-a]carbazole, 10.9 g (46.8 mmol) of 3-bromobiphenyl, 1.3 g (1.4 mmol) of $Pd_2(dba)_3$, 2.3 ml (4.7 mmol) of $P(t\text{-}Bu)_3$, and 6.8 g (70.2 mmol) of NaOtBu were suspended in 220 ml of xylene and then, stirred under reflux at 120° C. for 12 hours. When a reaction was completed, distilled water was added thereto and then, stirred for 30 minutes and extracted, and an organic layer therefrom alone was purified through silica gel column (hexane:DCM (30%)) to obtain 11.5 g (60%) of Intermediate Int-12.

2nd Step: Synthesis of Compound 1-43

11 g (26.9 mmol) of Intermediate Int-12 and 1.3 g (53.8 mmol) of NaH were suspended in 150 ml of dry N,N- dimethylformamide (DMF) and then, stirred under a nitrogen flow. Subsequently, 11.1 g (32.2 mmol) of 2-chloro-4-phenyl-6-(4-biphenyl)-1,3,5-triazine were suspended in 70 ml of dry DMF and then, slowly added to the mixture in a dropwise fashion. After completing the addition in a dropwise fashion, the obtained mixture was stirred for 6 hours. When a reaction was completed, distilled water was added thereto, and crystals precipitated therein were filtered and dried. The crystals were recrystallized in 150 ml of DCB to obtain 8.3 g (39%) of Compound 1-43.

(LC/MS: theoretical value: 791.30 g/mol, measured value: 792.11 g/mol)

Synthesis Example 8: Synthesis of Compound 1-45

[Reaction Scheme 8]

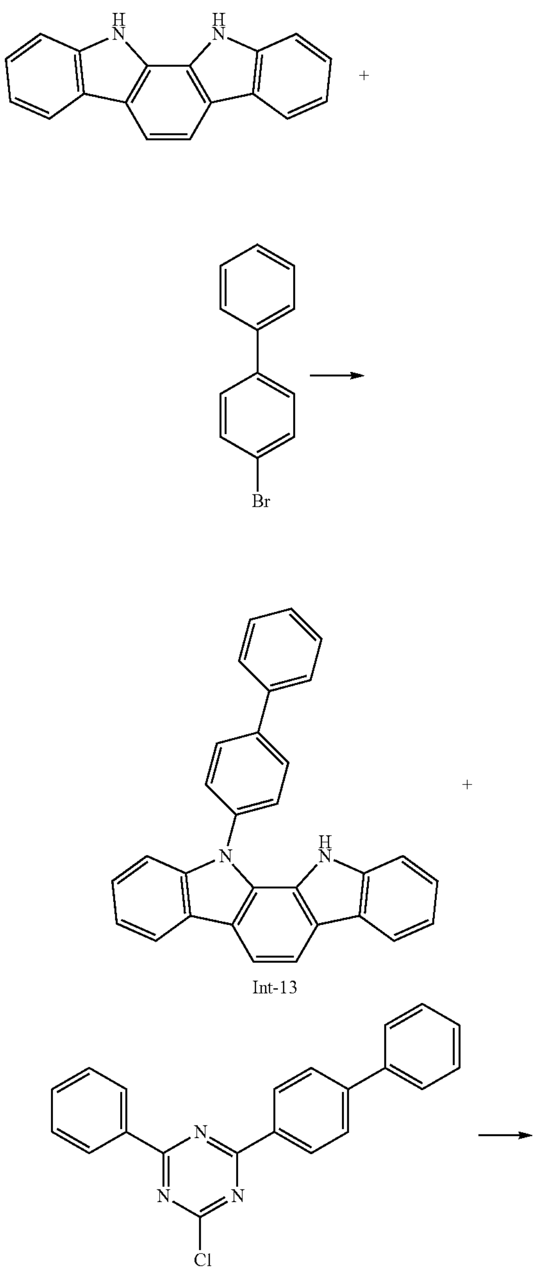

Int-13

-continued

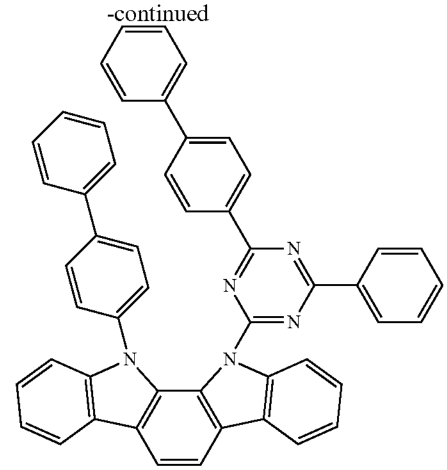

1-45

1st Step: Synthesis of Intermediate Int-13

Intermediate Int-13 was synthesized in the same manner as in 1st step of Synthesis Example 7, using indolo[2,3-a]carbazole and 4-bromobiphenyl.

2nd Step: Synthesis of Compound 1-45

Compound 1-45 was synthesized in the same manner as in 2nd step of Synthesis Example 7, using Intermediate Int-13 and 2-chloro-4-phenyl-6-(4-biphenyl)-1,3,5-triazine.

(LC/MS: theoretical value: 715.27 g/mol, measured value: 716.34 g/mol)

Synthesis Example 9: Synthesis of Compound 1-73

[Reaction Scheme 9]

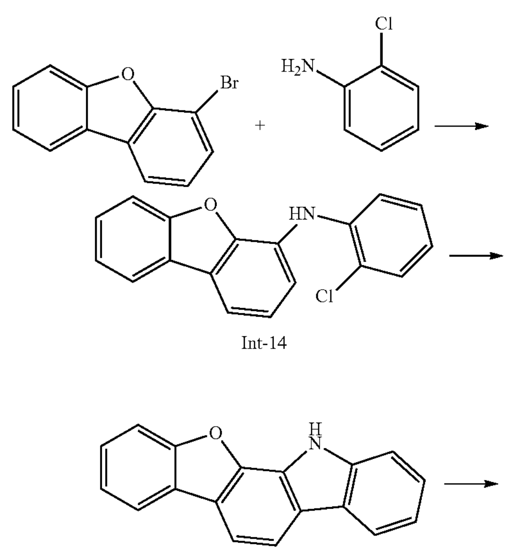

Int-14

Int-15

-continued

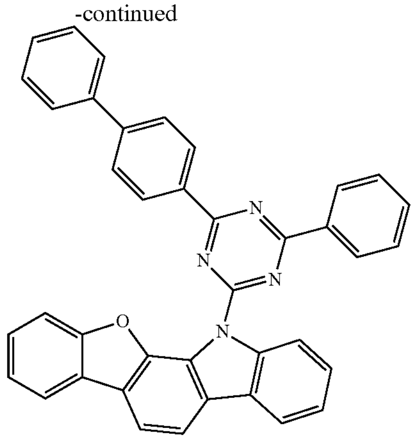

1-73

1st Step: Synthesis of Intermediate Int-14

50 g (202.4 mmol) of 4-bromodibenzofuran, 38.7 g (303.53 mmol) of 2-chloroaniline, 9.3 g (10.2 mmol) of $Pd_2(dba)_3$, 7.4 ml (30.4 mmol) of $P(t\text{-}bu)_3$, and 29.2 g (303.5 mmol) of NaOtBu were put in a round-bottomed flask and dissolved in 650 ml of toluene and then, stirred under reflux at 130° C. for 12 hours. When a reaction was completed, after removing an aqueous layer therefrom, the residue was treated through column chromatography (hexane:DCM (20%)) to obtain 38 g (64%) of Intermediate Int-14.

2nd Step: Synthesis of Intermediate Int-15

50 g (170.2 mmol) of Intermediate Int-13, 7.8 g (8.5 mmol) of $Pd_2(dba)_3$, 110.9 g (340.4 mmol) of $CS_2CO_3$, and 6.3 g (17.0 mmol) of $PCy_3{\cdot}HBF_4$ (tricyclohexylphosphine tetrafluorobarate) were put in a round-bottomed flask and dissolved in 550 ml of DMAc and then, stirred under reflux at 160° C. for 12 hours. When a reaction was completed, an excess of distilled water was poured thereinto and then, stirred for 1 hour. A solid therein was filtered and dissolved in MCB at a high temperature. Subsequently, $MgSO_4$ was used to remove moisture, a silica gel pad was used to filter an organic solvent, and a filtrate therefrom was stirred. A solid obtained therefrom was filtered and vacuum-dried to obtain 26.9 g (62%) of Intermediate Int-15.

3rd Step: Synthesis of Compound 1-73

11.5 g (44.7 mmol) of Intermediate Int-15, 18.4 g (53.7 mmol) of 2-chloro-4-phenyl-6-(4-biphenyl)-1,3,5-triazine, and 2.2 g (89.5 mmol) of NaH were put in a round bottomed flask and dissolved in 180 ml of dry DMF and then, stirred at ambient temperature for 12 hours. When a reaction was completed, an excess of distilled water was poured thereinto and then, stirred for 1 hour. A solid therein was filtered and dissolved in MCB at a high temperature. $MgSO_4$ was used to remove moisture, a silica gel pad was used to filter an organic solvent, and a filtrate therefrom was stirred. A solid therein was filtered and vacuum-dried to obtain 22.1 g (88%) of Compound 1-73.

(LC/MS: theoretical value: 561.21 g/mol, measured value: 562.62 g/mol)

Synthesis Example 10: Synthesis of Compound 1-75

[Reaction Scheme 10]

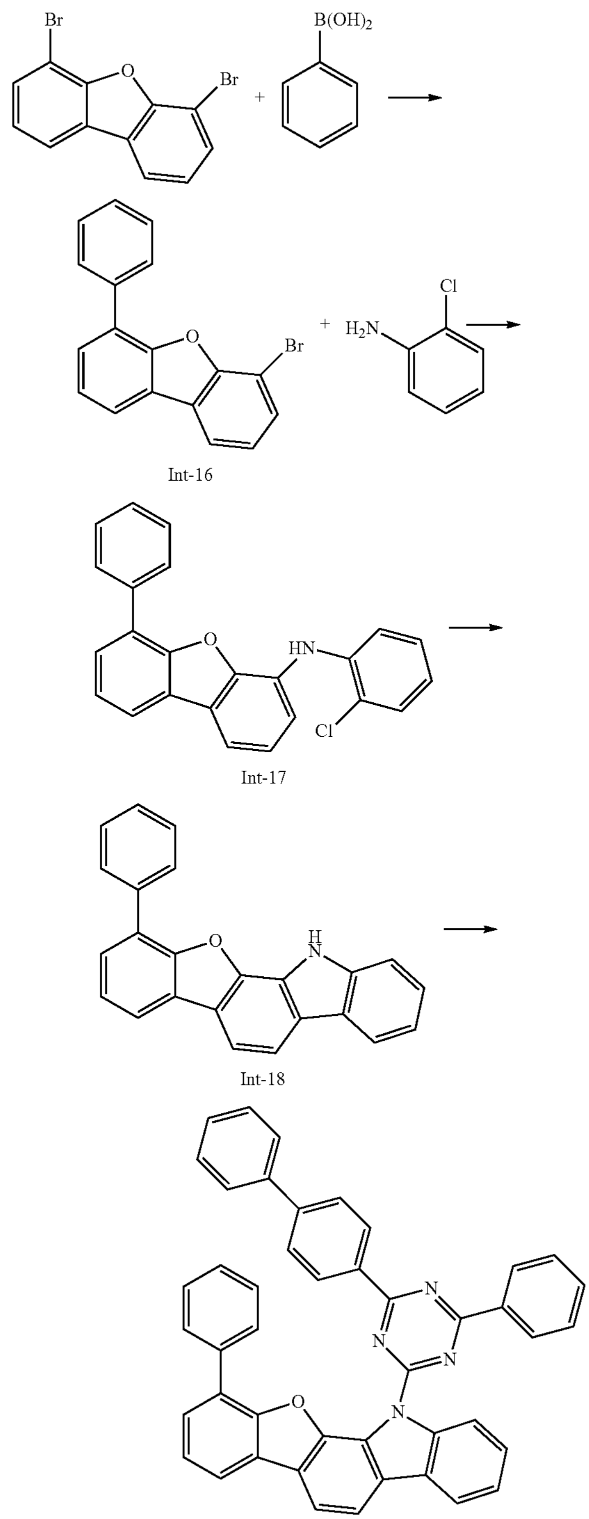

1-75

1st Step: Synthesis of Intermediate Int-16

50 g (153 mmol) of 4,6-dibromodibenzofuran was dissolved in 510 mL of THF, and 18 g (153 mmol) of phenylboronic acid and 8.8 g (7.6 mmol) of $Pd(PPh_3)_4$ were added thereto and then stirred. Subsequently, $K_2CO_3$ saturated in water was added thereto in order to provide 53 g (383 mmol) of $K_2CO_3$ and then, refluxed and stirred at 80° C. for 12 hours. When a reaction was completed, water was added to the reaction solution, and the mixture was extracted with DCM, treated with $MgSO_4$ to remove moisture, filtered, and concentrated under a reduced pressure. The obtained residue was separated and purified through column chromatography (hexane:DCM (20%)) to obtain 41 g (83%) of Intermediate Int-16.

2$^{nd}$ Step: Synthesis of Intermediate Int-17

Intermediate Int-16 and 2-chloroaniline were used in the same manner as the 1$^{st}$ step of Synthesis Example 9 to synthesize Intermediate Int-17.

2$^{nd}$ Step: Synthesis of Intermediate Int-18

Intermediate Int-17 was used in the same manner as the 2$^{nd}$ step of Example 9 to synthesize Intermediate Int-18.

3$^{rd}$ Step: Synthesis of Compound 1-75

Intermediate Int-18 and 2-chloro-4-phenyl-6-(4-biphenyl)-1,3,5-triazine were used in the same manner as the 3$^{rd}$ step of Synthesis Example 9 to synthesize Compound 1-75.

(LC/MS: theoretical value: 640.23 g/mol, measured value: 641.37 g/mol)

Synthesis of Second Compound

Synthesis Example 11: Synthesis of Compound 2-1

Compound 2-1 was synthesized as described in KR10-2017-0068927A.

Synthesis Example 12: Synthesis of Compound 2-2

Compound 2-2 was synthesized as described in KR10-2017-0037277A.

Synthesis Example 13: Synthesis of Compound 2-33

[Reaction Scheme 11]

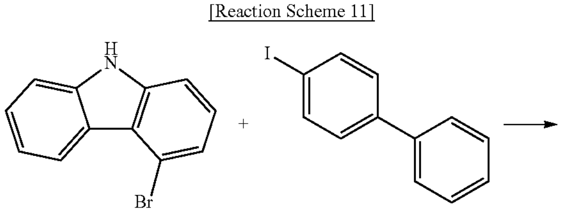

-continued

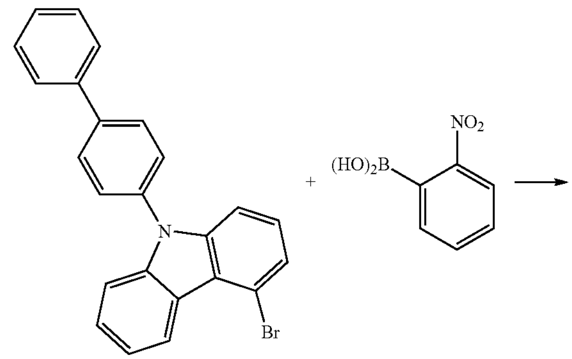

Int-19

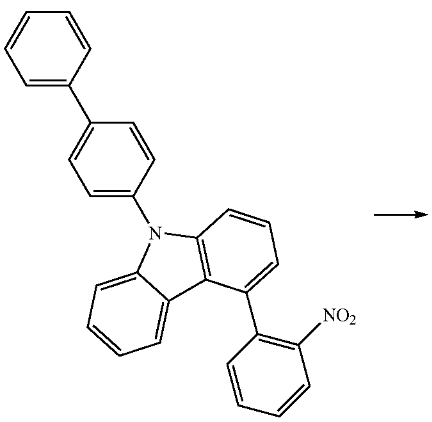

Int-20

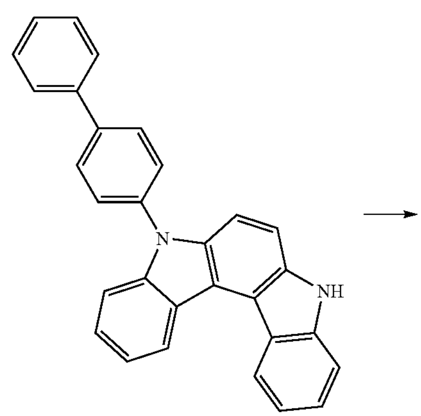

Int-21

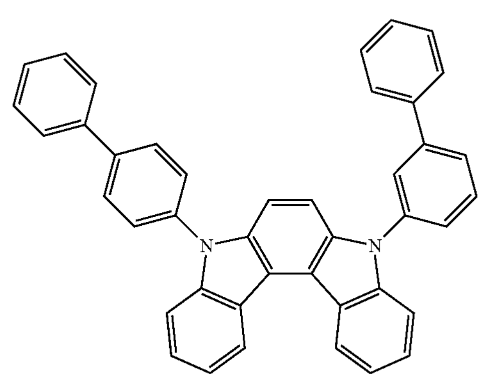

2-33

1st Step: Synthesis of Intermediate Int-19

10.4 g (42.4 mmol) of 4-bromo-9H-carbazole, 11.9 g (42.4 mmol) of 4-iodo-1,1'-biphenyl, 0.39 g (0.42 mmol) of $Pd_2(dba)_3$, 0.21 g (0.85 mmol) of $P(t\text{-}Bu)_3$, and 6.1 g (63.6 mmol) of NaOt-Bu were suspended in 420 ml of toluene and then, stirred at 60° C. for 12 hours. When a reaction was completed, distilled water was added thereto and then, stirred for 30 minutes, extracted, and treated through column chromatography (hexane:DCM (10%)) to obtain 14.7 g (87%) of Intermediate Int-19.

2nd Step: Synthesis of Intermediate Int-20

15.5 g (38.9 mmol) of Intermediate Int-19, 7.2 g (42.8 mmol) of 2-nitrophenylboronic acid, 16.1 g (116.7 mmol) of $K_2CO_3$, and 1.4 g (1.2 mmol) of $Pd(PPh_3)_4$ were suspended in 150 ml of toluene and 70 ml of distilled water and then, stirred under reflux for 12 hours. The resultant was treated with DCM and distilled water, and an organic layer therefrom was silica gel-filtered. Subsequently, after removing an organic solution, a solid produced therein was recrystallized with DCM and hexane to obtain 13.7 g (80%) of Intermediate Int-20.

3rd Step: Synthesis of Intermediate Int-21

22.5 g (51.0 mmol) of Intermediate Int-20 and 52.8 ml of triethyl phosphite were added thereto, and after substituting the atmosphere with nitrogen, the mixture was stirred under reflux for 12 hours at 160° C. When a reaction was completed, 3 L of methanol was added thereto and then, stirred and filtered, and a filtrate therefrom was distilled under a reduced pressure. The obtained product was treated through column chromatography (hexane:DCM (10%)) to obtain 10.4 g (50%) of Intermediate Int-21.

4th Step: Synthesis of Compound 2-33

The Intermediate Int-21 and 3-iodo-biphenyl were used in the same manner as the first step of Synthesis Example 11 to synthesize Compound 2-33.

(LC/MS: theoretical value: 560.23 g/mol, measured value: 561.57 g/mol)

Synthesis Example 14: Synthesis of Compound 2-13

[Reaction Scheme 12]

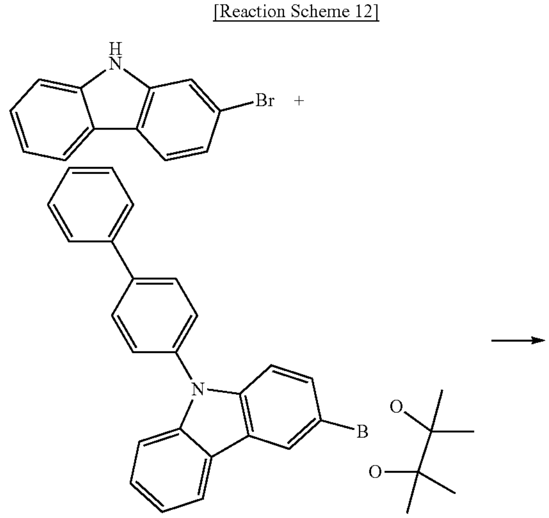

-continued

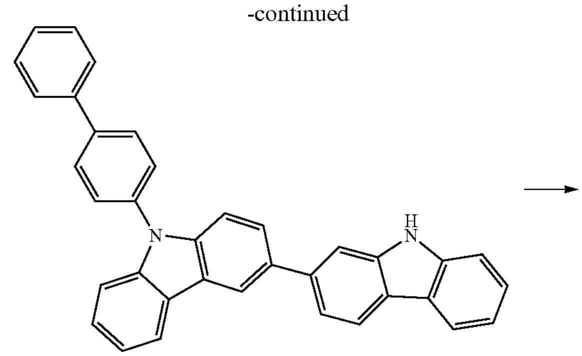

Int-22

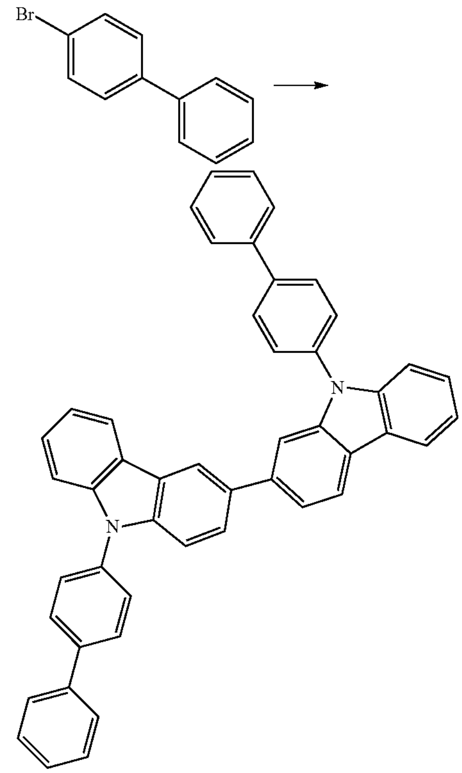

2-13

1st Step: Synthesis of Intermediate Int-22

18.2 g (40.9 mmol) of 9-(4-biphenyl)-3-(tetramethyl-1,3,2-dioxaborolane-2-yl)-9H-carbazole, 11.1 g (45.0 mmol) of 2-bromo-9H-carbazole, 11.3 g (81.9 mmol) of $K_2CO_3$, and 1.4 g (1.2 mmol) of $Pd(PPh_3)_4$ were suspended in 180 ml of THF and 75 ml of distilled water and then, stirred under reflux for 12 hours. Subsequently, the resultant was extracted with DCM and distilled water, and an organic layer therefrom was silica gel-filtered. Subsequently, after removing an organic solution therefrom, a solid produced therein was recrystallized with DCM and hexane to obtain 18.1 g (91%) of Intermediate Int-22.

2nd Step: Synthesis of Compound 2-13

13.3 g (27.4 mmol) of Intermediate Int-22, 6.4 g (27.4 mmol) of 4-bromobiphenyl, 0.25 g (0.27 mmol) of $Pd_2(dba)_3$, 0.13 g (0.27 mmol) of $P(t\text{-}Bu)_3$, and 3.9 g (41.1 mmol) of NaOtBu were suspended in 300 ml of toluene and then, stirred at 60° C. for 12 hours. When a reaction was completed, distilled water was added thereto and then, stirred for 30 minutes, extracted, and treated through column chromatography (hexane:DCM (10%)) to obtain 15.4 g (88%) of Compound 2-13.

LC-Mass (theoretical value: 636.26 g/mol, measured value: M+=637.40 g/mol)

Synthesis Example 15: Synthesis of Compound 2-8

[Reaction Scheme 13]

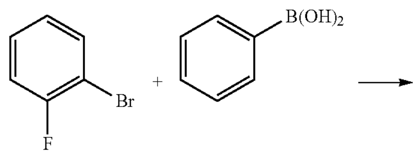

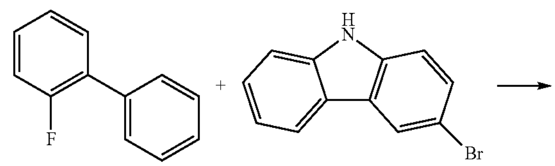

Int-23

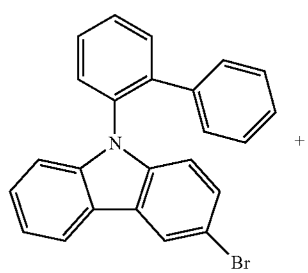

Int-24

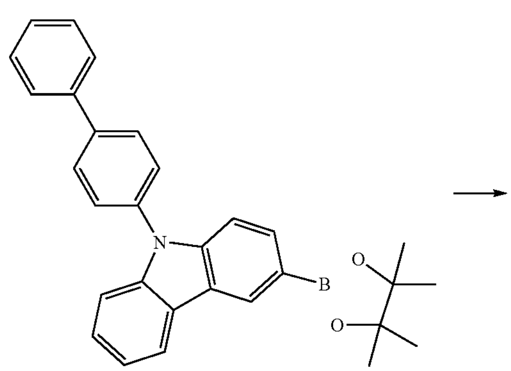

-continued

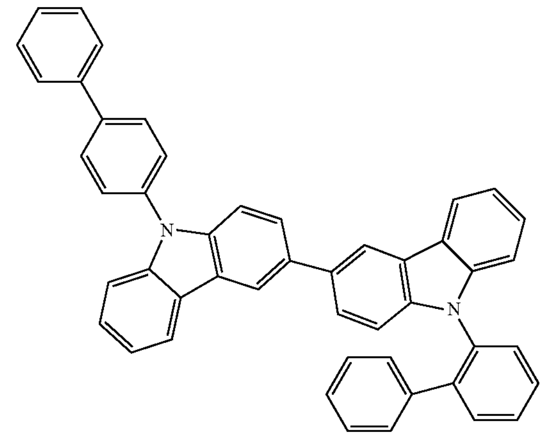

2-8

1$^{st}$ Step: Synthesis of Intermediate Int-23

105 g (600 mmol) of 2-bromo-1-fluorobenzene, 87.8 g (720 mmol) of phenylboronic acid, 124.4 g (900 mmol) of $K_2CO_3$, and 20.8 g (18 mmol) of $Pd(PPh_3)_4$ were suspended in 1,200 ml of THE and 450 ml of distilled water under a nitrogen flow and then, stirred under reflux for 12 hours. When a reaction was completed, the resultant was extracted with DCM and treated through column chromatography (hexane:DCM (10%)) to obtain 77.5 g (75%) of Intermediate Int-23.

2$^{nd}$ Step: Synthesis of Intermediate Int-24

30 g (174.2 mmol) of Intermediate Int-23, 55.7 g (226.5 mmol) of 3-bromo-9H-carbazole, and 8.4 g (348.5 mmol) of NaH were suspended in 290 ml of N-methyl-2-pyrrolidone (NMP) under a nitrogen flow and then, stirred under reflux for 18 hours. The reactant was slowly poured into an excess of water and then stirred, and a solid therein was filtered to obtain 41.6 g (60%) of Intermediate Int-24.

3$^{rd}$ Step: Synthesis of Compound 2-8

25.0 g (62.8 mmol) of Intermediate Int-24, 27.9 g (62.8 mmol) of 9-(4-biphenyl)-3-(tetramethyl-1,3,2-dioxaborolane-2-yl)-9H-carbazole, 17.4 g (125.5 mmol) of $K_2CO_3$, and 2.2 g (1.9 mmol) of $Pd(PPh_3)_4$ were suspended in 120 ml of THF and 60 ml of distilled water under a nitrogen flow and then, stirred under reflux for 12 hours. When a reaction was completed, the resultant was extracted with DCM and treated through column chromatography (hexane:DCM (30%)), and a solid obtained therefrom was recrystallized with 250 ml of toluene to obtain 31.9 g (80%) of Compound 2-8.

LC-Mass (theoretical value: 636.78 g/mol, measured value: M+=637.87 g/mol)

Synthesis of Third Compound

Synthesis Example 16: Synthesis of Compound 3-25

[Reaction Scheme 14]

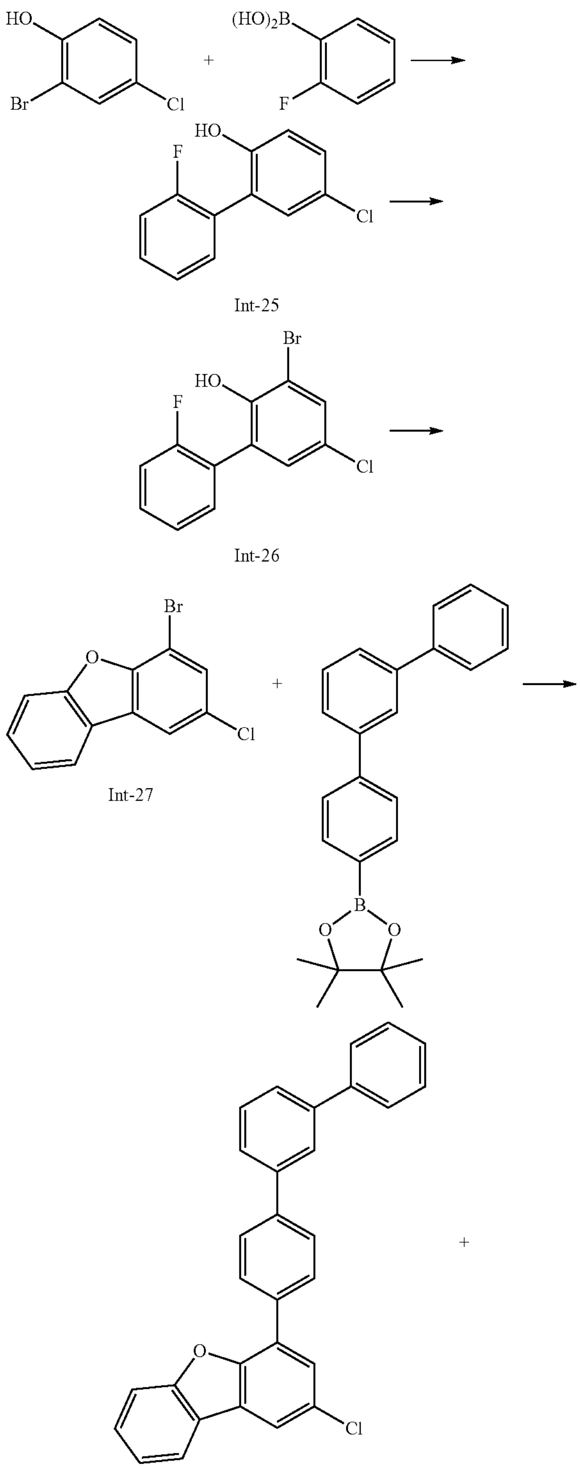

-continued

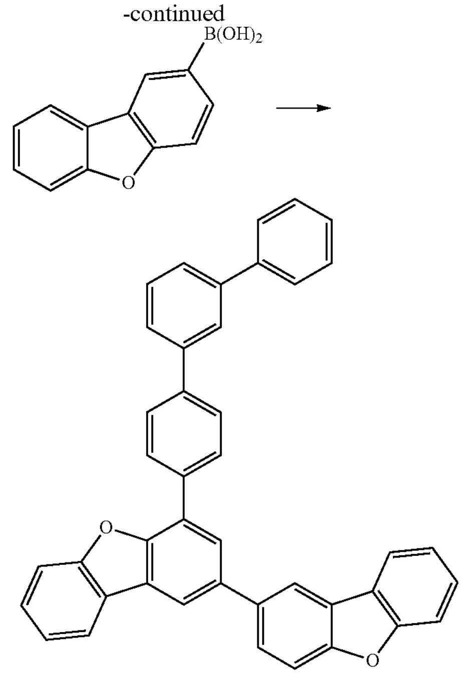

3-25

1st Step: Synthesis of Intermediate Int-25

50 g (241 mmol) of 2-bromo-4-chlorophenol was dissolved in 800 mL of THF, and 37 g (265 mmol) of 2-fluorophenylboronic acid and 14 g (12 mmol) of $Pd(PPh_3)_4$ were added thereto and then, stirred. Subsequently, $K_2CO_3$ saturated in 2M water (300 mL) was added thereto in order to provide 83 g (603 mmol) of $K_2CO_3$ and then, refluxed and stirred at 80° C. for 12 hours. When a reaction was completed, water was added to the reaction solution, and the mixture was extracted with DCM, treated with $MgSO_4$ to removed moisture, filtered, and concentrated under a reduced pressure. The obtained residue was separated and purified through column chromatography (hexane:DCM (10%)) to obtain 42 g (78%) of intermediate Int-25.

2nd Step: Synthesis of Intermediate Int-26

42 g (188 mmol) of Intermediate Int-25 was dissolved in 630 mL of THF and then, cooled down to 0° C., and 34 g (188 mmol) of N-bromosuccinimide was little by little added thereto. After about 1 hour, 630 mL of a saturated ammonium chloride aqueous solution was added thereto and then, stirred to separate an aqueous layer, and an organic layer obtained therefrom was concentrated under a reduced pressure. Subsequently, a small amount of ethyl acetate and an excess of hexane were added to the concentrated compound, and slurry obtained therefrom was filtered to obtain 41 g (72%) of Intermediate Int-26 as a solid.

3rd Step: Synthesis of Intermediate Int-27

41 g (136 mmol) of Intermediate Int-26 and 56 g (408 mmol) of $K_2CO_3$ were put in a round-bottomed flask, dissolved in 230 ml of NMP, and stirred under reflux at 180° C. for 12 hours. When a reaction was completed, the mixture was poured into an excess of distilled water. The solid was filtered, dissolved in ethyl acetate (EA), dried with $MgSO_4$, and an organic layer was removed under a reduced pressure. 25 g (66%) of Intermediate Int-27 was obtained using column chromatography (Hexane:EA (10%)).

4$^{th}$ Step: Synthesis of Intermediate Int-28

25 g (89 mmol) of Intermediate Int-27 was dissolved in 300 mL of THF, and 35 g (97 mmol) of 4-(4,4,5,5-tetramethyl-1,3,2-dioxaborolan-2-yl)-m-terphenyl and 5.1 g (4.4 mmol) of $Pd(PPh_3)_4$ were added thereto and then, stirred. Subsequently, $K_2CO_3$ saturated in water was added thereto in order to provide 30 g (22 2 mmol) of $K_2CO_3$ and then, refluxed and stirred at 80° C. for 12 hours. When a reaction was completed, water was added to the reaction solution, and the mixture was extracted with DCM, treated with $MgSO_4$ to remove moisture, filtered, and concentrated under a reduced pressure. The obtained residue was separated and purified through column chromatography (hexane:DCM (20%)) to obtain 32 g (85%) of Intermediate Int-28.

5$^{th}$ Step: Synthesis of Compound 3-25

32 g (74 mmol) of Intermediate Int-28, 17 g (82 mmol) of 2-dibenzofuranylboronic acid, 48 g (148 mmol) of $Cs_2CO_3$, 3.4 g (3.7 mmol) of $Pd_2(dba)_3$, and 6 g (50% in toluene) of $P(t\text{-}Bu)_3$ were added to 250 mL of 1,4-dioxane and then, refluxed and stirred under a nitrogen flow for 12 hours. After removing the 1,4-dioxane, 200 mL of methanol was added to the obtained mixture to crystallize a solid, the solid was filtered, dissolved in MCB, and silica gel-filtered, and an appropriate amount of an organic solvent was eluted to obtain 30 g (73%) of Compound 3-25.

(LC/MS: theoretical value: 562.19 g/mol, measured value: 563.24 g/mol)

Synthesis Example 17: Synthesis of Compound 3-53

[Reaction Scheme 15]

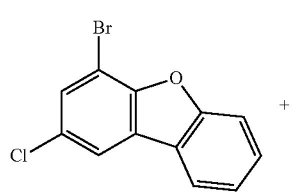

Int-27

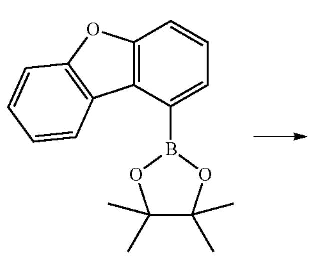

-continued

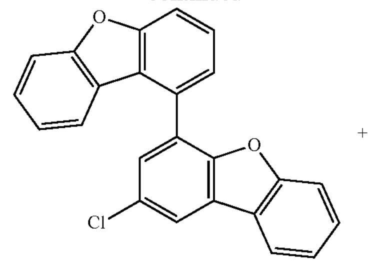

Int-29

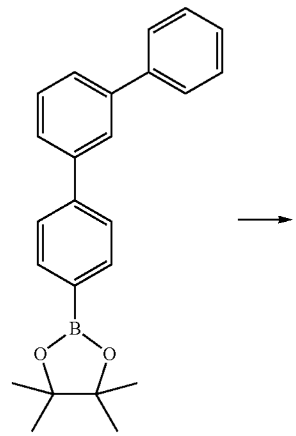

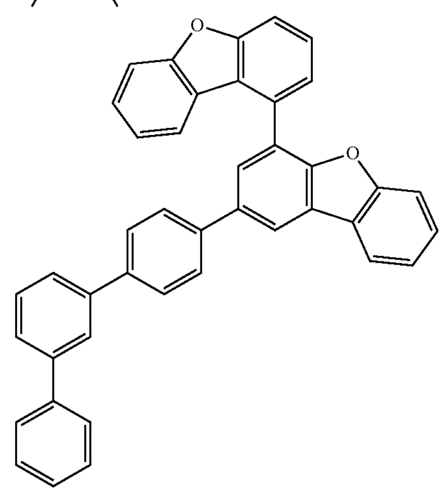

3-53

1st Step: Synthesis of Intermediate Int-29

25 g (88 mmol) of Intermediate Int-27 was dissolved in 300 mL of THF, and 28 g (97 mmol) of 1-(4,4,5,5-tetramethyl-1,3,2-dioxaborolan-2-yl)dibenzofuran and 5.1 g (4.4 mmol) of $Pd(PPh_3)_4$ were added thereto and then, stirred. Subsequently, $K_2CO_3$ saturated in water was added thereto in order to provide 30 g (222 mmol) of $K_2CO_3$ and then, refluxed and stirred at 80° C. for 12 hours. When a reaction was completed, water was added to the reaction solution, and the mixture was extracted with DCM, treated with $MgSO_4$ to remove moisture, filtered, and concentrated under a reduced pressure. The obtained residue was separated and purified through column chromatography (hexane:DCM (20%)) to obtain 26 g (81%) of Intermediate Int-29.

$2^{nd}$ Step: Synthesis of Compound 3-53

26 g (70 mmol) of Intermediate Int-29, 27 g (77 mmol) of 4-(4,4,5,5-tetramethyl-1,3,2-dioxaborolan-2-yl)-m-terphenyl, 46 g (141 mmol) of $Cs_2CO_3$, 3.2 g (3.5 mmol) of $Pd_2(dba)_3$, and 5.6 g (50% in toluene) of $P(t\text{-}Bu)_3$ were put in 230 mL of 1,4-dioxane and then, refluxed and stirred under a nitrogen flow for 12 hours. After removing the 1,4-dioxane, 200 mL of methanol was added to the obtained mixture to crystallize a solid, the solid was dissolved in MCB and silica gel-filtered, and an appropriate amount of an organic solvent was eluted to obtain 29 g (74%) of Compound 3-53.

(LC/MS: theoretical value: 562.19 g/mol, measured value: 563.31 g/mol)

Synthesis Example 18: Synthesis of Compound 3-138

[Reaction Scheme 16]

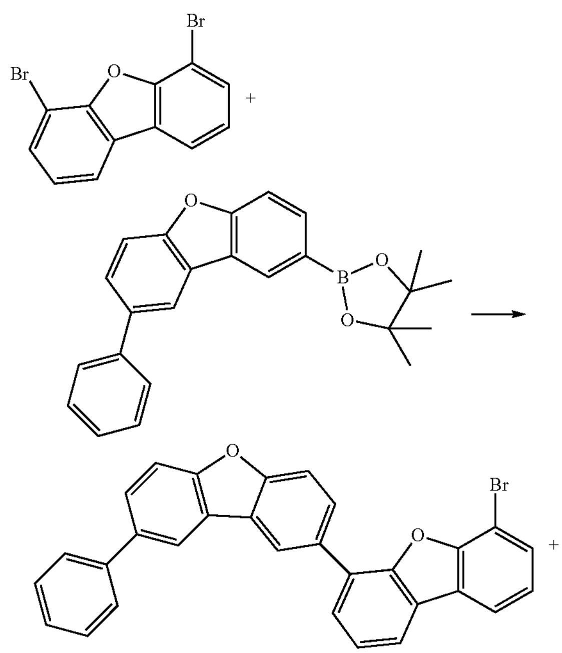

Int-30

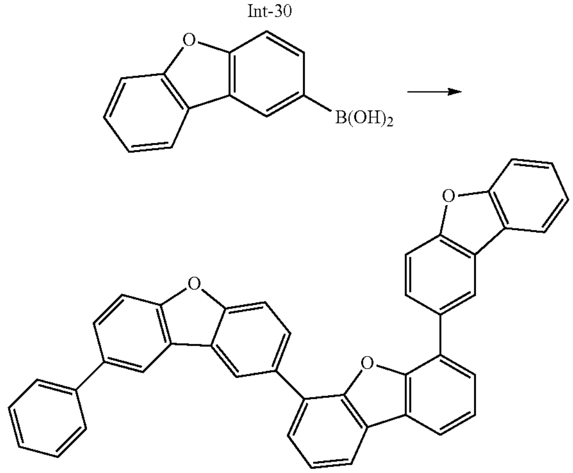

3-138

$1^{st}$ Step: Synthesis of Intermediate Int-30

50 g (153 mmol) of 4,6-dibromodibenzofuran was dissolved in 510 mL of THF, and 56 g (153 mmol) of 2-phenyl-8-(4,4,5,5-tetramethyl-1,3,2-dioxaborolan-2-yl)dibenzofuran and 8.8 g (7.6 mmol) of $Pd(PPh_3)_4$ were added thereto and then, stirred. Subsequently, $K_2CO_3$ saturated in water was added thereto in order to provide 53 g (383 mmol) of $K_2CO_3$ and then, refluxed and stirred at 80° C. for 12 hours. When a reaction was completed, water was added to the reaction solution, and the mixture was extracted with DCM, treated with $MgSO_4$ to remove moisture, filtered, and concentrated under a reduced pressure. The obtained residue was separated and purified through column chromatography (hexane:DCM (20%)) to obtain 55 g (74%) of Intermediate Int-30.

$2^{nd}$ Step: Synthesis of Compound 3-138

55 g (112 mmol) of Intermediate Int-30 was dissolved in 370 mL of THF, and 26 g (123 mmol) of 2-dibenzofuranylboronic acid and 6.5 g (5.6 mmol) of $Pd(PPh_3)_4$ were added thereto and then stirred. Subsequently, $K_2CO_3$ saturated in water was added thereto in order to provide 39 g (281 mmol) of $K_2CO_3$ and then, refluxed and stirred at 80° C. for 12 hours. When a reaction was completed, water was added to the reaction solution, and the mixture was extracted with DCM, treated with $MgSO_4$ to remove moisture, filtered, and concentrated under a reduced pressure. The obtained residue was separated and purified through column chromatography (hexane:DCM (30%)) to obtain 45 g (70%) of Compound 3-138.

(LC/MS: theoretical value: 576.17 g/mol, measured value: 577.53 g/mol)

Synthesis Example 19: Synthesis of Compound 3-139

[Reaction Scheme 17]

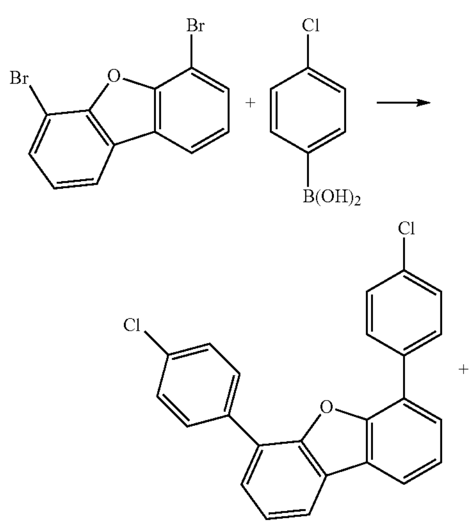

Int-31

-continued

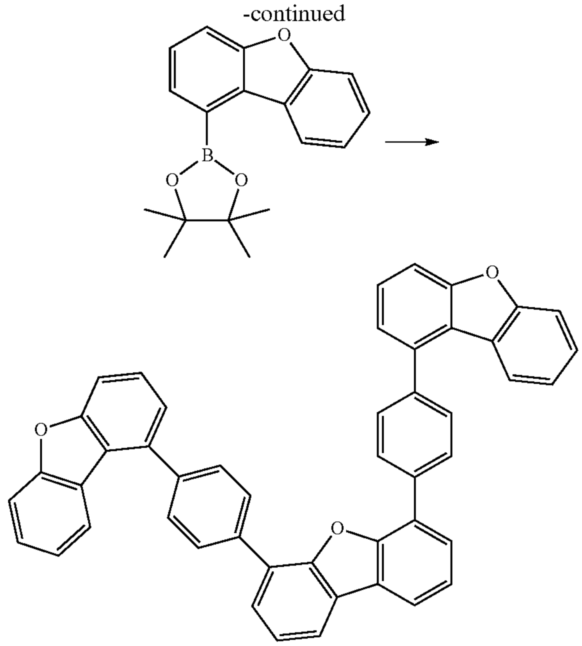

3-139

1st Step: Synthesis of Intermediate Int-31

50 g (153 mmol) of 4,6-dibromodibenzofuran was dissolved in 510 mL of THF, and 52 g (337 mmol) of 4-chlorophenylboronic acid and 8.8 g (7.6 mmol) of $Pd(PPh_3)_4$ were added thereto and then stirred. Subsequently, $K_2CO_3$ saturated in water was added thereto in order to provide 53 g (383 mmol) of $K_2CO_3$ and then, refluxed and stirred at 80° C. for 12 hours. When a reaction was completed, water was added to the reaction solution, and the mixture was extracted with DCM, treated with $MgSO_4$ to remove moisture, filtered, and concentrated under a reduced pressure. The obtained residue was separated and purified through column chromatography (hexane:DCM (20%)) to obtain 49 g (82%) of Intermediate Int-31.

2nd Step: Synthesis of Compound 3-139

49 g (125 mmol) of Intermediate Int-31, 81 g (277 mmol) of 1-(4,4,5,5-tetramethyl-1,3,2-dioxaborolan-2-yl)dibenzofuran, 82 g (251 mmol) of $Cs_2CO_3$, 5.7 g (6.3 mmol) of $Pd_2(dba)_3$, and 10 g (50% in toluene) of $P(t\text{-}Bu)_3$ were added to 420 mL of 1,4-dioxane and then, refluxed and stirred under a nitrogen flow for 12 hours. After removing the 1,4-dioxane, 200 mL of methanol was added to the obtained mixture to crystallize a solid, the solid was filtered, dissolved in MCB, and silica gel-filtered, and an appropriate amount of an organic solvent was eluted therefrom to obtain 62 g (76%) of Compound 3-139.

(LC/MS: theoretical value: 652.20 g/mol, measured value: 653.48 g/mol)

Manufacture of Organic Light Emitting Diode

Example 1

The glass substrate coated with ITO (indium tin oxide) was washed with distilled water. After washing with the distilled water, the glass substrate was ultrasonically washed with isopropyl alcohol, acetone, or methanol and dried and then, moved to a plasma cleaner, cleaned by using oxygen plasma for 10 minutes, and moved to a vacuum depositor. This obtained ITO transparent electrode was used as an anode, Compound A doped with 3% NDP-9 (available from Novaled) was vacuum-deposited on the ITO substrate to form a 1,400 Å-thick hole transport layer, and Compound B was deposited on the hole transport layer to form a 350 Å-thick hole transport auxiliary layer. On the hole transport auxiliary layer, a 400 Å-thick light emitting layer was formed by vacuum-depositing Compound 1-46, Compound 2-1, and Compound 3-17 as a host simultaneously and doping 15 wt % of PtGD as a dopant. Herein, Compound 1-27, Compound 2-13, and Compound 3-25 were used in a weight ratio of 35:55:10, and the ratios are separately described below for the other Examples and Comparative Examples. Subsequently, Compound C was deposited on the light emitting layer to form a 50 Å-thick electron transport auxiliary layer, and Compound D and LiQ were simultaneously vacuum deposited at a weight ratio of 1:1 to form a 300 Å-thick electron transport layer. On the electron transport layer, Liq and Al were sequentially vacuum-deposited to be 15 Å thick and 1,200 Å thick, manufacturing an organic light emitting diode having the following structure.

ITO/Compound A (3% NDP-9 doping, 1,400 Å)/Compound B (350 Å)/EML[85 wt % of host (1-27:2-13:3-25=35:55:10 (wt %)):15 wt % of [PtGD] (400 Å)/Compound C (50 Å)/Compound D: LiQ (300 Å)/LiQ (15 Å)/Al (1,200 Å).

Compound A: N-(biphenyl-4-yl)-9,9-dimethyl-N-(4-(9-phenyl-9H-carbazol-3-yl)phenyl)-9H-fluoren-2-amine Compound B: N,N-bis(9,9-dimethyl-9H-fluoren-4-yl)-9,9-spirobi(fluorene)-2-amine Compound C: 2-(3-(3-(9,9-dimethyl-9H-fluoren-2-yl)phenyl)phenyl)-4,6-diphenyl-1,3,5-triazine Compound D: 8-(4-(4,6-di(naphthalen-2-yl)-1,3,5-triazin-2-yl)phenyl)quinolone [PtGD]

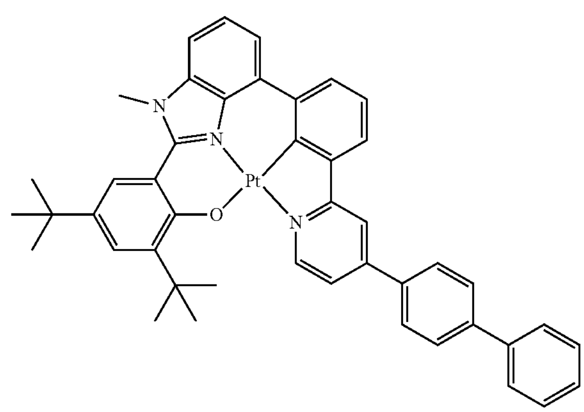

Examples 2 to 8

Organic light emitting diodes were manufactured in the same manner as in Example 1, except that the composition was changed to the host shown in Tables 1 to 4.

Comparative Examples 1 to 10

Organic light emitting diodes were manufactured in the same manner as in Example 1, except that the composition was changed to the host shown in Tables 1 to 4.

Evaluation

The luminous efficiency and driving voltages of the organic light emitting diodes according to Examples 1 to 8 and Comparative Examples 1 to 10 were measured.

Specific measurement methods are as follows, and the results are shown in Tables 1 to 4.

(1) Measurement of Current Density Change Depending on Voltage Change

The obtained organic light emitting diodes were measured regarding a current value flowing in the unit diode, while increasing the voltage from 0 V to 10 V using a current-voltage meter (Keithley 2400), and the measured current value was divided by area to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Current Efficiency

The current efficiency (cd/A) of the same current density (10 mA/cm$^2$) was calculated using the luminance, current density, and voltage measured from the (1) and (2).

(4) Measurement of Driving Voltage

The driving voltage of each diode at 15 mA/cm$^2$ using a current-voltmeter (Keithley 2400) was measured to obtain the results.

(5) Calculation of Efficiency Ratio

Relative values were calculated based on the current efficiency values of Comparative Example 1, Comparative Example 3, Comparative Example 6, and Comparative Example 8, respectively, and are shown as efficiency ratios in Tables 1 to 4.

(6) Calculation of Driving Voltage Ratio

Relative values were calculated based on the driving voltages of Comparative Example 1, Comparative Example 3, Comparative Example 6, and Comparative Example 8, respectively, and are shown as driving voltage ratios in Tables 1 to 4.

TABLE 1

| | First host | Second host | Third host | First host: Second host: Third host ratio (wt:wt) | Efficiency ratio (%) | Driving voltage ratio (%) |
|---|---|---|---|---|---|---|
| Example 1 | 1-27 | 2-13 | 3-25 | 35:55:10 | 118 | 95 |
| Example 2 | 1-27 | 2-13 | 3-25 | 32:48:20 | 116 | 96 |
| Comparative Example 1 | 1-27 | 2-13 | | 35:65 | 100 | 100 |
| Comparative Example 2 | 1-27 | | 3-25 | 35:65 | 57 | 133 |

TABLE 2

| | First host | Second host | Third host | First host: Second host: Third host ratio (wt:wt) | Efficiency ratio (%) | Driving voltage ratio (%) |
|---|---|---|---|---|---|---|
| Example 3 | 1-45 | 2-8 | 3-53 | 35:55:10 | 120 | 94 |
| Example 4 | 1-45 | 2-8 | 3-53 | 32:48:20 | 118 | 96 |
| Comparative Example 3 | 1-45 | 2-8 | — | 35:65 | 100 | 100 |
| Comparative Example 4 | 1-45 | — | 3-53 | 35:65 | 62 | 121 |
| Comparative Example 5 | 1-45 | 2-8 | 1-24 | 20:60:20 | 100 | 105 |

TABLE 3

| | First host | Second host | Third host | First host: Second host: Third host ratio (wt:wt) | Efficiency ratio (%) | Driving voltage ratio (%) |
|---|---|---|---|---|---|---|
| Example 5 | 1-73 | 2-2 | 3-138 | 35:55:10 | 117 | 95 |
| Example 6 | 1-73 | 2-2 | 3-138 | 32:48:20 | 117 | 96 |
| Comparative Example 6 | 1-73 | 2-2 | — | 35:65 | 100 | 100 |
| Comparative Example 7 | 1-73 | — | 3-138 | 35:65 | 70 | 118 |

TABLE 4

| | First host | Second host | Third host | First host: Second host: Third host ratio (wt:wt) | Efficiency ratio (%) | Driving voltage ratio (%) |
|---|---|---|---|---|---|---|
| Example 7 | 1-43 | 2-33 | 3-139 | 35:55:10 | 123 | 93 |
| Example 8 | 1-43 | 2-33 | 3-139 | 32:48:20 | 120 | 96 |
| Comparative Example 8 | 1-43 | 2-33 | — | 35:65 | 100 | 100 |
| Comparative Example 9 | 1-43 | — | 3-139 | 35:65 | 66 | 125 |
| Comparative Example 10 | 1-43 | 2-33 | 2-13 | 30:60:10 | 101 | 102 |

Referring to Tables 1 to 4, the organic light emitting diodes according to Examples 1 to 8 exhibited significantly improved driving voltage and efficiency, compared with the organic light emitting diodes according to Comparative Examples 1 to 10.

One or more embodiments may provide a composition for an organic optoelectronic device having high efficiency and a long life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for an organic optoelectronic device, the composition comprising:

a first compound;
a second compound; and
a third compound,
wherein the first compound is represented by Chemical Formula I,
the second compound is represented by Chemical Formula II, and
the third compound is represented by Chemical Formula III:

[Chemical Formula I]

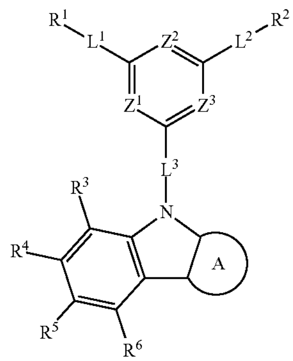

wherein, in Chemical Formula I,
$Z^1$ to $Z^3$ are each independently N or C-$L^a$-$R^a$, at least two of Z to $Z^3$ being N,
$L^a$ and $L^1$ to $L^3$ are each independently a single bond, a substituted or unsubstituted C6 to C20 arylene group, a substituted or unsubstituted C2 to C20 heterocyclic group, or a combination thereof,
$R^1$ and $R^2$ are each independently a substituted or unsubstituted C6 to C30 aryl group, a substituted or unsubstituted C2 to C30 heterocyclic group, or a combination thereof,
$R^a$ and $R^3$ to $R^6$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and
ring A is represented by one of Substituent A-1 to Substituent A-6,

[Substituent A-1]

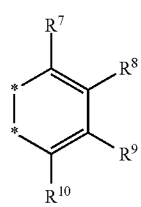

[Substituent A-2]

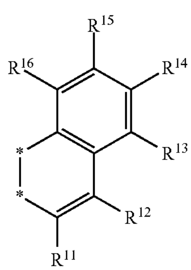

-continued

[Substituent A-3]

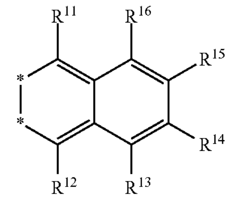

[Substituent A-4]

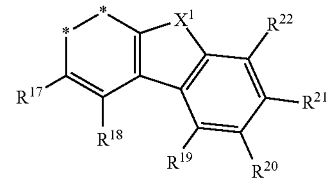

[Substituent A-5]

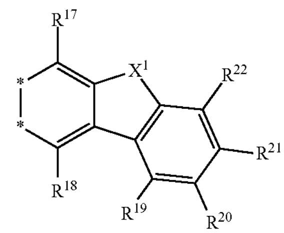

[Substituent A-6]

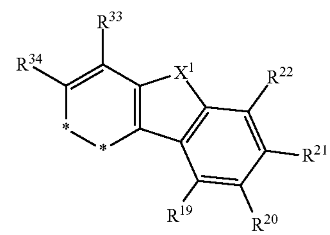

wherein, in Substituent A-1 to Substituent A-6,
$X^1$ is O, S, or $NR^b$,
$R^b$ and $R^7$ to $R^{22}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and
* is a linking carbon;

[Chemical Formula II]

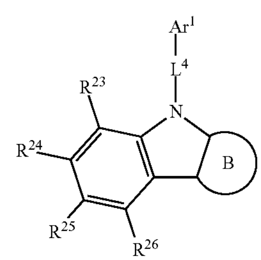

wherein, in Chemical Formula II,
$L^4$ is a single bond, a substituted or unsubstituted C6 to C20 arylene group, a substituted or unsubstituted C2 to C20 heterocyclic group, or a combination thereof, $Ar^1$ is a substituted or unsubstituted C6 to C30 aryl group, a substituted or unsubstituted dibenzofuranyl group, a substituted or unsubstituted dibenzothiophenyl group, or a combination thereof, $R^{23}$ to $R^{26}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and ring B is represented by one of Substituent B-1 to Substituent B-4:

[Substituent B-1]

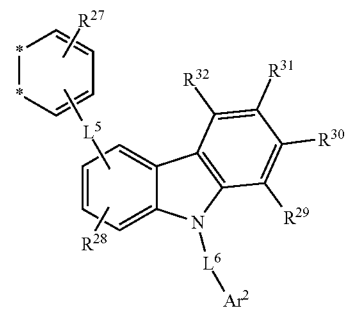

[Substituent B-2]

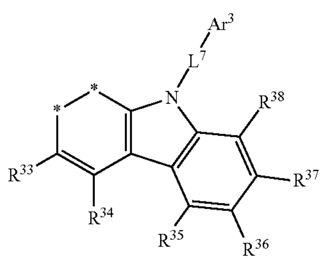

[Substituent B-3]

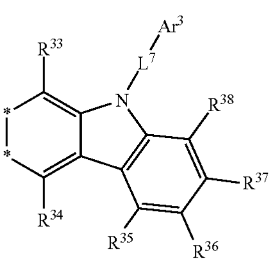

[Substituent B-4]

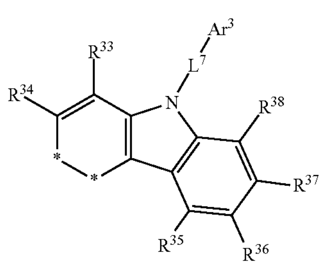

wherein, in Substituent B-1 to Substituent B-4, $L^5$ to $L^7$ are each independently a single bond, a substituted or unsubstituted C6 to C20 arylene group, a substituted or unsubstituted C2 to C20 heterocyclic group, or a combination thereof, $Ar^2$ and $Ar^3$ are each independently a substituted or unsubstituted C6 to C30 aryl group, a substituted or unsubstituted dibenzofuranyl group, a substituted or unsubstituted dibenzothiophenyl group, or a combination thereof, $R^{27}$ to $R^{38}$ are each independently hydrogen, deuterium, a substituted or unsubstituted C1 to C30 alkyl group, a substituted or unsubstituted C6 to C30 aryl group, a substituted or unsubstituted C2 to C30 heterocyclic group, a substituted or unsubstituted silyl group, a substituted or unsubstituted amine group, a halogen, a cyano group, or a combination thereof, and

* is a linking carbon;

[Chemical Formula III]

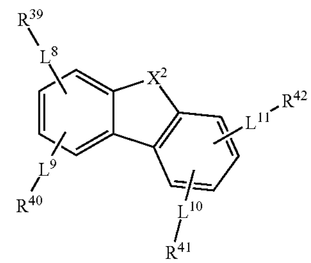

wherein, in Chemical Formula III, $X^2$ is O, or S, $L^8$ to $L^{11}$ are each independently a single bond or a substituted or unsubstituted C6 to C20 arylene group, $R^{39}$ to $R^{42}$ are each independently hydrogen, deuterium, a substituted or unsubstituted C1 to C30 alkyl group, a substituted or unsubstituted C6 to C30 aryl group, a substituted or unsubstituted dibenzofuranyl group, or a substituted or unsubstituted dibenzothiophenyl group, and at least one of $R^{39}$ to $R^{42}$ is a substituted or unsubstituted dibenzofuranyl group or a substituted or unsubstituted dibenzothiophenyl group.

2. The composition as claimed in claim 1, wherein the first compound is represented by Chemical Formula I-A, Chemical Formula I-D, Chemical Formula I-E, Chemical Formula I-F, Chemical Formula I-G, Chemical Formula I-H, Chemical Formula I-I, or Chemical Formula I-J:

[Chemical Formula I-A]

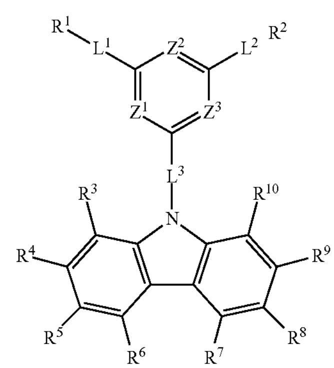

-continued
[Chemical Formula I-D]
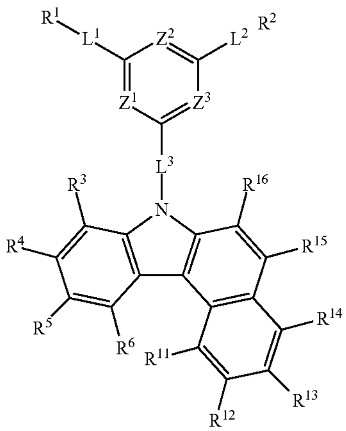
[Chemical Formula I-E]
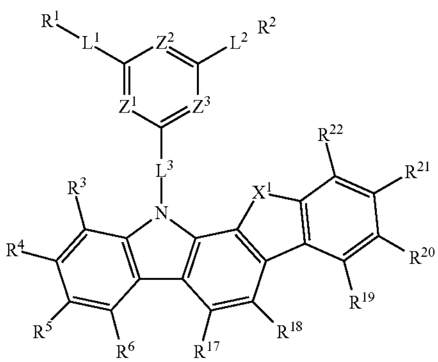
[Chemical Formula I-F]
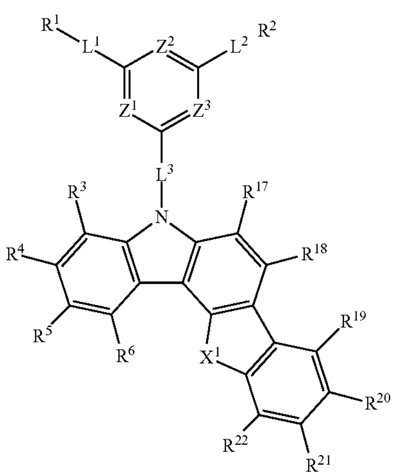
-continued
[Chemical Formula I-G]
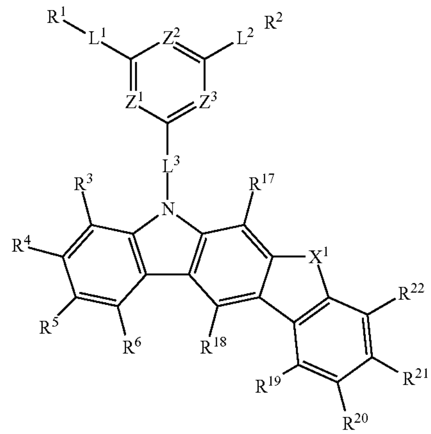
[Chemical Formula I-H]
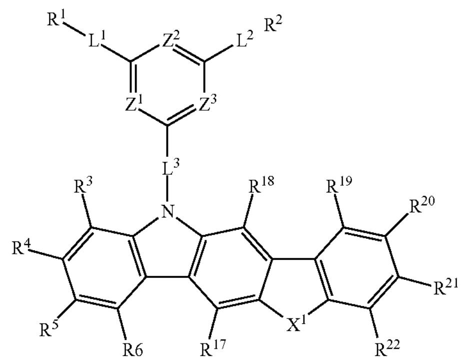
[Chemical Formula I-I]
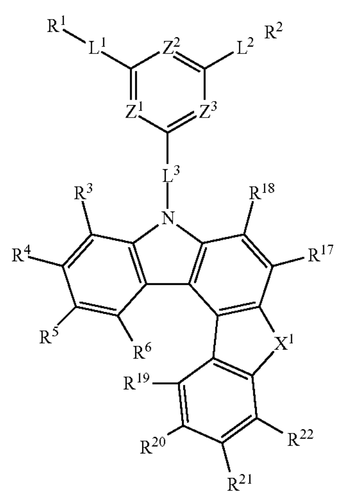

-continued

[Chemical Formula I-J]

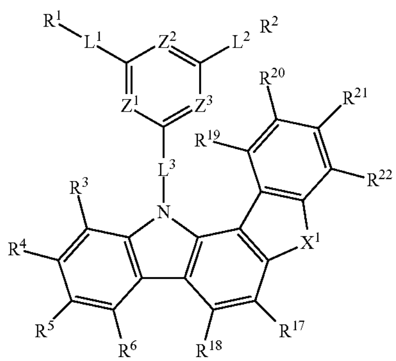

wherein, in Chemical Formula I-A, Chemical Formula I-D, Chemical Formula I-E, Chemical Formula I-F, Chemical Formula I-G, Chemical Formula I-H, Chemical Formula I-I, and Chemical Formula I-J, $Z^1$ to $Z^3$, $L^1$ to $L^3$, $R^1$ to $R^{22}$, and $X^1$ are defined the same as those of Chemical Formula I.

3. The composition as claimed in claim 1, wherein the first compound is represented by Chemical Formula I-A-1, Chemical Formula I-A-4, or Chemical Formula I-E-1:

[Chemical Formula I-A-1]

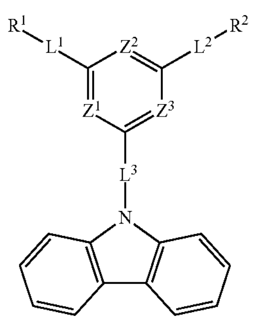

[Chemical Formula I-A-4]

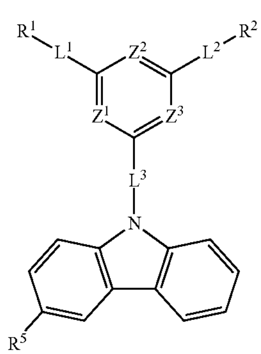

-continued

[Chemical Formula I-E-1]

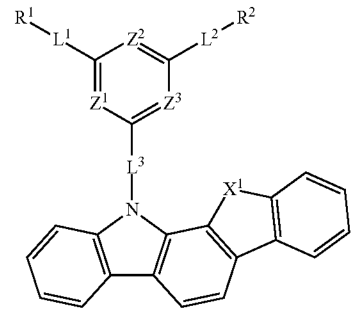

wherein, in Chemical Formula I-A-1, Chemical Formula I-A-4, and Chemical Formula I-E-1, $Z^1$ to $Z^3$, $L^8$ to $L^3$, $R^1$, $R^2$, $R^5$, and $X^1$ are defined the same as those of Chemical Formula I.

4. The composition as claimed in claim 1, wherein the second compound is represented by Chemical Formula IIA or Chemical Formula IIF:

[Chemical Formula IIA]

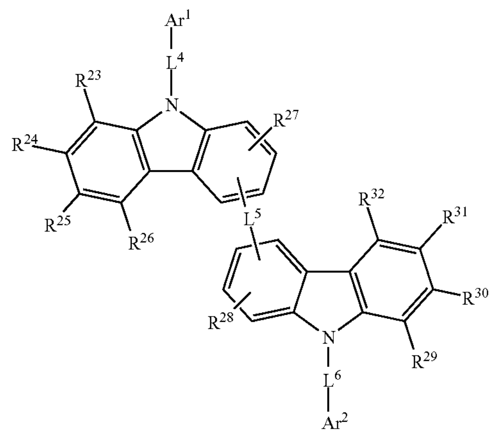

[Chemical Formula IIF]

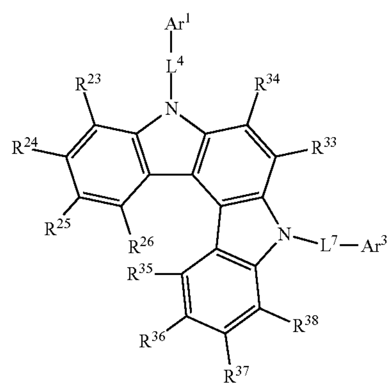

wherein, in Chemical Formula IIA and Chemical Formula IIF, $L^4$ to $L^7$, $Ar^1$ to $Ar^3$, and $R^{23}$ to $R^{38}$ are defined the same as those of Chemical Formula II.

5. The composition as claimed in claim 4, wherein:

the second compound is represented by Chemical Formula IIA,

Chemical Formula IIA is represented by Chemical Formula IIA-I or Chemical Formula IIA-2:

[Chemical Formula IIA-1]

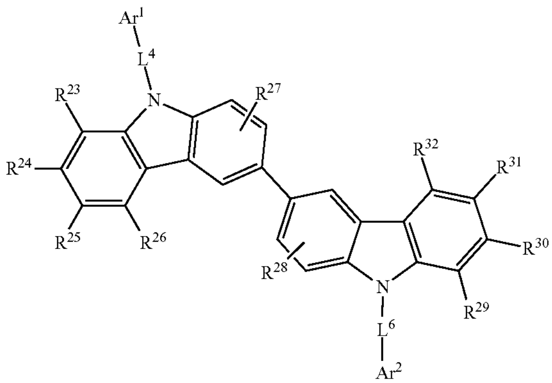

[Chemical Formula IIA-2]

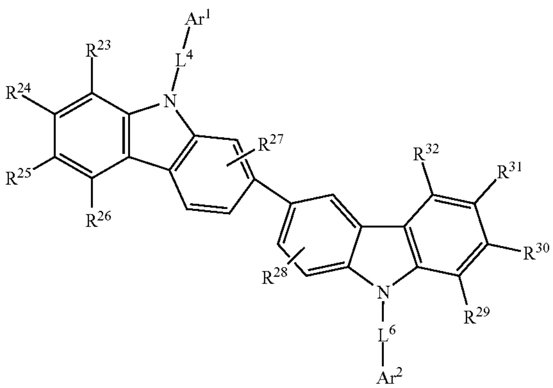

in Chemical Formula IIA-I and Chemical Formula IIA-2, $L^4$, $L^6$, $Ar^1$, $Ar^2$, and $R^{23}$ to $R^{32}$ are defined the same as those of Chemical Formula II.

6. The composition as claimed in claim 1, wherein the third compound is represented by Chemical Formula IIIA-1, Chemical Formula IIIA-2, Chemical Formula IIIA-4, or Chemical Formula IIIB-4:

[Chemical Formula IIIA-1]

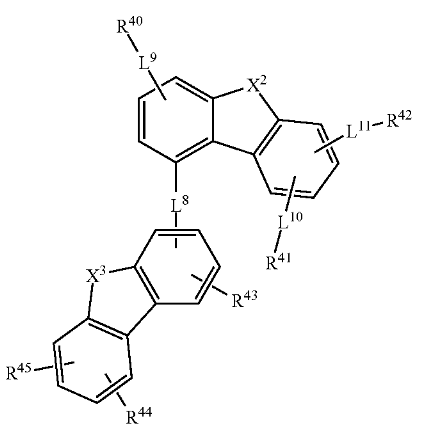

-continued

[Chemical Formula IIIA-2]

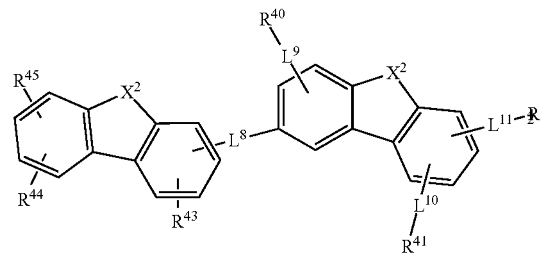

[Chemical Formula IIIA-4]

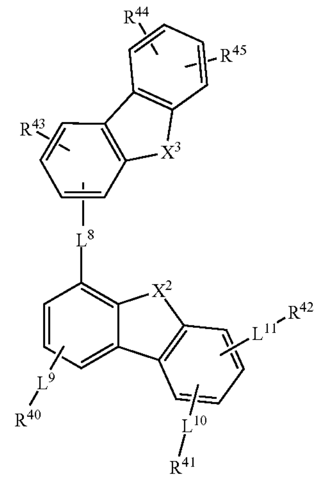

[Chemical Formula IIIB-4]

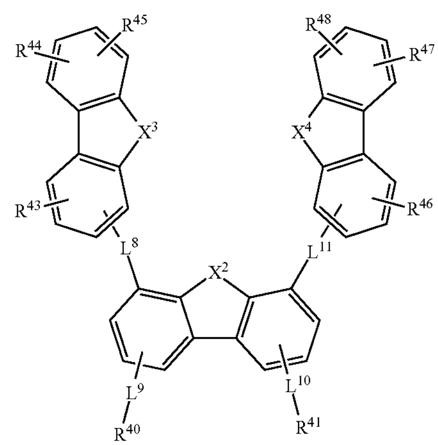

wherein, in Chemical Formula IIIA-1, Chemical Formula IIIA-2, Chemical Formula IIIA-4, and Chemical Formula IIIB-4, $X^2$, $R^{40}$ to $R^{45}$, and $L^8$ to $L^{11}$ are defined the same as those of Chemical Formula III, $X^3$ and $X^4$ are each independently O or S, and $R^{46}$ to $R^{48}$ are each independently hydrogen, deuterium, a substituted or unsubstituted C1 to C30 alkyl group, or a substituted or unsubstituted C6 to C30 aryl group.

7. The composition as claimed in claim 1, wherein the third compound is represented by Chemical Formula IIIA-1-4, Chemical Formula IIIA-2-2, Chemical Formula IIIA-4-1, Chemical Formula IIIB-4-1, or Chemical Formula IIIB-4-5:

[Chemical Formula IIIA-1-4]

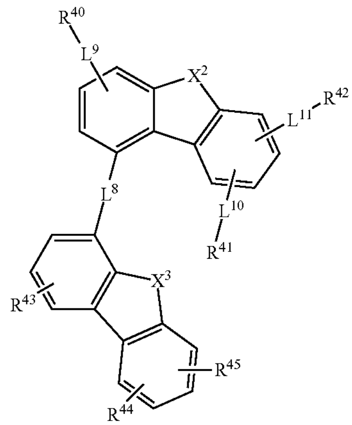

[Chemical Formula IIIA-2-2]

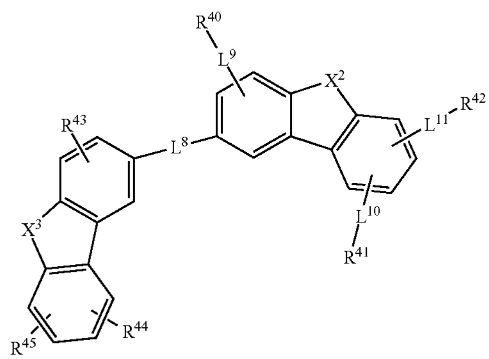

[Chemical Formula IIIA-4-1]

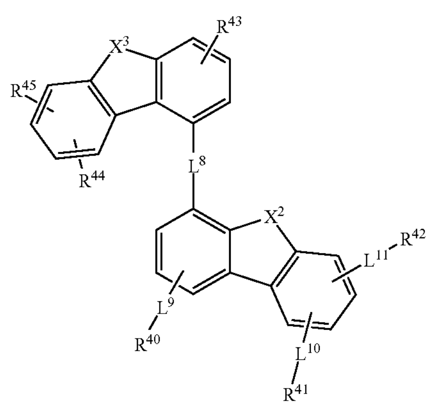

[Chemical Formula IIIB-4-1]

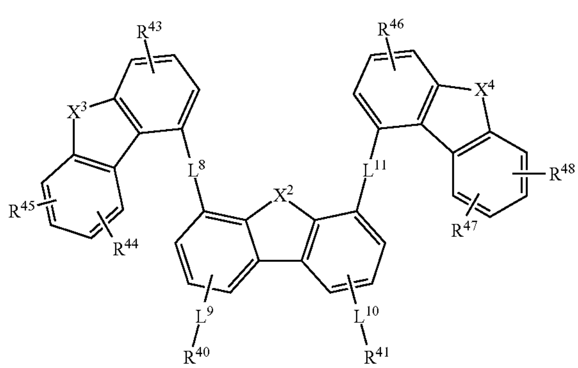

-continued

[Chemical Formula IIIB-4-5]

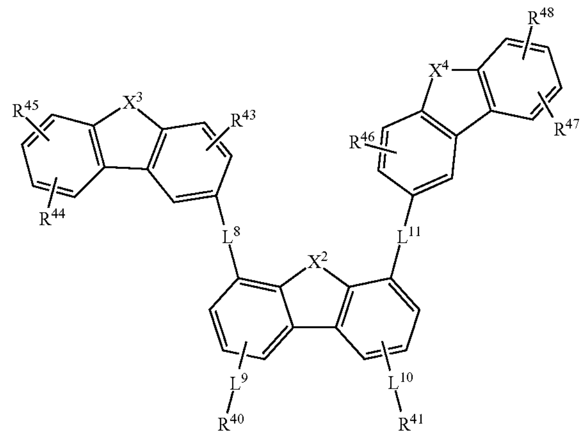

wherein, in Chemical Formula IIIA-1-4, Chemical Formula IIIA-2-2, Chemical Formula IIIA-4-1, Chemical Formula IIIB-4-1, and Chemical Formula IIIB-4-5, $X^2$, $R^{40}$ to $R^{45}$, and $L^8$ to $L^{11}$ are defined the same as those of Chemical Formula III, $X^3$ and $X^4$ are each independently O or S, and $R^{46}$ to $R^{48}$ are each independently hydrogen, deuterium, a substituted or unsubstituted C1 to C30 alkyl group, or a substituted or unsubstituted C6 to C30 aryl group.

8. The composition as claimed in claim 1, wherein the third compound is a compound of the following Group 3:

[Group 3]

[3-1]

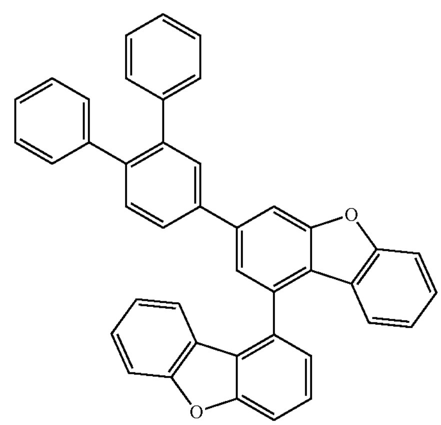

[3-2]

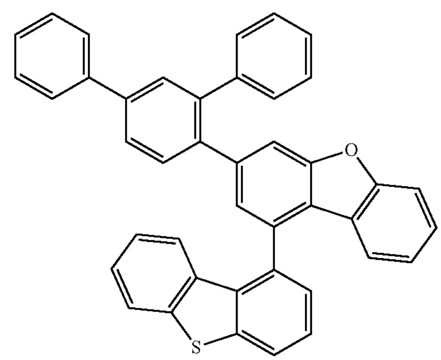

-continued
[3-3]
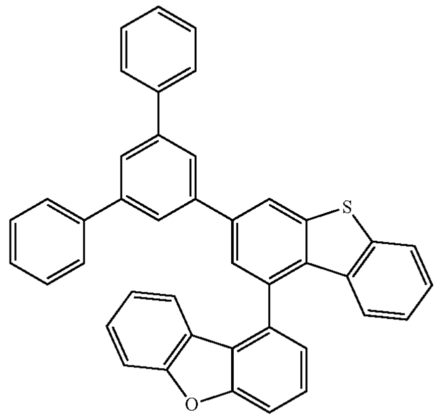
[3-4]
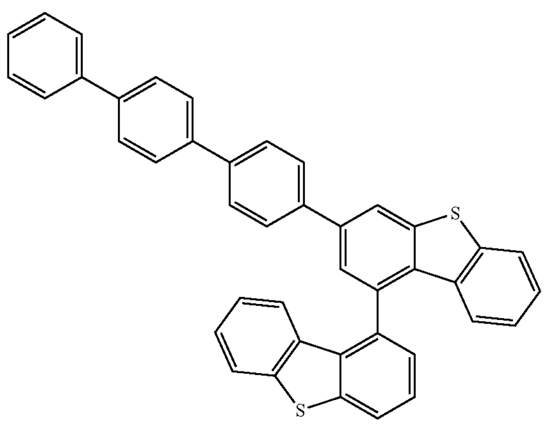
[3-5]
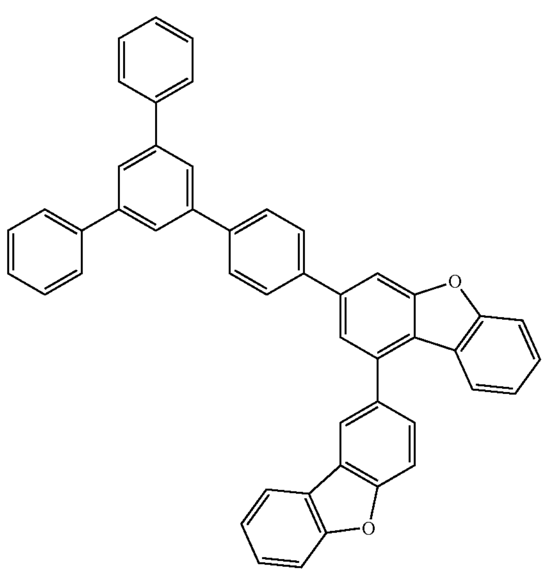
-continued
[3-6]
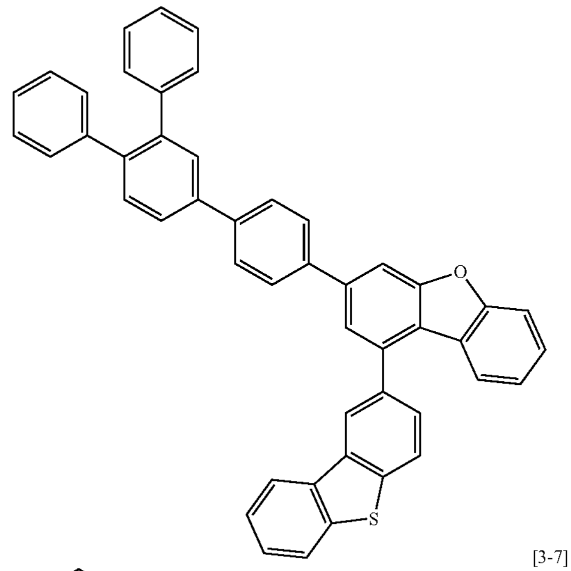
[3-7]
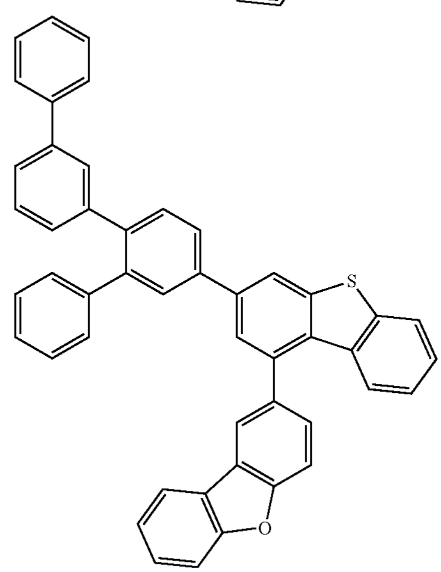
[3-8]
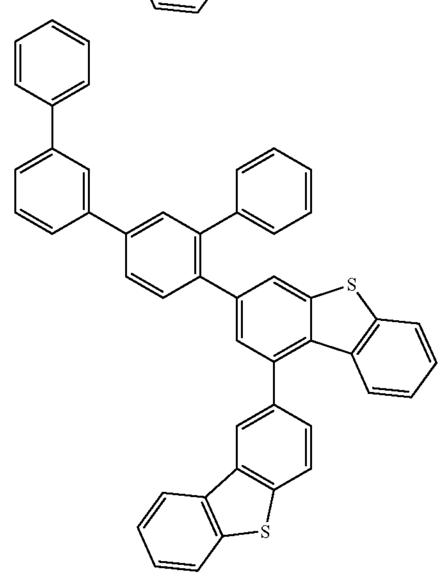

-continued
[3-9]
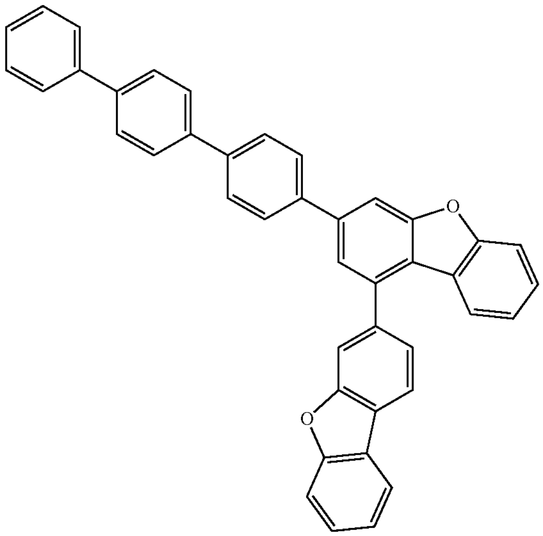
[3-10]
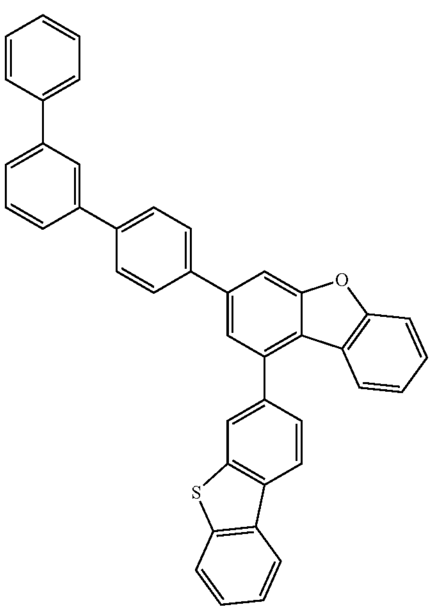
-continued
[3-11]
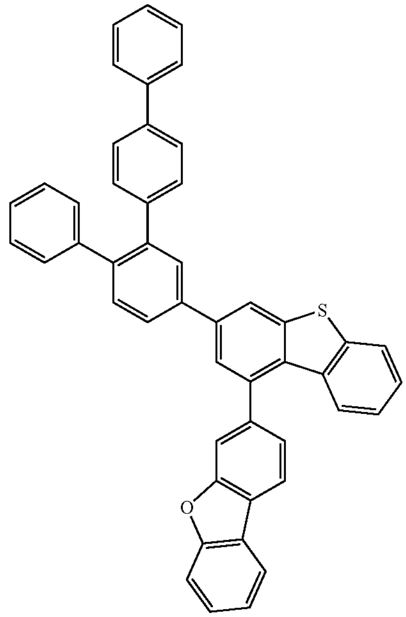
[3-12]
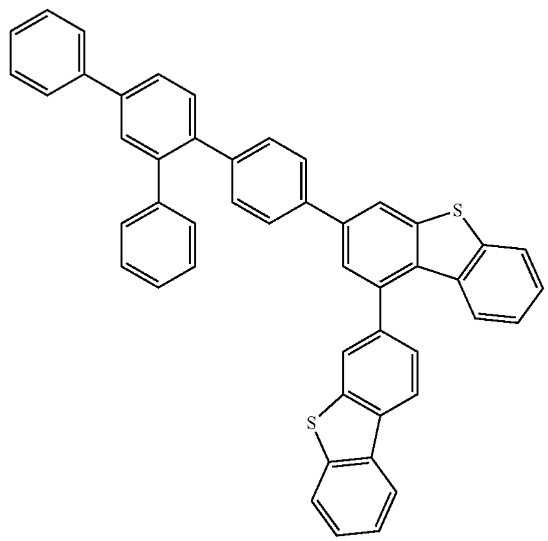
[3-13]
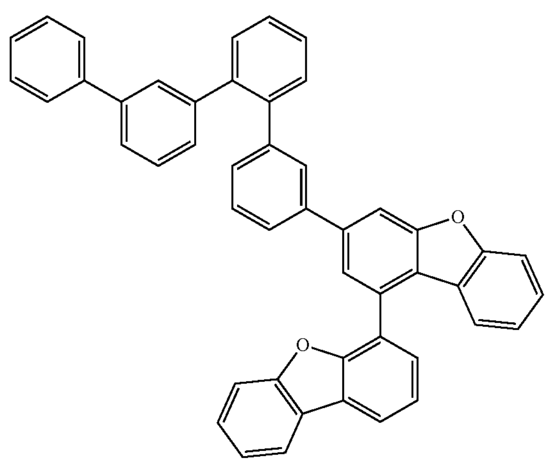

-continued
[3-14]
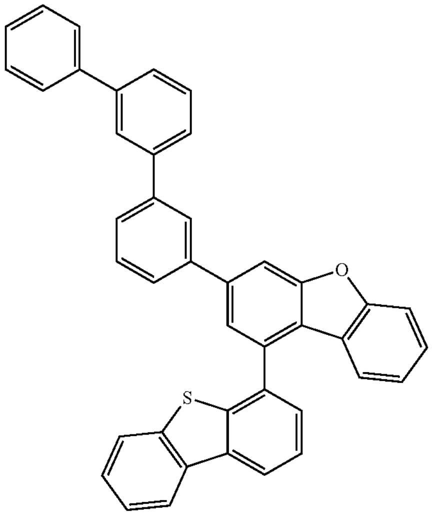
[3-15]
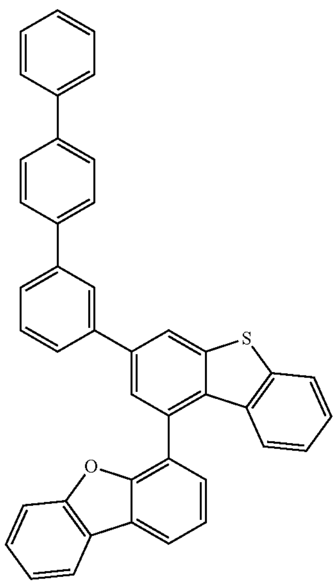
[3-16]
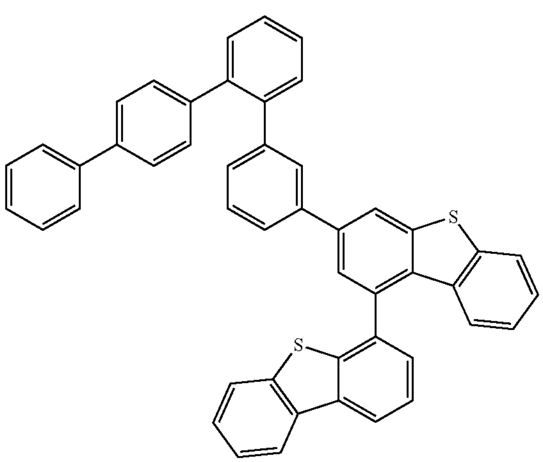
-continued
[3-17]
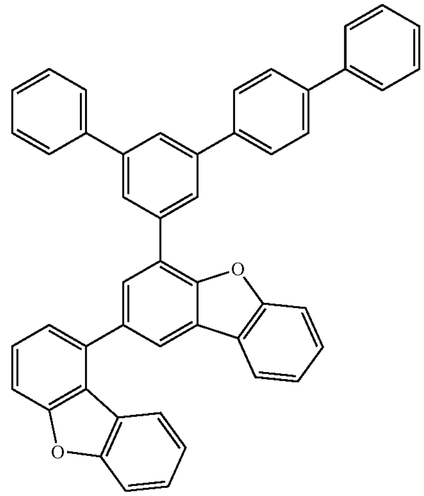
[3-18]
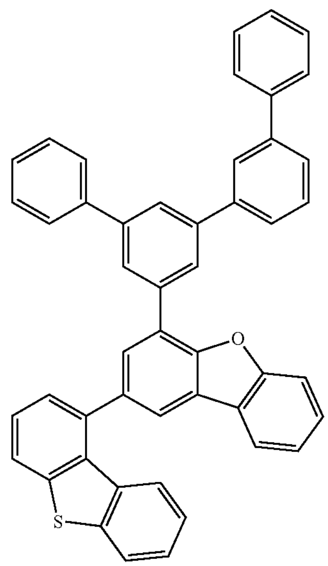
[3-19]
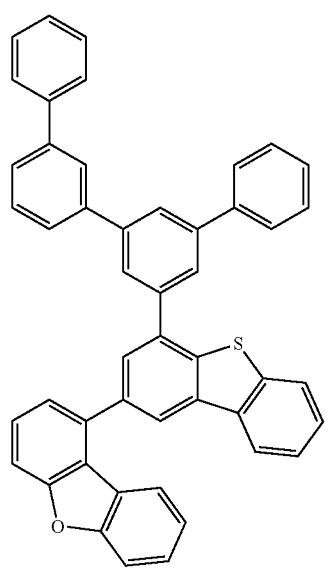

-continued
[3-20]
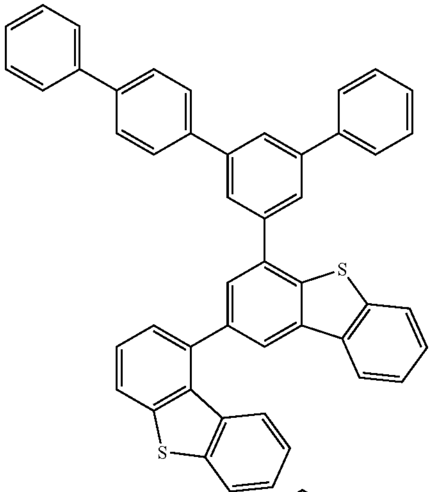
[3-25]
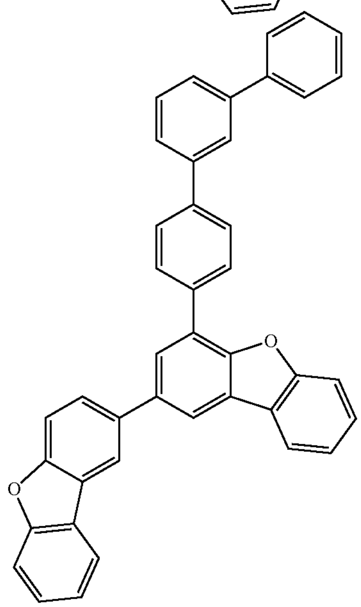
[3-26]
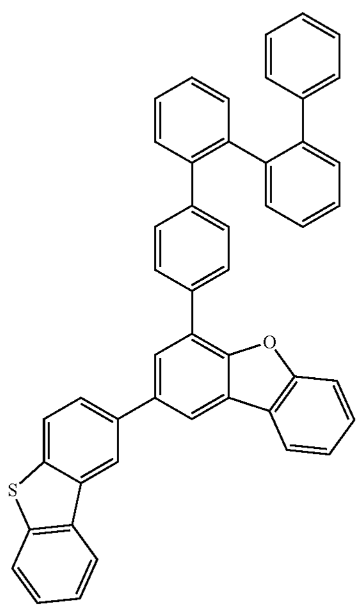
-continued
[3-27]
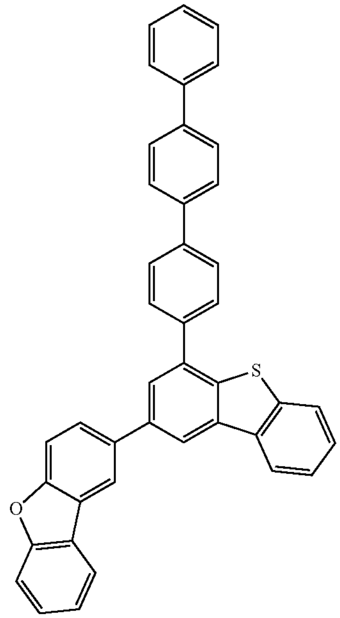
[3-28]
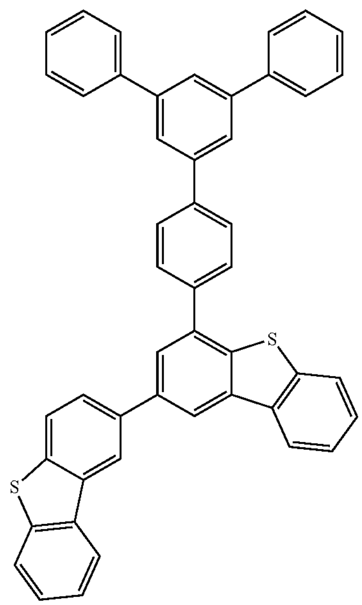
[3-29]
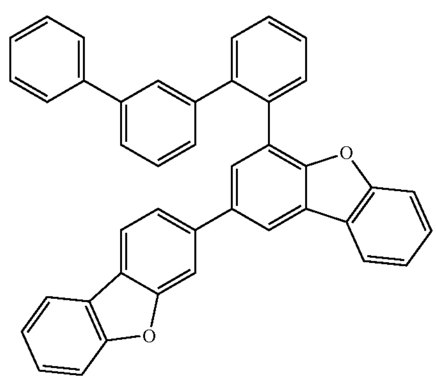

-continued
[3-30]
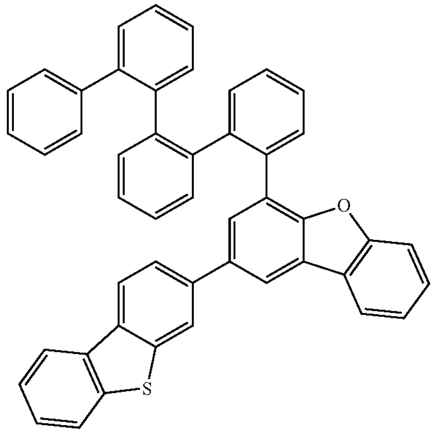
[3-31]
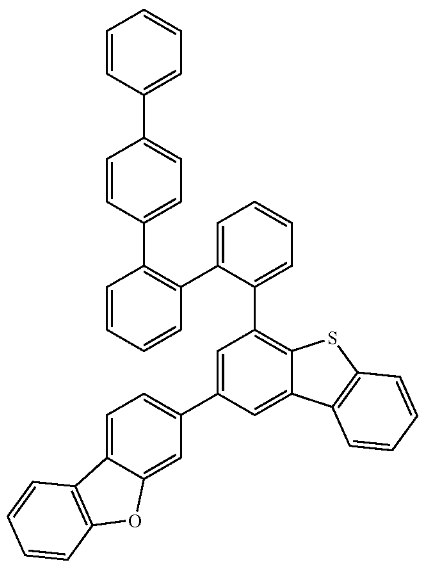
[3-32]
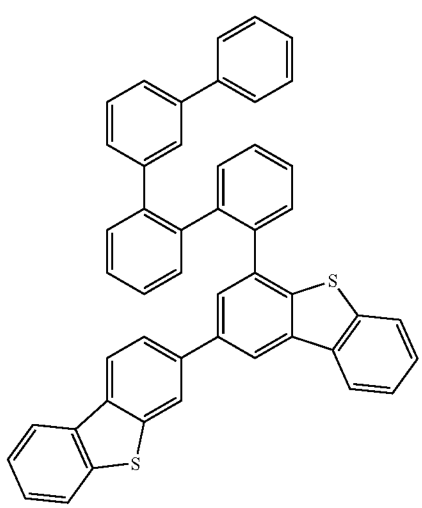
-continued
[3-33]
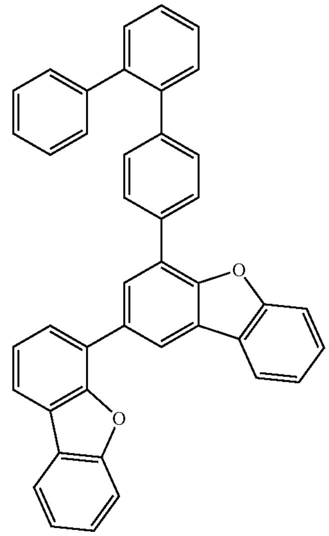
[3-34]
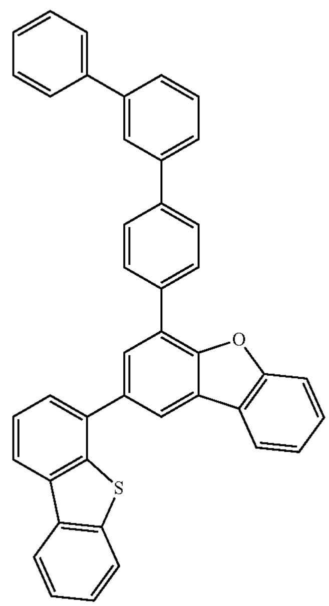
[3-35]
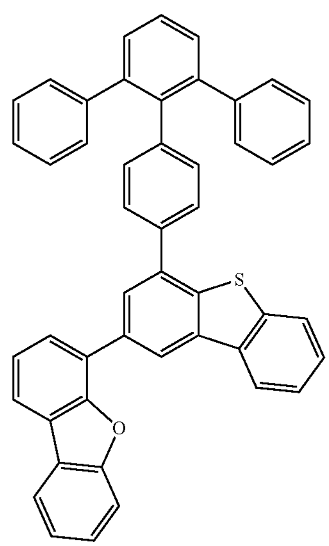

-continued
[3-36]
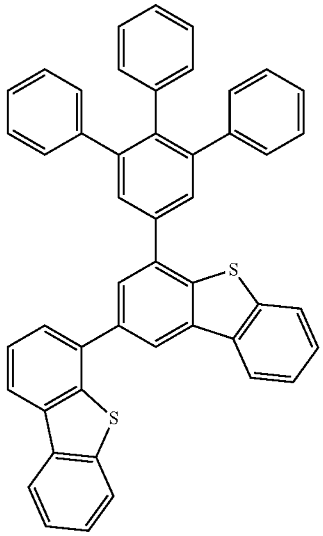
[3-37]
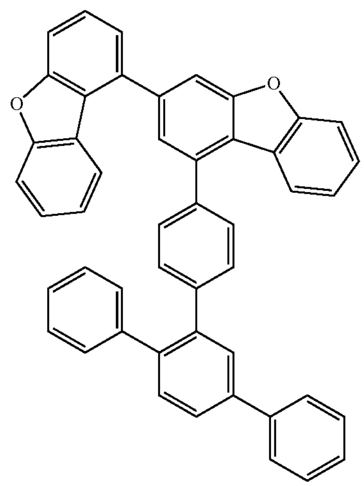
[3-38]
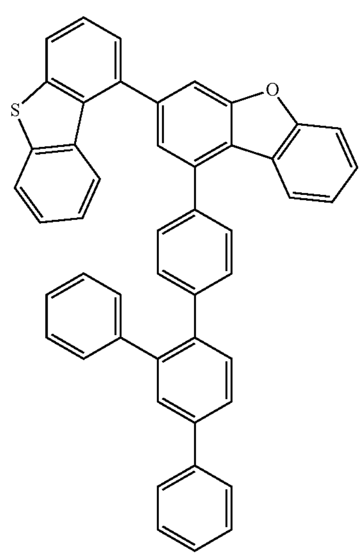
-continued
[3-39]
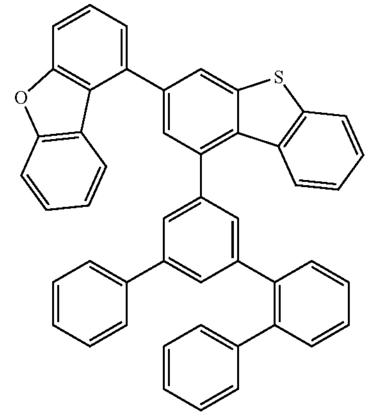
[3-40]
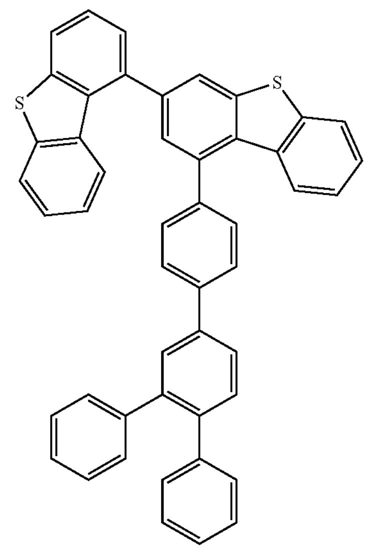
[3-41]
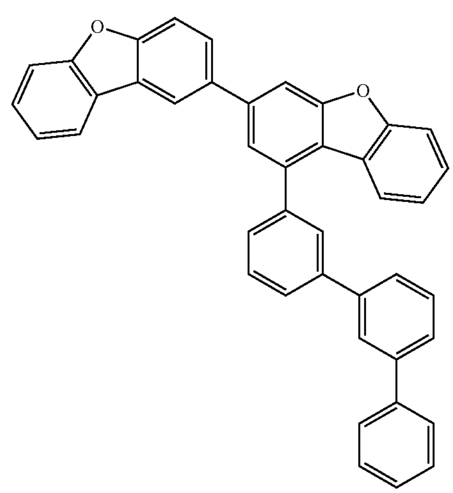

-continued
[3-42]
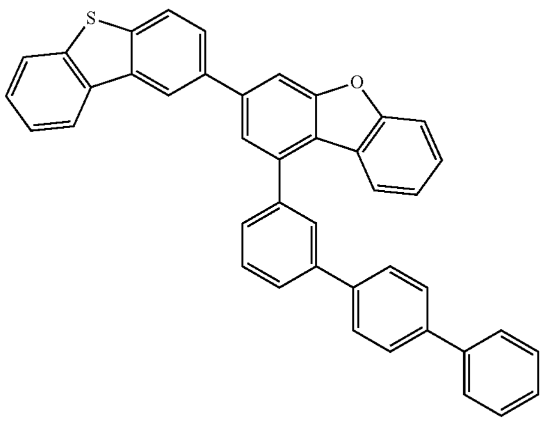
[3-43]
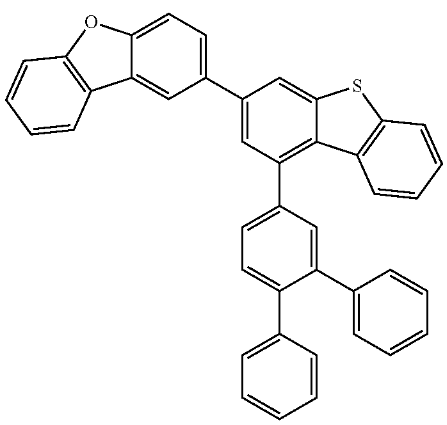
[3-44]
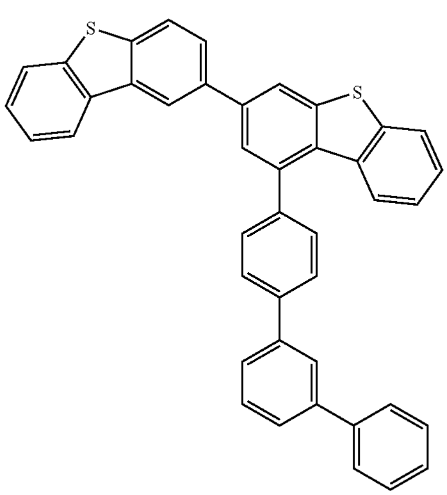
-continued
[3-45]
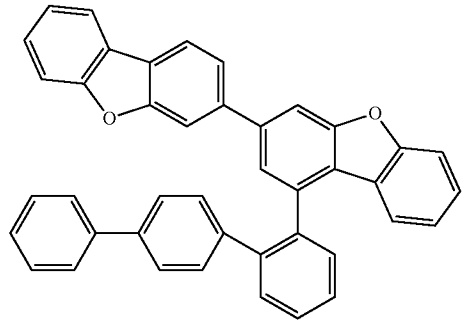
[3-46]
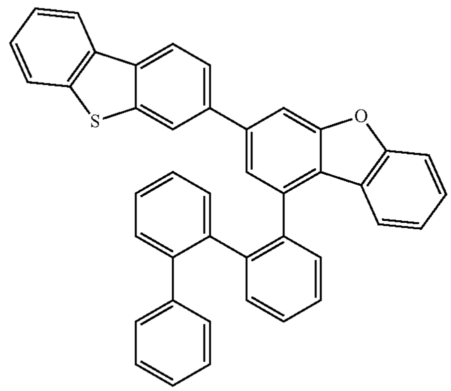
[3-47]
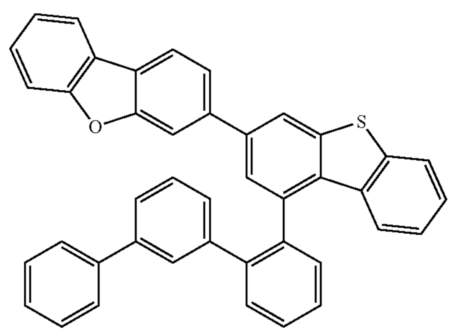
[3-48]
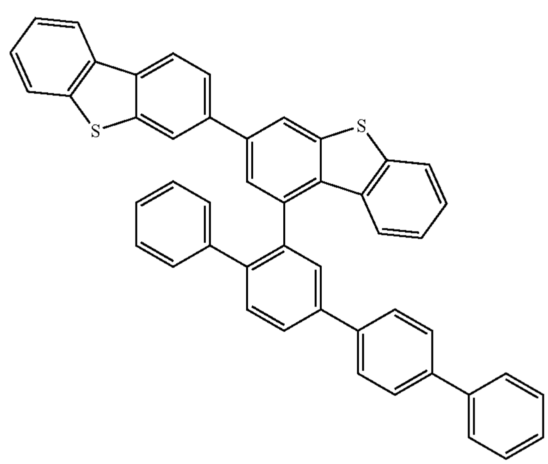

-continued
[3-49]
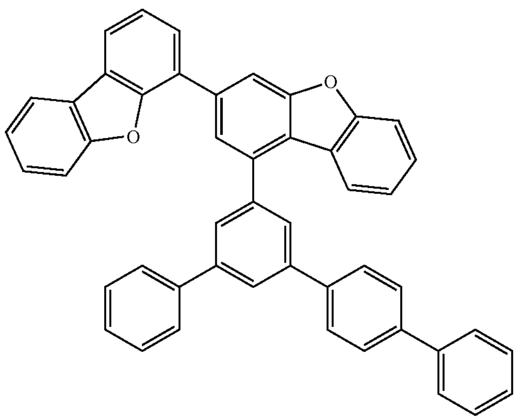
[3-50]
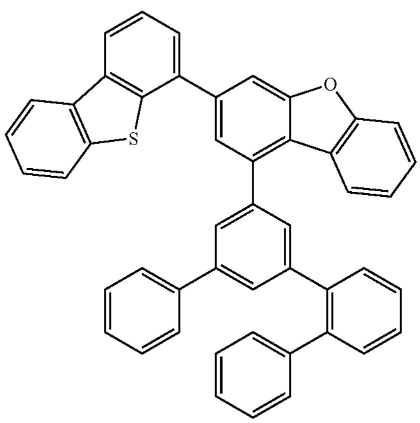
[3-51]
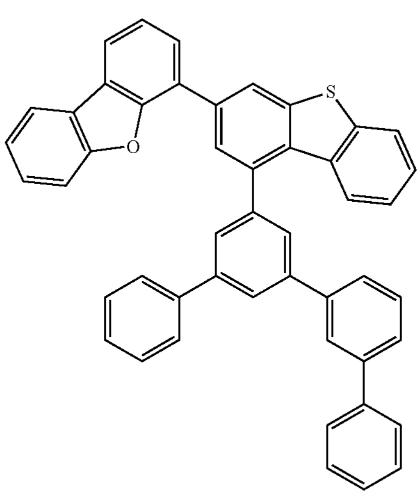
-continued
[3-52]
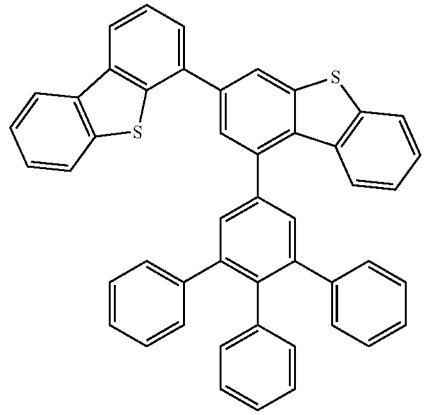
[3-53]
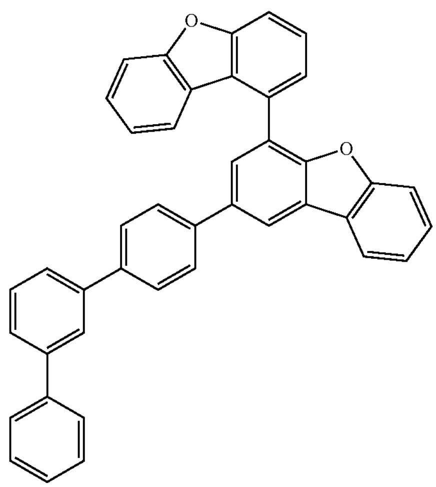
[3-54]
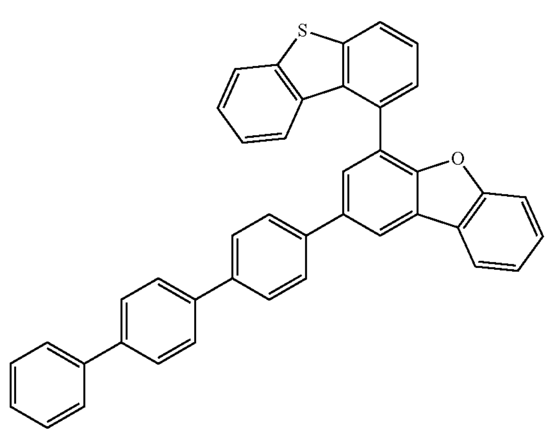

[3-55]
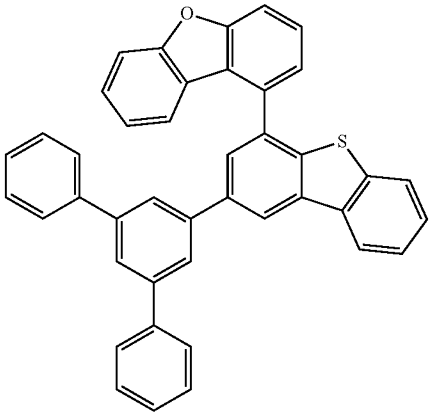
[3-56]
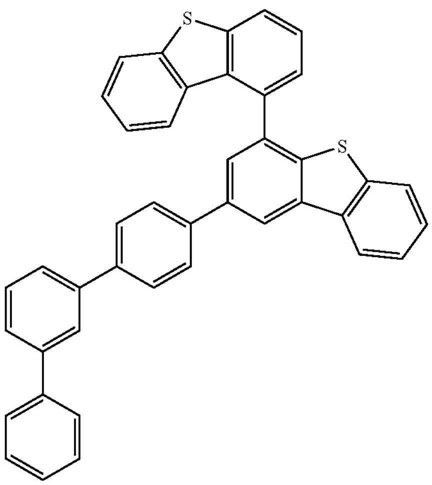
[3-57]
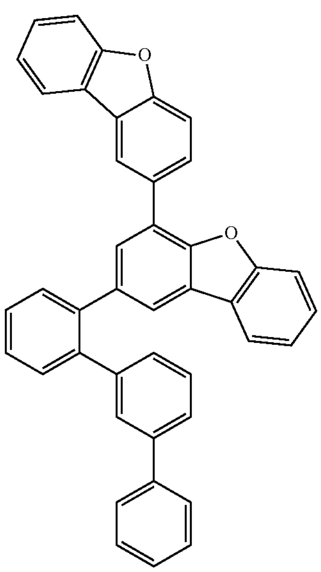
[3-58]
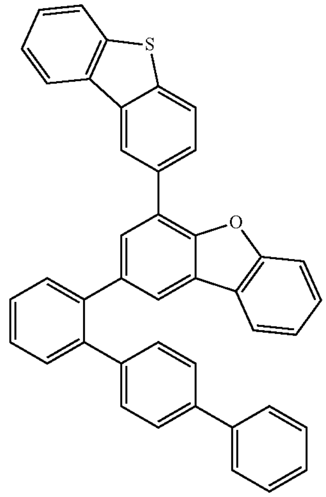
[3-59]
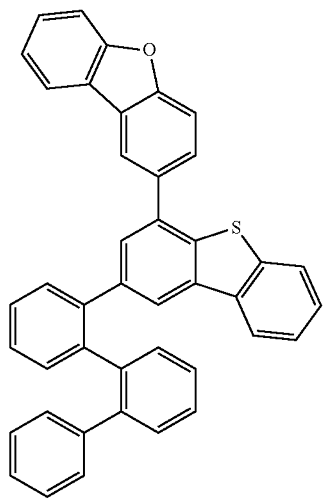
[3-60]
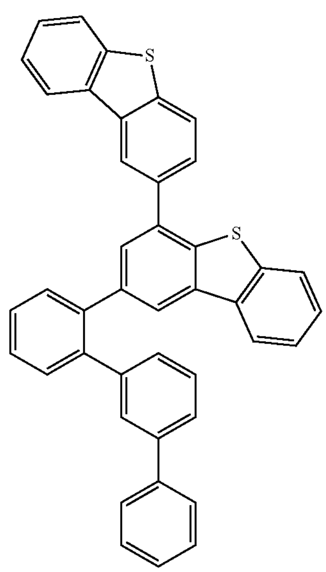

-continued
[3-61]
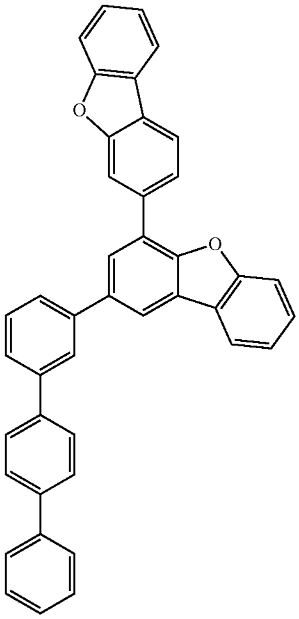
[3-62]
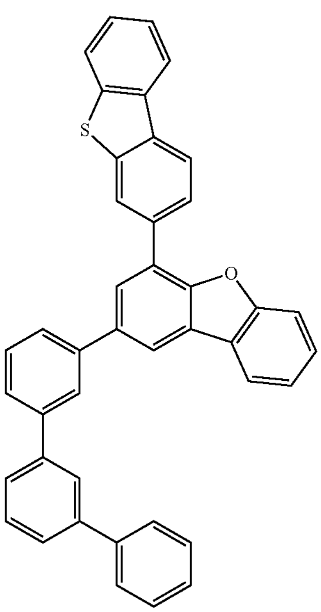
-continued
[3-63]
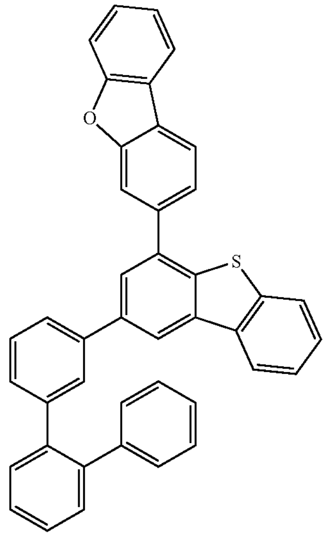
[3-64]
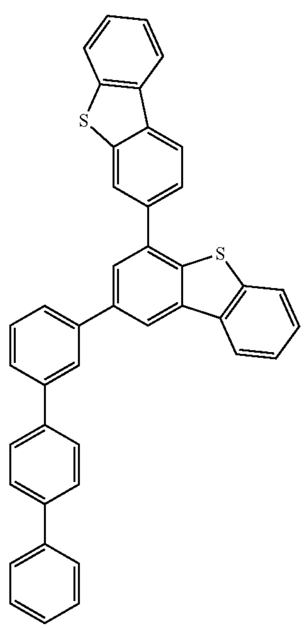

-continued
[3-65]
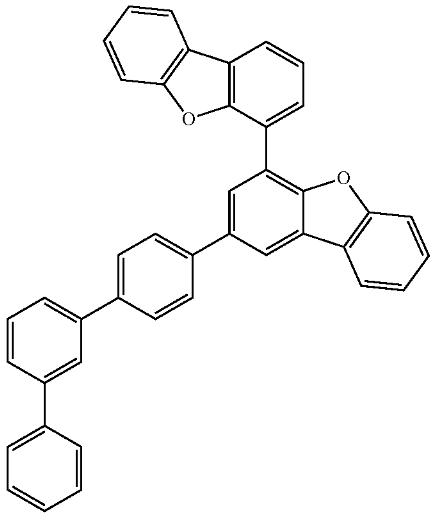
[3-66]
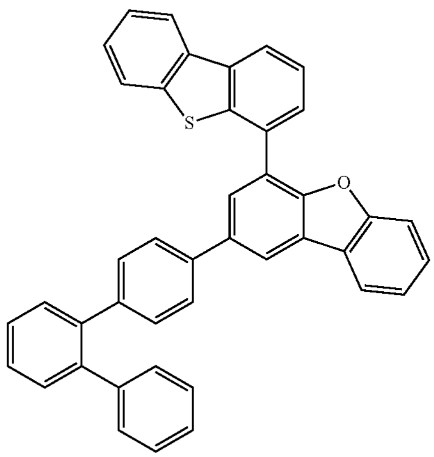
[3-67]
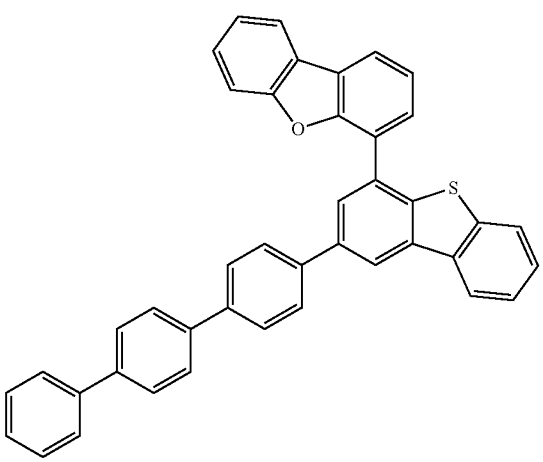
-continued
[3-68]
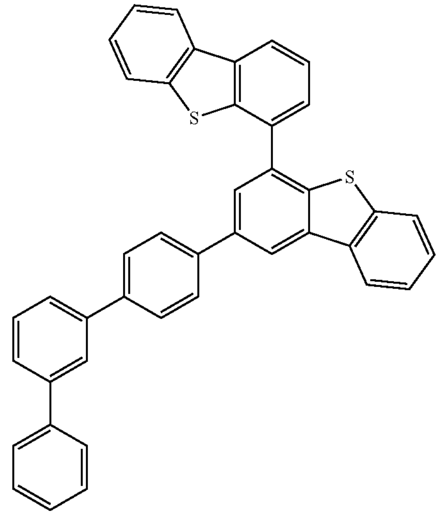
[3-69]
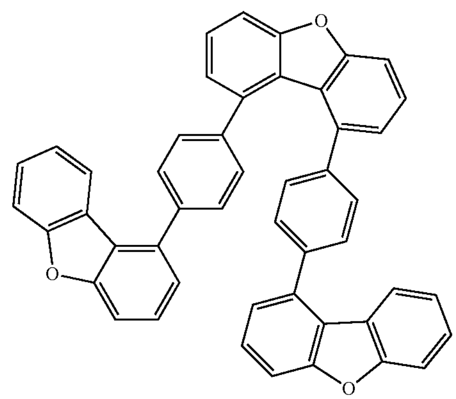
[3-70]
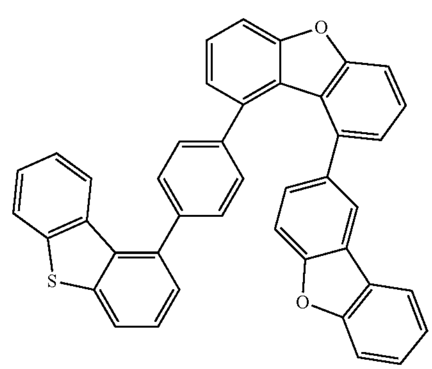

-continued
[3-71]
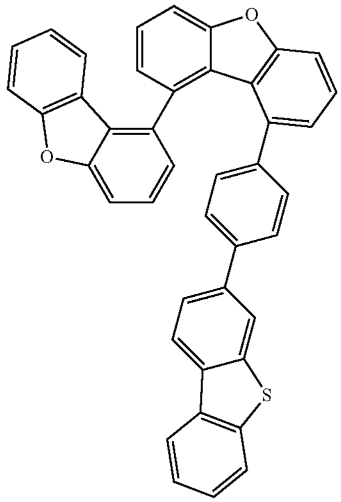
[3-72]
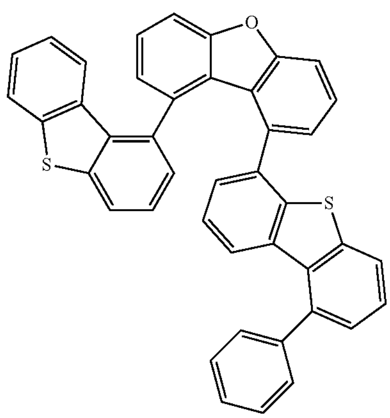
[3-73]
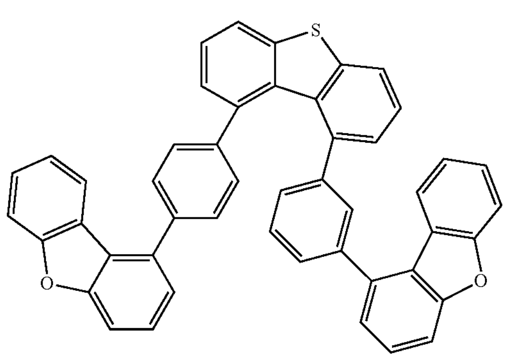
-continued
[3-74]
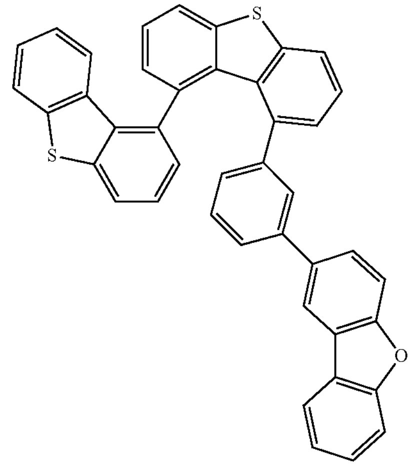
[3-75]
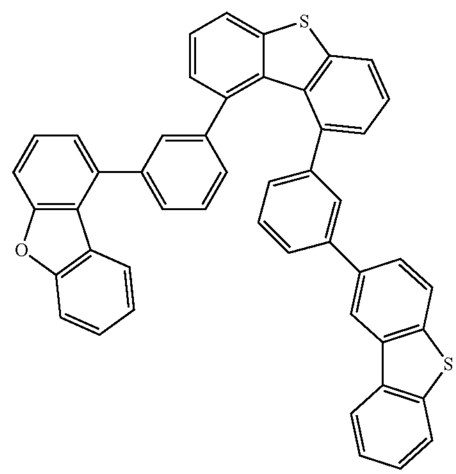
[3-76]
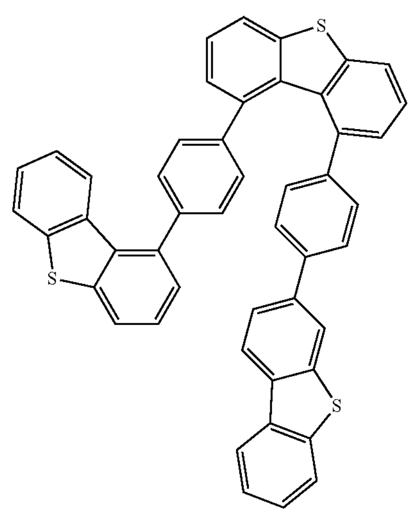

-continued
[3-77]
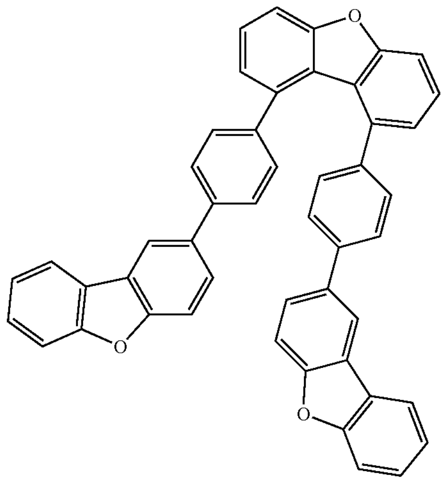
[3-78]
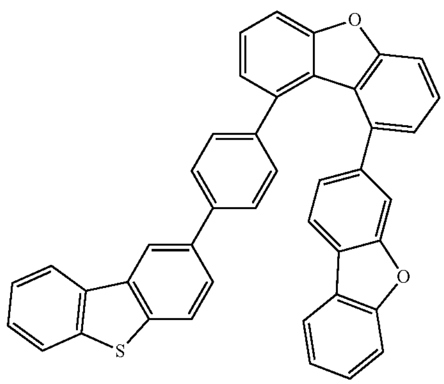
[3-79]
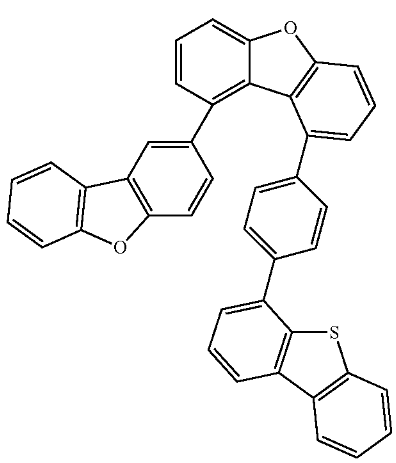
-continued
[3-80]
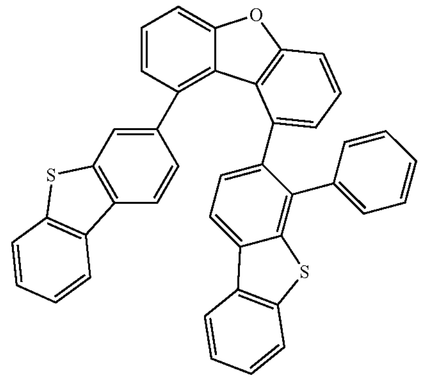
[3-81]
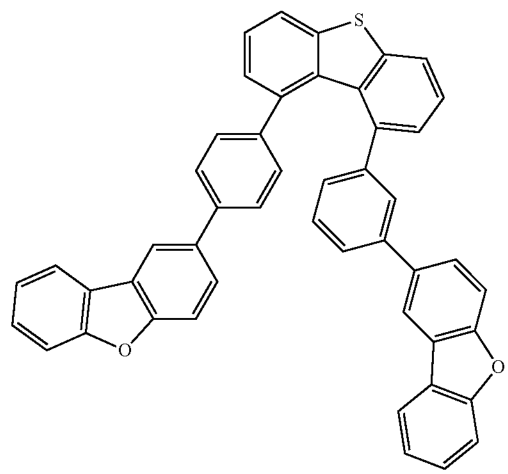
[3-82]
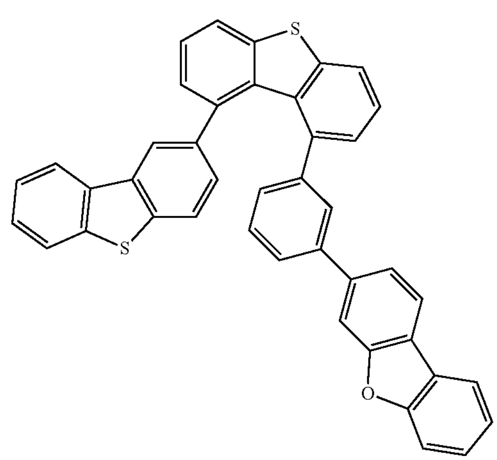

-continued
[3-83]
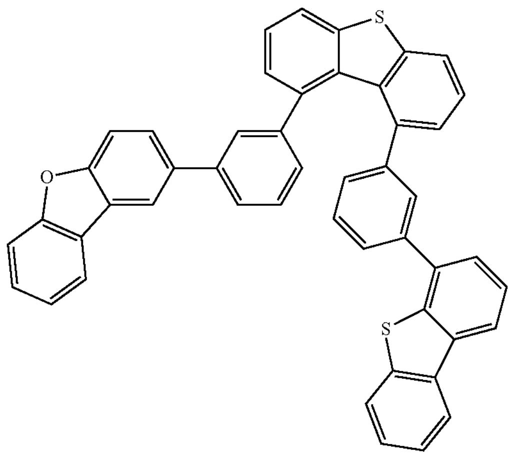
[3-84]
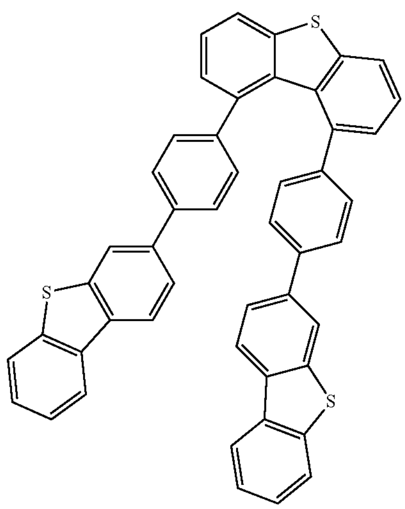
[3-85]
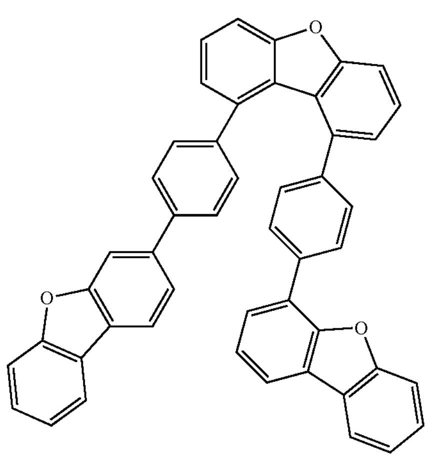
-continued
[3-86]
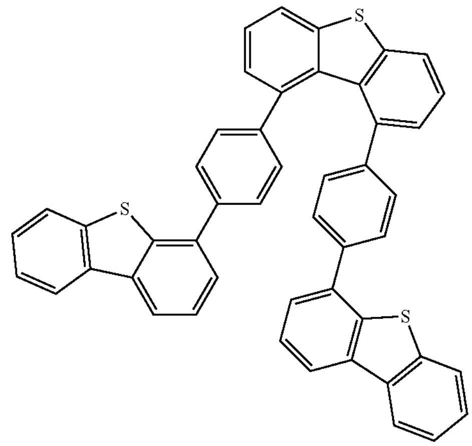
[3-87]
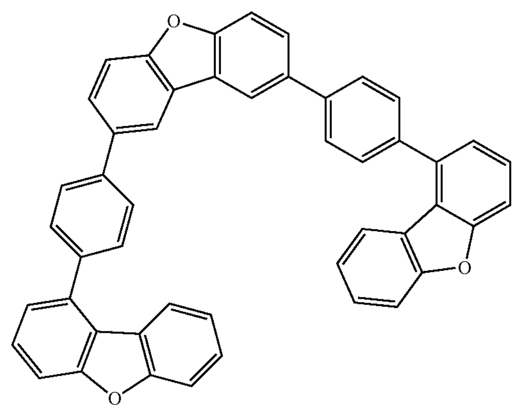
[3-88]
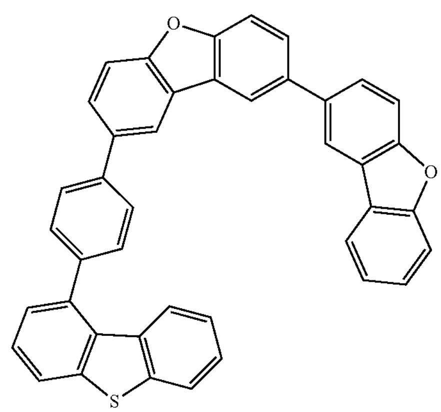
[3-89]
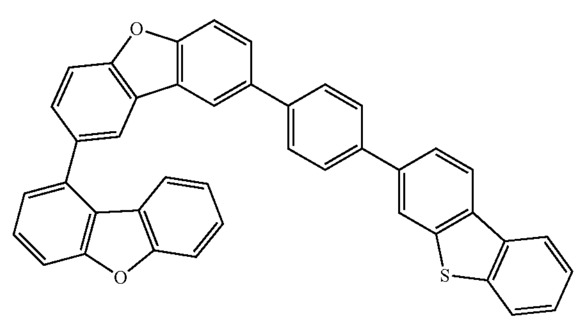

-continued
[3-90]
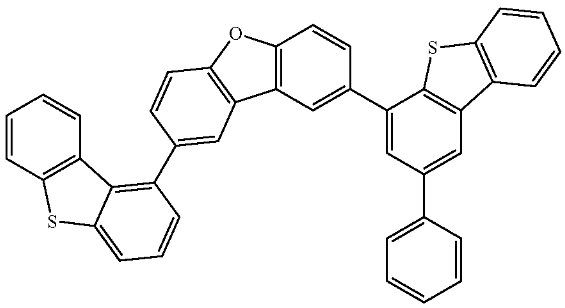
[3-91]
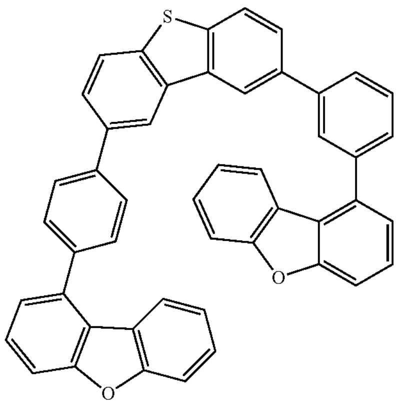
[3-92]
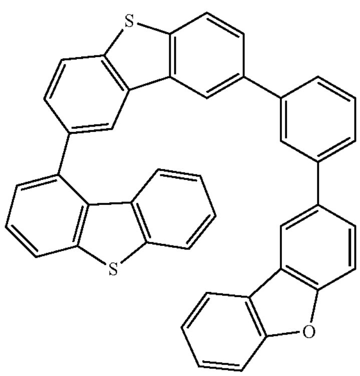
[3-93]
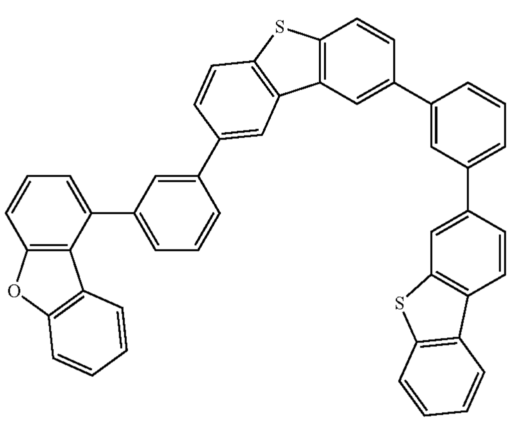
-continued
[3-94]
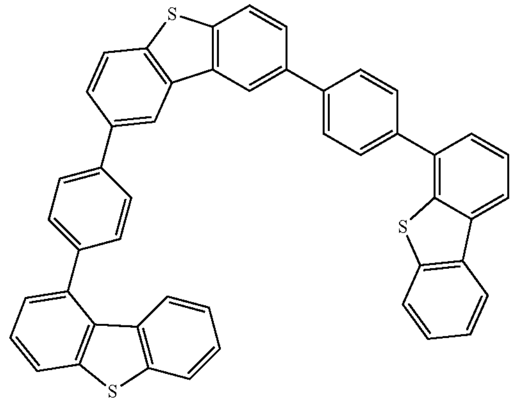
[3-95]
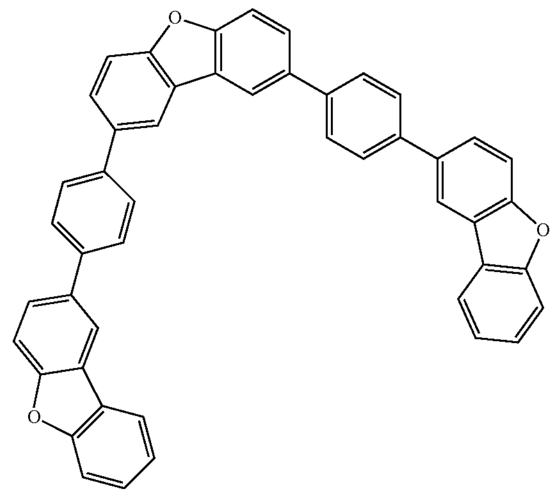
[3-96]
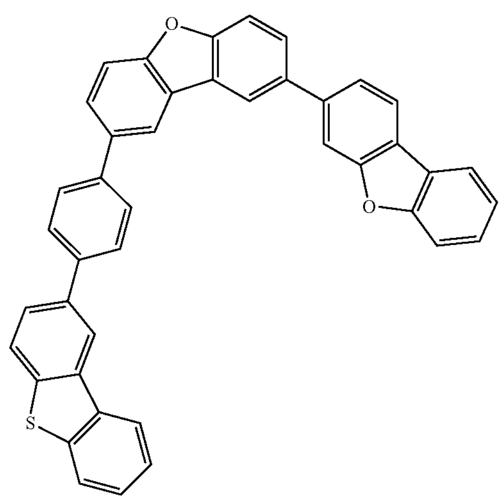

-continued
[3-97]
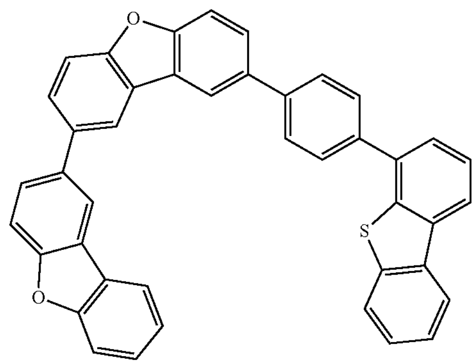
[3-98]
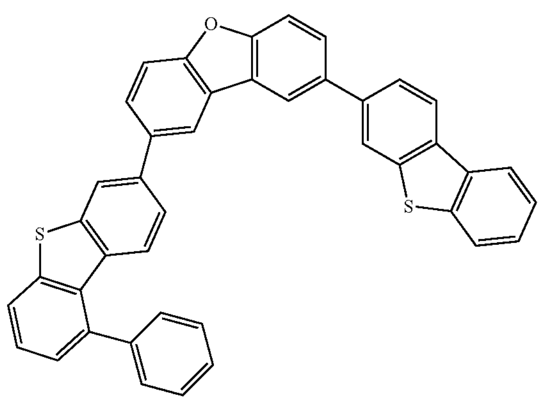
[3-99]
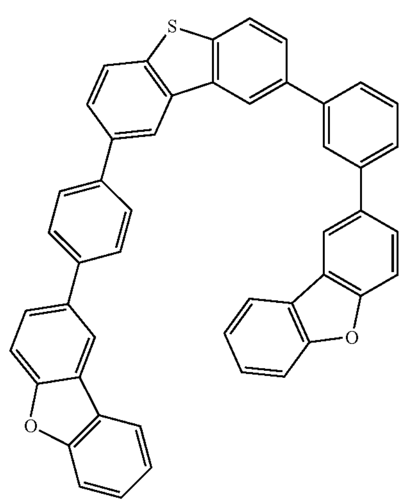
-continued
[3-100]
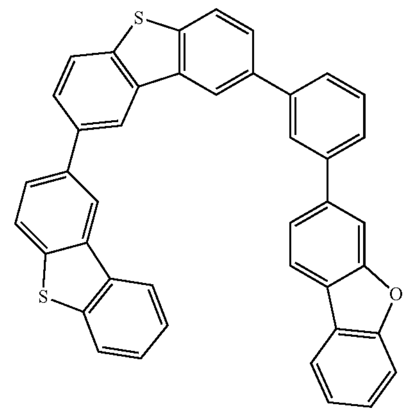
[3-101]
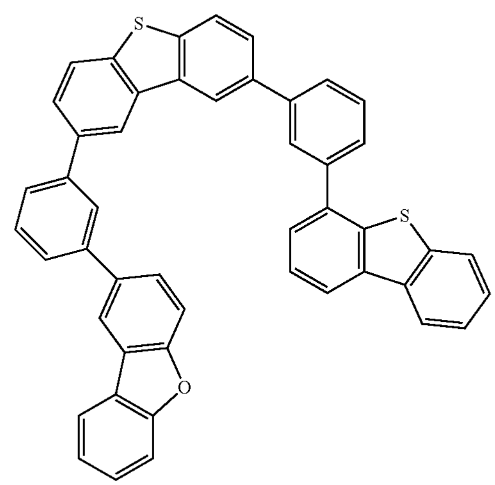
[3-102]
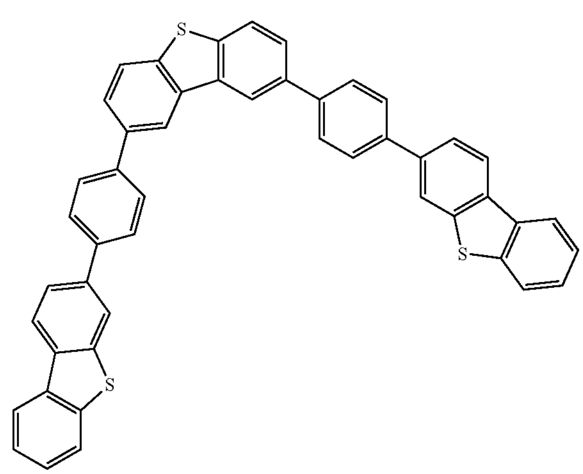

[3-103]
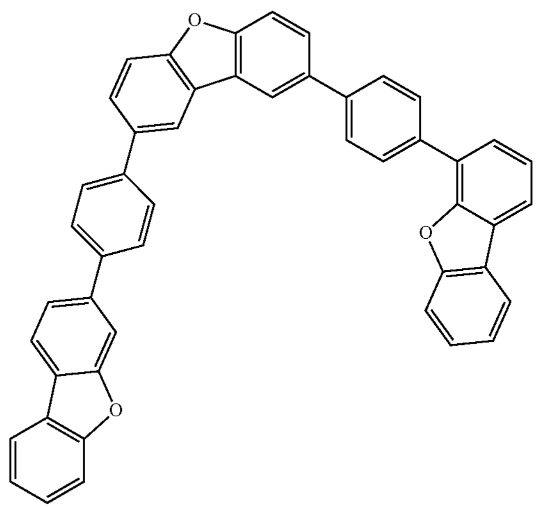
[3-104]
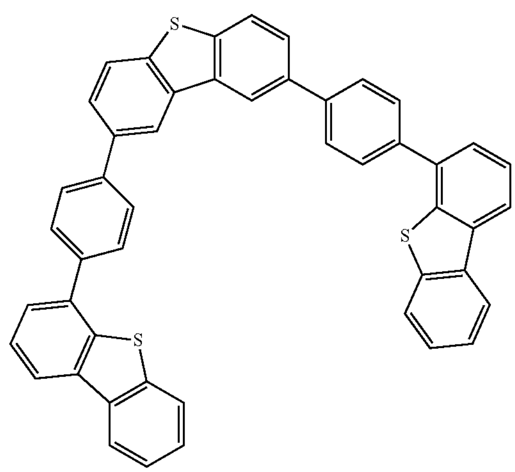
[3-105]
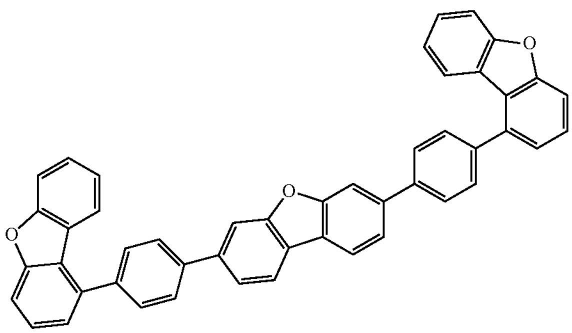
[3-106]
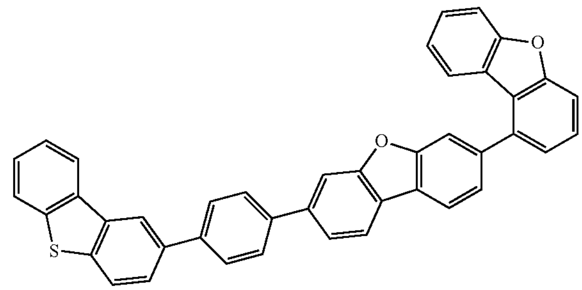
[3-107]
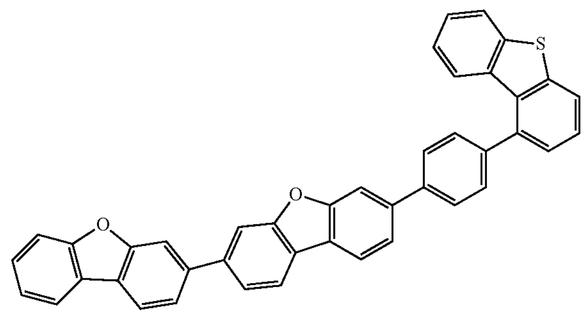
[3-108]
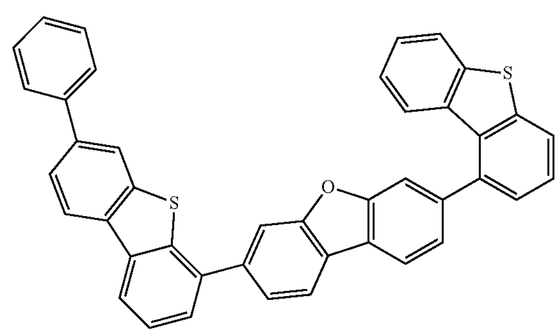
[3-109]
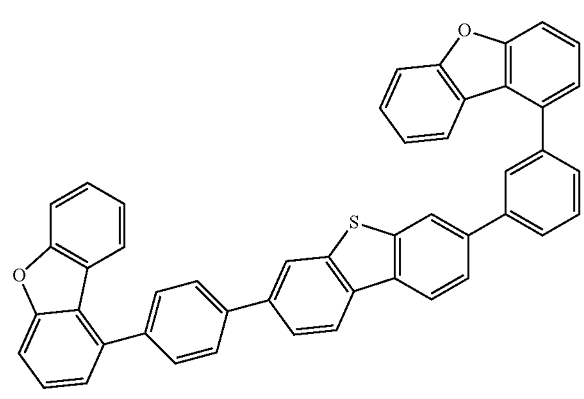

-continued
[3-110]
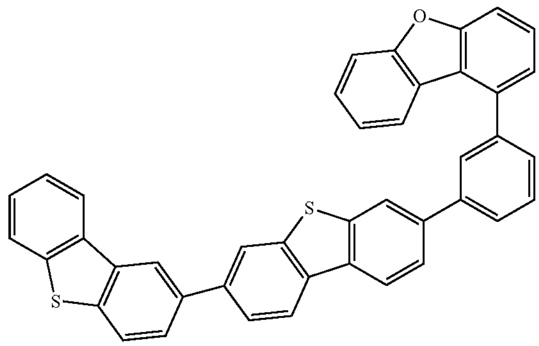
[3-111]
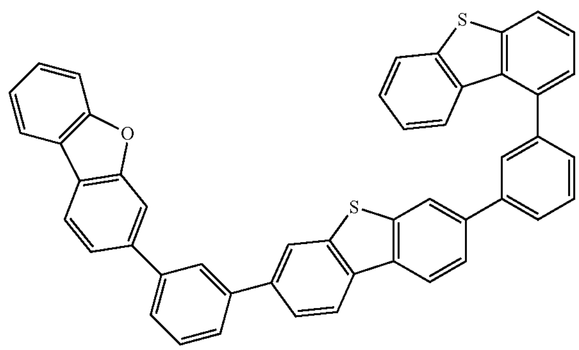
[3-112]
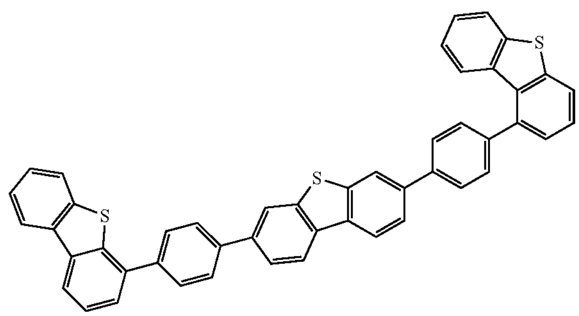
[3-113]
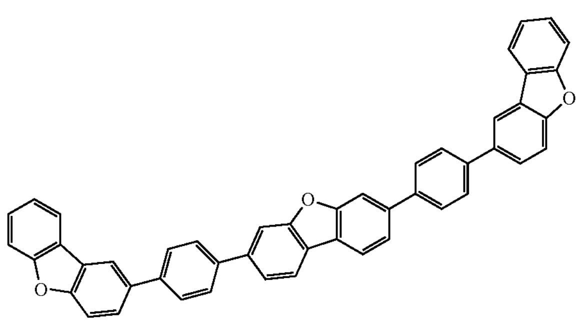
-continued
[3-114]
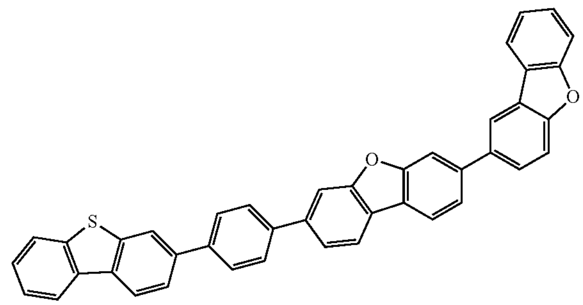
[3-115]
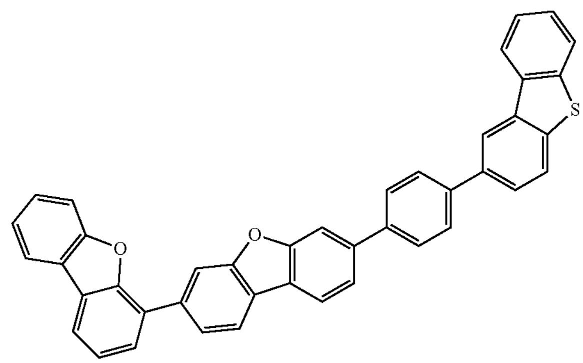
[3-116]
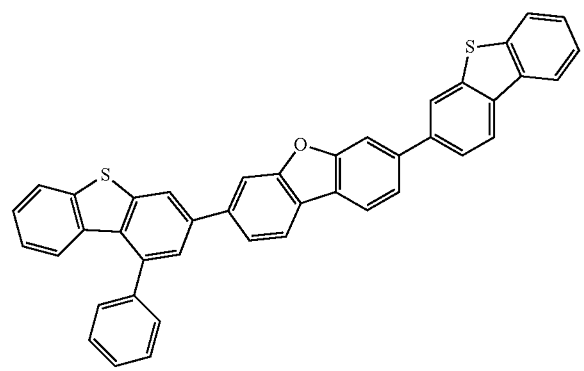
[3-117]
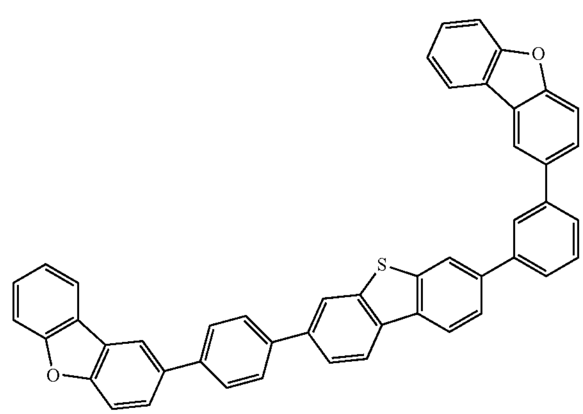

-continued
[3-118]
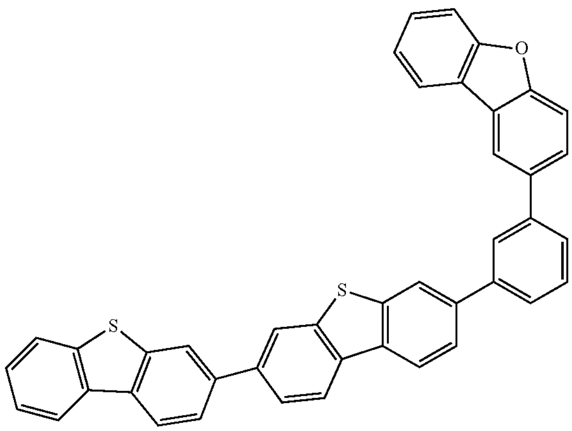
[3-119]
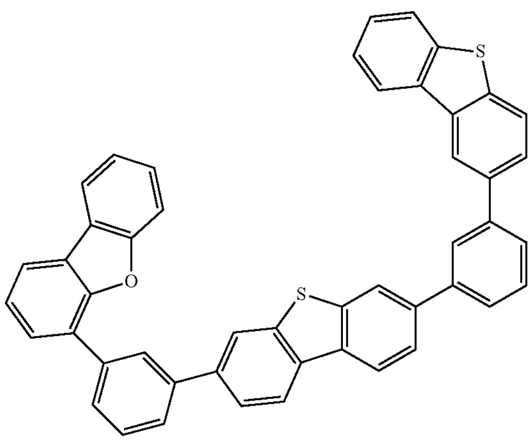
[3-120]
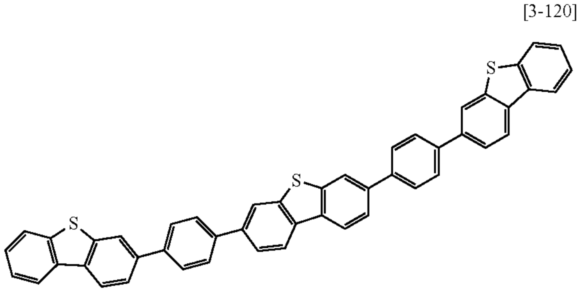
[3-121]
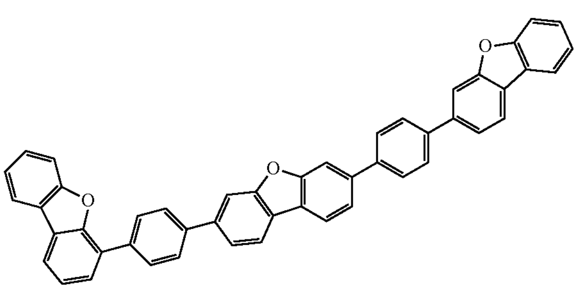
-continued
[3-122]
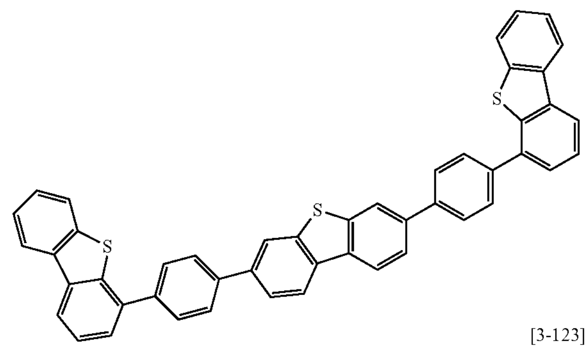
[3-123]
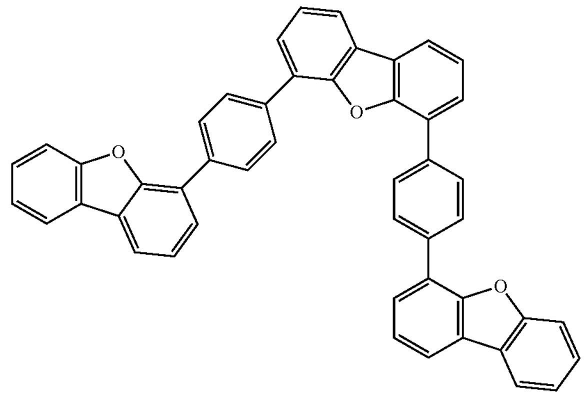
[3-124]
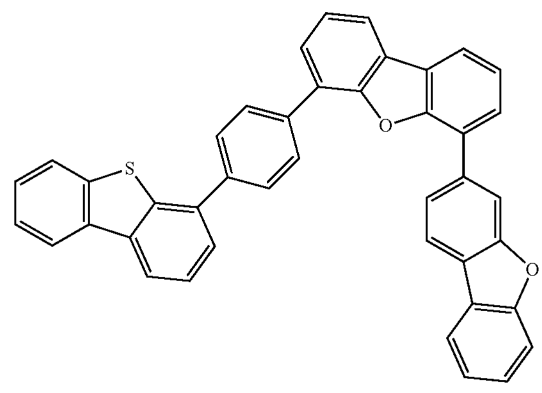
[3-125]
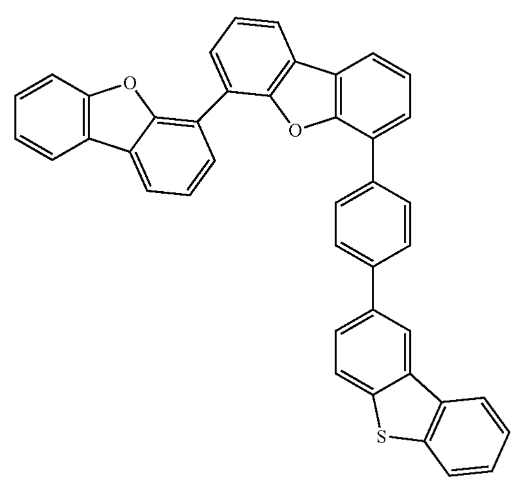

[3-126]
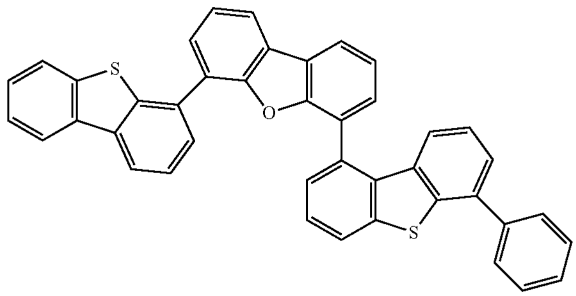
[3-127]
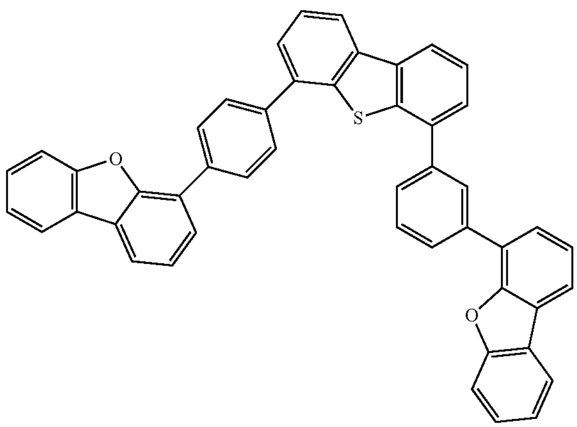
[3-128]
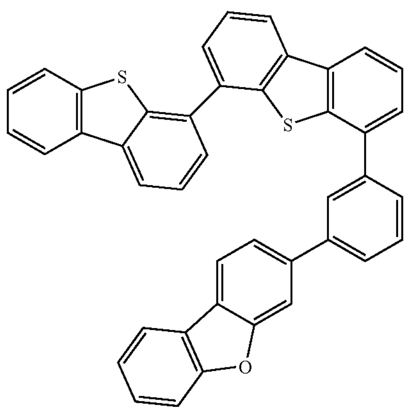
[3-129]
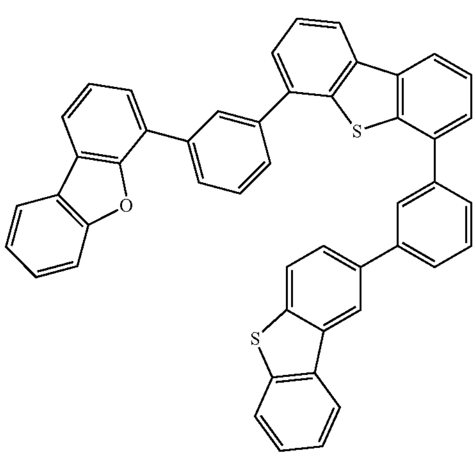
[3-130]
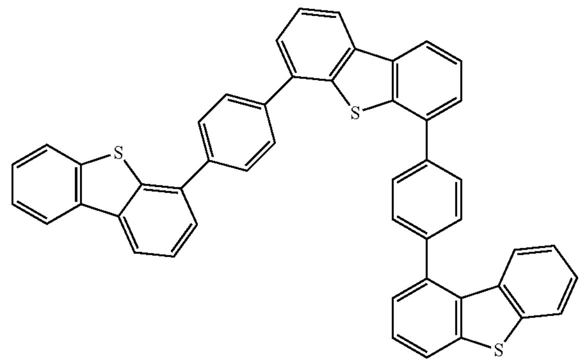
[3-131]
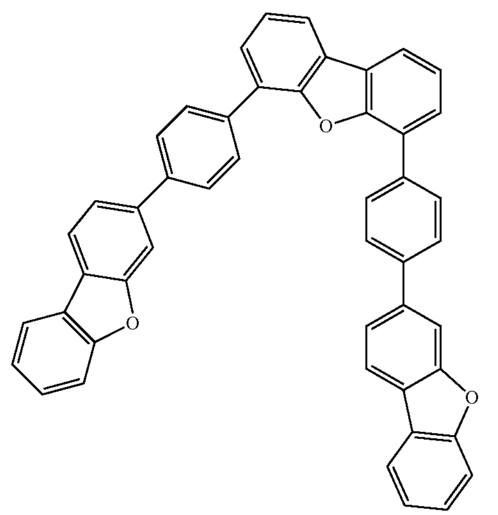
[3-132]
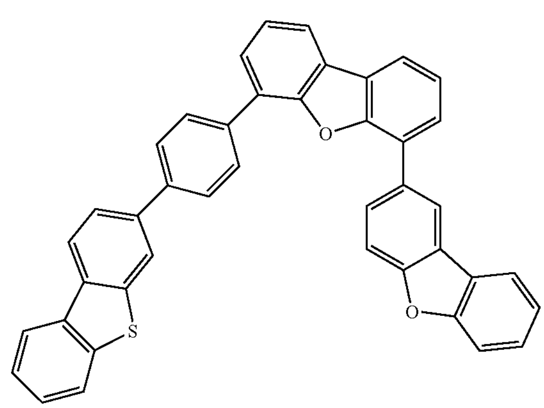

-continued
[3-133]
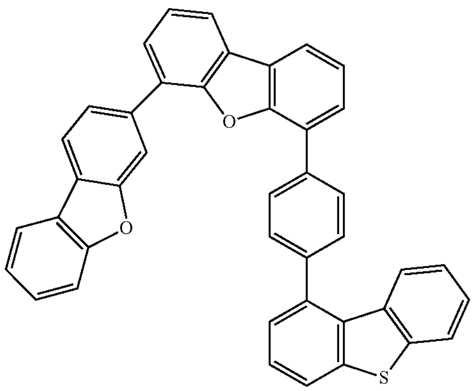
[3-134]
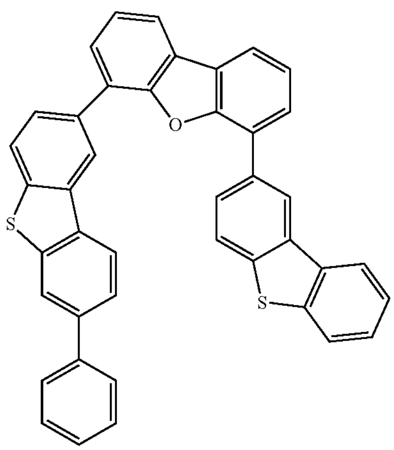
[3-135]
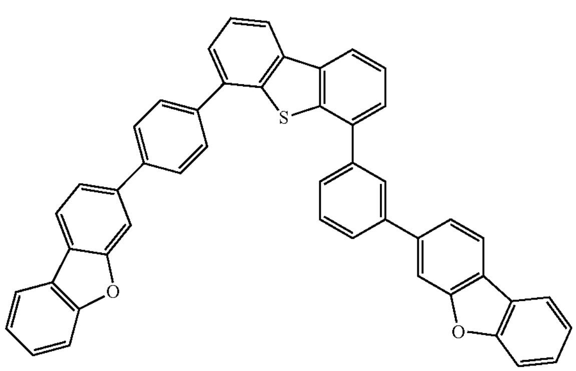
-continued
[3-136]
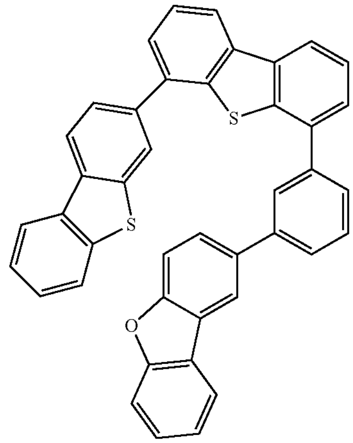
[3-137]
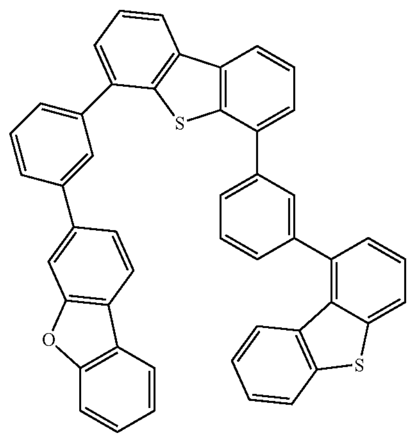
[3-138]
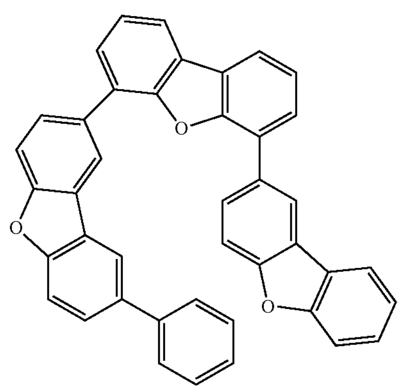

-continued

[3-139]

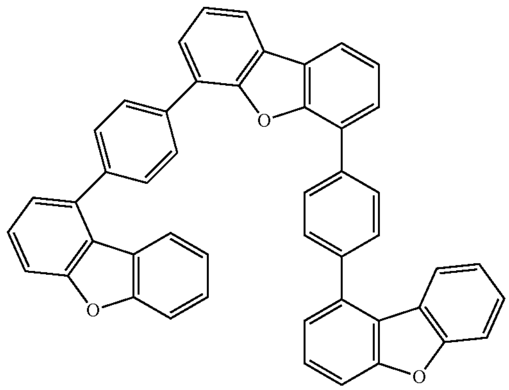

[3-140]

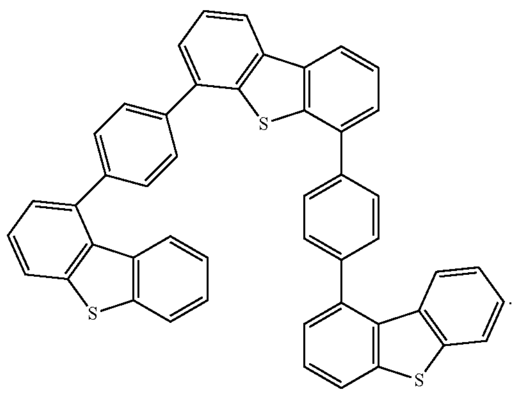

9. The composition as claimed in claim 1, wherein:

the first compound is represented by Chemical Formula IA-1, the second compound is represented by Chemical Formula IIA-2, and the third compound is represented by Chemical Formula IIIA-2-2:

[Chemical Formula IA-1]

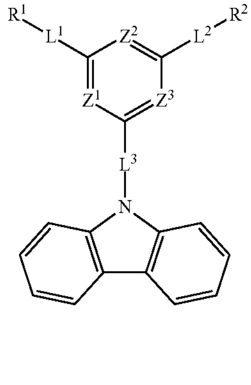

-continued

[Chemical Formula IIA-2]

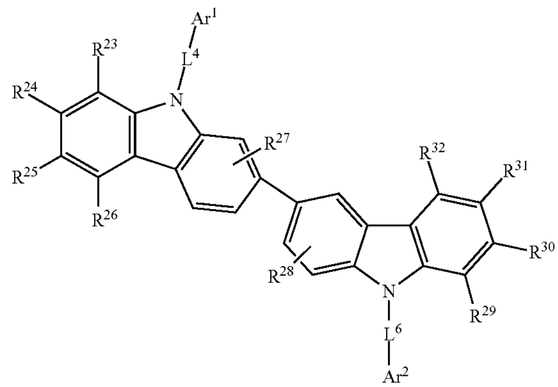

[Chemical Formula IIIA-2-2]

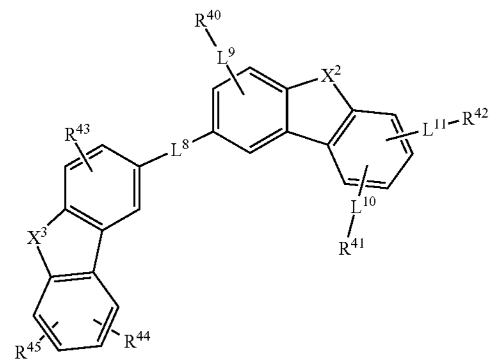

in Chemical Formula IA-1, $Z^1$ to $Z^3$ are each N, $L^1$ to $L^3$ are each independently a single bond or a substituted or unsubstituted phenylene group, and $R^1$ and $R^2$ are each independently a substituted or unsubstituted phenyl group, a substituted or unsubstituted biphenyl group, a substituted or unsubstituted carbazolyl group, a substituted or unsubstituted dibenzofuranyl group, or a substituted or unsubstituted dibenzothiophenyl group;

in Chemical Formula IIA-2, $R^{23}$ to $R^{32}$ are each independently hydrogen, deuterium, a cyano group, a substituted or unsubstituted phenyl group, or a substituted or unsubstituted biphenyl group, $L^4$ and $L^6$ are each independently a single bond, a substituted or unsubstituted phenylene group, or a substituted or unsubstituted biphenylene group, and $Ar^1$ and $Ar^2$ are each independently a substituted or unsubstituted phenyl group, a substituted or unsubstituted biphenyl group, a substituted or unsubstituted terphenyl group, a substituted or unsubstituted naphthyl group, a substituted or unsubstituted phenanthrene group, a substituted or unsubstituted triphenylene group, a substituted or unsubstituted fluorenyl group, a substituted or unsubstituted dibenzofuranyl group, or a substituted or unsubstituted dibenzothiophenyl group;

in Chemical Formula IIIA-2-2, $X^2$ and $X^3$ are each independently O or S, $R^{40}$ to $R^{45}$ are each independently hydrogen or a substituted or unsubstituted C6 to C18 aryl group, $L^8$ is a single bond, and $L^9$ to $L^{11}$ are each independently a single bond, a substituted or unsubstituted phenylene group, or a substituted or unsubstituted biphenylene group.

10. The composition as claimed in claim 1, wherein:

the first compound is represented by Chemical Formula IE-1, the second compound is represented by Chemical Formula IIA-1, and the third compound is represented by Chemical Formula IIIA-4-1:

[Chemical Formula IE-1]

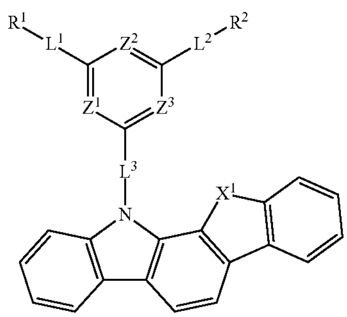

[Chemical Formula IIA-1]

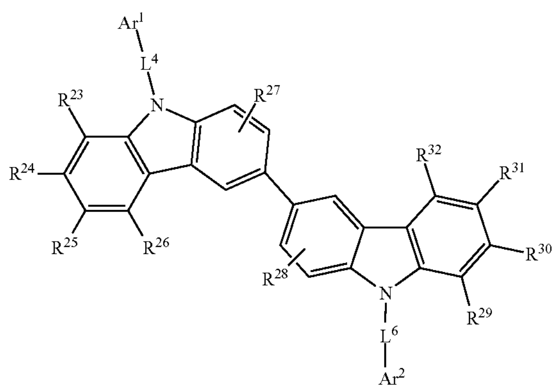

[Chemical Formula IIIA-4-1]

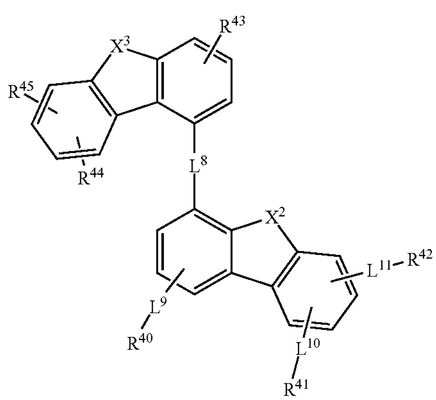

in Chemical Formula IE-I, $X^1$ is $NR^b$, O, or S, $R^b$ is a substituted or unsubstituted phenyl group, a substituted or unsubstituted biphenyl group, or a substituted or unsubstituted terphenyl group, $Z^1$ to $Z^3$ are each N, $L^8$ to $L^3$ are each independently a single bond or a substituted or unsubstituted phenylene group, and $R^1$ and $R^2$ are each independently a substituted or unsubstituted phenyl group or a substituted or unsubstituted biphenyl group;

in Chemical Formula IIA-1, $R^{23}$ to $R^{32}$ are each independently hydrogen, deuterium, a cyano group, a substituted or unsubstituted phenyl group, or a substituted or unsubstituted biphenyl group, $L^4$ and $L^6$ are each independently a single bond, a substituted or unsubstituted phenylene group, or a substituted or unsubstituted biphenylene group, and $Ar^1$ and $Ar^2$ are each independently a substituted or unsubstituted phenyl group, a substituted or unsubstituted biphenyl group, a substituted or unsubstituted terphenyl group, a substituted or unsubstituted naphthyl group, a substituted or unsubstituted phenanthrene group, a substituted or unsubstituted triphenylene group, a substituted or unsubstituted fluorenyl group, a substituted or unsubstituted dibenzofuranyl group, or a substituted or unsubstituted dibenzothiophenyl group;

in Chemical Formula IIIA-4-1, $X^2$ and $X^3$ are each independently O or S, $R^{40}$ to $R^{45}$ are each independently hydrogen or a substituted or unsubstituted C6 to C18 aryl group, $L^8$ is a single bond, and $L^9$ to $L^{11}$ are each independently a single bond, a substituted or unsubstituted phenylene group, or a substituted or unsubstituted biphenylene group.

11. The composition as claimed in claim 1, wherein:

the first compound is represented by Chemical Formula IE-1, the second compound is represented by Chemical Formula IIA-1 or Chemical Formula IIF, and the third compound is represented by Chemical Formula IIIB-4-1 or Chemical Formula IIIB-4-5:

[Chemical Formula IE-1]

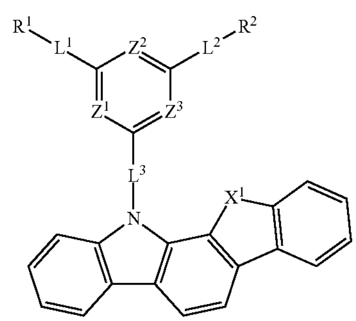

[Chemical Formula IIA-1]

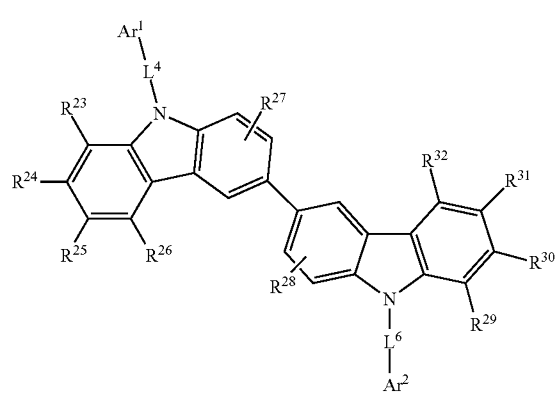

-continued

[Chemical Formula IIF]

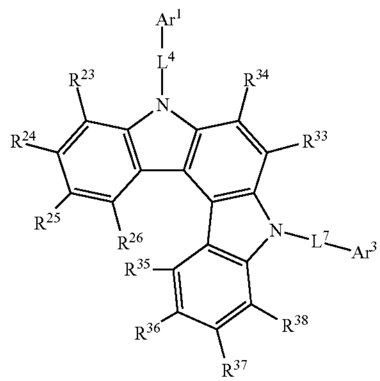

[Chemical Formula IIIB-4-1]

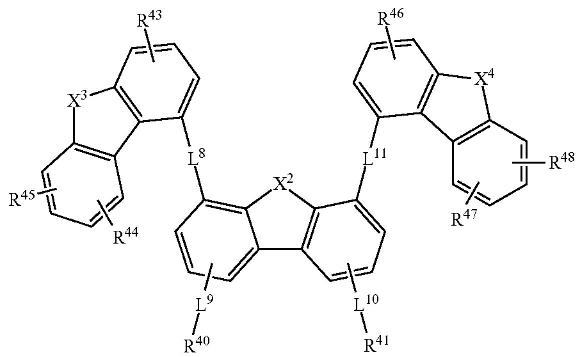

[Chemical Formula IIIB-4-5]

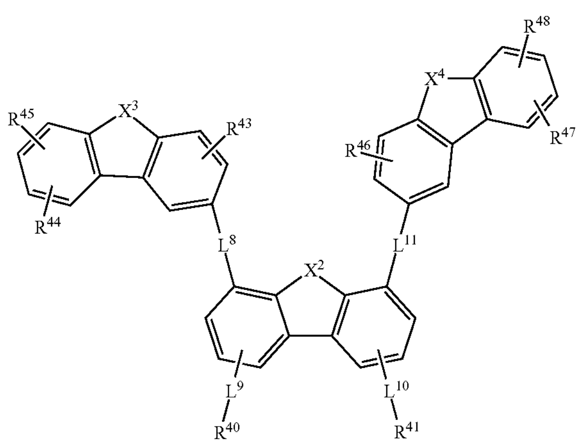

in Chemical Formula IE-1, $X^1$ is $NR^b$, O, or S, $R^b$ is a substituted or unsubstituted phenyl group, a substituted or unsubstituted biphenyl group, or a substituted or unsubstituted terphenyl group, $Z^1$ to $Z^3$ are each N, $L^1$ to $L^3$ are each independently a single bond or a substituted or unsubstituted phenylene group, and $R^1$ and $R^2$ are each independently a substituted or unsubstituted phenyl group or a substituted or unsubstituted biphenyl group;

in Chemical Formula IIA-I and Chemical Formula IIF, $R^{23}$ to $R^{38}$ are each independently hydrogen, deuterium, a cyano group, a substituted or unsubstituted phenyl group, or a substituted or unsubstituted biphenyl group, and $L^4$, $L^6$, and $L^7$ are each independently a single bond, a substituted or unsubstituted phenylene group, or a substituted or unsubstituted biphenylene group, $Ar^1$ to $Ar^3$ are each independently a substituted or unsubstituted phenyl group, a substituted or unsubstituted biphenyl group, a substituted or unsubstituted terphenyl group, a substituted or unsubstituted naphthyl group, a substituted or unsubstituted phenanthrene group, a substituted or unsubstituted triphenylene group, a substituted or unsubstituted fluorenyl group, a substituted or unsubstituted dibenzofuranyl group, or a substituted or unsubstituted dibenzothiophenyl group;

in Chemical Formula IIIB-4-1 and Chemical Formula IIIB-4-5, $X^2$ to $X^4$ are each independently O or S, $R^{40}$, $R^{41}$, and $R^{43}$ to $R^{48}$ are each independently hydrogen or a substituted or unsubstituted C6 to C18 aryl group, and $L^8$ to $L^{11}$ are each independently a single bond, or a substituted or unsubstituted phenylene group.

12. The composition as claimed in claim 1, wherein the composition for an organic optoelectronic device includes:

about 20 wt % to about 50 wt % of the first compound, about 40 wt % to about 60 wt % of the second compound, and about 10 wt % to about 30 wt % of the third compound, all wt % being based on a total weight of the first compound, the second compound, and the third compound.

13. An organic optoelectronic device, comprising:

an anode and a cathode facing each other, and at least one organic layer between the anode and the cathode, wherein the at least one organic layer includes the composition for an organic optoelectronic device as claimed in claim 1.

14. The organic optoelectronic device as claimed in claim 13, wherein:

the at least one organic layer includes a light emitting layer, and the light emitting layer includes the composition for an organic optoelectronic device.

15. The organic optoelectronic device as claimed in claim 14, wherein the first compound, the second compound, and the third compound are a phosphorescent host of the light emitting layer.

16. The organic optoelectronic device as claimed in claim 15, wherein the composition for an organic optoelectronic device is a green light emitting composition.

17. A display device comprising the organic optoelectronic device as claimed in claim 13.

* * * * *